US011239425B2

(12) United States Patent
Suh et al.

(10) Patent No.: US 11,239,425 B2
(45) Date of Patent: Feb. 1, 2022

(54) ORGANIC LIGHT EMITTING DEVICE

(71) Applicant: LG CHEM, LTD., Seoul (KR)

(72) Inventors: Sang Duk Suh, Daejeon (KR); Sung Kil Hong, Daejeon (KR); Seong So Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 481 days.

(21) Appl. No.: 16/316,608

(22) PCT Filed: Mar. 8, 2018

(86) PCT No.: PCT/KR2018/002776

§ 371 (c)(1),
(2) Date: Jan. 9, 2019

(87) PCT Pub. No.: WO2018/164510

PCT Pub. Date: Sep. 13, 2018

(65) Prior Publication Data

US 2019/0296243 A1 Sep. 26, 2019

(30) Foreign Application Priority Data

Mar. 8, 2017 (KR) ........................ 10-2017-0029698

(51) Int. Cl.
*H01L 51/00* (2006.01)
*H01L 51/50* (2006.01)
*C09K 11/06* (2006.01)

(52) U.S. Cl.
CPC .......... *H01L 51/0058* (2013.01); *C09K 11/06* (2013.01); *H01L 51/00* (2013.01);
(Continued)

(58) Field of Classification Search
None
See application file for complete search history.

(56) References Cited

U.S. PATENT DOCUMENTS 9,203,033 B2 12/2015 Park et al.
9,997,716 B2 6/2018 Zeng et al.
(Continued)

FOREIGN PATENT DOCUMENTS

CN 102077384 A 5/2011
EP 2515615 A1 10/2012
(Continued)

OTHER PUBLICATIONS

Machine translation of KR-10-2017-0134264, translation generated May 2021, 23 pages. (Year: 2021).*
(Continued)

*Primary Examiner* — Robert S Loewe
(74) *Attorney, Agent, or Firm* — Dentons US LLP

(57) ABSTRACT

The present invention relates to an organic light emitting device including a light emitting layer comprising a compound represented by Chemical Formula 1 and an electron transport region comprising a compound represented by Chemical Formula 2, and having improved driving voltage, efficiency and lifetime.

[Chemical Formula 1]

(Continued)

-continued

[Chemical Formula 2]

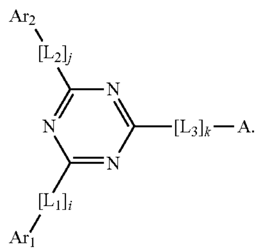

12 Claims, 1 Drawing Sheet

(52) U.S. Cl.
CPC ...... *H01L 51/0052* (2013.01); *H01L 51/0054* (2013.01); *H01L 51/0059* (2013.01); *H01L 51/0067* (2013.01); *H01L 51/0072* (2013.01); *H01L 51/0073* (2013.01); *H01L 51/0074* (2013.01); *H01L 51/50* (2013.01); *H01L 51/5012* (2013.01); *H01L 51/5096* (2013.01); *H01L 51/5072* (2013.01); *H01L 51/5076* (2013.01)

(56) References Cited

U.S. PATENT DOCUMENTS

| | | | | |
|---|---|---|---|---|
| 2004/0251816 | A1 | 12/2004 | Leo et al. | |
| 2011/0095282 | A1* | 4/2011 | Pflumm | H01L 51/0067 257/40 |
| 2011/0156013 | A1* | 6/2011 | Kim | C07D 401/10 257/40 |
| 2012/0181922 | A1 | 7/2012 | Kawamura et al. | |
| 2013/0200338 | A1 | 8/2013 | Kim et al. | |
| 2013/0299794 | A1* | 11/2013 | Jung | H01L 51/0072 257/40 |
| 2014/0131681 | A1 | 5/2014 | Ito et al. | |
| 2015/0171337 | A1 | 6/2015 | Jung et al. | |
| 2015/0243897 | A1 | 8/2015 | Montenegro et al. | |
| 2015/0255736 | A1 | 9/2015 | Kim et al. | |
| 2015/0349265 | A1 | 12/2015 | Hwang et al. | |
| 2015/0349268 | A1 | 12/2015 | Zeng et al. | |
| 2015/0357574 | A1 | 12/2015 | Ito et al. | |
| 2015/0364693 | A1 | 12/2015 | Ito et al. | |
| 2016/0013427 | A1 | 1/2016 | Kim et al. | |
| 2016/0013430 | A1 | 1/2016 | Kim et al. | |
| 2016/0087217 | A1 | 3/2016 | Ito et al. | |
| 2016/0118590 | A1 | 4/2016 | Ito et al. | |
| 2016/0133849 | A1 | 5/2016 | Miyake et al. | |
| 2016/0141514 | A1* | 5/2016 | Lee | C07D 401/10 257/40 |
| 2016/0211454 | A1* | 7/2016 | Kim | C09B 57/00 |
| 2016/0211458 | A1* | 7/2016 | Ito | C09K 11/025 |
| 2016/0351816 | A1* | 12/2016 | Kim | C09K 11/06 |
| 2016/0351817 | A1 | 12/2016 | Kim et al. | |
| 2016/0351818 | A1* | 12/2016 | Kim | H01L 51/0052 |
| 2016/0372524 | A1* | 12/2016 | Yun | H01L 51/5092 |
| 2017/0018723 | A1 | 1/2017 | Cha et al. | |
| 2017/0077415 | A1* | 3/2017 | Kim | C07D 403/10 |
| 2017/0098777 | A1 | 4/2017 | Huh et al. | |
| 2017/0148995 | A1* | 5/2017 | Kim | H01L 51/0052 |
| 2017/0155050 | A1* | 6/2017 | Kim | H01L 51/0058 |
| 2017/0170405 | A1* | 6/2017 | Cho | H01L 51/0073 |
| 2017/0186968 | A1* | 6/2017 | Shiomi | C07D 401/10 |
| 2018/0002256 | A1 | 1/2018 | Cha et al. | |
| 2018/0269402 | A1* | 9/2018 | Huh | H01L 51/0058 |
| 2020/0010433 | A1* | 1/2020 | Jung | H01L 51/5072 |

FOREIGN PATENT DOCUMENTS

| | | | | |
|---|---|---|---|---|
| EP | 2592671 | A1 | 5/2013 | |
| EP | 3048654 | A2 | 7/2016 | |
| EP | 3127901 | A1 | 2/2017 | |
| JP | 2005-314239 | A | 11/2005 | |
| JP | 2011222831 | A | 11/2011 | |
| JP | 2015531755 | A | 11/2015 | |
| JP | 2016006039 | A | 1/2016 | |
| JP | 2016-092302 | A | 5/2016 | |
| KR | 10-2000-0051826 | A | 8/2000 | |
| KR | 10-2013-0091619 | A | 8/2013 | |
| KR | 10-2015-0006199 | A | 1/2015 | |
| KR | 10-2015-0006722 | A | 1/2015 | |
| KR | 10-2015-0007476 | A | 1/2015 | |
| KR | 10-1542714 | B1 | 8/2015 | |
| KR | 10-2015-0136579 | A | 12/2015 | |
| KR | 10-2015-0142822 | A | 12/2015 | |
| KR | 10-1580357 | B1 | 12/2015 | |
| KR | 10-2016-0007966 | A | 1/2016 | |
| KR | 10-2016-0007967 | A | 1/2016 | |
| KR | 10-2016-0036159 | A | 4/2016 | |
| KR | 10-2016-0036160 | A | 4/2016 | |
| KR | 10-2016-0100698 | A | 8/2016 | |
| KR | 10-2016-0127692 | A | 11/2016 | |
| KR | 10-2016-0141359 | A | 12/2016 | |
| KR | 10-2017-0134264 | A | 12/2017 | |
| KR | 1020170134264 | * | 12/2017 | C09K 11/06 |
| WO | 03/012890 | A2 | 2/2003 | |
| WO | 2014/069602 | A1 | 5/2014 | |
| WO | 2015008866 | A1 | 1/2015 | |

OTHER PUBLICATIONS

Electronic properties of dibenzofuran and benzonaphthofuran derivatives, Versuchsbericht, Jul. 1, 2020.

Samsung Galaxy S6, "Galazy S6 im Test: Top Hardware, edles Design, hoher Pries", Netzwelt, Apr. 29, 2015.

Journal of Nanoscience and Nanotechnology, "Blue Electroluminescent Materials Based on Dibenzofuran-Containing Anthracene Derivatives for Organic Light-Emitting Diodes", Jan. 1, 2016, vol. 16, pp. 8460-8464.

Optical Materials, "Blue fluorescent materials based on bis(10-phenylanthracen-9-yl) derivatives containing heterocyclic moiety", Apr. 3, 2015, pp. 247-253.

Toray Reverse Engineering Report, "Structure Analysis of OLED panel", Jan. 1, 2016.

* cited by examiner

[FIG. 1]
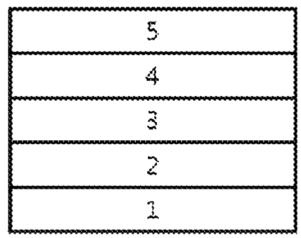
[FIG. 2]
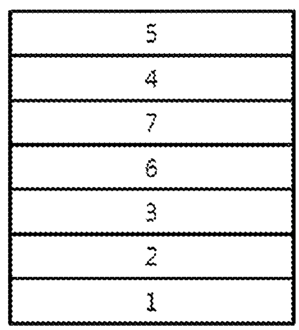
[FIG. 3]
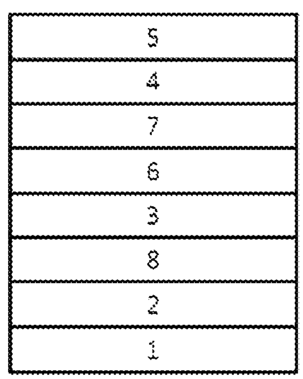

ORGANIC LIGHT EMITTING DEVICE

CROSS-REFERENCE TO RELATED APPLICATION(S)

This application is a National Stage Application of International Application No. PCT/KR2018/002776 filed on Mar. 8, 2018, and claims the benefit of priority from Korean Patent Application No. 10-2017-0029698 filed on Mar. 8, 2017, the full disclosure of which is incorporated herein by reference.

TECHNICAL FIELD

The present invention relates to an organic light emitting device having improved driving voltage, efficiency and lifetime.

BACKGROUND ART

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently has a multilayered structure that comprises different materials in order to enhance efficiency and stability of the organic light emitting device, and for example, the organic material layer may be formed of a hole injection layer, a hole transport layer, a light emitting layer, an electron transport layer, an electron injection layer and the like. In the structure of the organic light emitting device, if a voltage is applied between two electrodes, the holes are injected from an anode into the organic material layer and the electrons are injected from the cathode into the organic material layer, and when the injected holes and the electrons meet each other, an exciton is formed, and light is emitted when the exciton falls to a ground state again.

With respect to the organic light emitting device as described above, there is a continuing demand for development of an organic light emitting device having improved driving voltage, efficiency and lifetime.

PRIOR ART LITERATURE

Patent Literature (Patent Literature 0001) Korean Patent Laid-open Publication No. 10-2000-0051826

(Patent Literature 0002) Japanese Patent Laid-open Publication No. 2005-314239

(Patent Literature 0003) Korean Patent No. 10-1542714

(Patent Literature 0004) Korean Patent No. 10-1580357

(Patent Literature 0005) Korean Patent Laid-open Publication No. 10-2016-0100698

(Patent Literature 0006) Korean Patent Laid-open Publication No. 10-2016-0127692

DETAILED DESCRIPTION OF THE INVENTION

Technical Problem

It is an object of the present invention to provide an organic light emitting device having improved driving voltage, efficiency and lifetime.

Technical Solution

In order to achieve the above object, the present invention provides an organic light emitting device comprising:

an anode;

a cathode;

a light emitting layer disposed between the anode and the cathode; and an electron transport region between the cathode and the light emitting layer, wherein the light emitting layer comprises a compound represented by Chemical Formula 1, and the electron transport region comprises a compound represented by Chemical Formula 2 below:

[Chemical Formula 1]

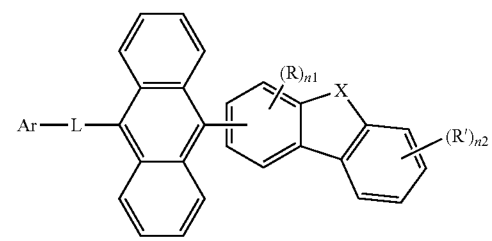

in Chemical Formula 1,

X is O or S,

L is a bond; or a substituted or unsubstituted $C_{6-60}$ arylene,

Ar is a substituted or unsubstituted $C_{6-60}$ aryl,

R and R' are each independently hydrogen; deuterium; halogen; nitrile; nitro; amino; a substituted or unsubstituted $C_{1-60}$ alkyl; a substituted or unsubstituted $C_{3-60}$ cycloalkyl; a substituted or unsubstituted $C_{2-60}$ alkenyl group; a substituted or unsubstituted $C_{6-60}$ aryl; or a substituted or unsubstituted $C_{2-60}$ heteroaryl containing at least one heteroatom selected from the group consisting of N, O and S, n1 is an integer of 0 to 3, and n2 is an integer of 0 to 4,

[Chemical Formula 2]

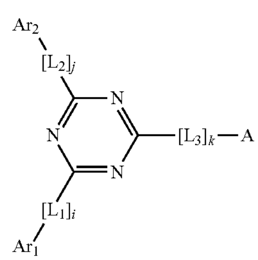

in Chemical Formula 2, $Ar_1$ and $Ar_2$ are each independently a substituted or unsubstituted $C_{6-60}$ aryl, or a substituted or unsubstituted $C_{2-60}$ heteroaryl containing at least one heteroatom selected from the group consisting of N, O and S, $L_1$, $L_2$ and $L_3$ are each independently a substituted or unsubstituted $C_{6-60}$ arylene, i, j, and k are each independently 0 or 1, A is represented by Chemical Formula 3,

[Chemical Formula 3]

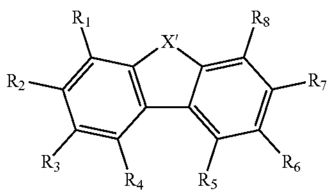

in Chemical Formula 3,

X' is

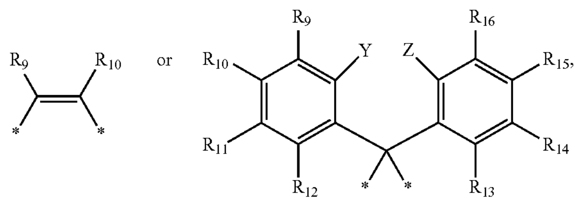

Y and Z are each independently hydrogen, or deuterium, or Y and Z together form a bond or —W—, wherein W is $CR_{17}R_{18}$, $SiR_{19}R_{20}$, $NR_{21}$, O, or S, $R_1$ to $R_{21}$ are each independently hydrogen; deuterium; a substituted or unsubstituted $C_{1-60}$ aryl; or a substituted or unsubstituted $C_{2-60}$ heteroaryl containing at least one heteroatom selected from the group consisting of N, O and S, or two adjacent radicals of $R_1$ to $R_{21}$ are linked to form a substituted or unsubstituted $C_{6-60}$ aryl, and one of $R_1$ to $R_{16}$ is linked to $L_3$.

Advantageous Effects

The organic light emitting device described above is excellent in driving voltage, efficiency and lifetime.

BRIEF DESCRIPTION OF DRAWINGS

FIG. 1 shows an example of an organic light emitting device comprising a substrate 1, an anode 2, a light emitting layer 3, an electron transport region 4, and a cathode 5.

FIG. 2 shows an example of an organic light emitting device comprising a substrate 1, an anode 2, a light emitting layer 3, a hole blocking layer 6, an electron transport layer 7, and a cathode 5.

FIG. 3 shows an example of an organic light emitting device comprising a substrate 1, an anode 2, a hole transport layer 8, a light emitting layer 3, a hole blocking layer 6, an electron transport layer 7, and a cathode 5.

DETAILED DESCRIPTION OF THE EMBODIMENTS

Hereinafter, the present invention will be described in more detail to help understanding of the present invention.

The present invention provides a compound represented by the Chemical Formula 1.

In the present specification,

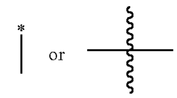

means a bond connected to another substituent group.

As used herein, the term "substituted or unsubstituted" means that substitution is performed by one or more substituent groups selected from the group consisting of deuterium; a halogen group; a nitrile group; a nitro group; a hydroxyl group; a carbonyl group; an ester group; an imide group; an amino group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group; a heteroarylamine group; an arylamine group; an arylphosphine group; or a heterocyclic group containing at least one of N, O, and S atoms, or there is no substituent group, or substitution is performed by a substituent group where two or more substituent groups of the exemplified substituent groups are linked or there is no substituent group. For example, the term "substituent group where two or more substituent groups are linked" may be a biphenyl group. That is, the biphenyl group may be an aryl group, or may be interpreted as a substituent group where two phenyl groups are connected.

In the present specification, the number of carbon atoms in a carbonyl group is not particularly limited, but is preferably 1 to 40. Specifically, the carbonyl group may be compounds having the following structures, but is not limited thereto.

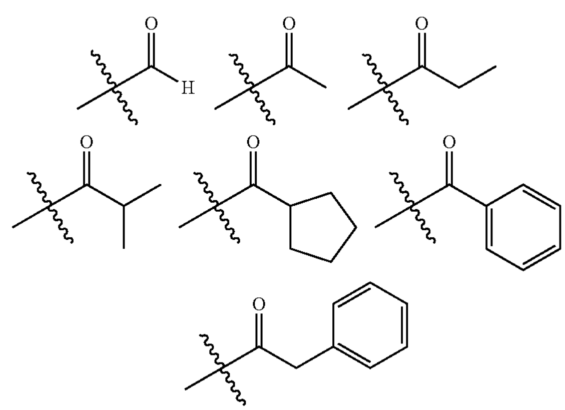

In the present specification, the ester group may have a structure in which oxygen of the ester group may be substituted by a straight-chain, branched-chain, or cyclic alkyl group having 1 to 25 carbon atoms, or an aryl group having 6 to 25 carbon atoms. Specifically, the ester group may be compounds having the following structures, but is not limited thereto.

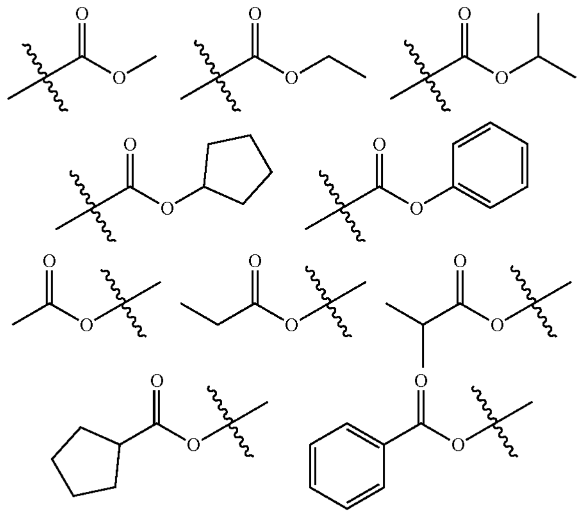

In the present specification, the number of carbon atoms in an imide group is not particularly limited, but is preferably 1 to 25. Specifically, the imide group may be compounds having the following structures, but is not limited thereto.

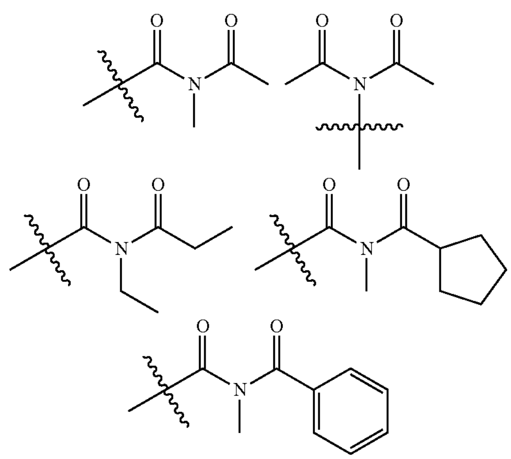

In the present specification, the silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but is not limited thereto.

In the present specification, the boron group specifically includes a trimethylboron group, a triethylboron group, a t-butyldimethylboron group, a triphenylboron group, a phenylboron group, and the like, but is not limited thereto.

In the present specification, examples of a halogen group include fluorine, chlorine, bromine, or iodine.

In the present specification, the alkyl group may be a straight chain or a branched chain, and the number of carbon atoms thereof is not particularly limited, but is preferably 1 to 40. According to one embodiment, the alkyl group has 1 to 20 carbon atoms. According to another embodiment, the alkyl group has 1 to 10 carbon atoms. According to still another embodiment, the alkyl group has 1 to 6 carbon atoms. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methyl-hexyl, and the like, but are not limited thereto.

In the present specification, the alkenyl group may be a straight chain or a branched chain, and the number of carbon atoms thereof is not particularly limited, but is preferably 2 to 40. According to one embodiment, the alkenyl group has 2 to 20 carbon atoms. According to another embodiment, the alkenyl group has 2 to 10 carbon atoms. According to still another embodiment, the alkenyl group has 2 to 6 carbon atoms. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenyl-vinyl-1-yl, 2-phenyl-2-(naphthyl-1-yl)vinyl-1-yl, 2,2-bis(di-phenyl-1-yl)vinyl-1-yl, a stilbenyl group, a styrenyl group, and the like, but are not limited thereto.

In the present specification, the cycloalkyl group is not particularly limited, but the number of carbon atoms thereof is preferably 3 to 60. According to one embodiment, the cycloalkyl group has 3 to 30 carbon atoms. According to another embodiment, the cycloalkyl group has 3 to 20 carbon atoms. According to another embodiment, the cycloalkyl group has 3 to 6 carbon atoms. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, the aryl group is not particularly limited, but preferably has 6 to 60 carbon atoms, and may be a monocyclic aryl group or a polycyclic aryl group. According to one embodiment, the aryl group has 6 to 30 carbon atoms. According to one embodiment, the aryl group has 6 to 20 carbon atoms. The aryl group may be a phenyl group, a biphenyl group, a terphenyl group or the like as the monocyclic aryl group, but is not limited thereto. Examples of the polycyclic aryl group include a naphthyl group, an anthracenyl group, a phenanthryl group, a pyrenyl group, a perylenyl group, a chrycenyl group, a fluorenyl group or the like, but is not limited thereto.

In the present specification, a fluorenyl group may be substituted, and two substituent groups may be linked with each other to form a spiro structure. In the case where the fluorenyl group is substituted,

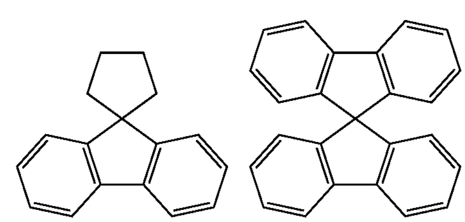

-continued

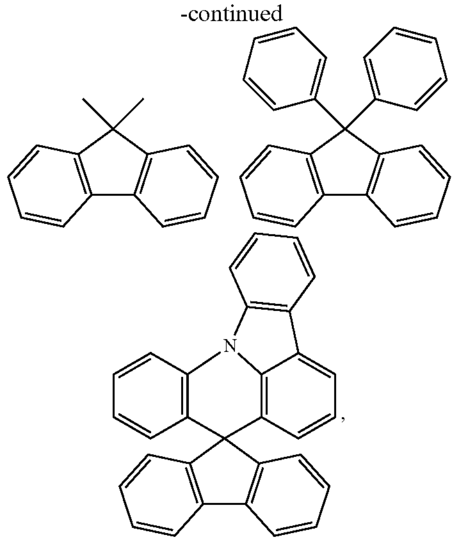

and the like can be formed. However, the structure is not limited thereto.

In the present specification, the heterocyclic group is a heterocyclic group containing at least one of O, N, Si and S as a heteroatom, and the number of carbon atoms thereof is not particularly limited, but is preferably 2 to 60. Examples of the heterocyclic group include a thiophene group, a furan group, a pyrrole group, an imidazole group, a thiazole group, an oxazole group, an oxadiazole group, a triazole group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, an isoxazolyl group, a thiadiazolyl group, a phenothiazinyl group, a dibenzofuranyl group, and the like, but are not limited thereto.

In the present specification, the aryl group in the aralkyl group, the aralkenyl group, the alkylaryl group, and the arylamine group is the same as the aforementioned examples of the aryl group. In the present specification, the alkyl group in the aralkyl group, the alkylaryl group and the alkylamine group is the same as the aforementioned examples of the alkyl group. In the present specification, the heteroaryl in the heteroarylamine can be applied to the aforementioned description of the heterocyclic group. In the present specification, the alkenyl group in the aralkenyl group is the same as the aforementioned examples of the alkenyl group. In the present specification, the aforementioned description of the aryl group may be applied except that the arylene is a divalent group. In the present specification, the aforementioned description of the heterocyclic group can be applied except that the heteroarylene is a divalent group. In the present specification, the aforementioned description of the aryl group or cycloalkyl group can be applied except that the hydrocarbon ring is not a monovalent group but formed by combining two substituent groups. In the present specification, the aforementioned description of the heterocyclic group can be applied, except that the heterocycle is not a monovalent group but formed by combining two substituent groups.

Hereinafter, the present invention will be described in detail for each configuration.

Anode and Cathode

The anode and cathode used in the present invention mean electrodes used in an organic light emitting device.

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or $SNO_2$:Sb; conductive polymers such as poly(3-methylthiophene), poly[3,4-(ethylene-1,2-dioxy)thiophene](PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al, and the like, but are not limited thereto.

Hole Injection Layer

The organic light emitting device according to the present invention may further include a hole injection layer between the anode and the hole transport layer.

The hole injection layer is a layer injecting holes from an electrode, and the hole injection material is preferably a compound which has an ability of transporting the holes, a hole injection effect in the anode and an excellent hole injection effect to the light emitting layer or the light emitting material, prevents movement of an exciton generated in the light emitting layer to the electron injection layer or the electron injection material, and has an excellent thin film forming ability. It is preferable that a HOMO (highest occupied molecular orbital) of the hole injection material is between the work function of the anode material and a HOMO of a peripheral organic material layer.

Specific examples of the hole injection material include metal porphyrine, oligothiophene, an arylamine-based organic material, a hexanitrilehexaazatriphenylene-based organic material, a quinacridone-based organic material, a perylene-based organic material, anthraquinone, polyaniline and polythiophene-based conductive polymer, and the like, but are not limited thereto.

Hole Transport Layer

The hole transport layer used in the present invention is a layer that receives holes from an anode or a hole injection layer formed on the anode and transports the holes to the light emitting layer. The hole transport material is suitably a material having large mobility to the holes, which may receive holes from the anode or the hole injection layer and transfer the holes to the light emitting layer.

Specific examples thereof include an arylamine-based organic material, a conductive polymer, a block copolymer in which a conjugate portion and a non-conjugate portion are present together, and the like, but are not limited thereto.

Light Emitting Layer

The light emitting layer used in the present invention means a layer that can emit light in the visible light region by combining holes and electrons transported from the anode and the cathode, and is preferably a material having good quantum efficiency for fluorescence or phosphorescence.

Generally, the light emitting layer includes a host material and a dopant material. In the present invention, the compound represented by the Chemical Formula 1 is included as a host In the Chemical Formula 1, preferably, L is a bond, phenylene, biphenylene, naphthylene, or anthracenylene.

Preferably, Ar is phenyl, biphenylyl, terphenylyl, naphthyl, phenylnaphthyl, naphthylphenyl, or phenanthrenyl.

Preferably, R and R' are each independently hydrogen, deuterium, phenyl, biphenylyl, or naphthyl.

Representative examples of the compound represented by the Chemical Formula 1 are as follows:

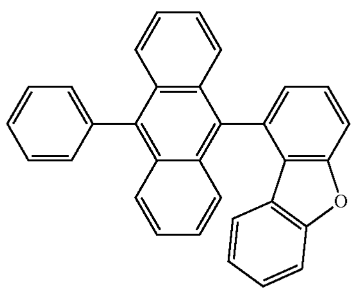

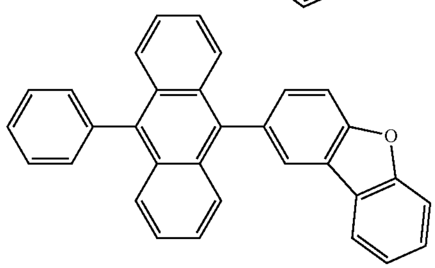

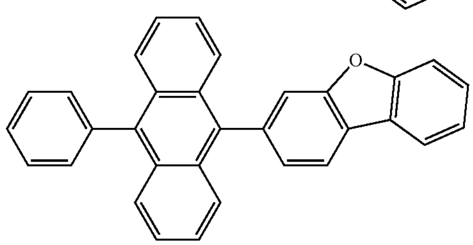

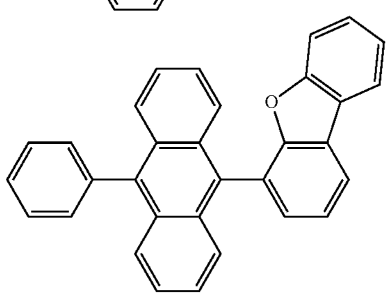

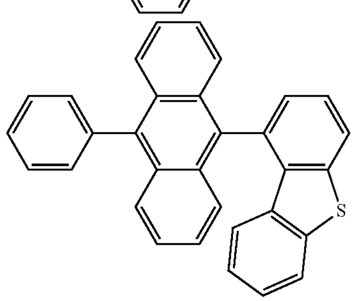

-continued

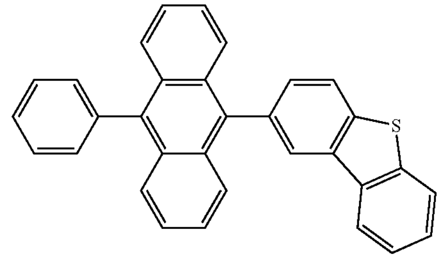

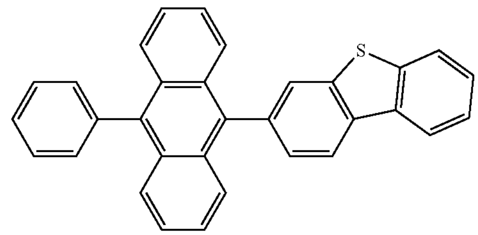

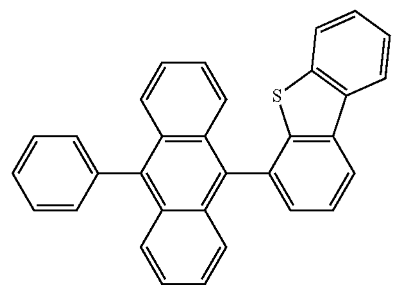

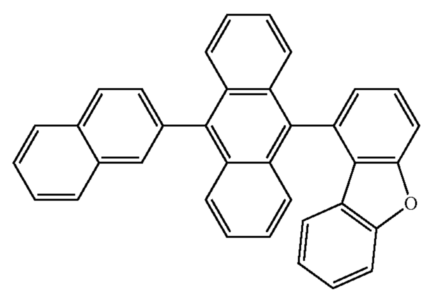

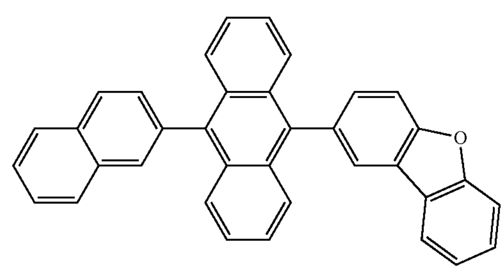

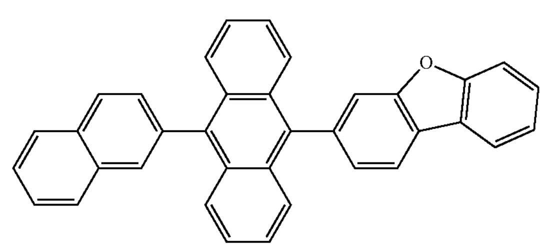

-continued
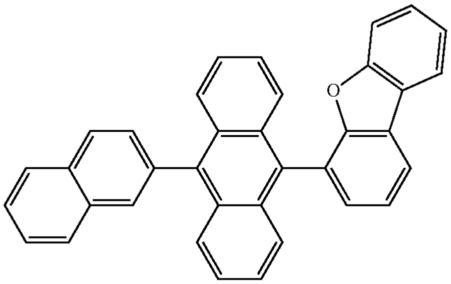
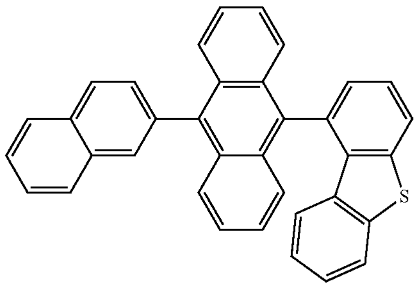
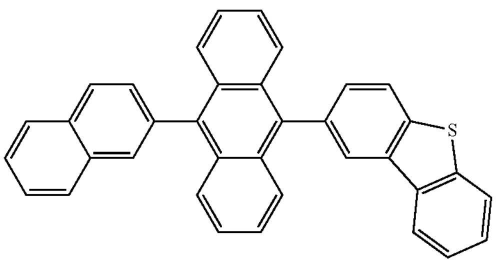
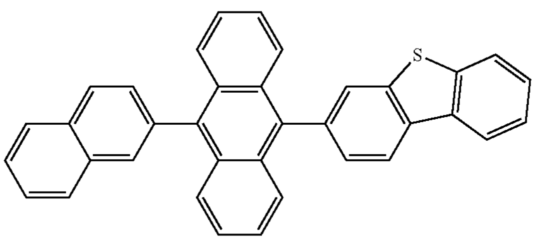
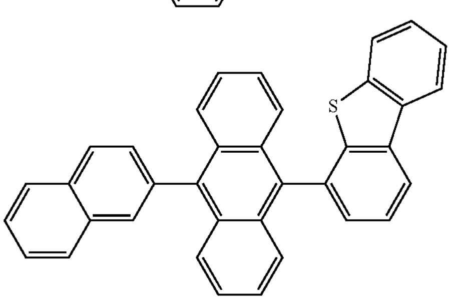
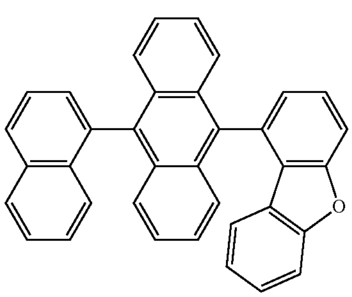
-continued
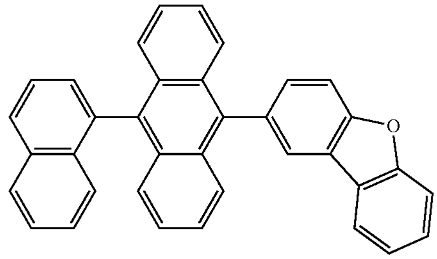
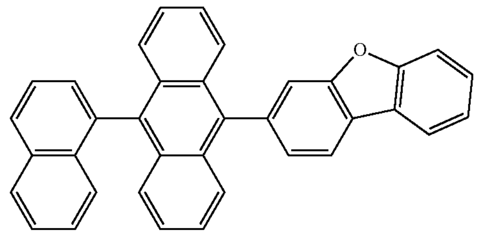
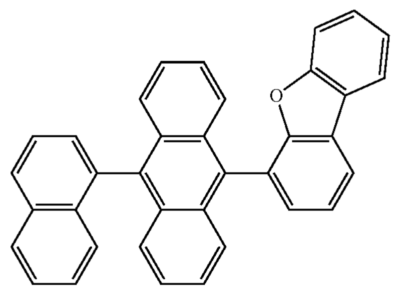
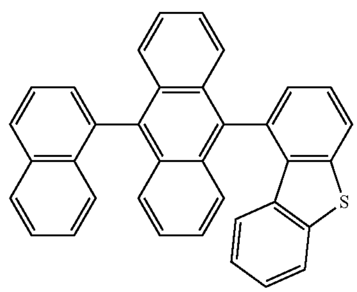
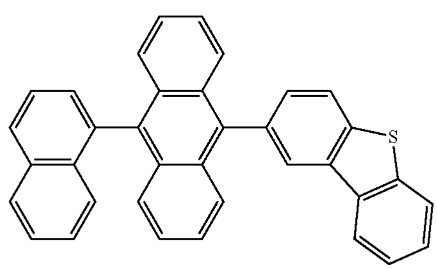
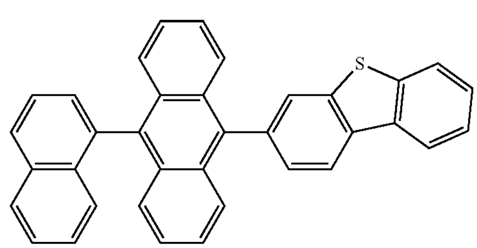

-continued
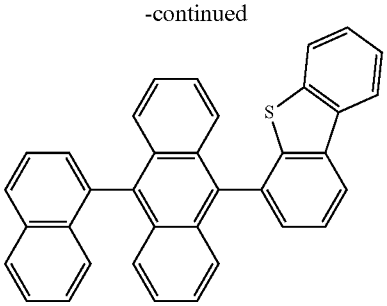
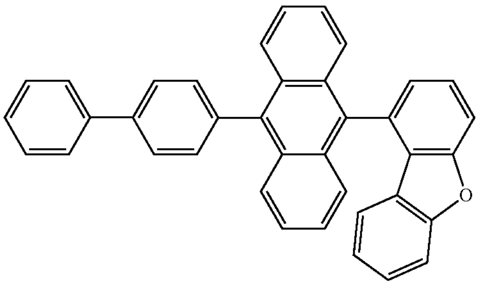
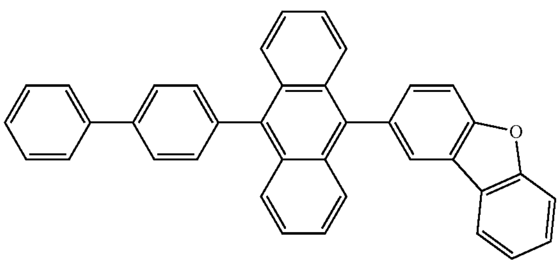
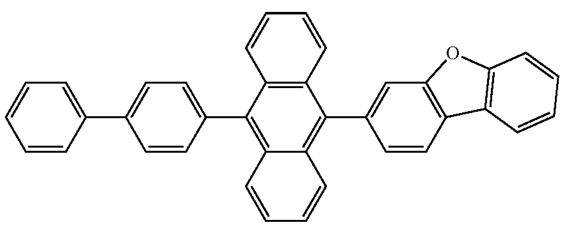
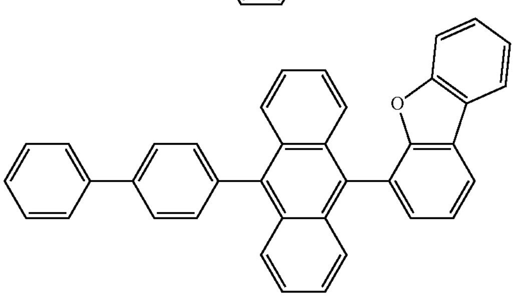
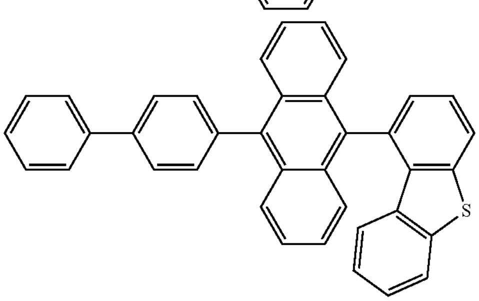
-continued
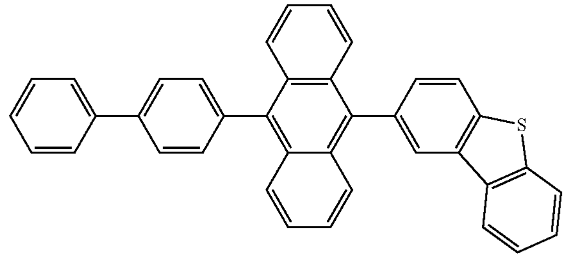
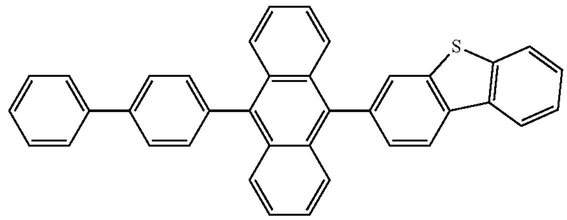
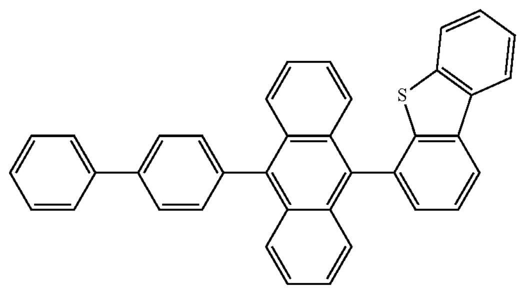
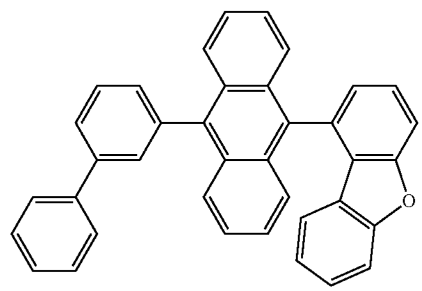
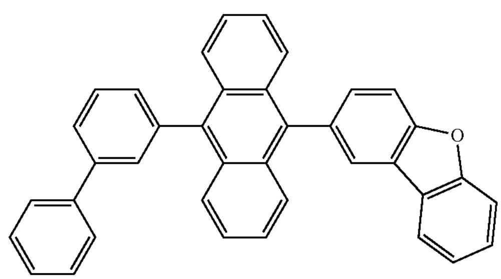
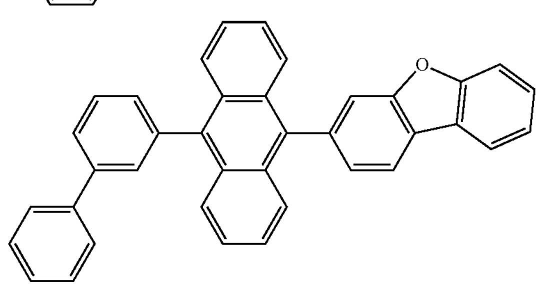

-continued
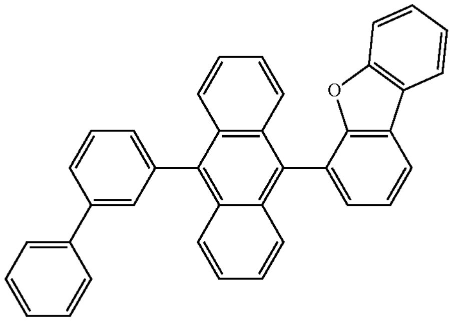
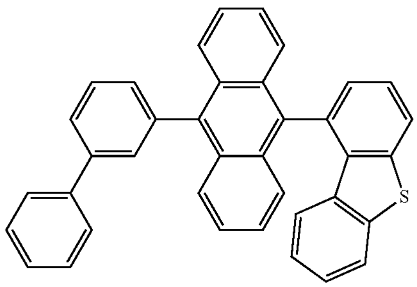
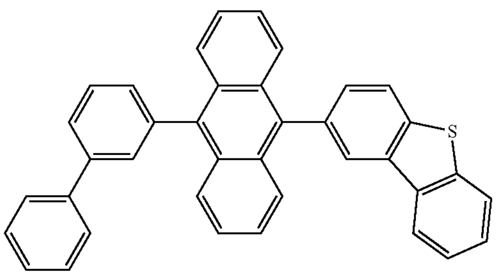
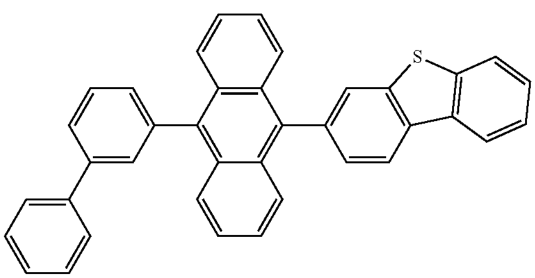
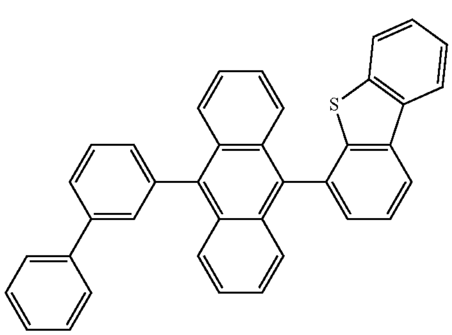
-continued
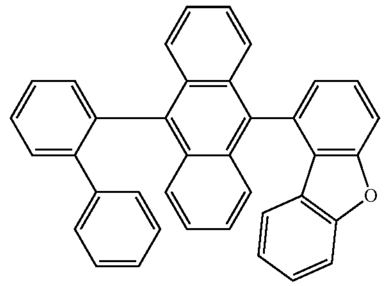
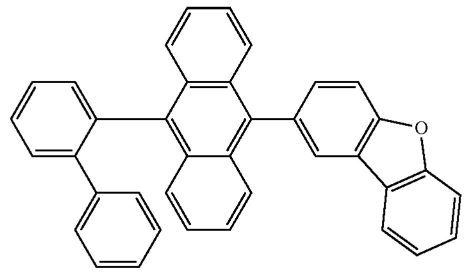
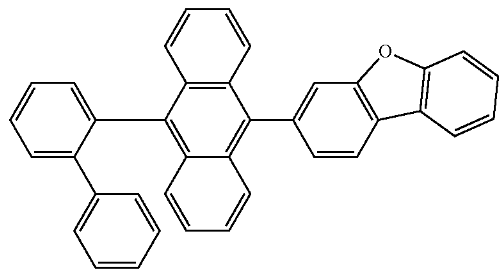
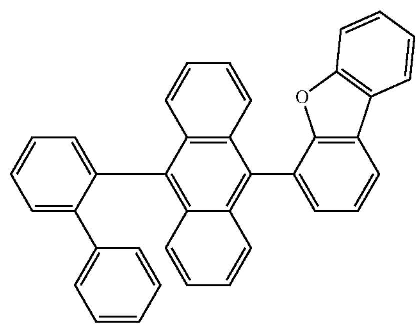
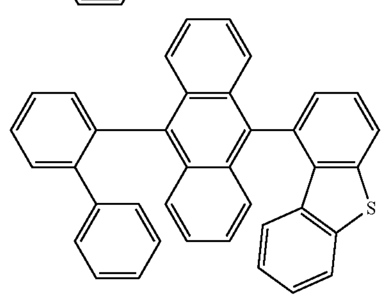
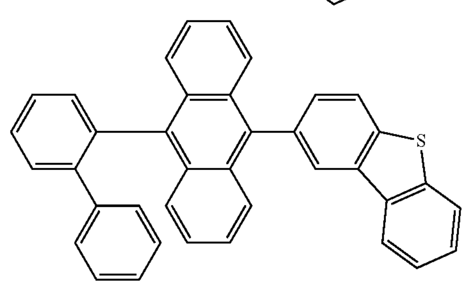

-continued
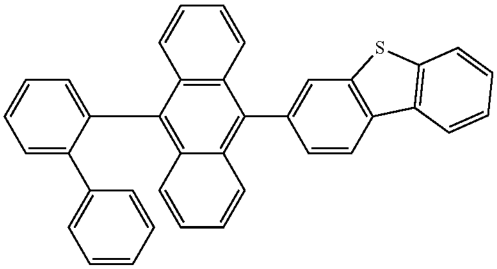
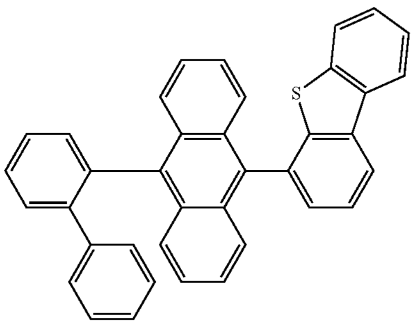
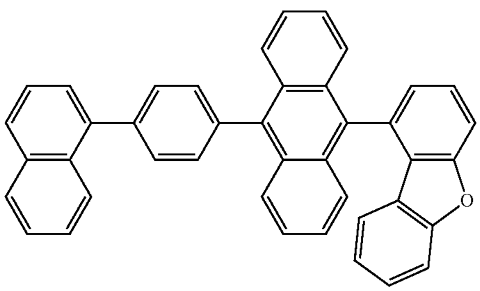
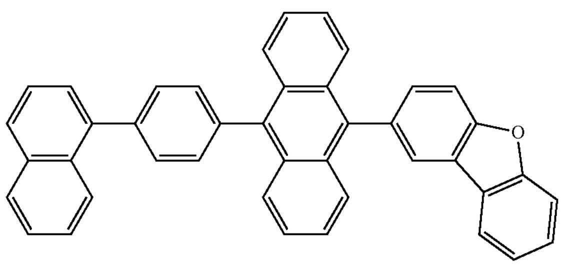
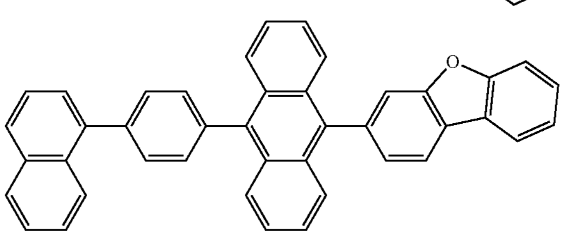
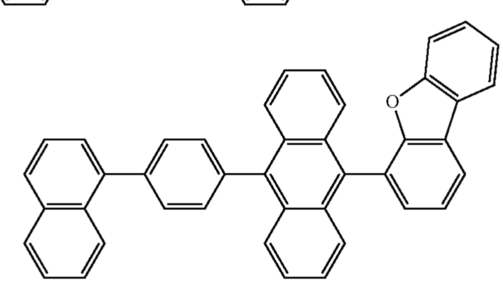
-continued
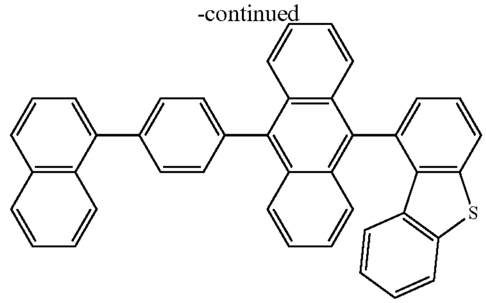
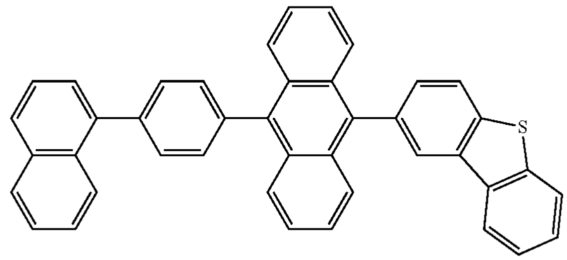
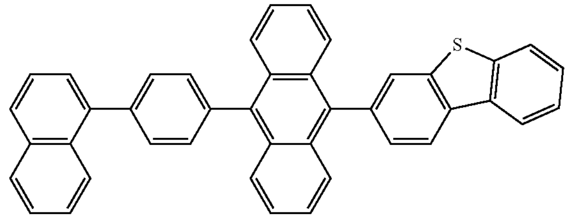
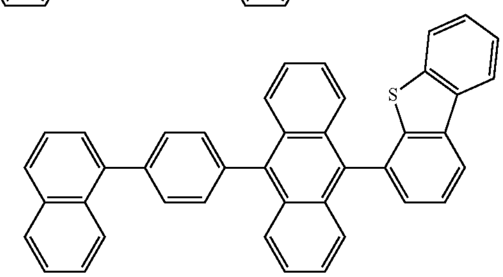
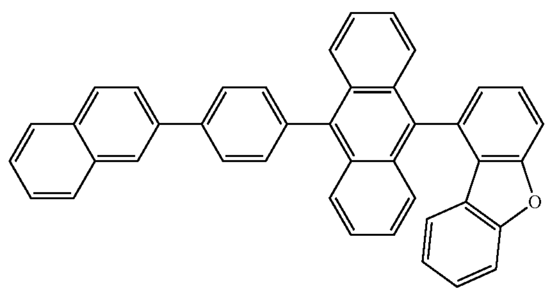
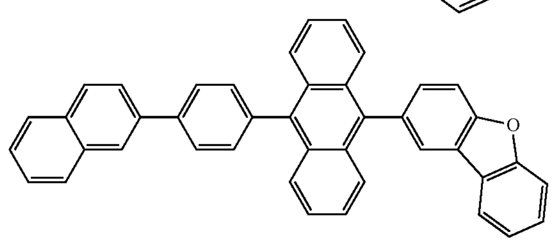
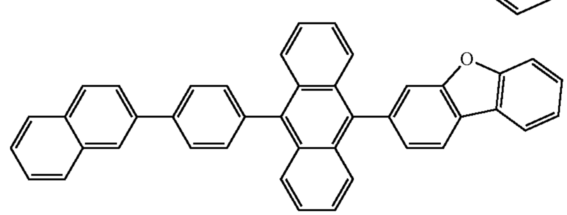

-continued
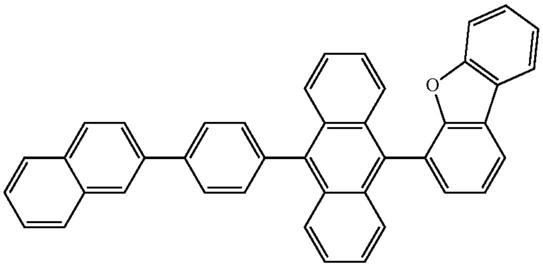
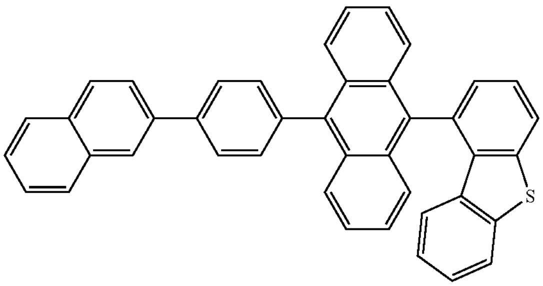
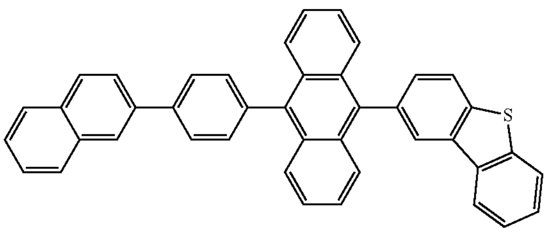
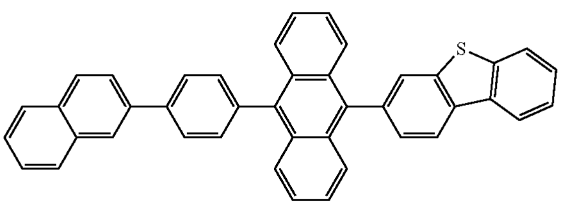
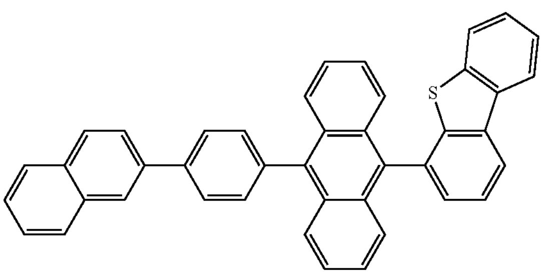
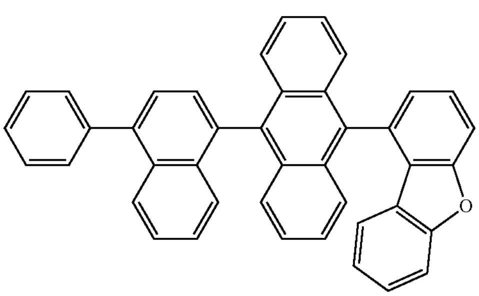
-continued
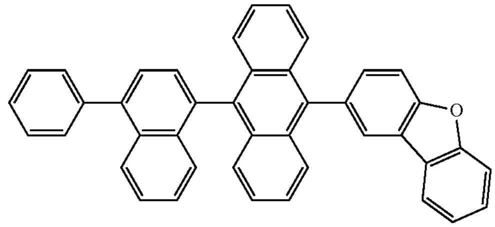
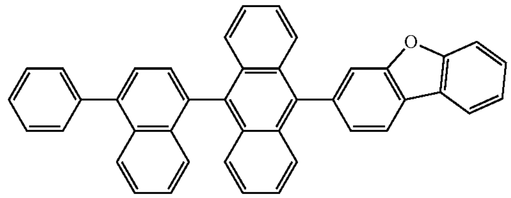
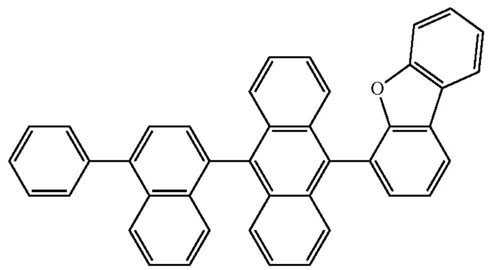
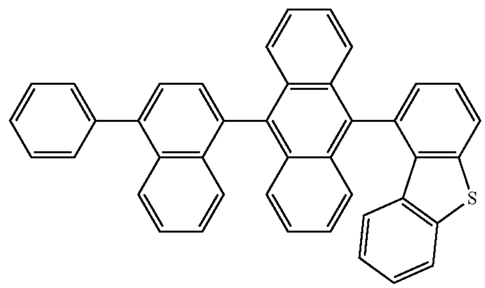
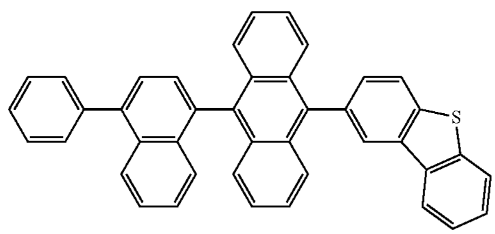
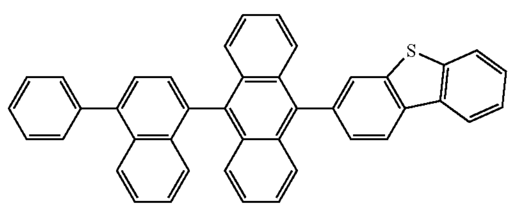
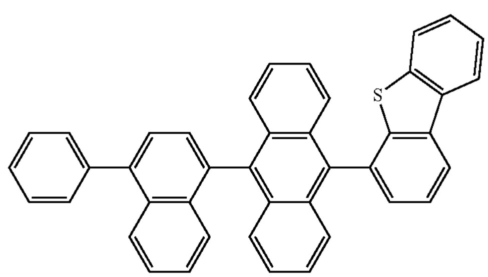

-continued
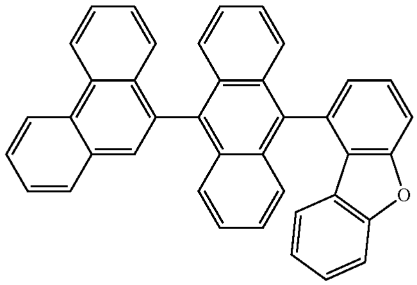
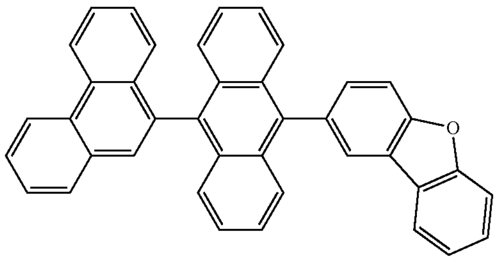
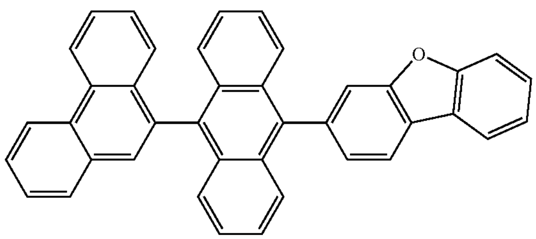
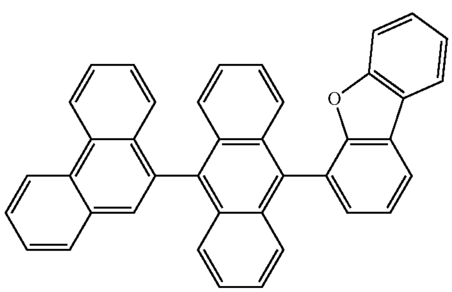
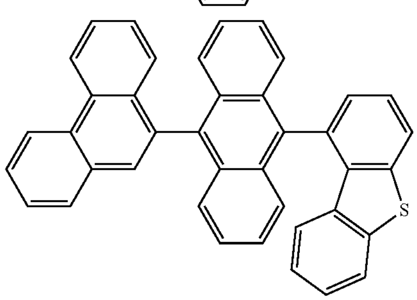
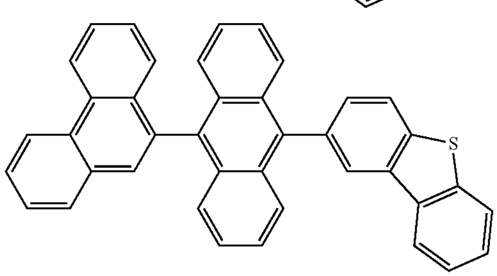
-continued
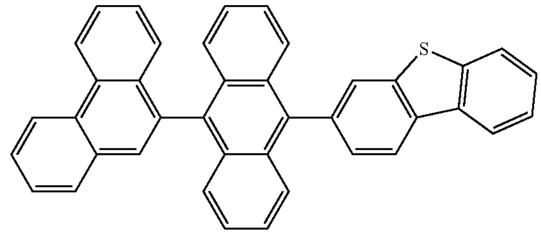
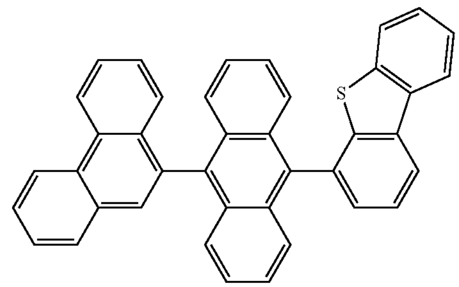
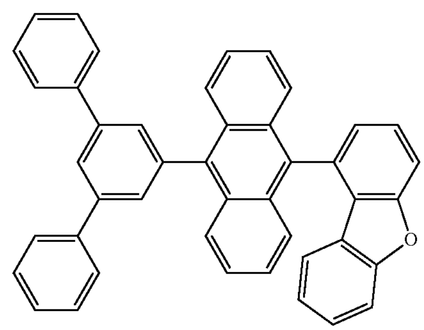
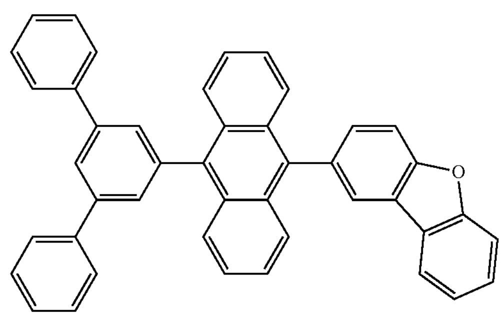
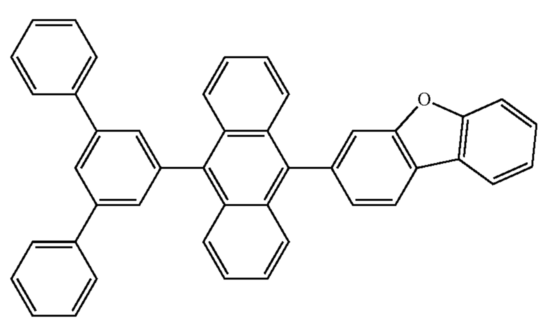

-continued
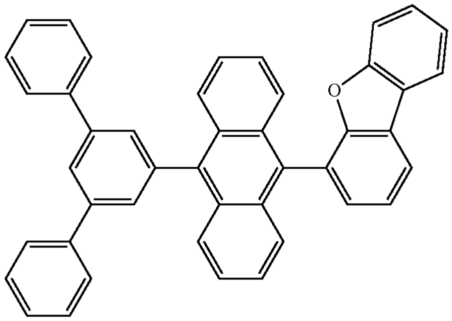
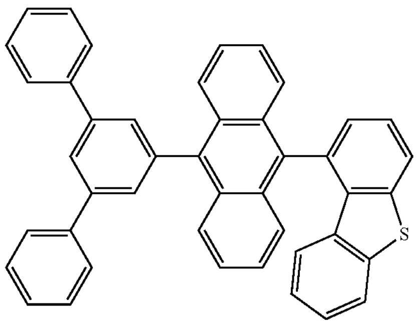
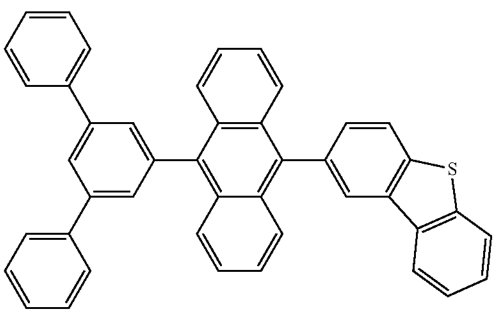
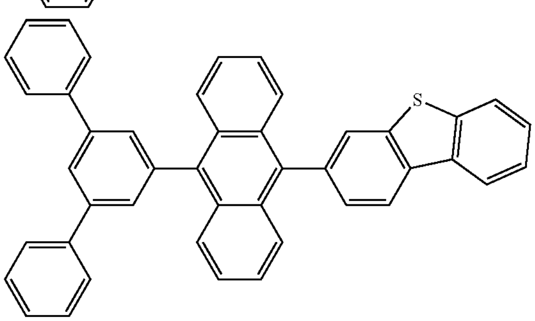
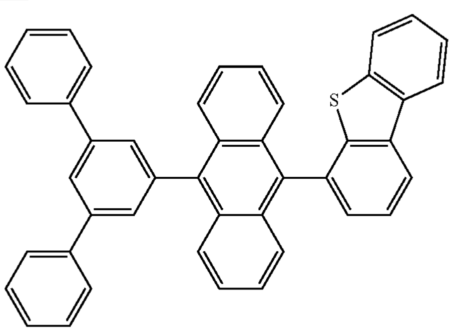
-continued
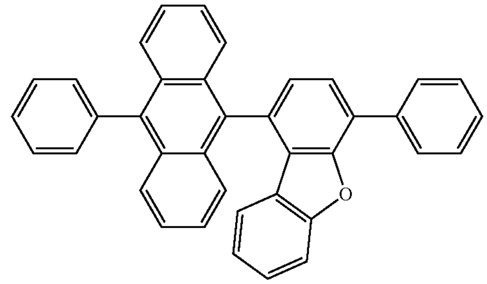
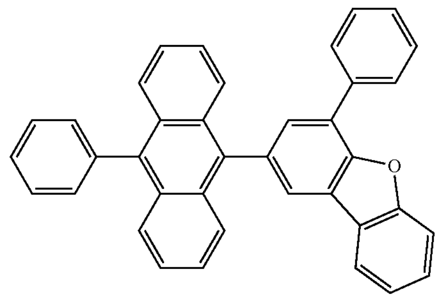
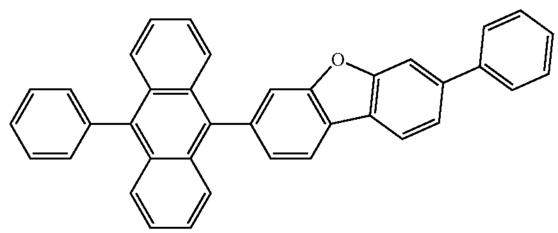
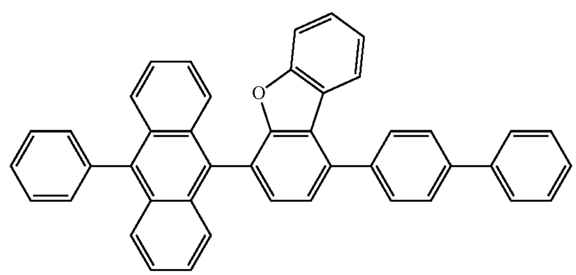
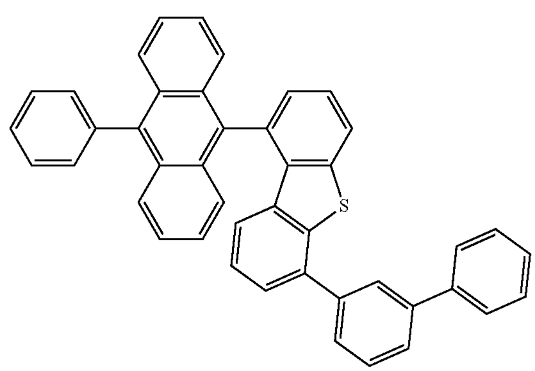

-continued
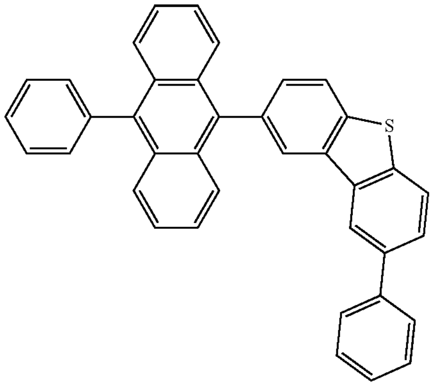
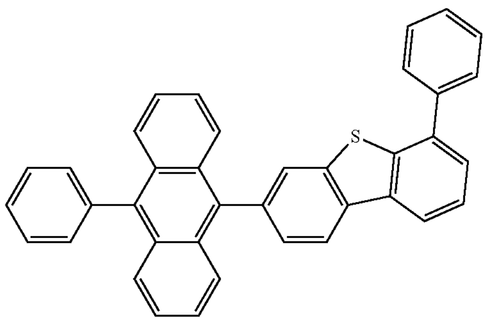
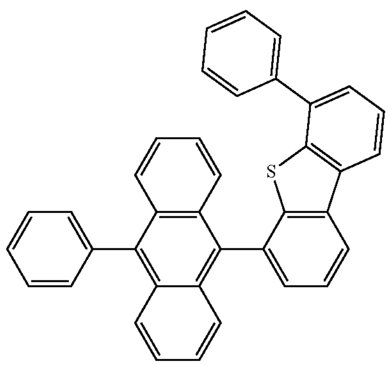
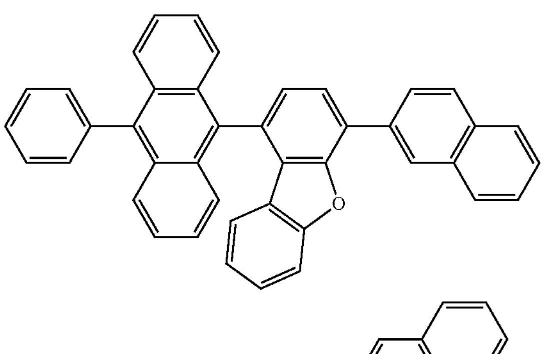
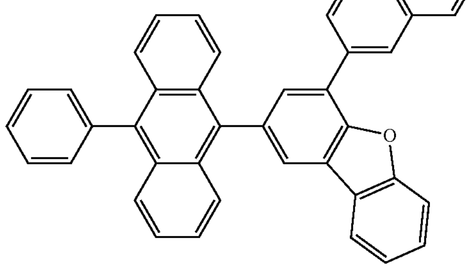
-continued
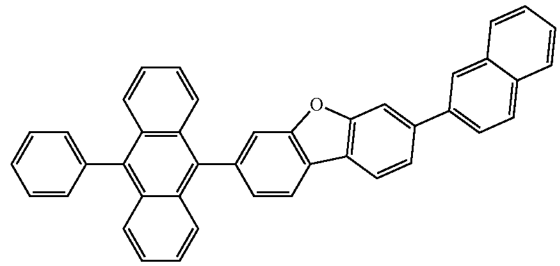
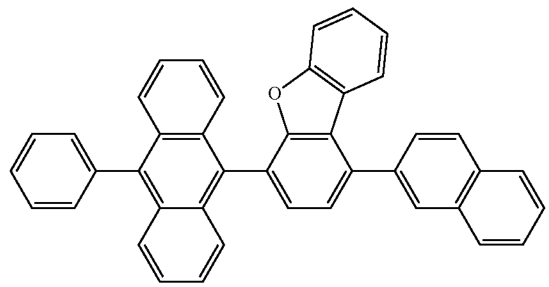
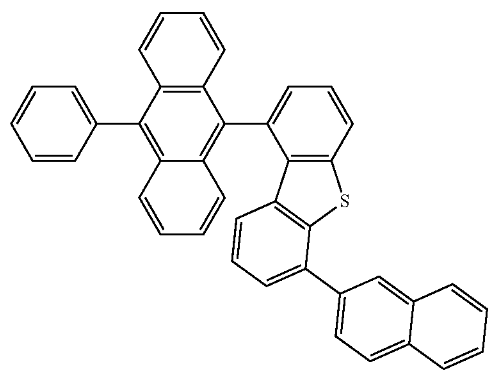
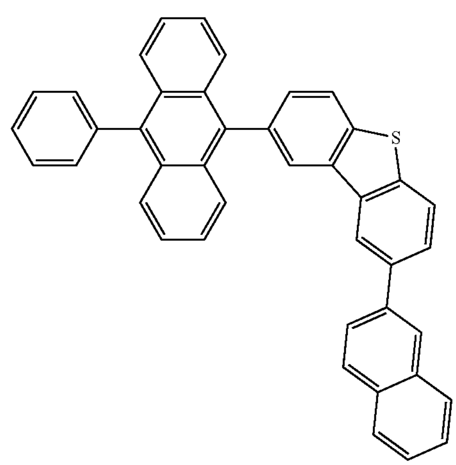

-continued
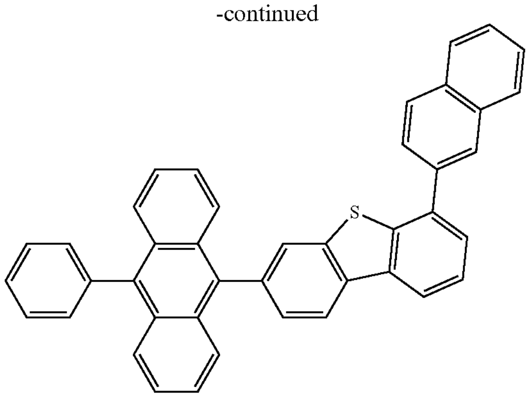
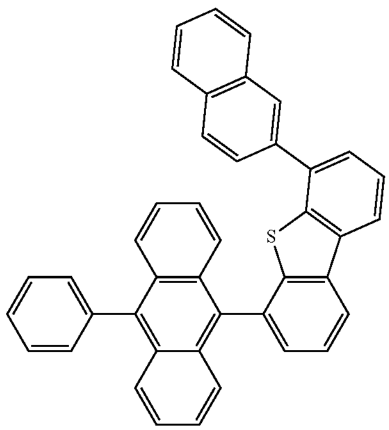
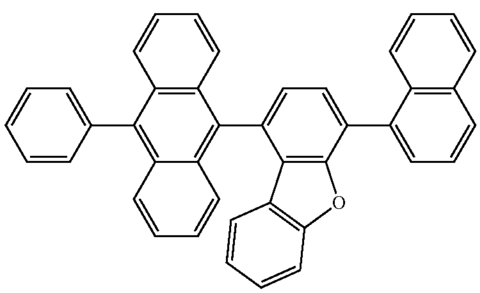
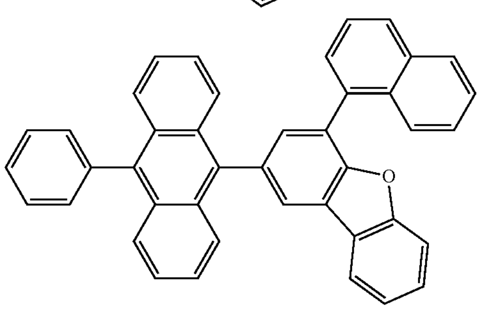
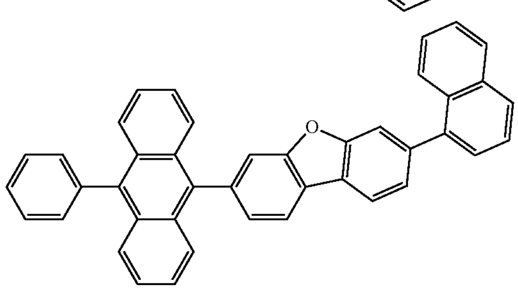
-continued
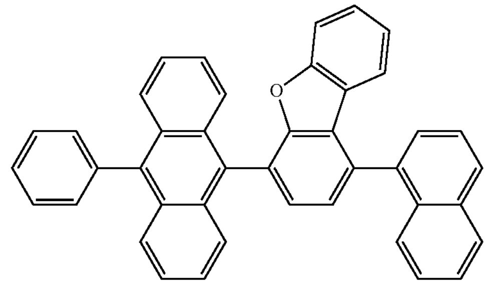
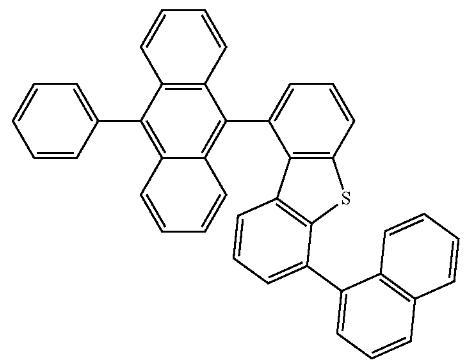
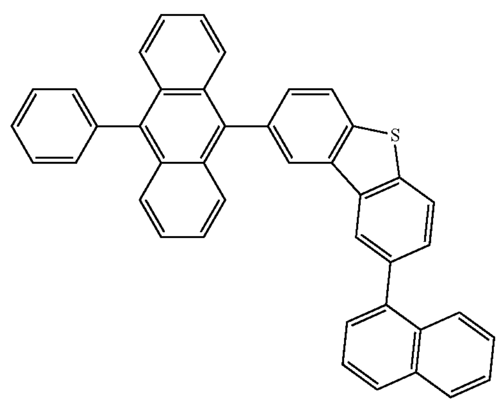
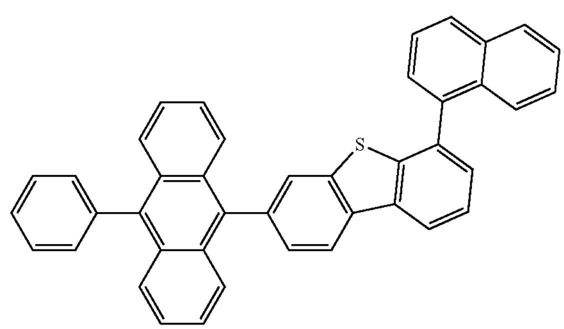

-continued
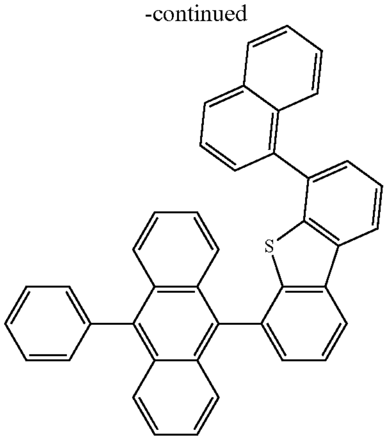
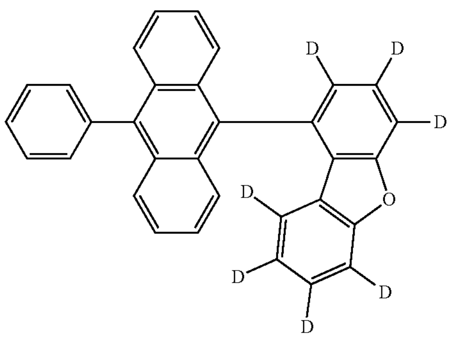
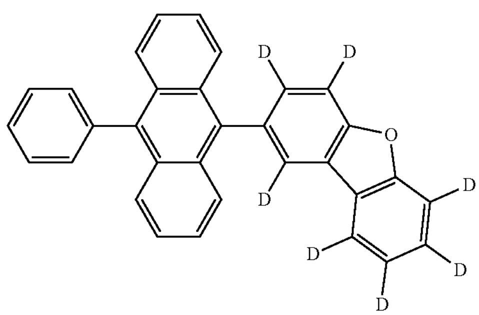
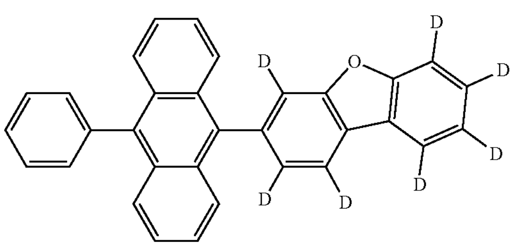
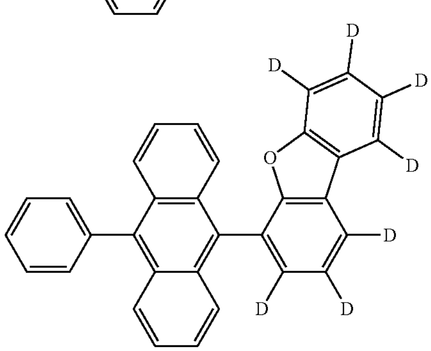
-continued
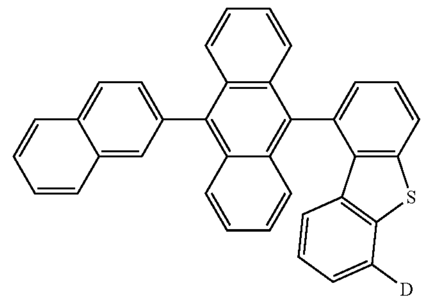
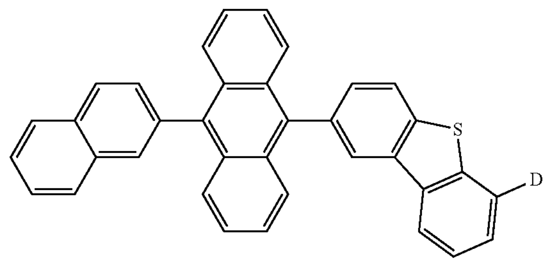
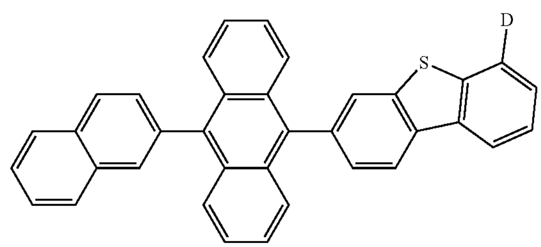
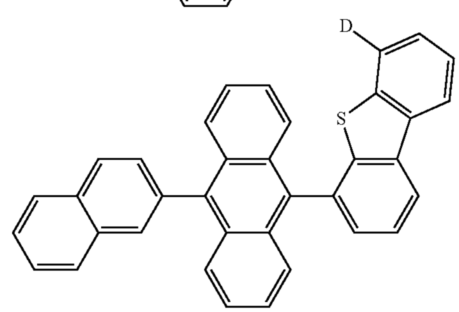
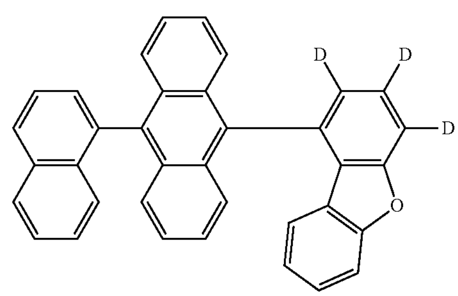
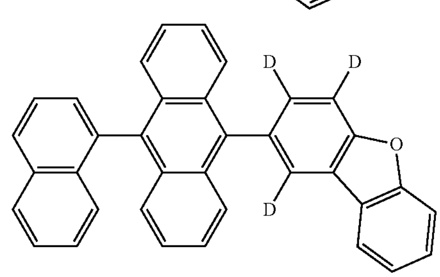

-continued
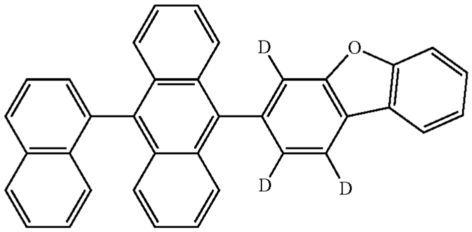
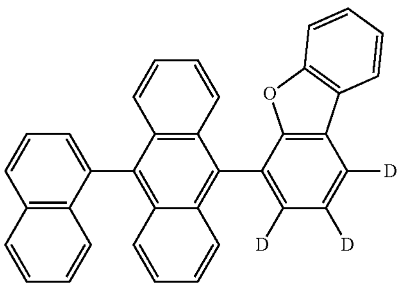
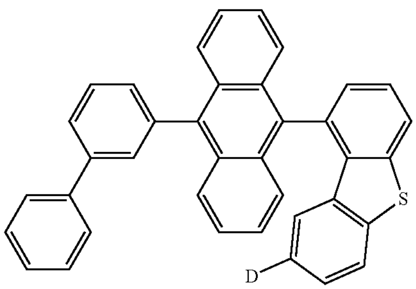
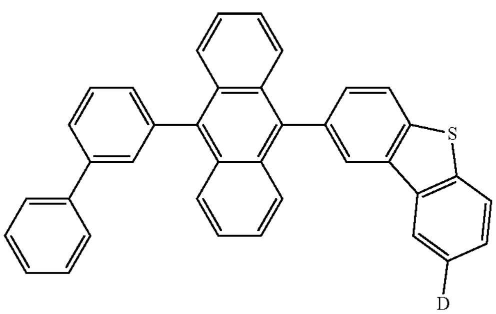
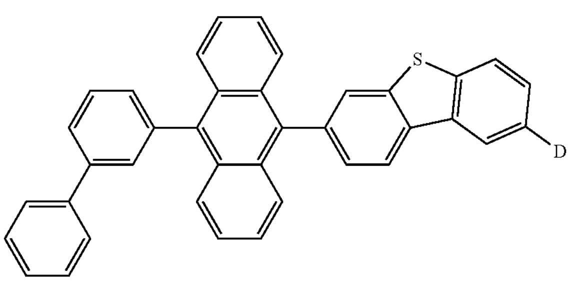
-continued
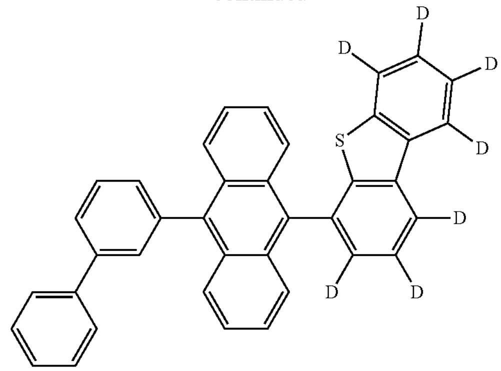
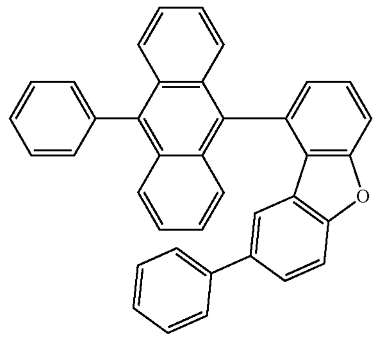
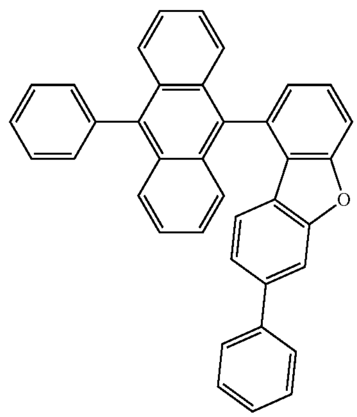
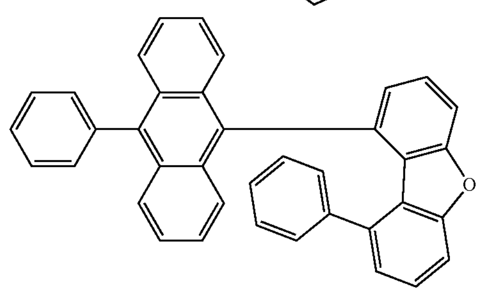
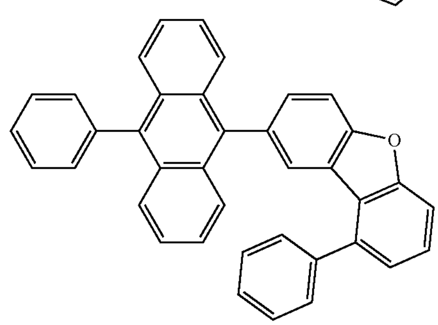

-continued
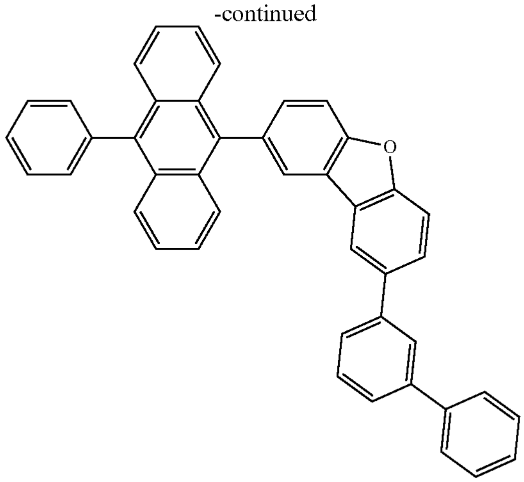
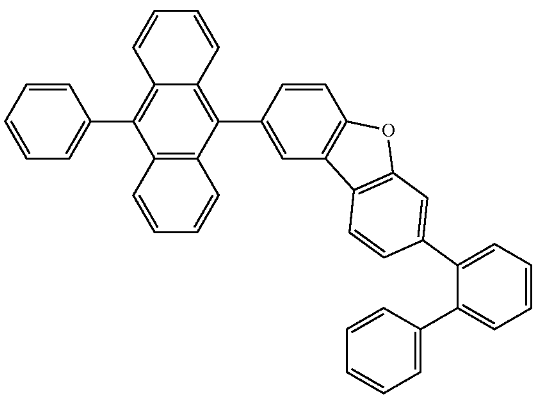
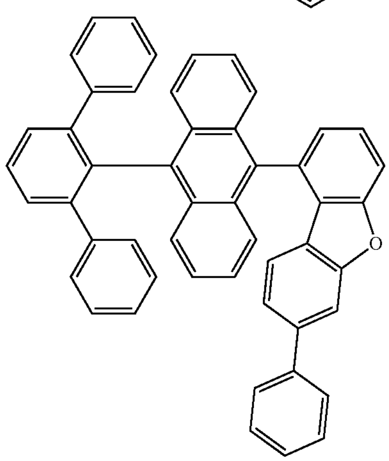
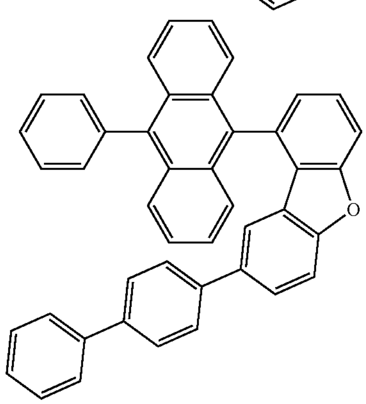
-continued
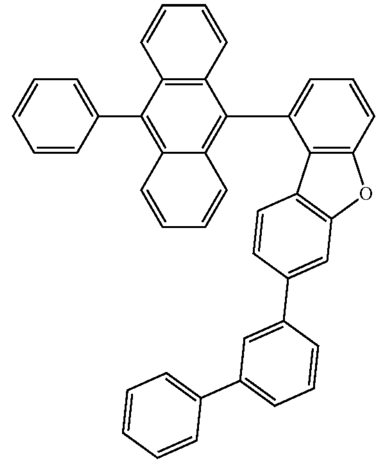
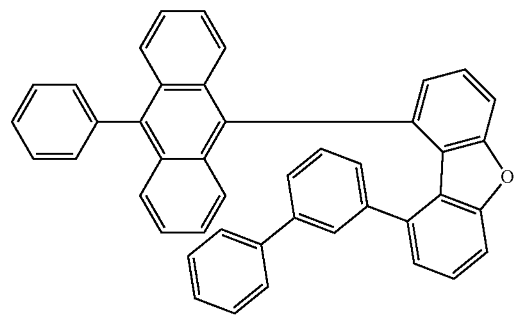
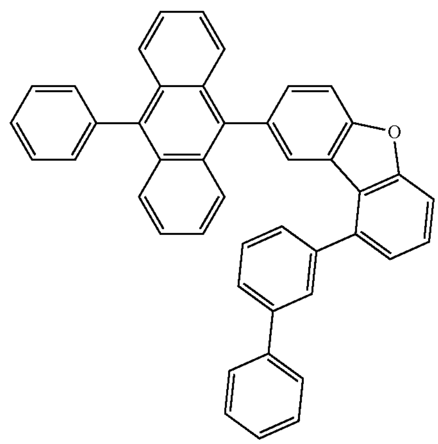
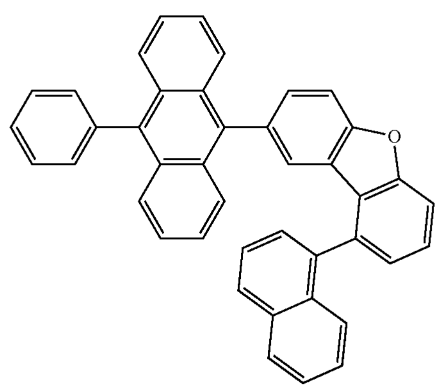

-continued
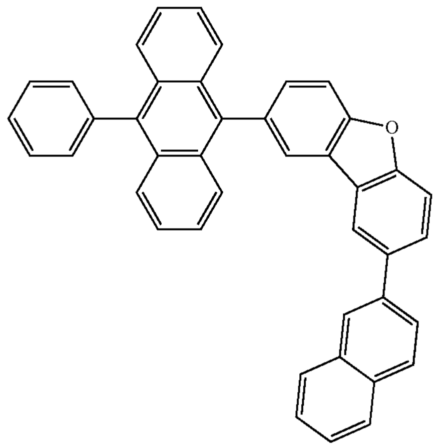
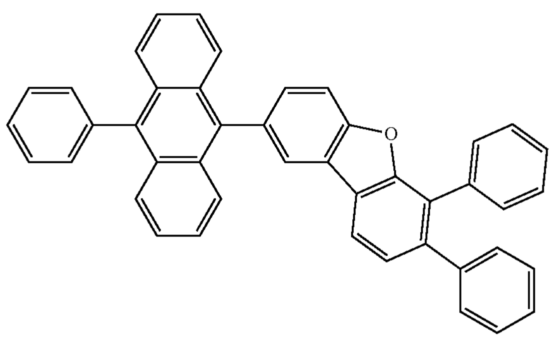
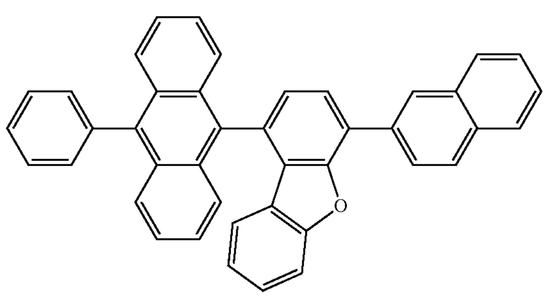
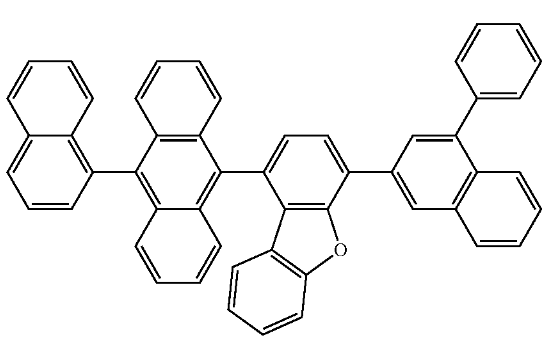
-continued
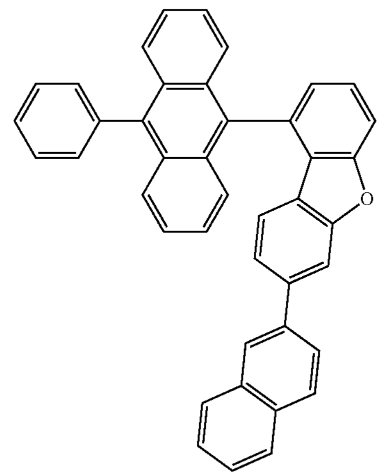
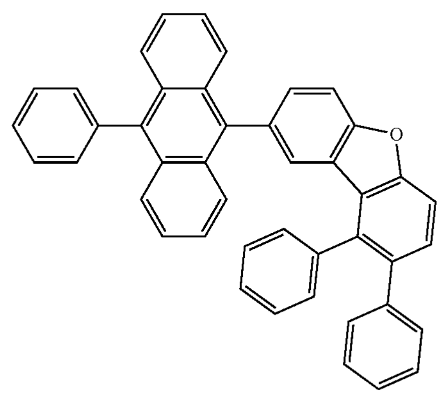
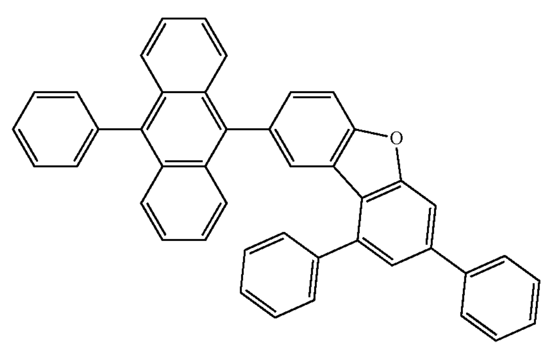
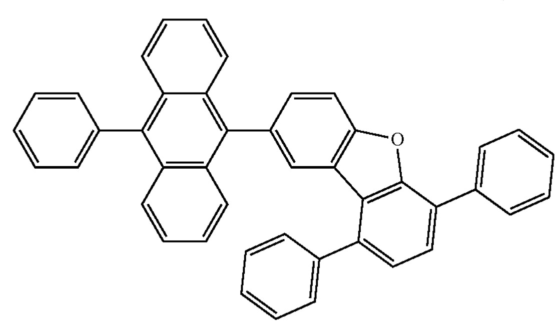

-continued
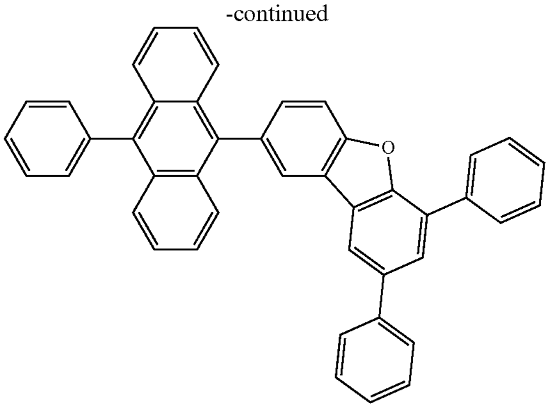
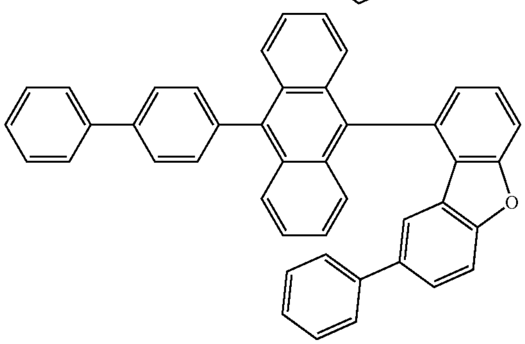
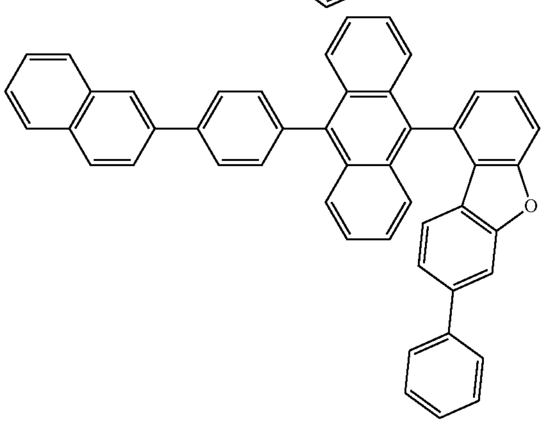
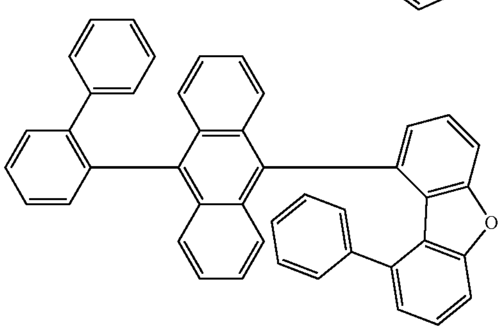
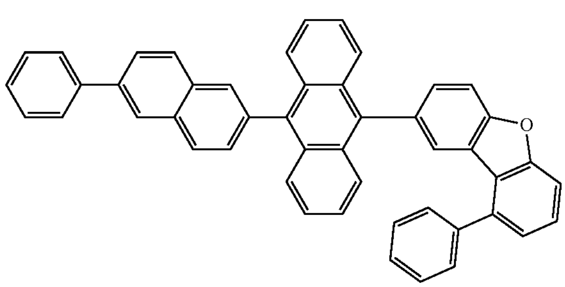
-continued
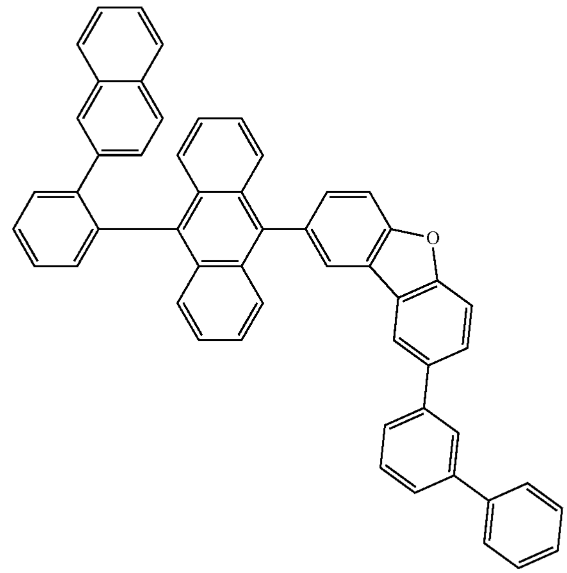
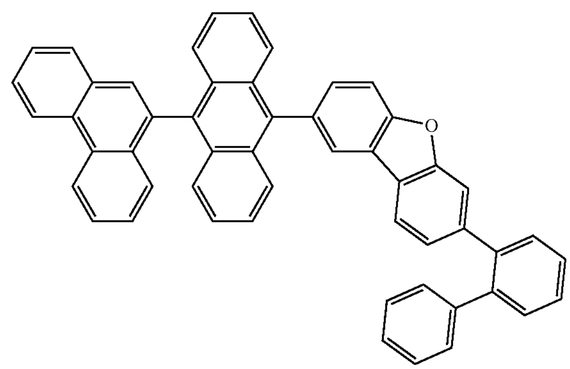
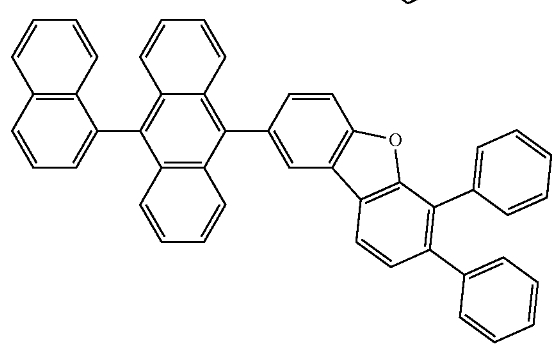
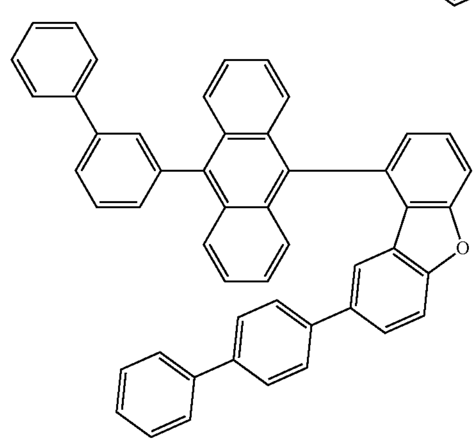

-continued
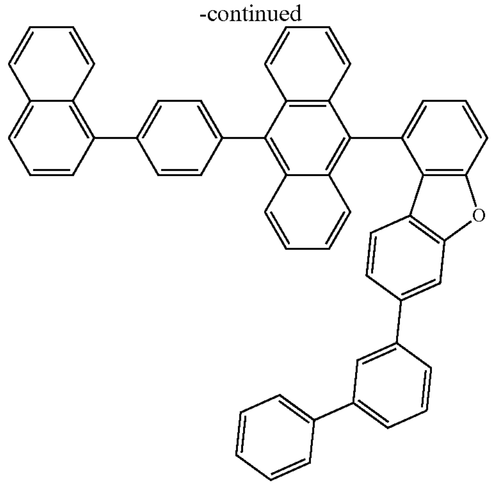
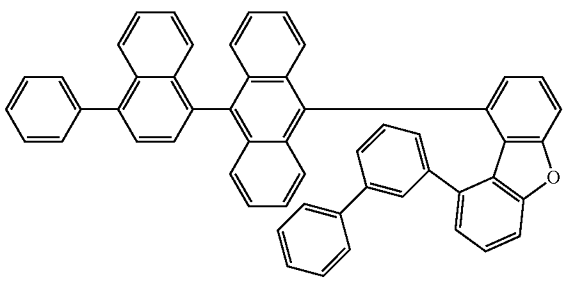
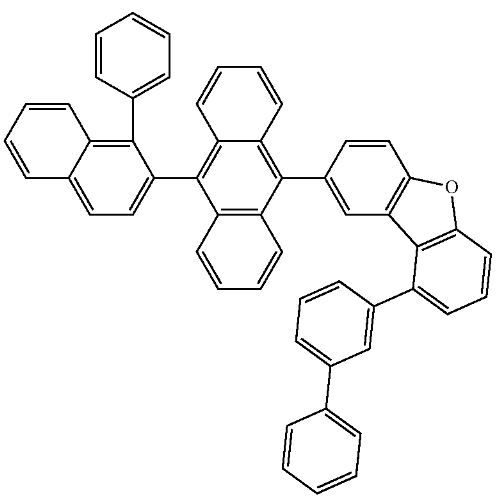
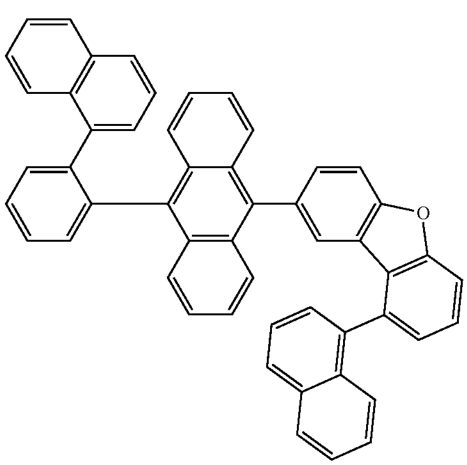
-continued
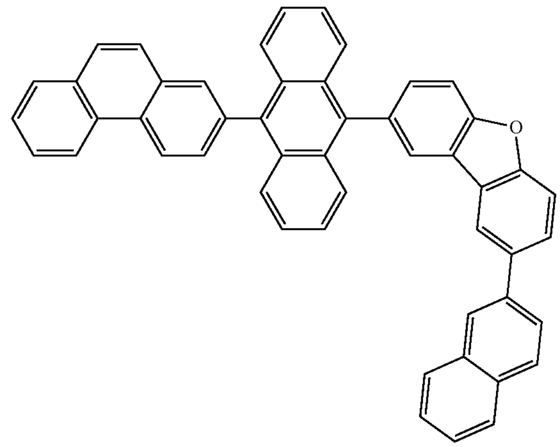
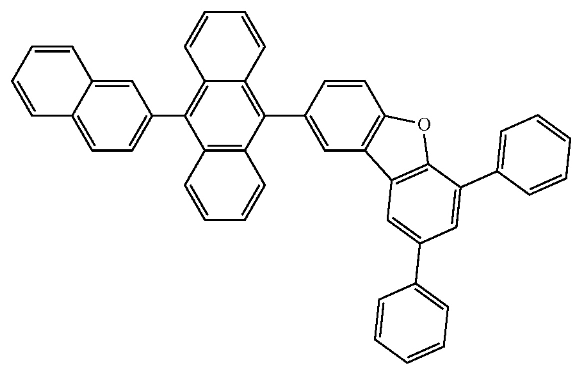
The compound represented by the Chemical Formula 1 can be prepared by a preparation method as the following Reaction Scheme 1.
[Reaction Scheme 1]
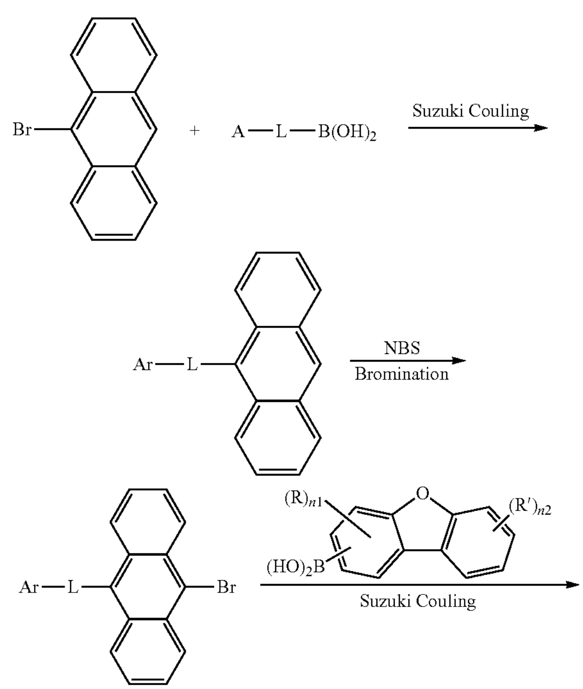

-continued

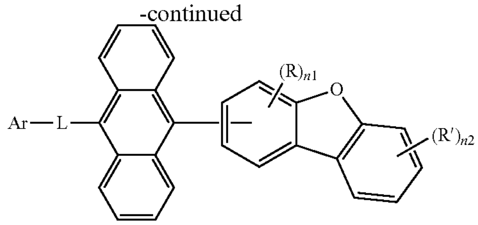

The above reaction is a Suzuki coupling reaction and can be further specified in the preparation examples described later.

The dopant material is not particularly limited as long as it is a material used for the organic light emitting device. Examples of the dopant material include an aromatic amine derivative, a styrylamine compound, a boron complex, a fluoranthene compound, a metal complex, and the like. Specific examples of the aromatic amine derivatives include substituted or unsubstituted fused aromatic ring derivatives having an arylamino group, examples thereof include pyrene, anthracene, chrysene, and periflanthene having the arylamino group, and the like. The styrylamine compound is a compound where at least one arylvinyl group is substituted in substituted or unsubstituted arylamine, in which one or two or more substituent groups selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, and the like, but are not limited thereto. Further, examples of the metal complex include an iridium complex, a platinum complex, and the like, but are not limited thereto.

Electron Transport Region

The electron transport region used in the present invention means a region that receives the electrons from the electron injection layer formed on the cathode and anode and transports the electrons to the light emitting layer, and that suppress the transfer of holes from the light emitting layer.

The electron transport region includes an electron transport layer, or includes an electron transport layer and a hole blocking layer. When the electron transport region includes the electron transport layer and the hole blocking layer, preferably, the light emitting layer and the hole blocking layer are positioned adjacent to each other. Therefore, the electron transport region includes an electron transport layer, and the electron transport layer includes the compound represented by the Chemical Formula 2, or the electron transport region includes an electron transport layer and a hole blocking layer, and the hole blocking layer includes a compound represented by the Chemical Formula 2.

In Chemical Formula 2, preferably, $Ar_1$ and $Ar_2$ are each independently phenyl, biphenylyl, or terphenylyl.

Preferably, $L_1$, $L_2$ and $L_3$ are each independently phenylene, naphthylene, or -(phenylene)-(naphthylene)-.

Preferably, i and j are 0, and k is 0, or 1.

Preferably, A is any one selected from the group consisting of:

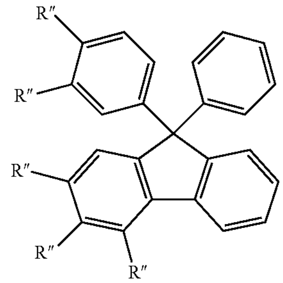

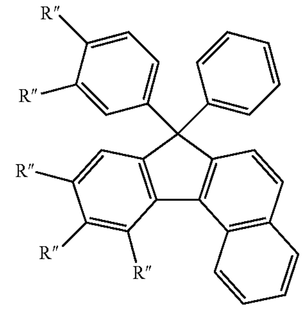

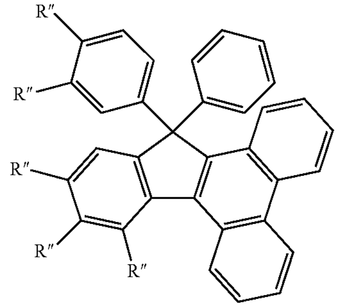

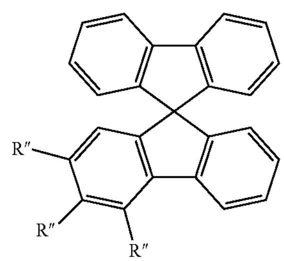

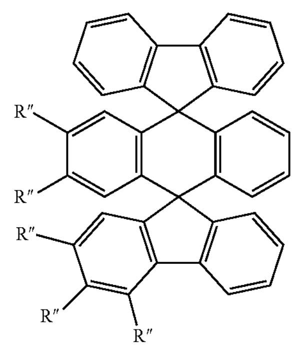

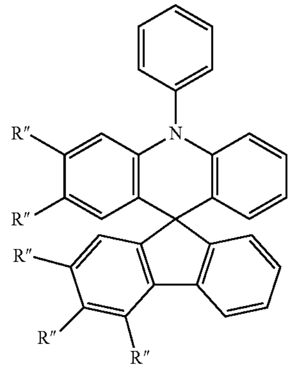

-continued
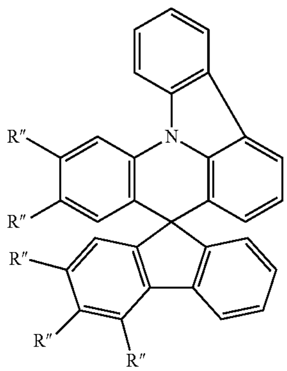
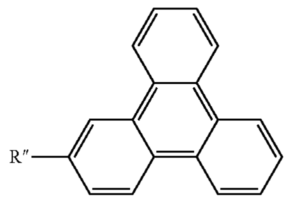
-continued
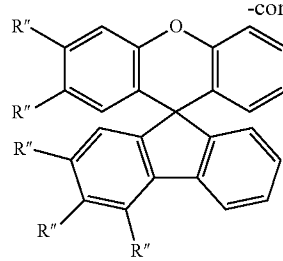
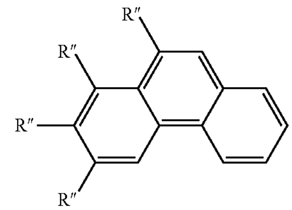
in each of Chemical Formulas,
one of R" is linked to $L_3$, and the rest are hydrogen.
Meanwhile, in Chemical Formula 2, when $R_1$ to $R_{16}$ and R" are linked to $L_3$, and when k is 0, it means that $R_1$ to $R_{16}$ and R" are linked directly to the triazine ring.
Representative examples of the compound represented by the Chemical Formula 2 are as follows:
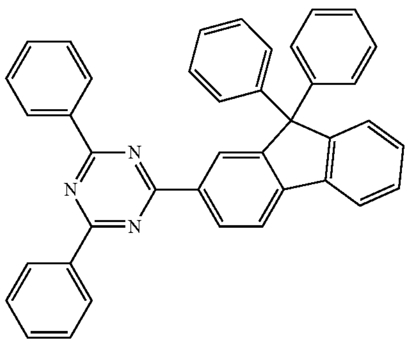
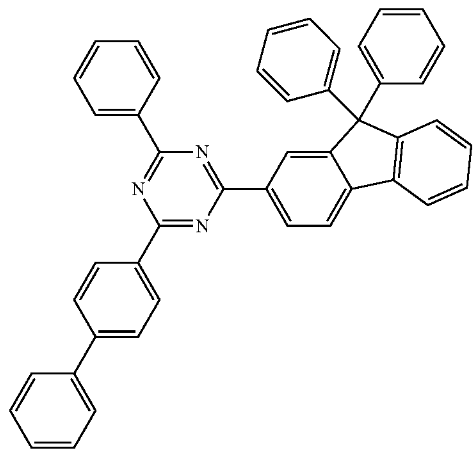
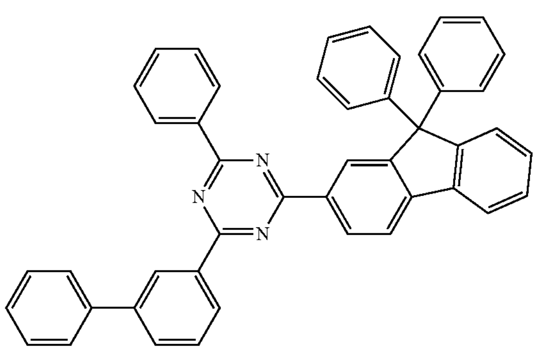
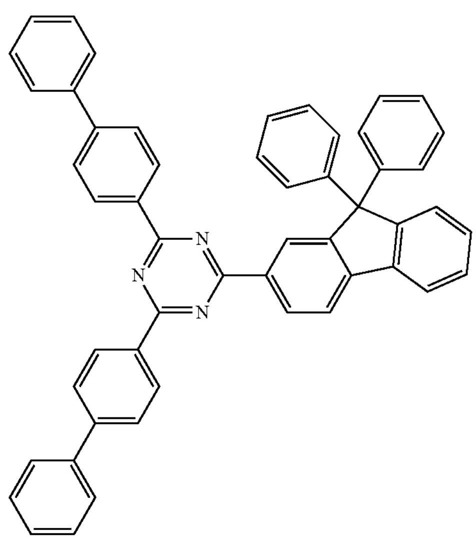

-continued
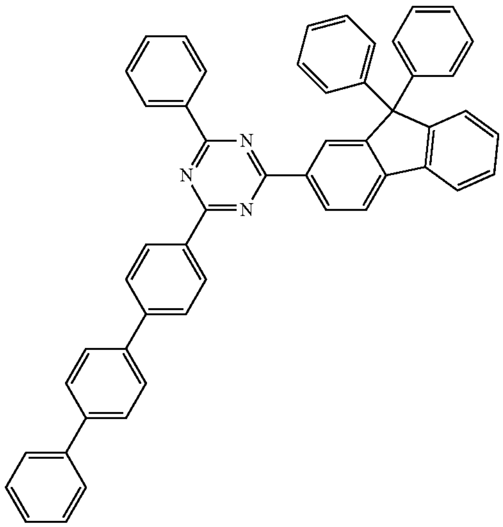
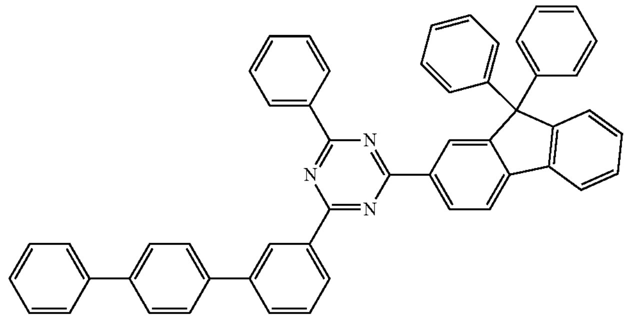
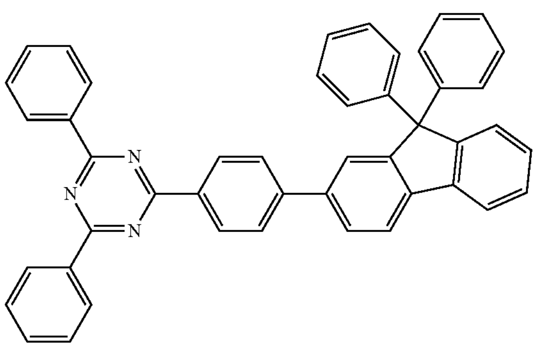
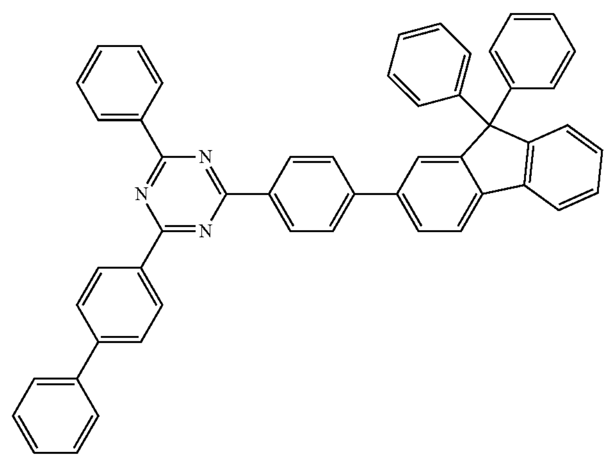
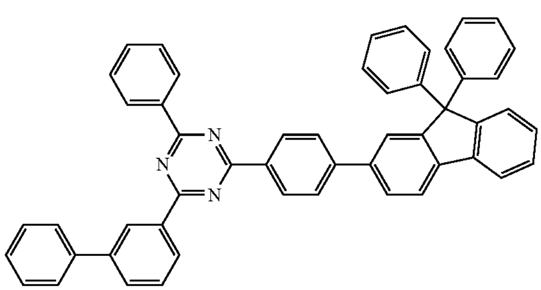
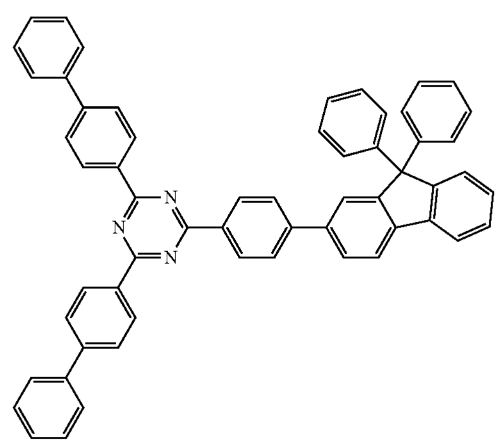

-continued
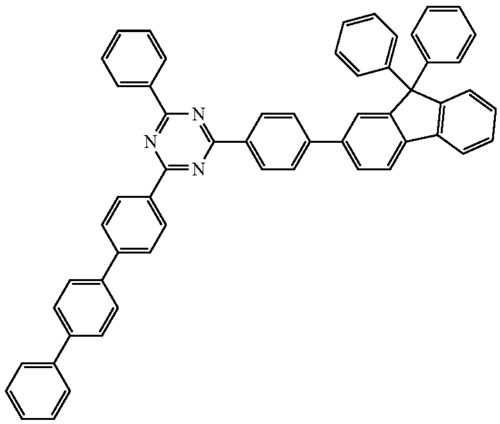
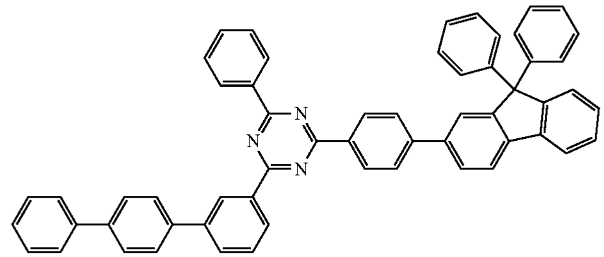
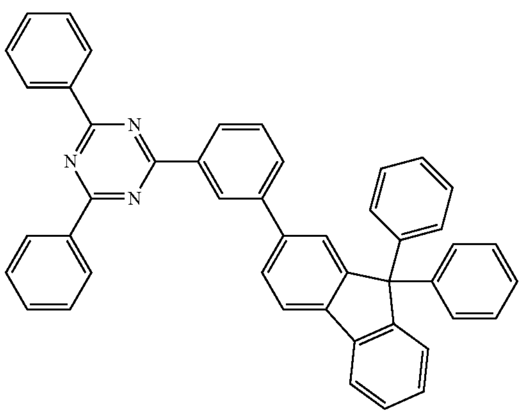
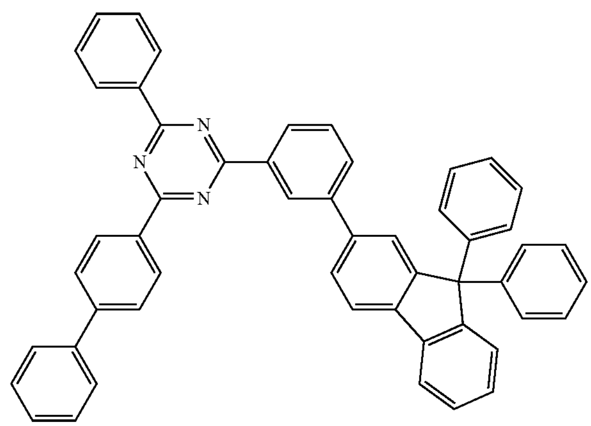
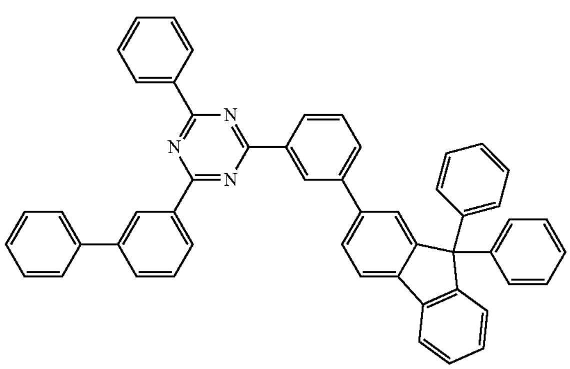
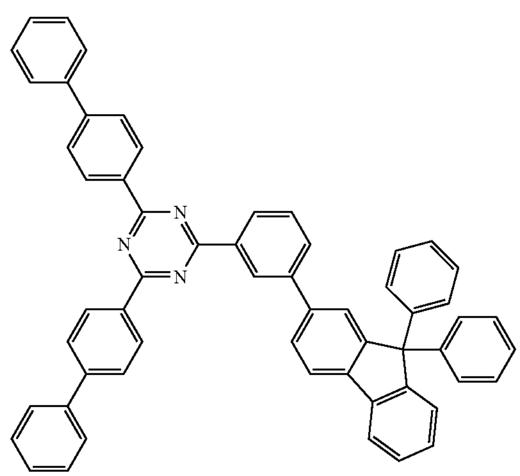

-continued
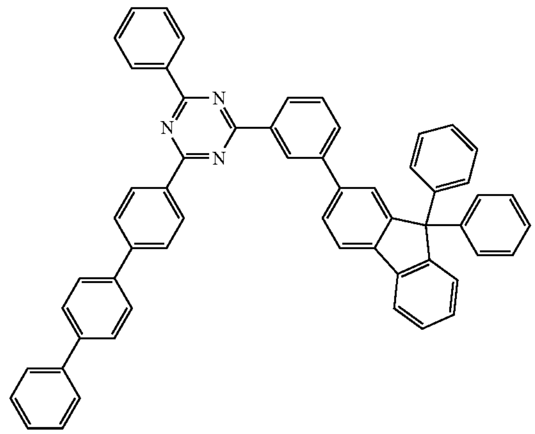
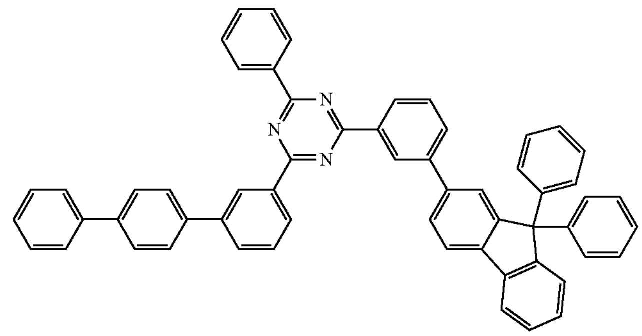
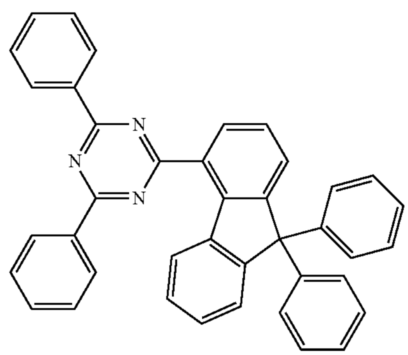
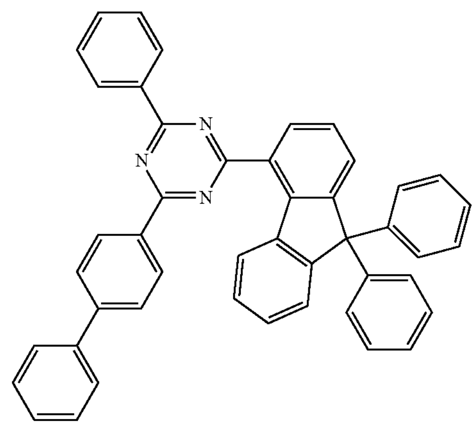
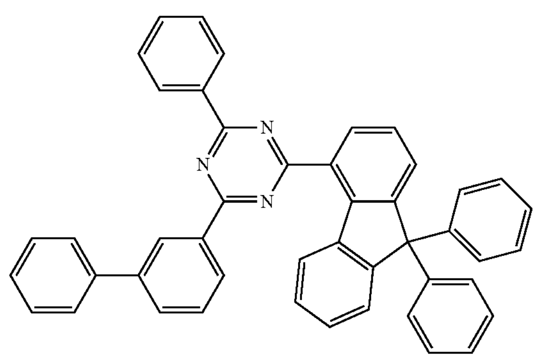
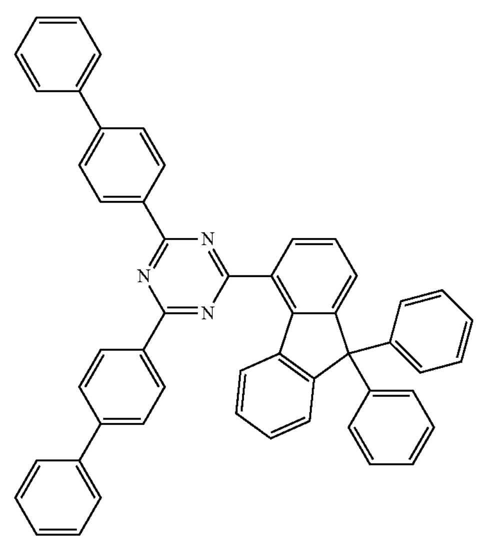

-continued
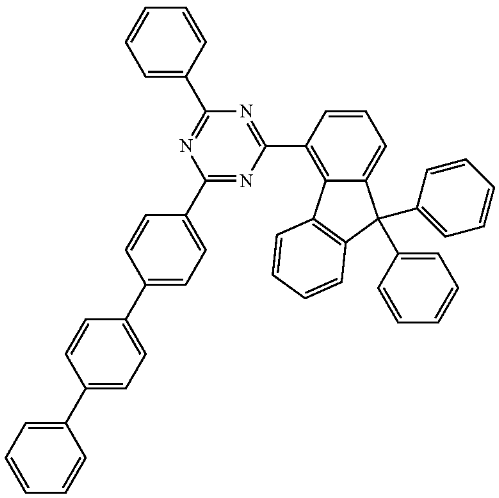
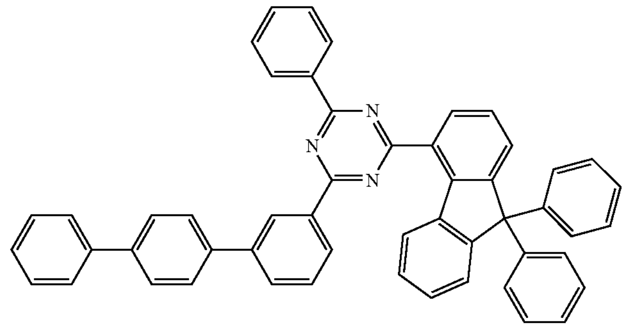
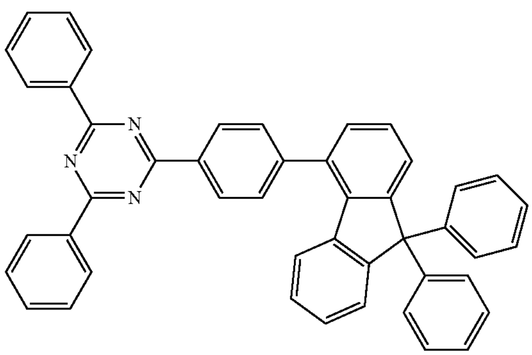
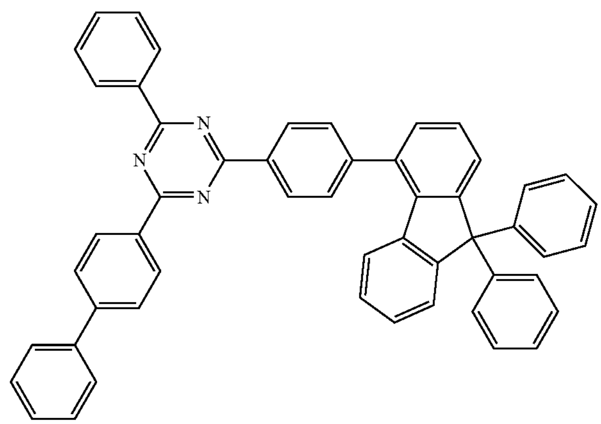
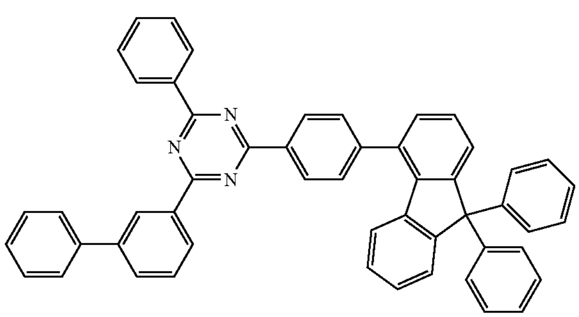
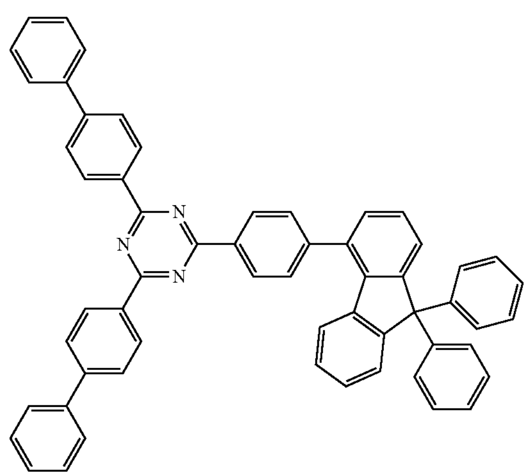

-continued
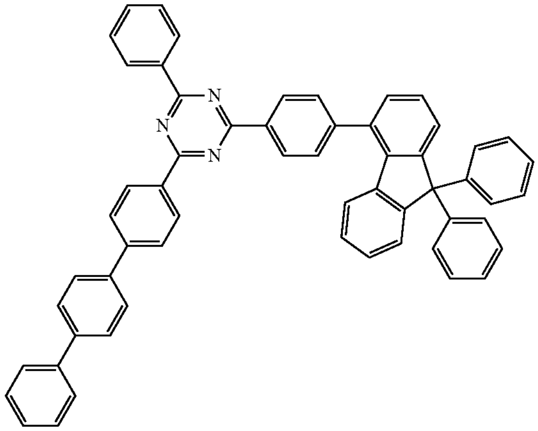
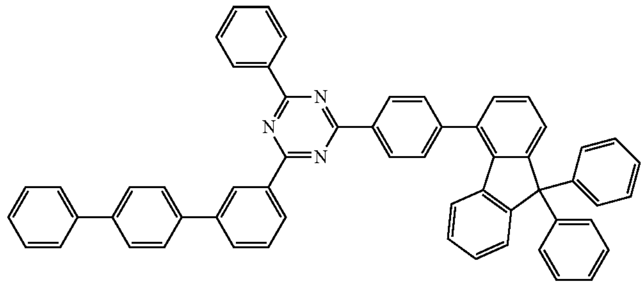
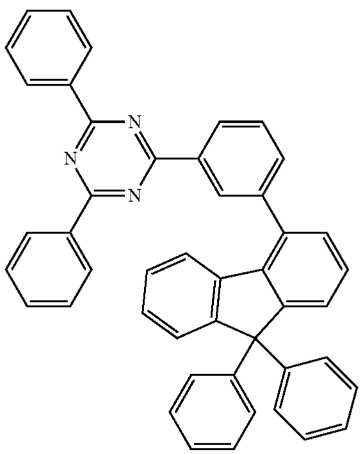
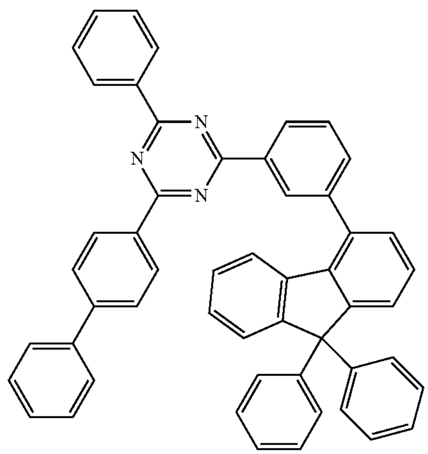
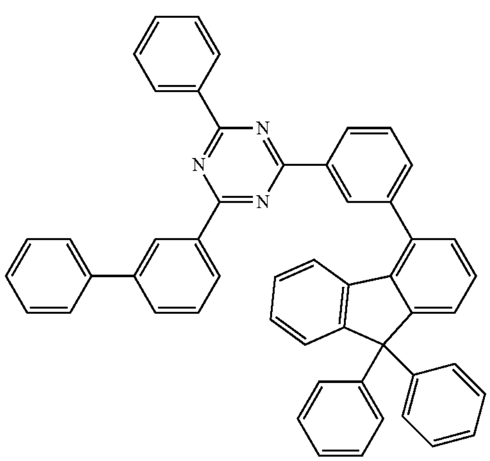
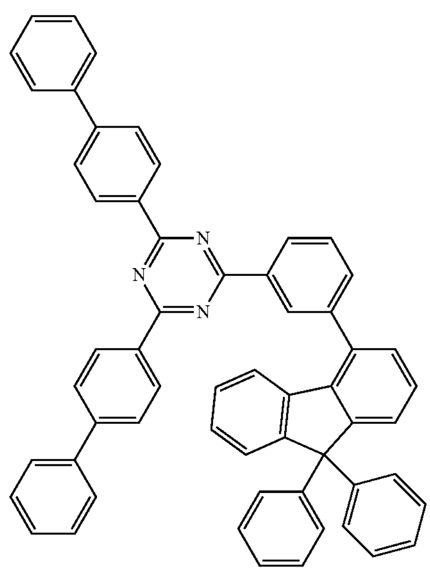

-continued
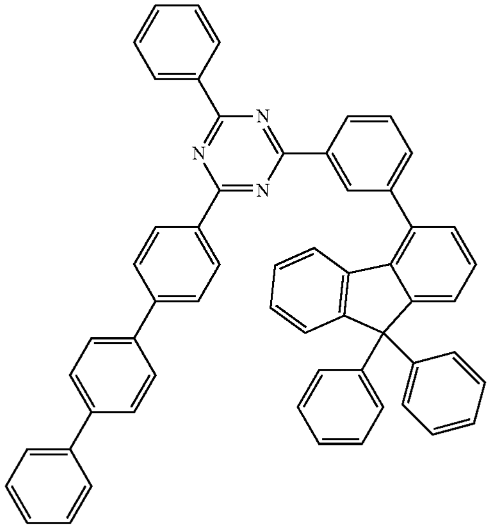
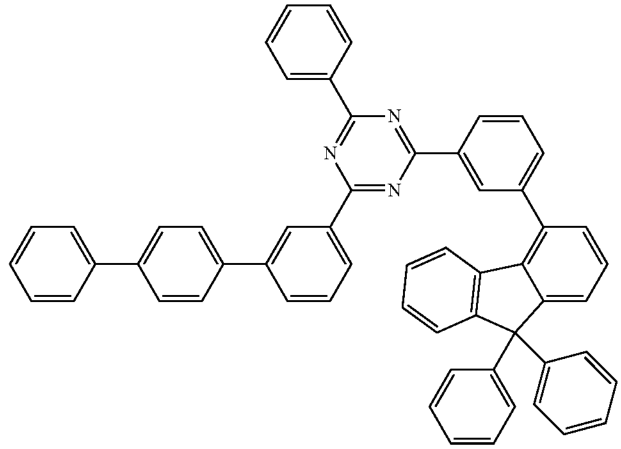
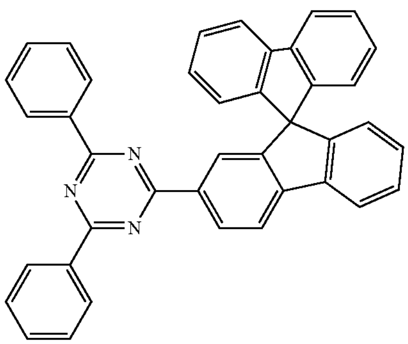
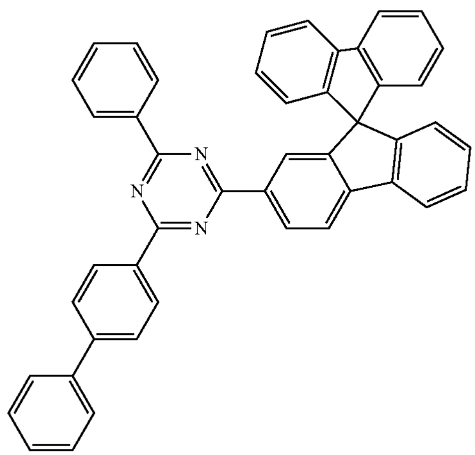
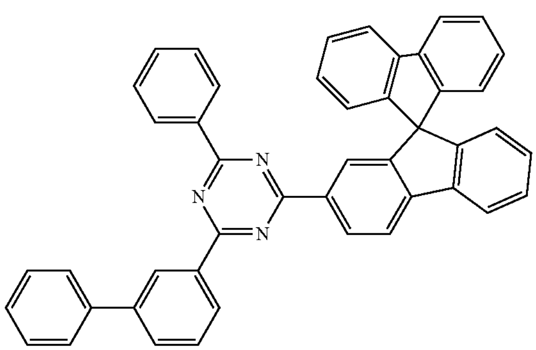
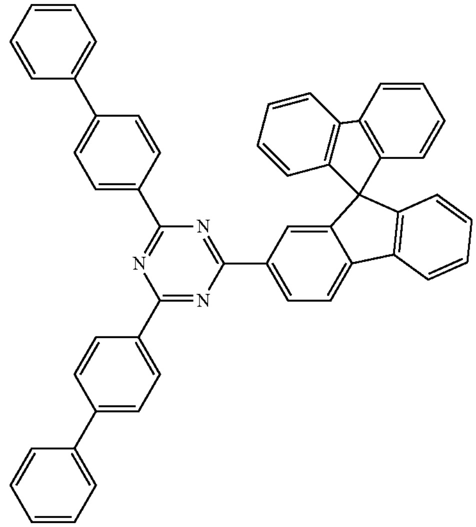

-continued
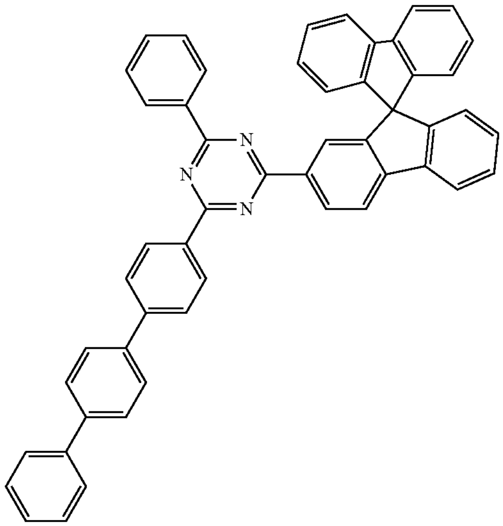
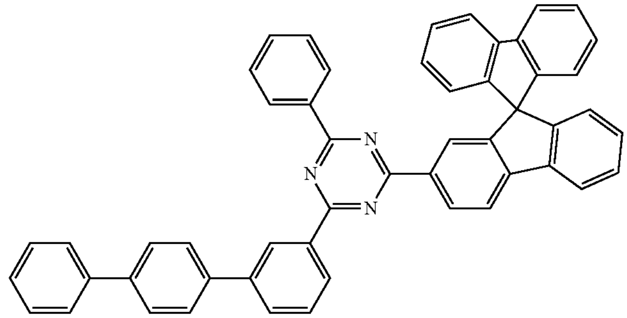
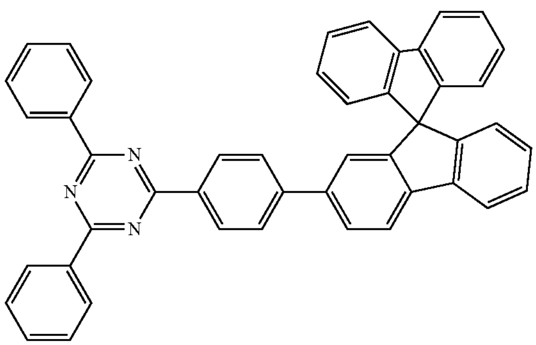
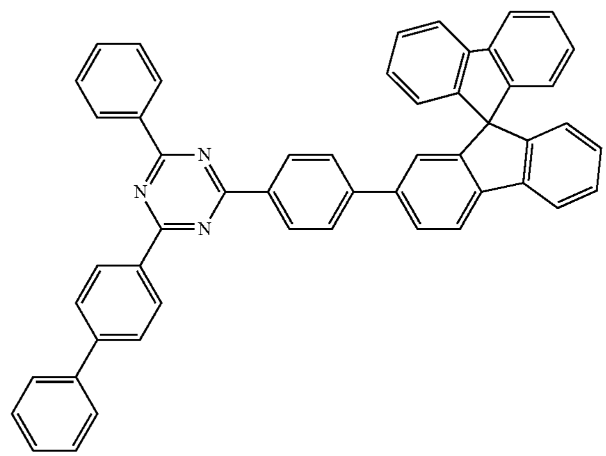
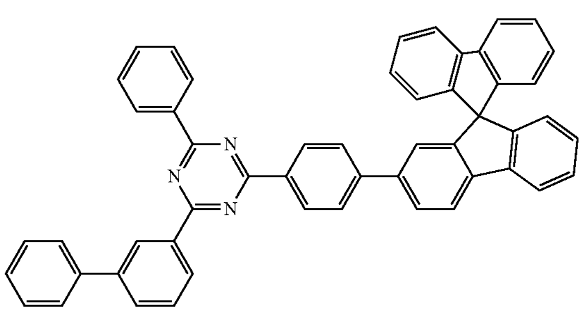
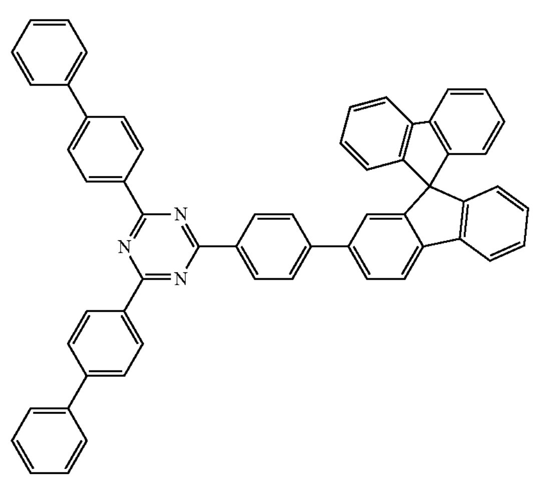

-continued
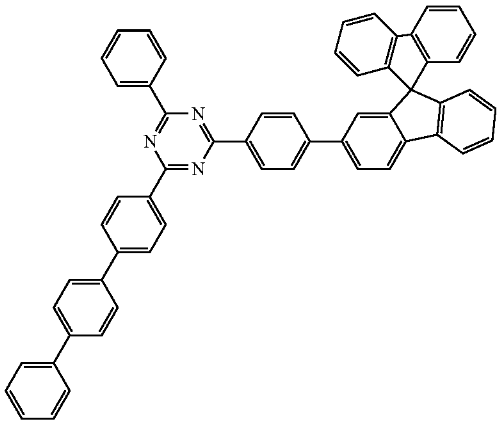
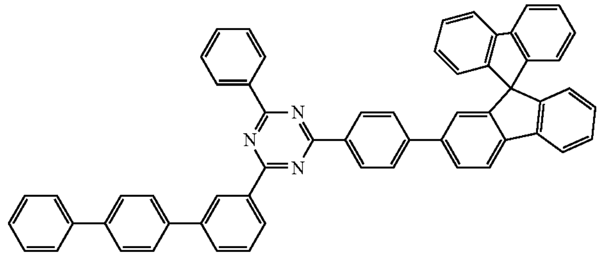
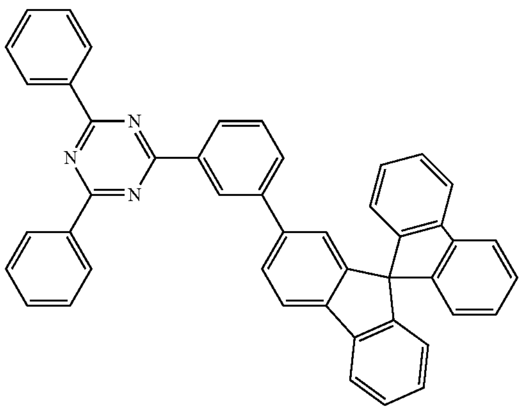
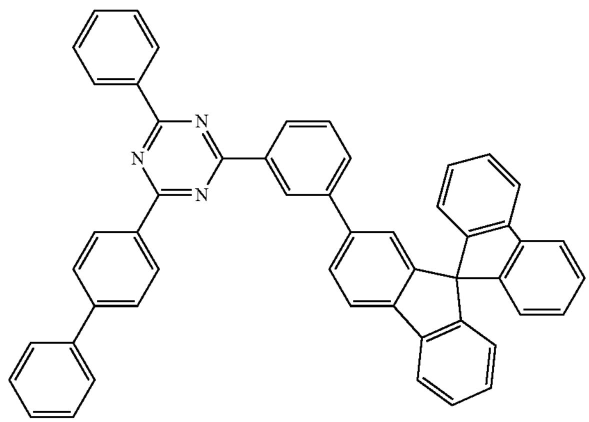
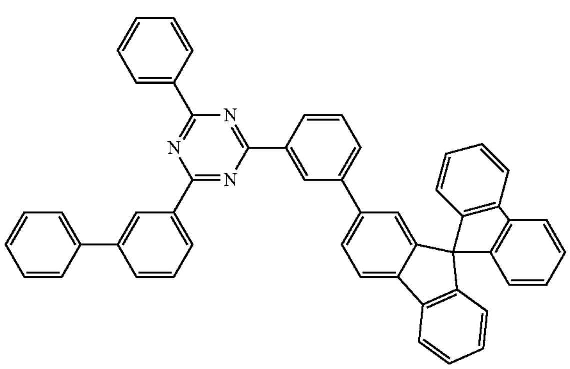
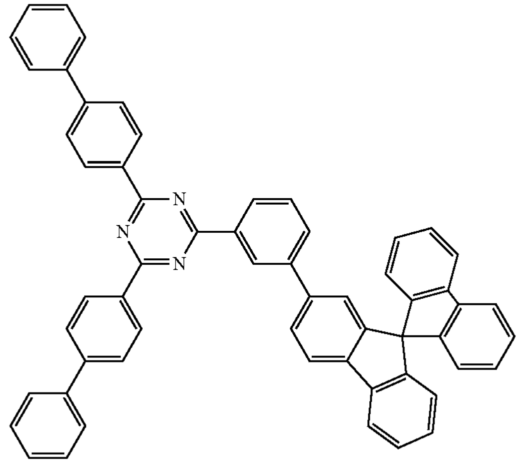

-continued
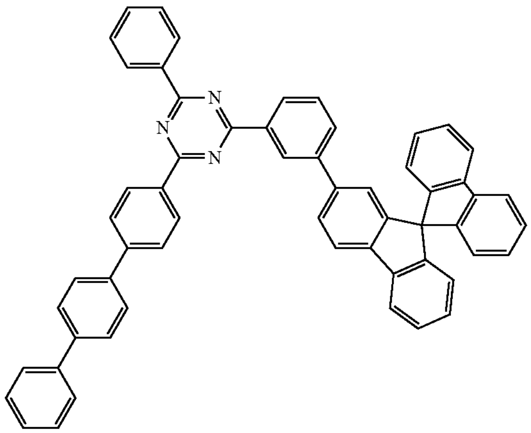
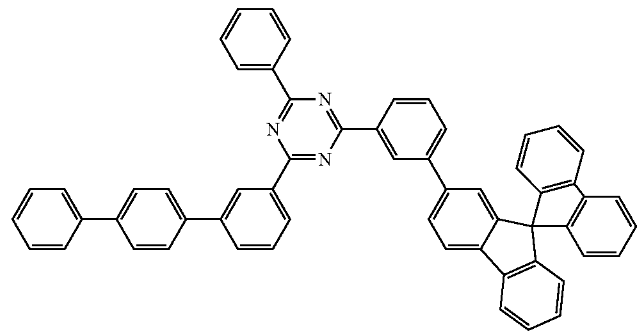
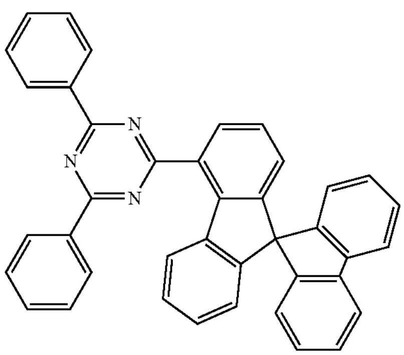
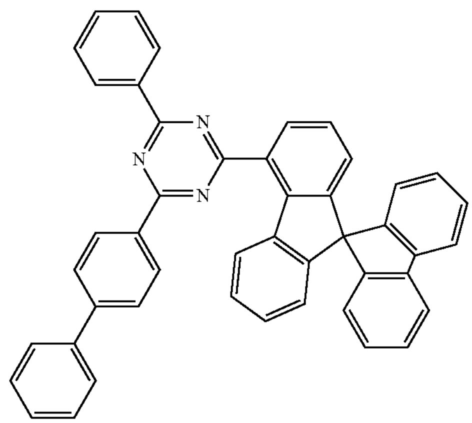
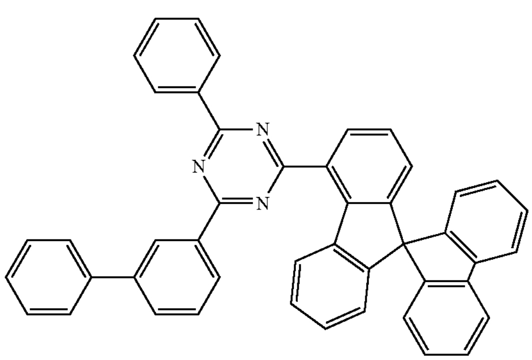
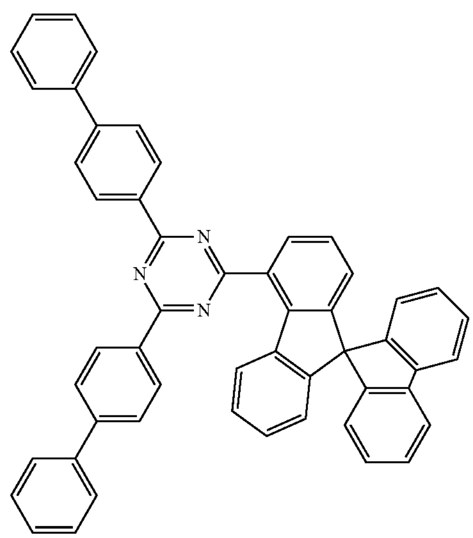

-continued
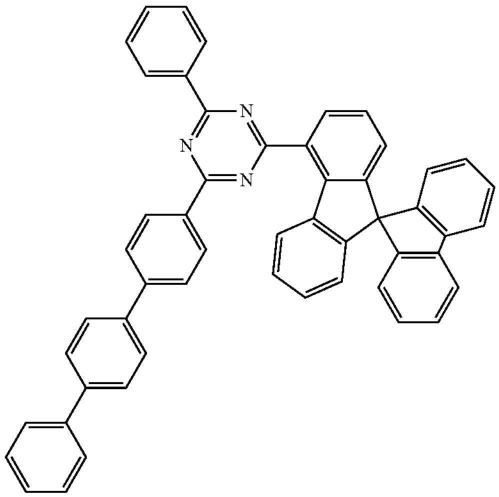
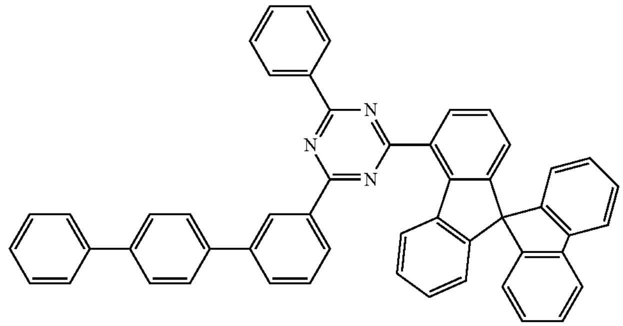
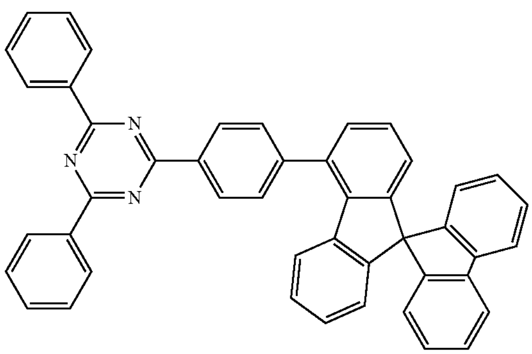
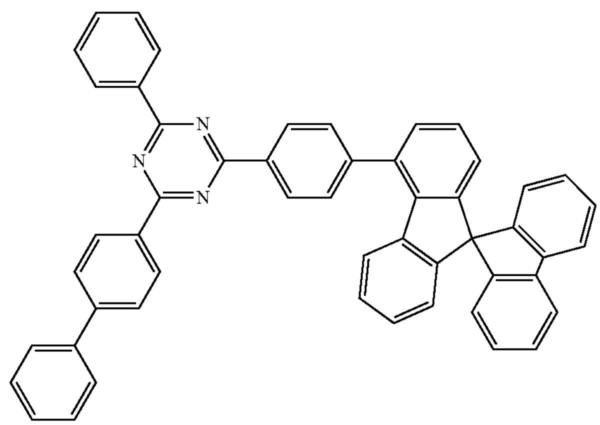
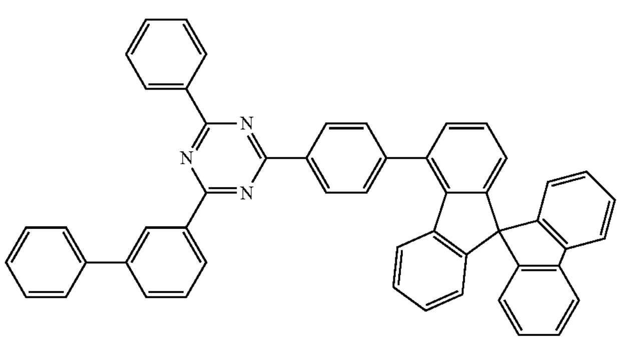
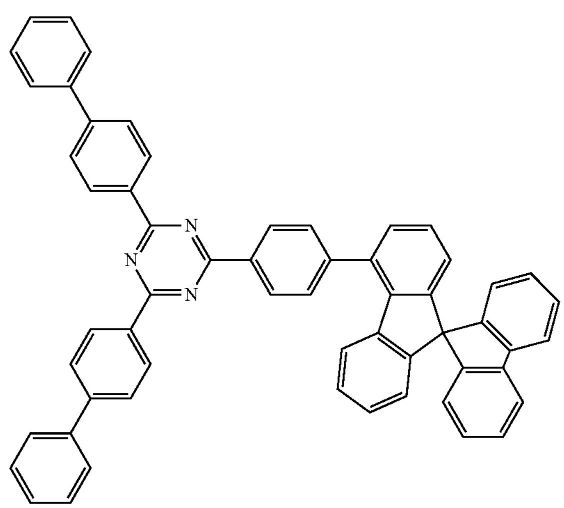

-continued
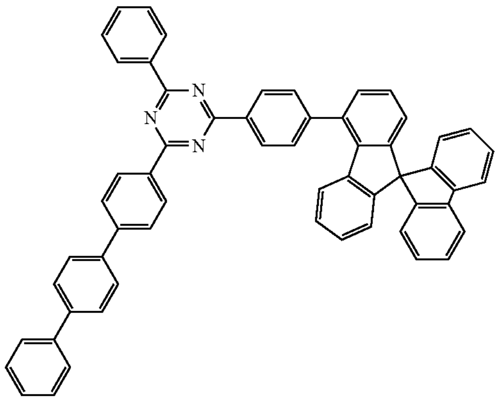
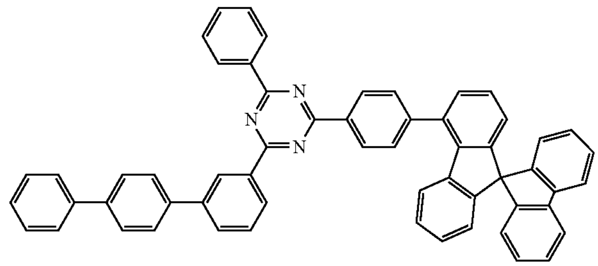
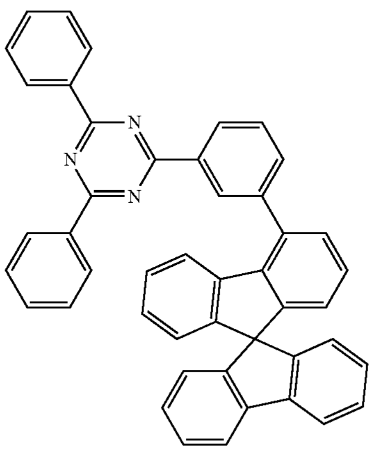
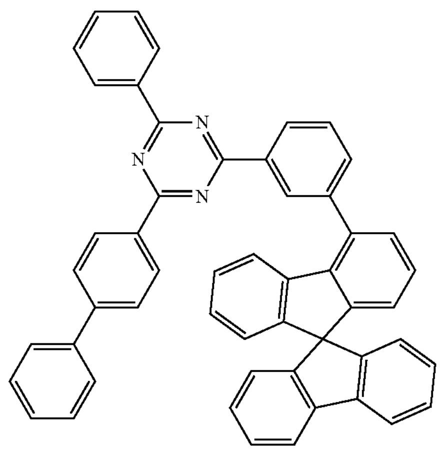
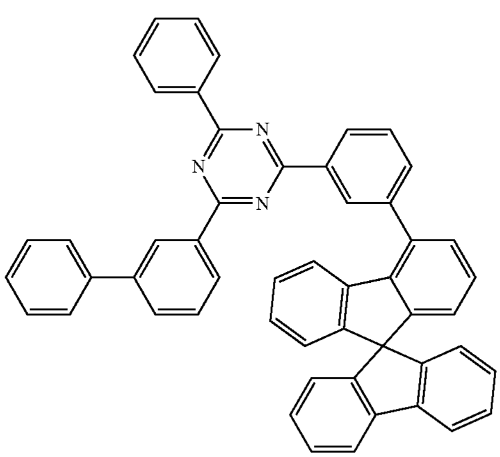
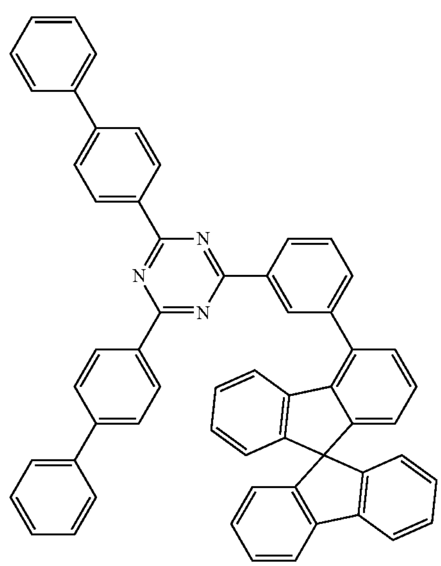

-continued
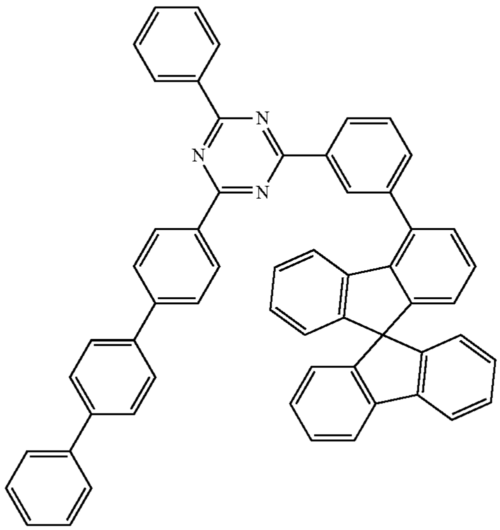
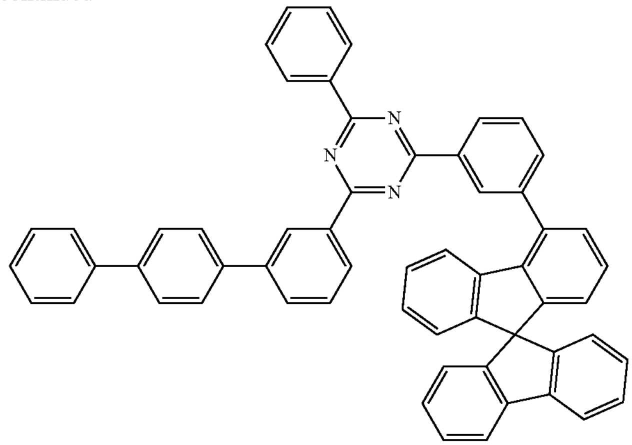
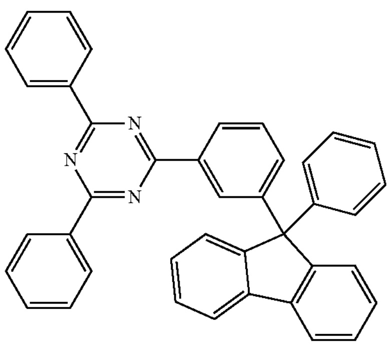
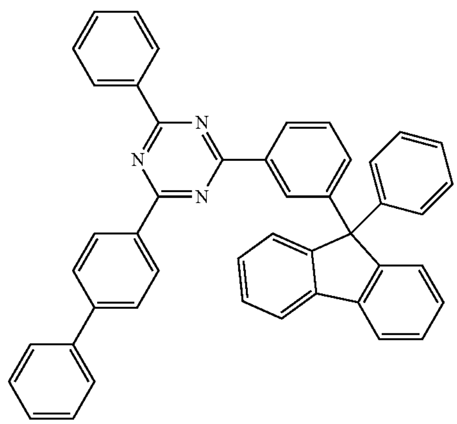
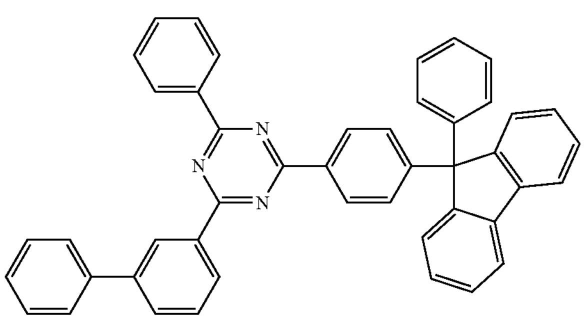
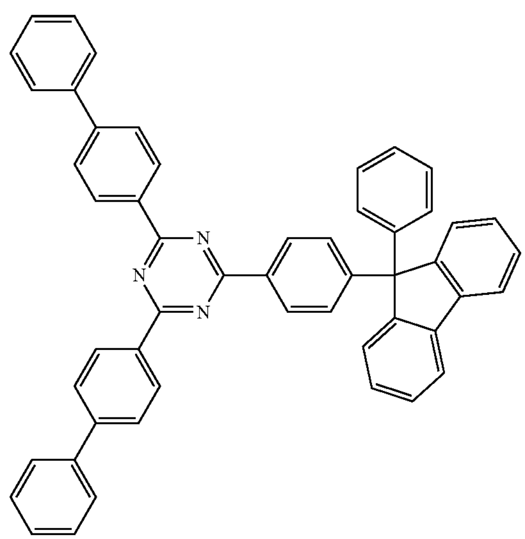

-continued
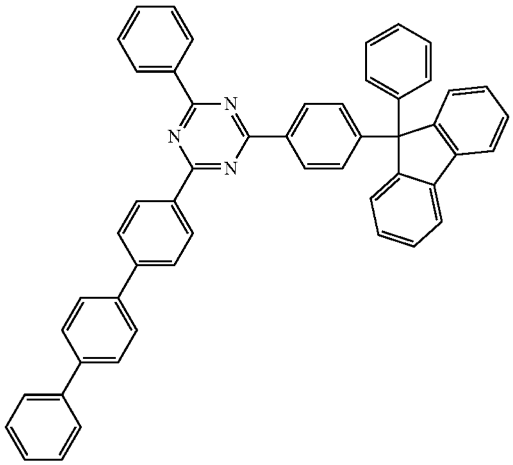
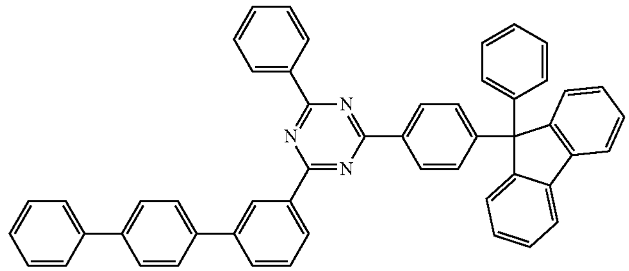
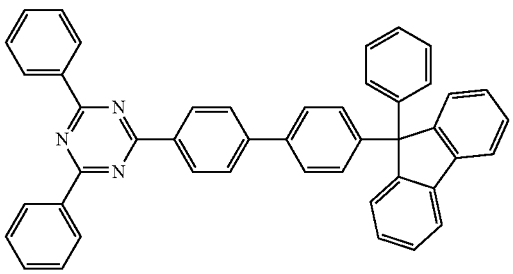
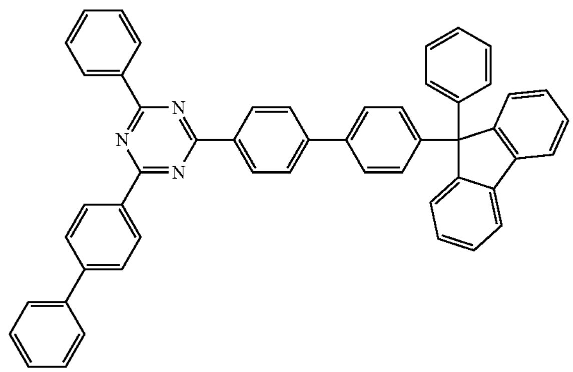
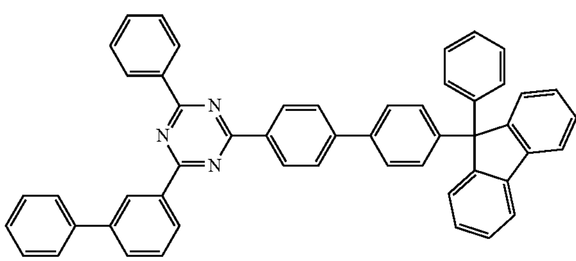
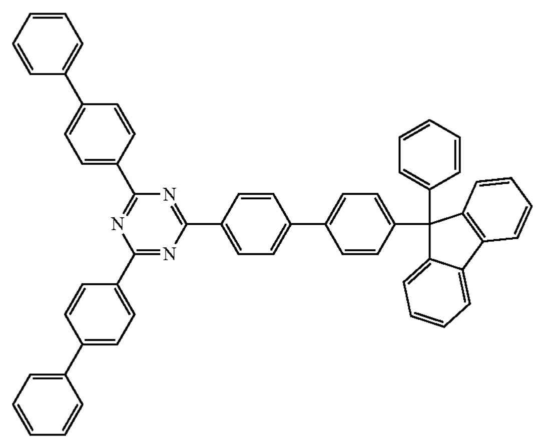
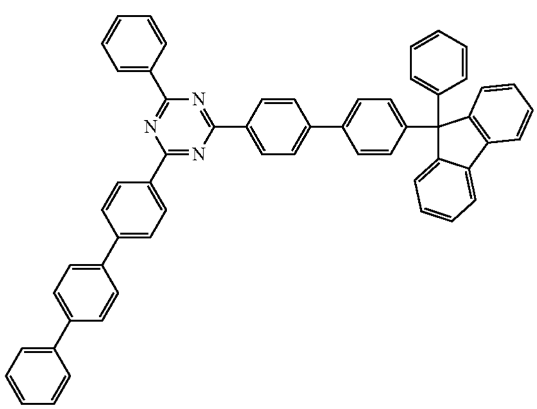
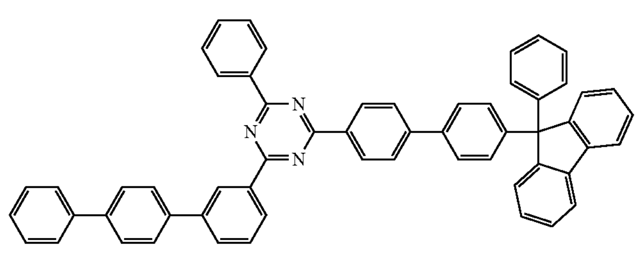

-continued
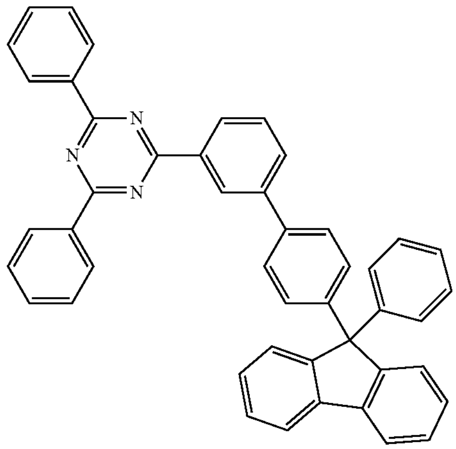
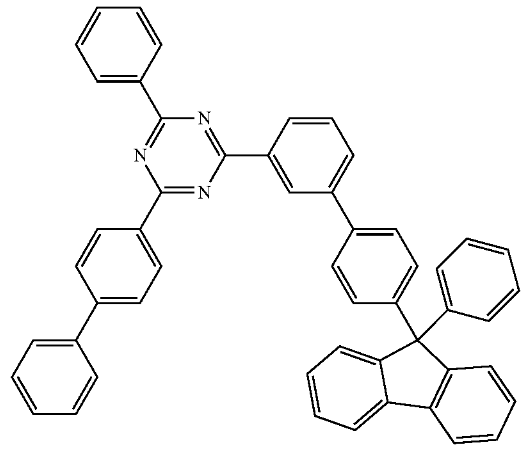
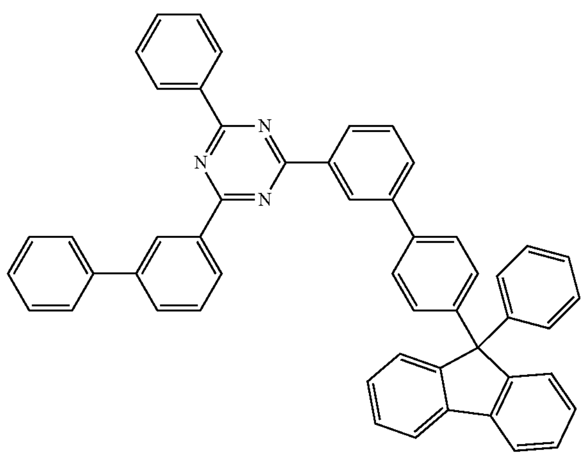
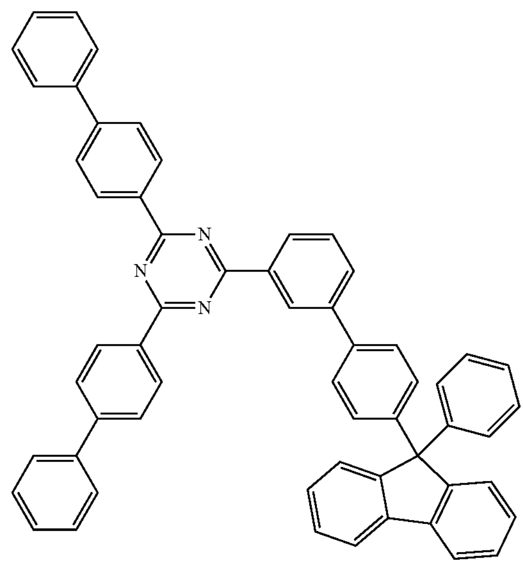
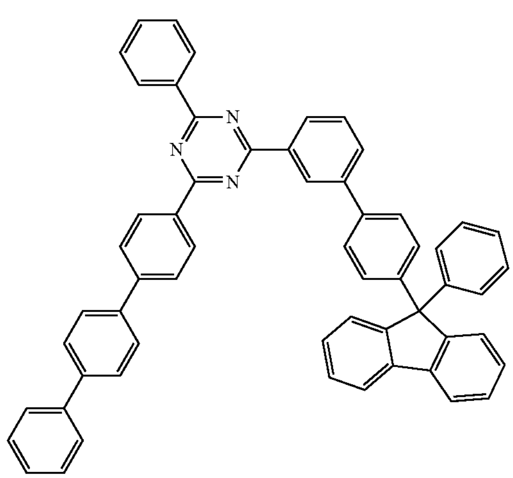
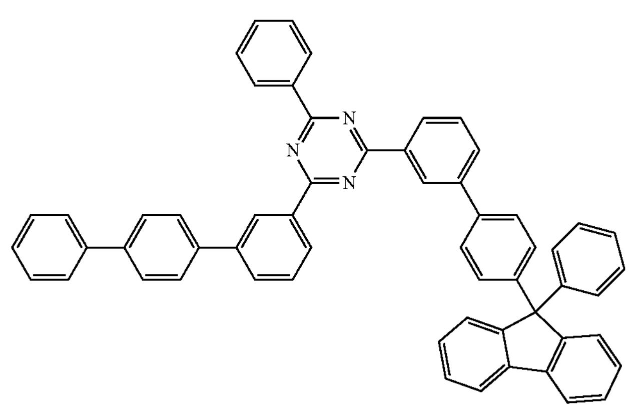

-continued
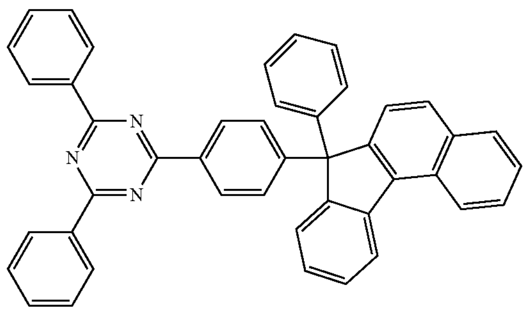
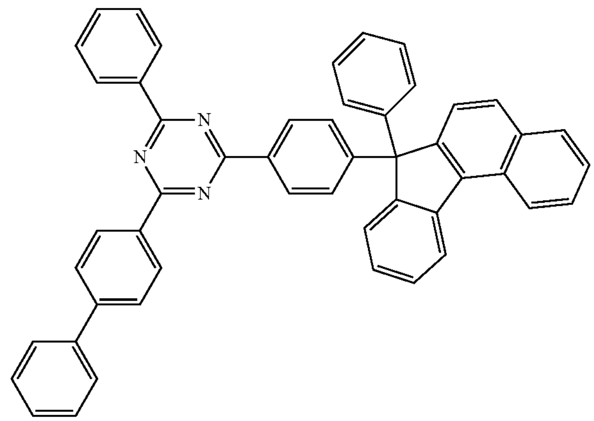
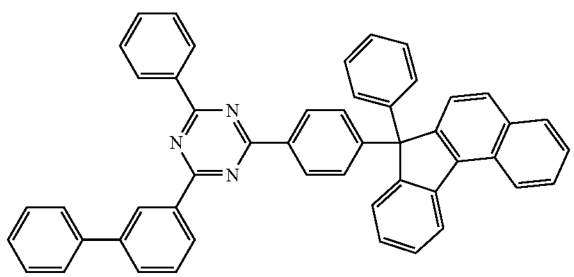
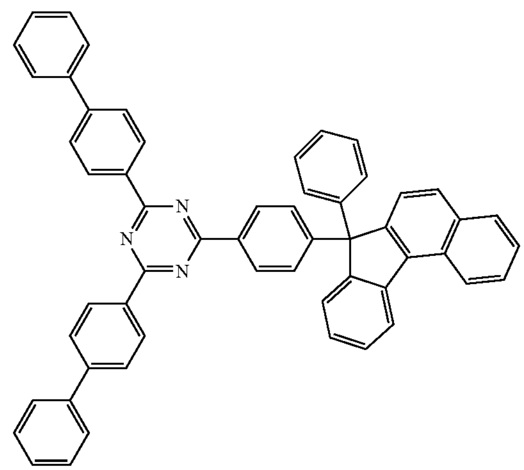
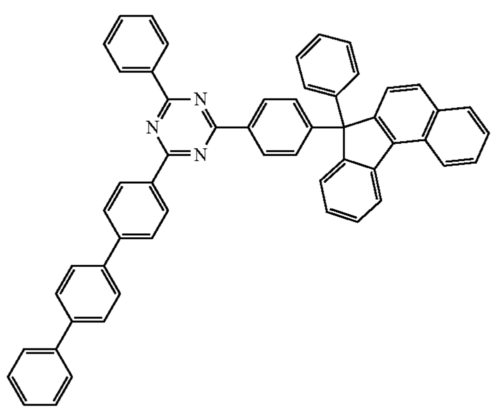
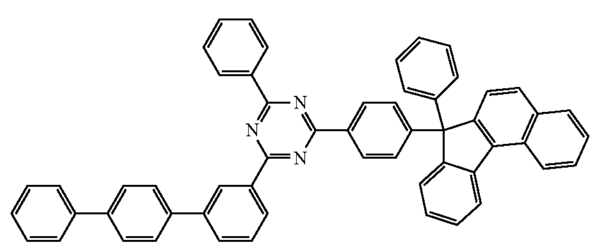
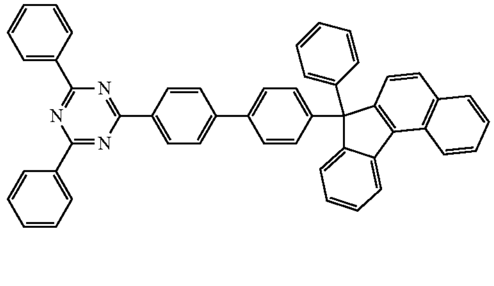
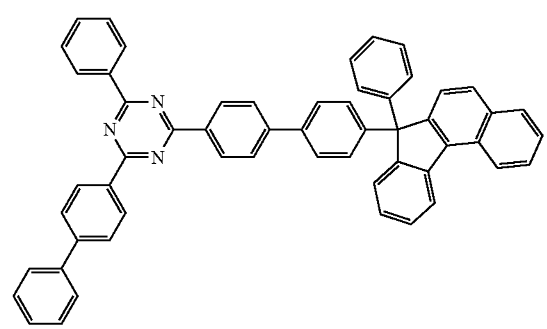

-continued
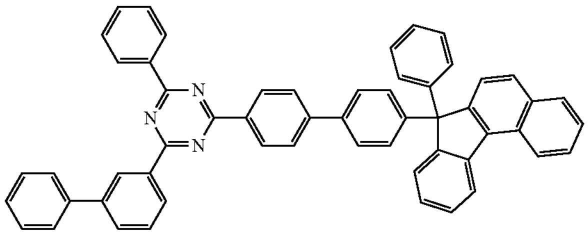
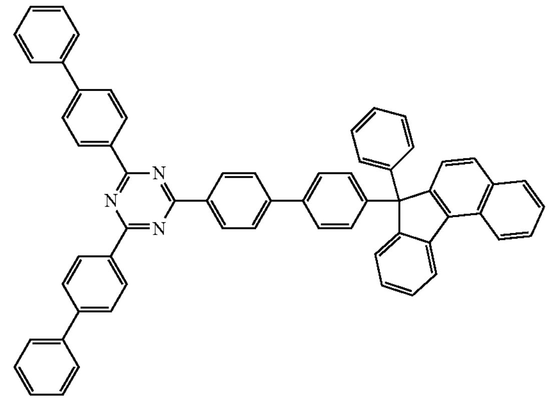
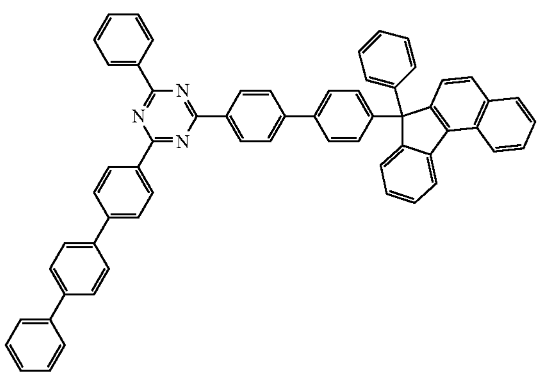
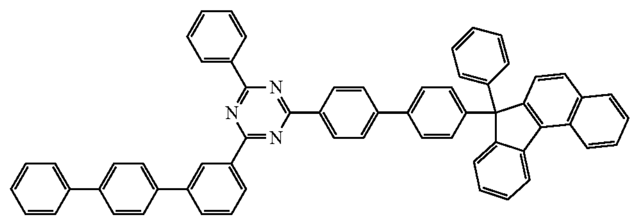
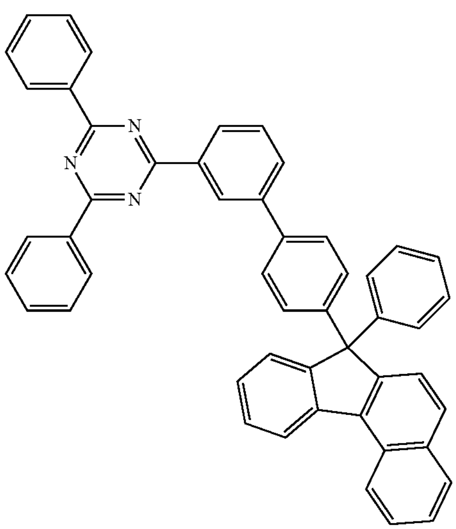
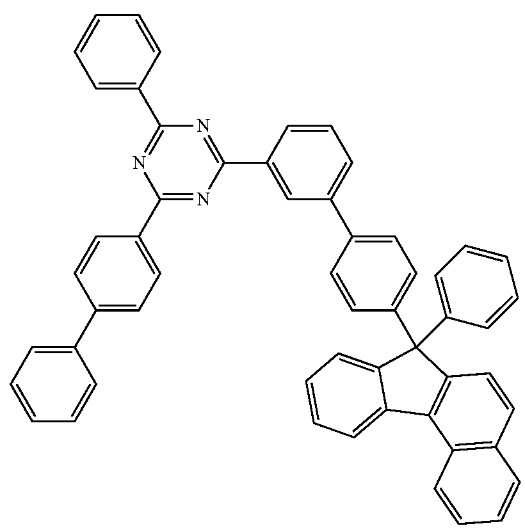

-continued
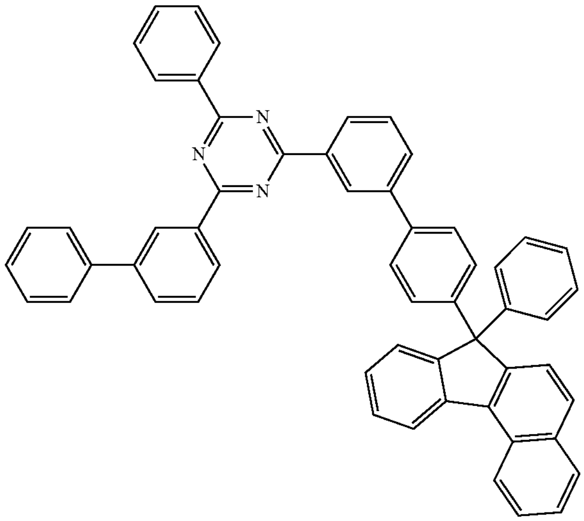
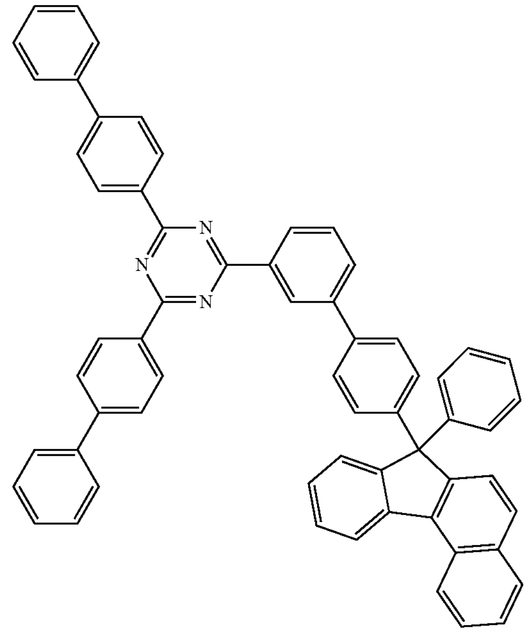
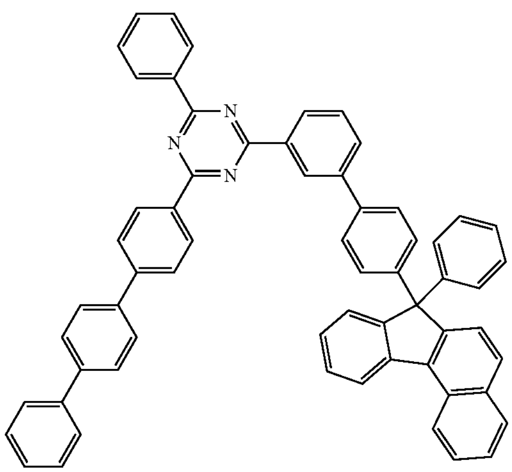
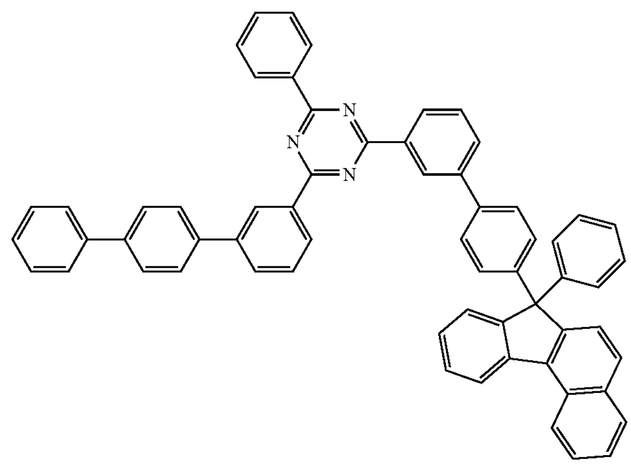
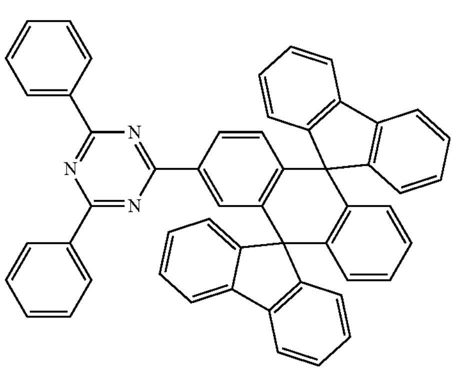
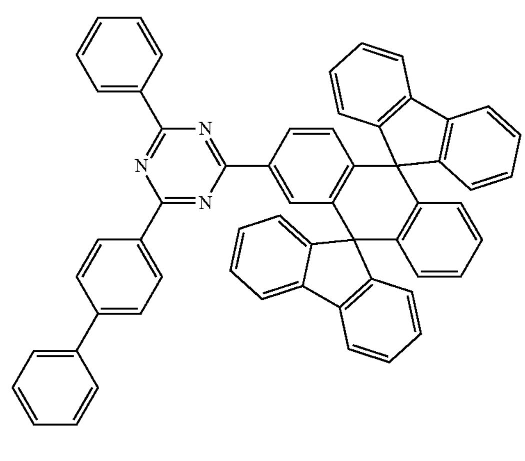

-continued
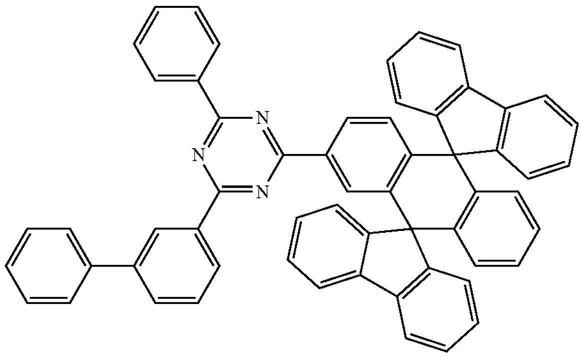
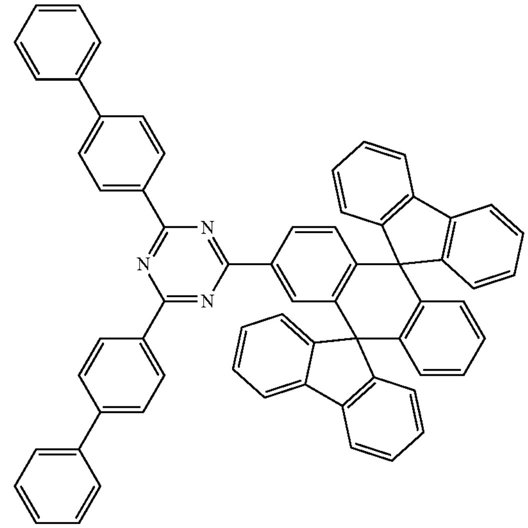
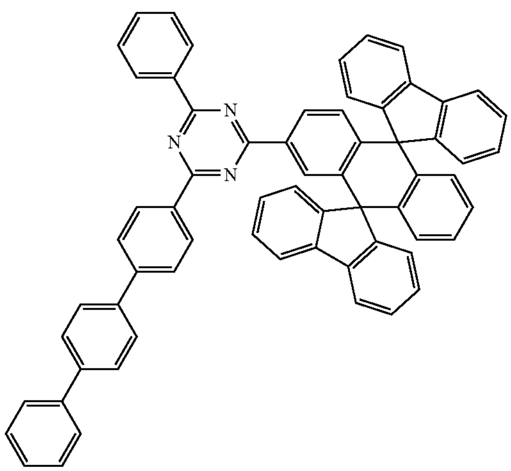
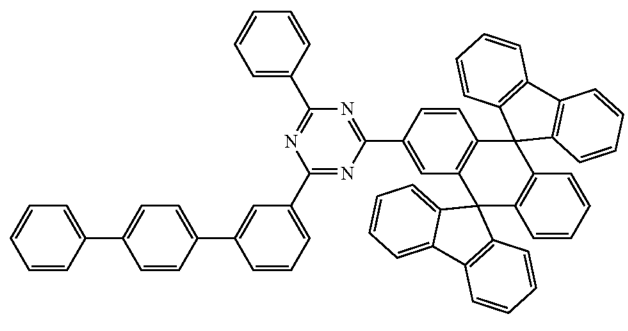
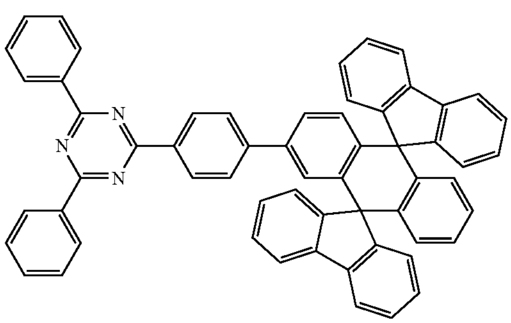
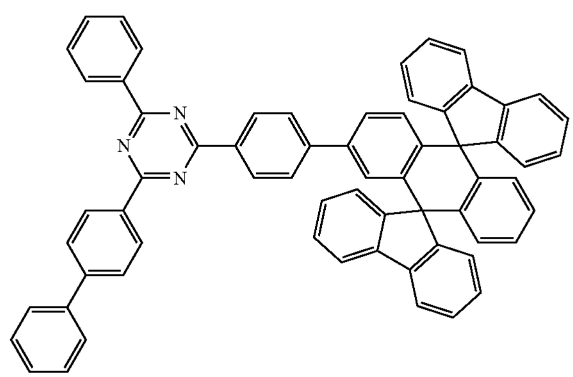

-continued
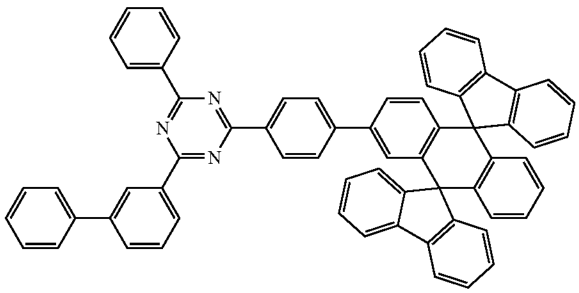
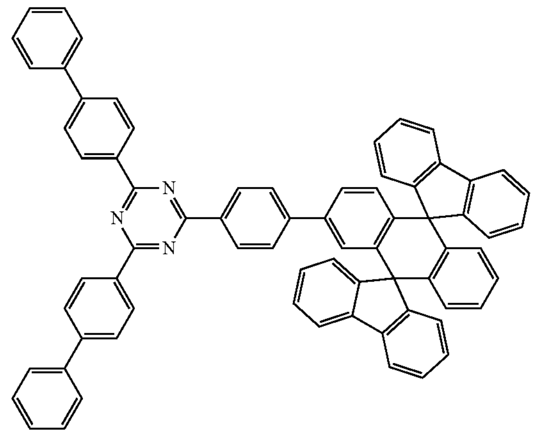
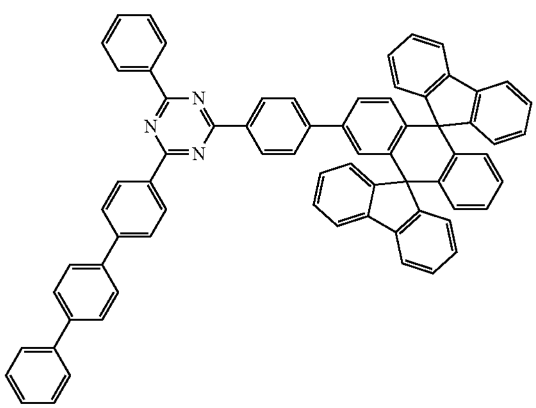
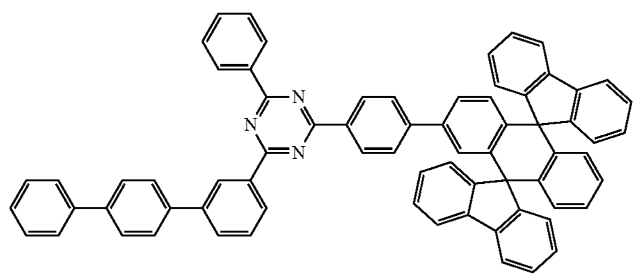
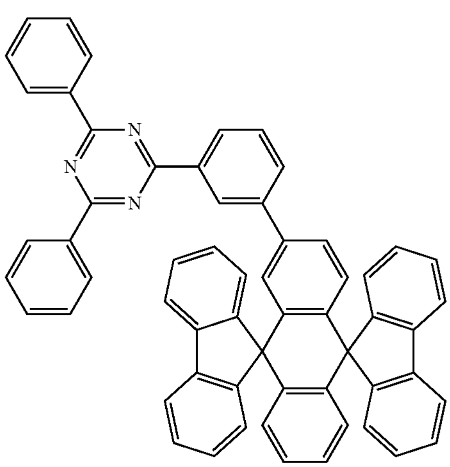
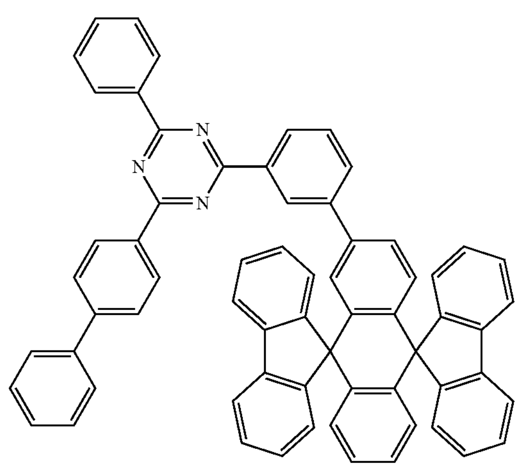

-continued
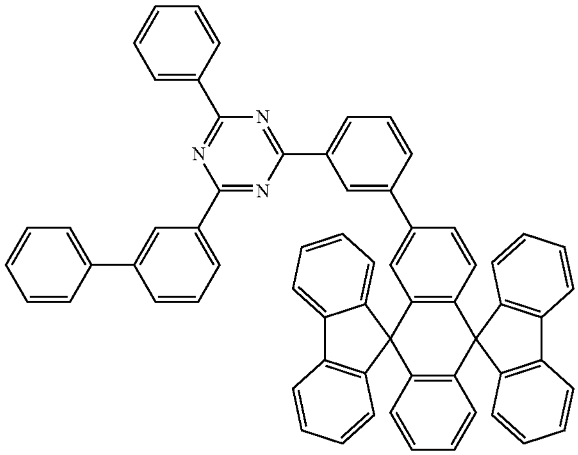
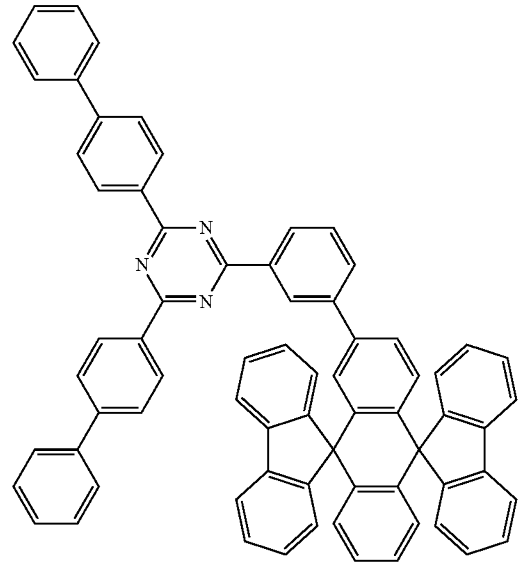
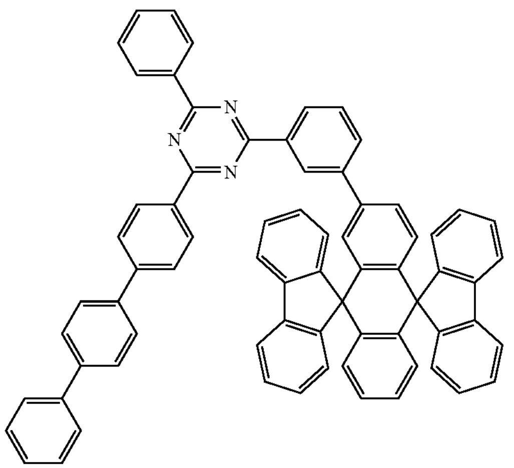
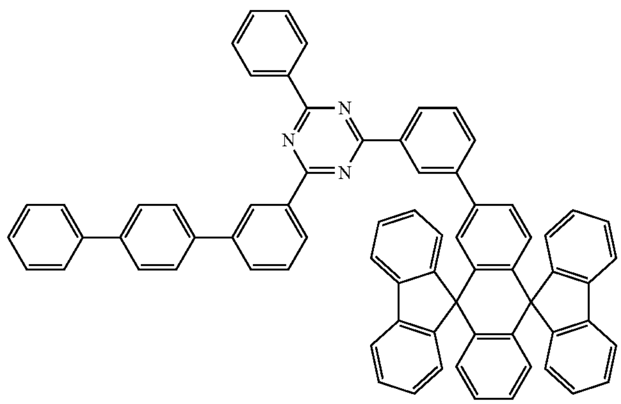
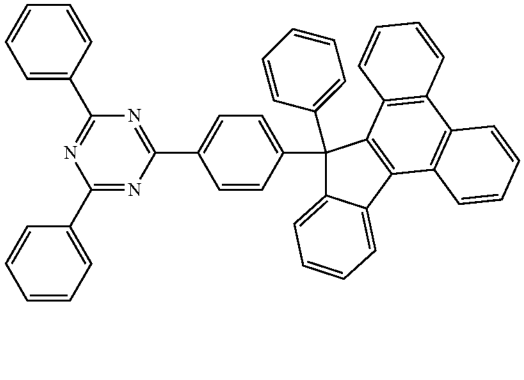
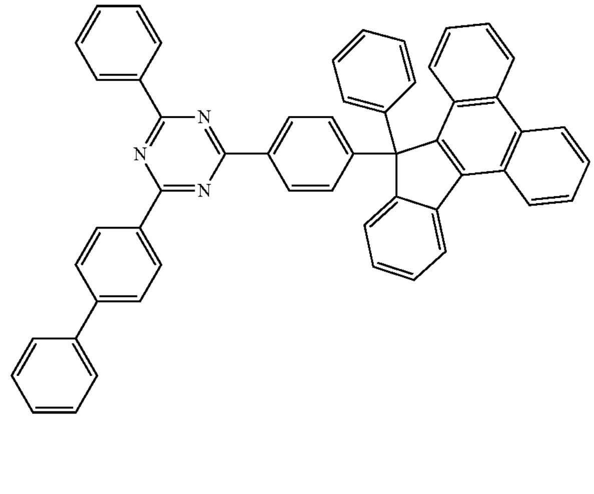

-continued
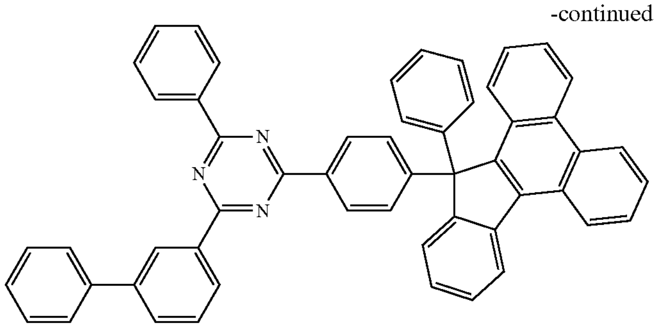
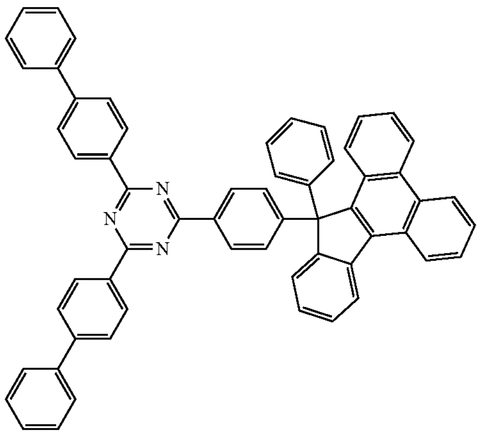
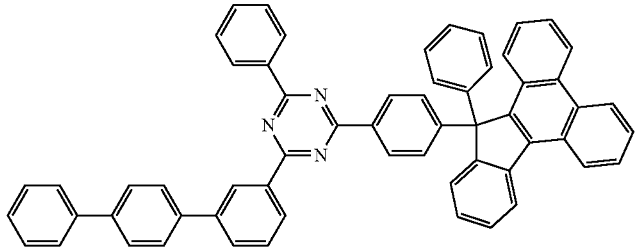
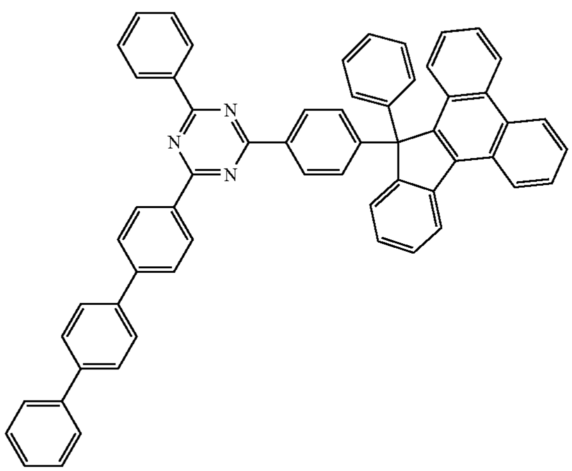
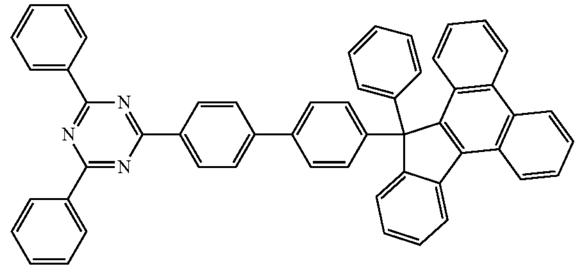
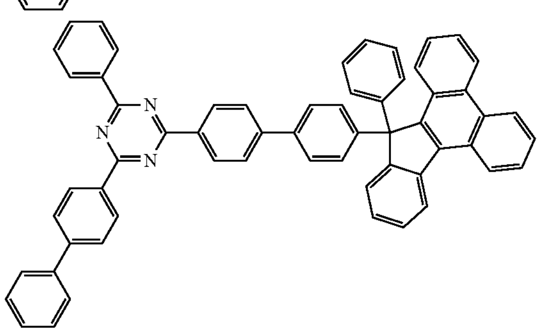
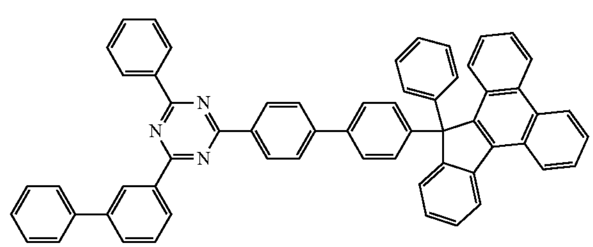

-continued
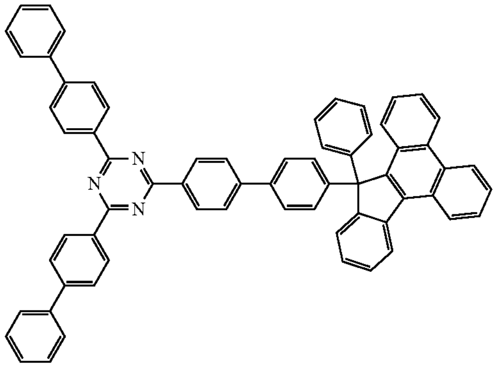
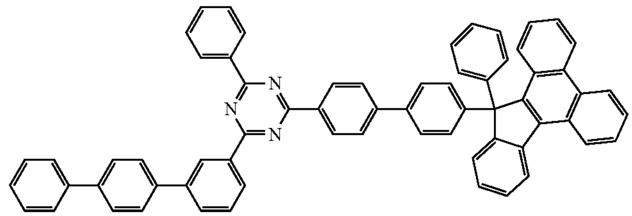
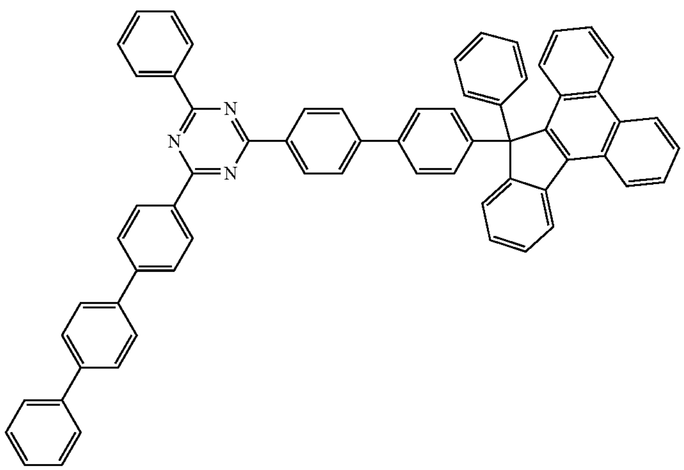
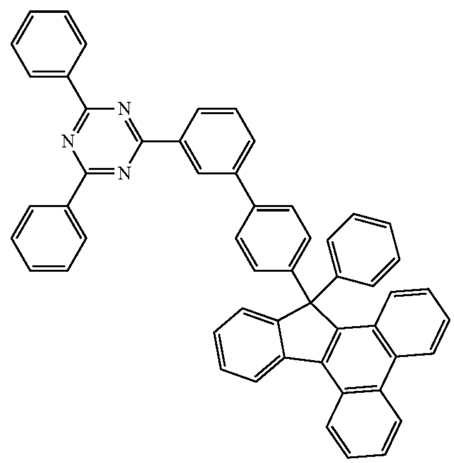
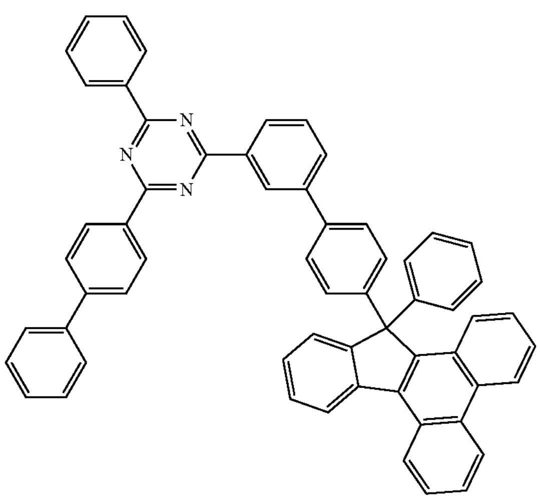
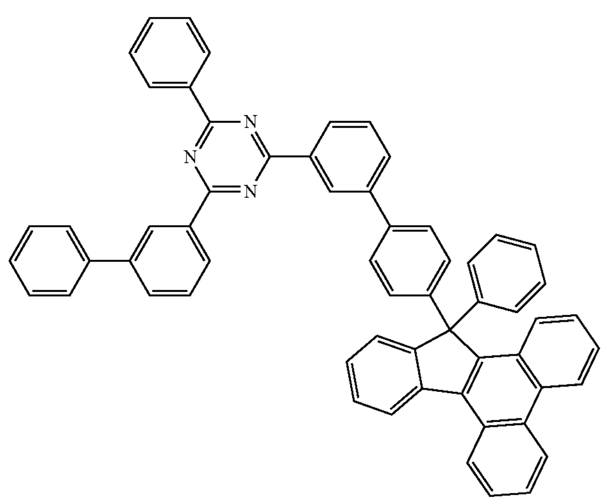

-continued
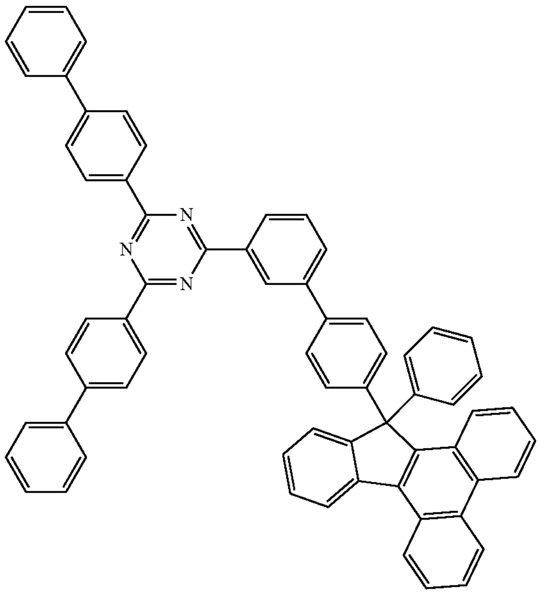
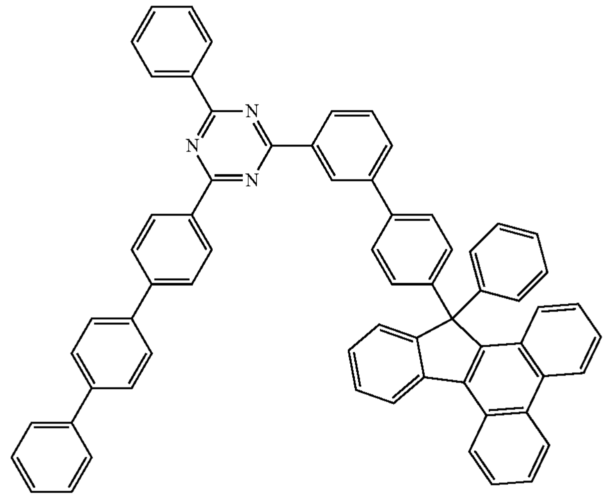
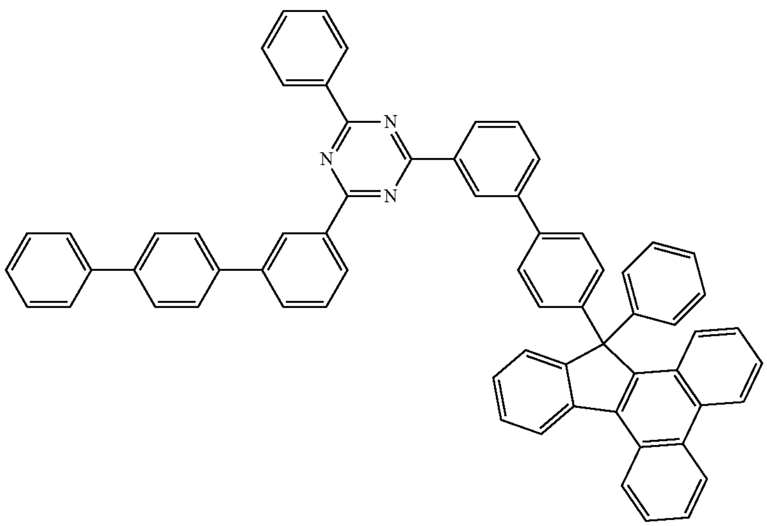
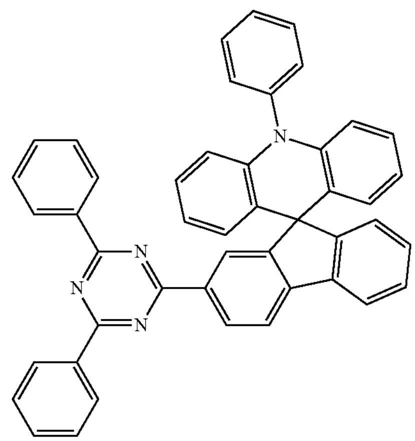
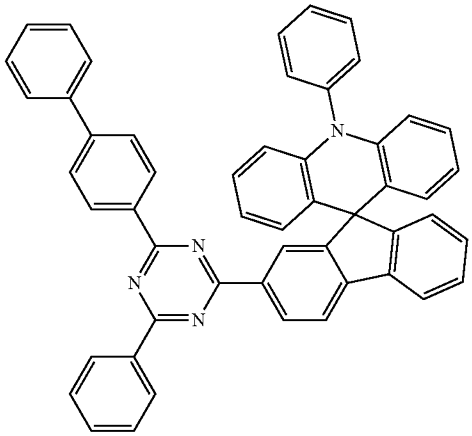
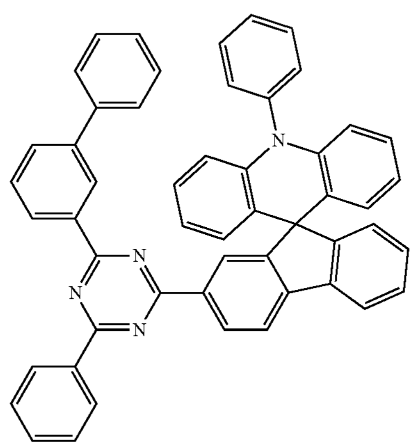

-continued
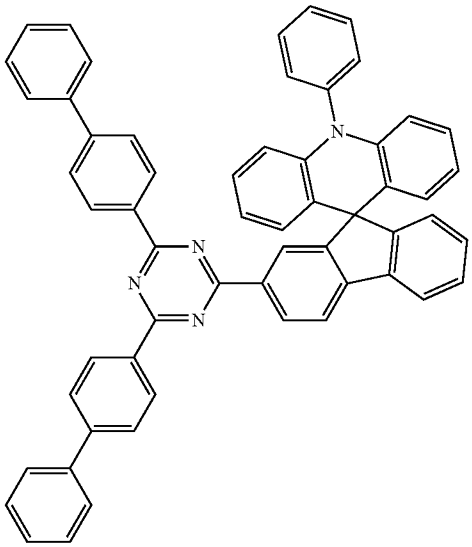
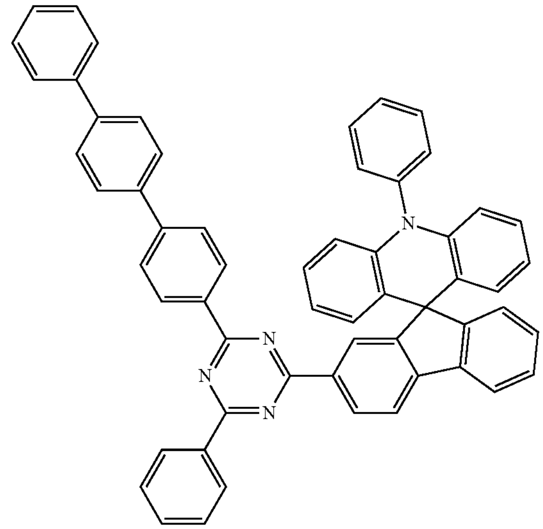
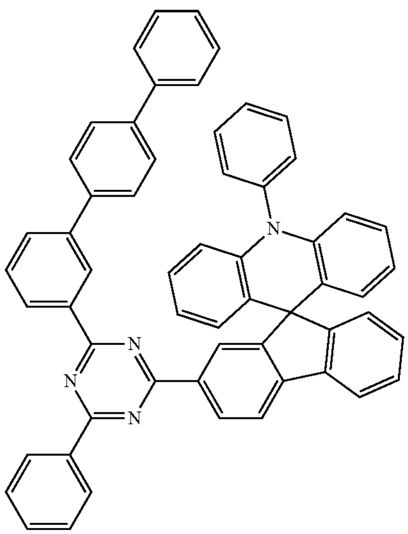
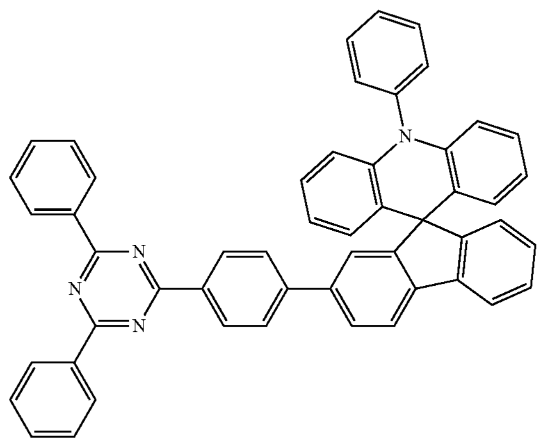
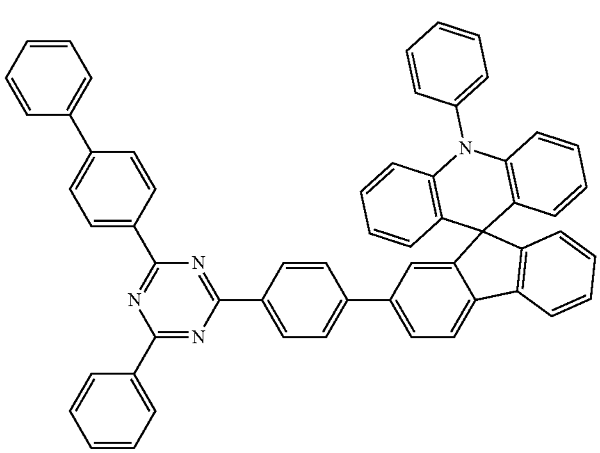
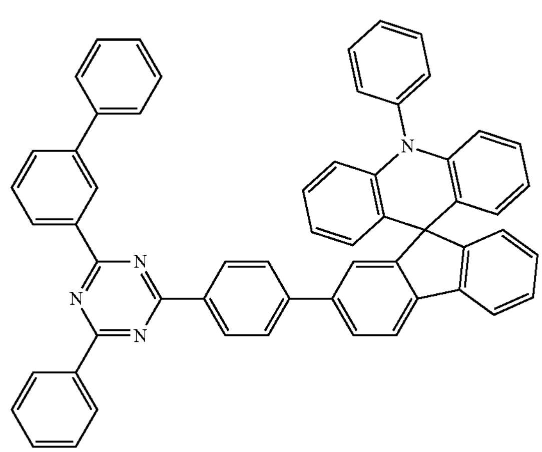

-continued
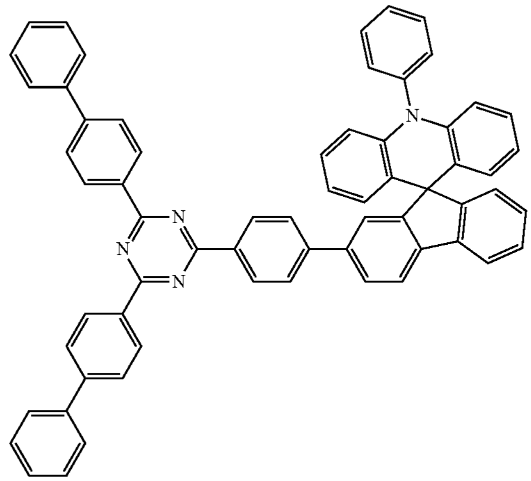
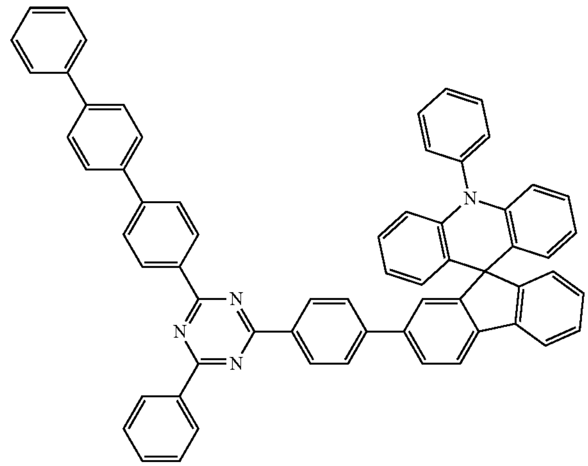
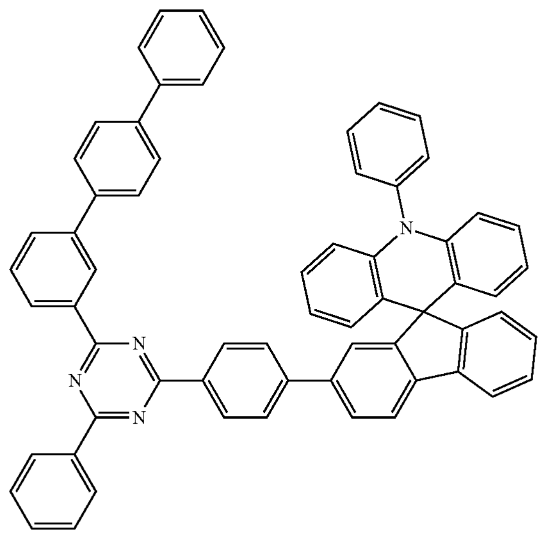
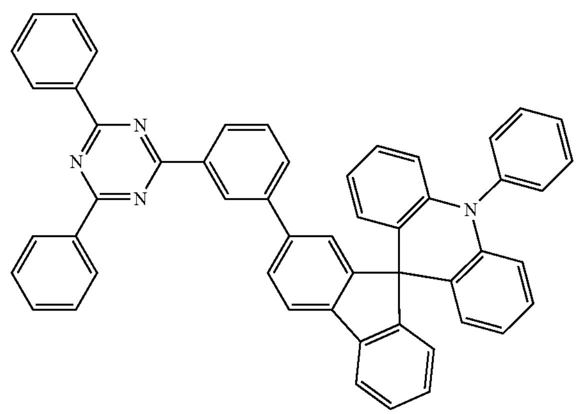
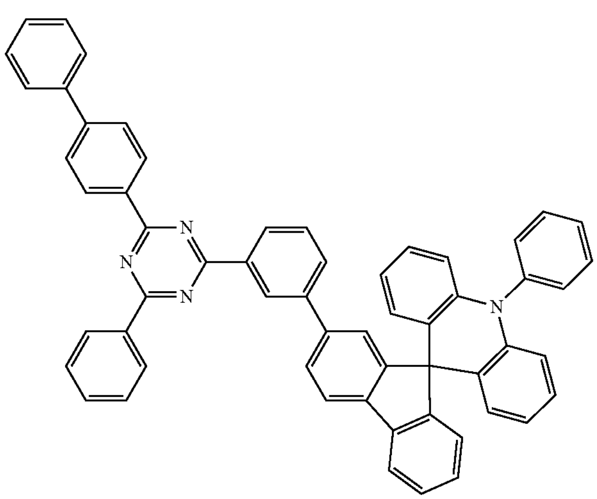
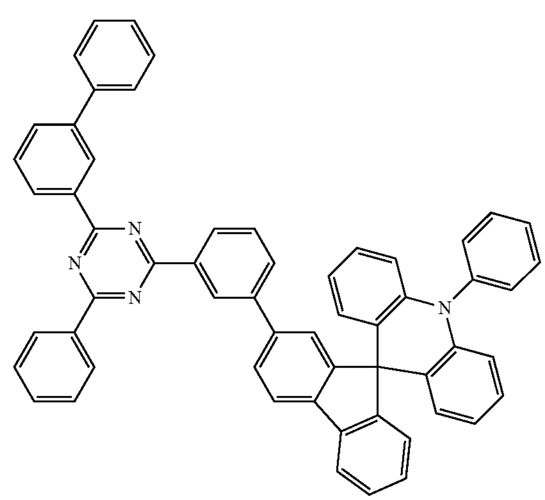

-continued
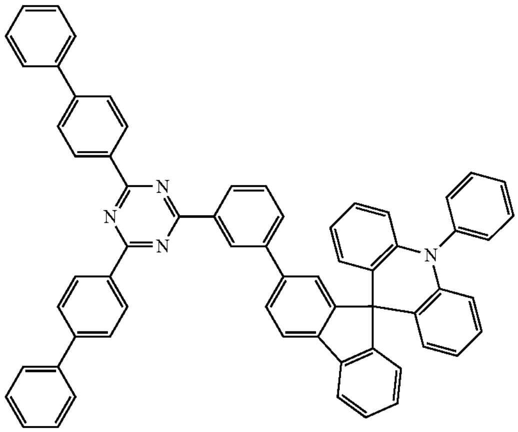
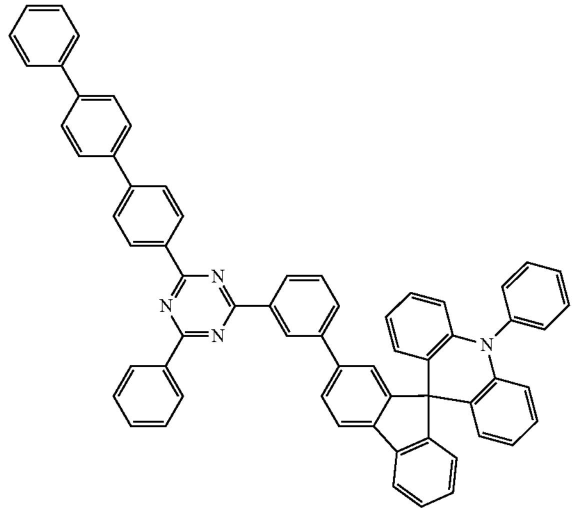
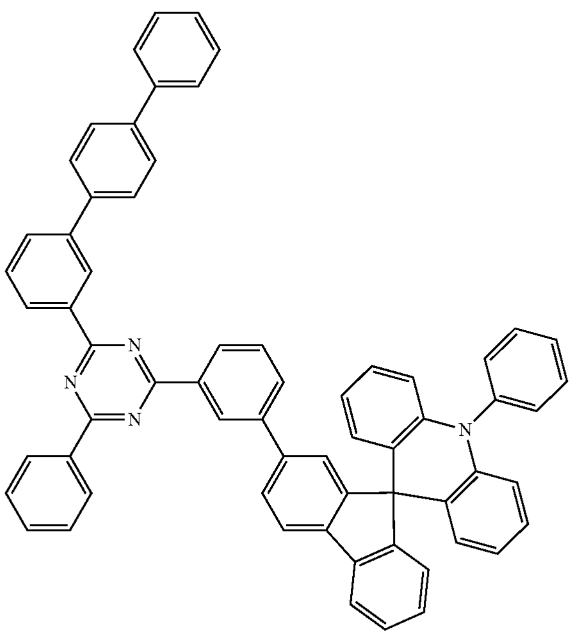
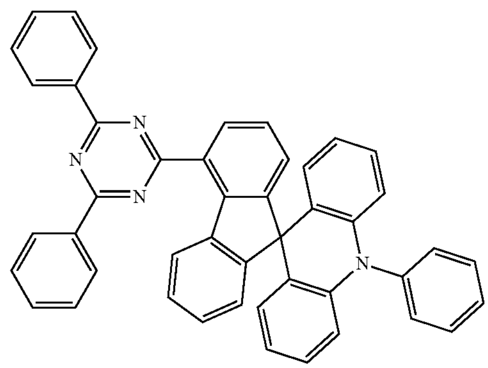
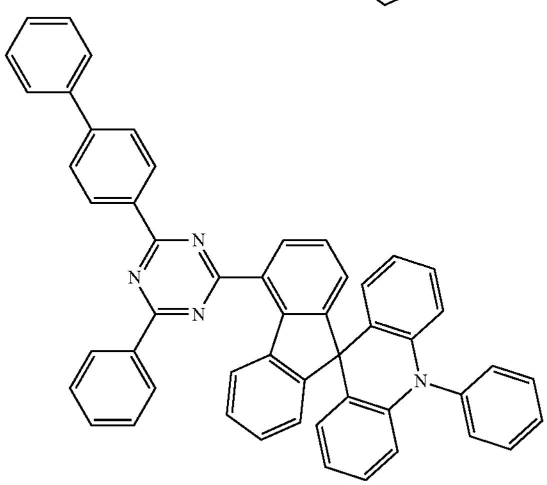
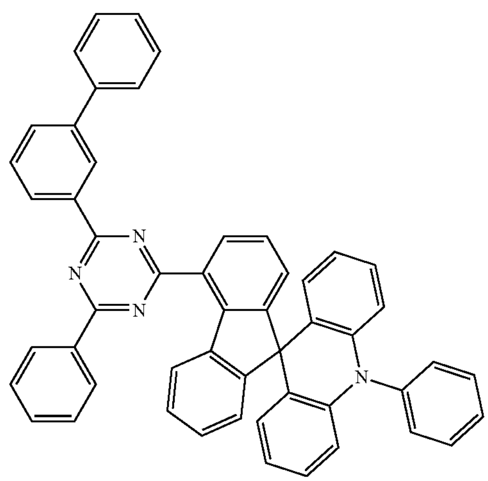

-continued
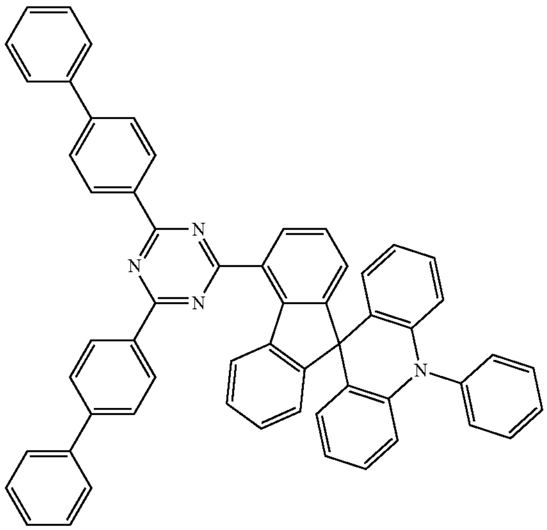
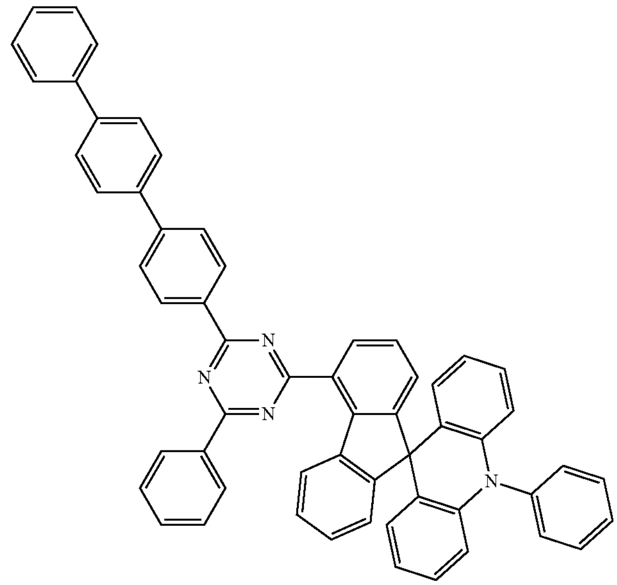
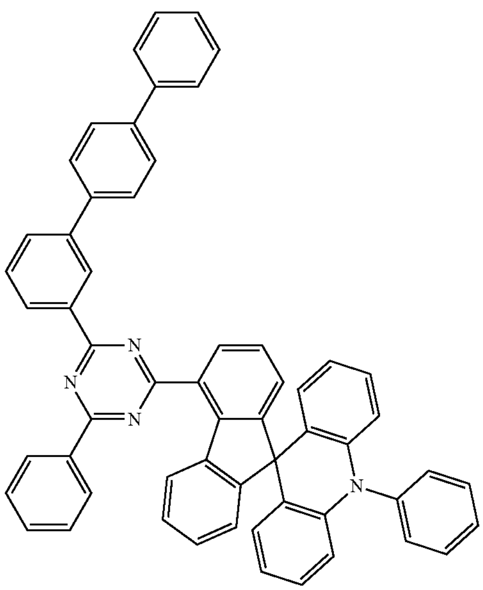
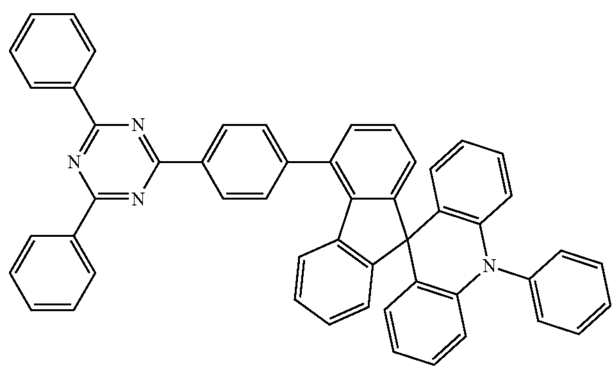
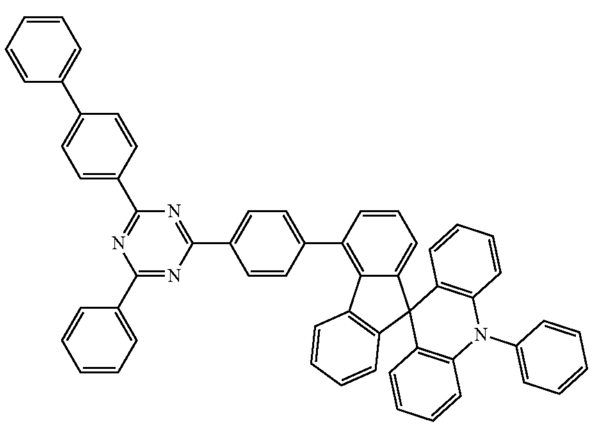
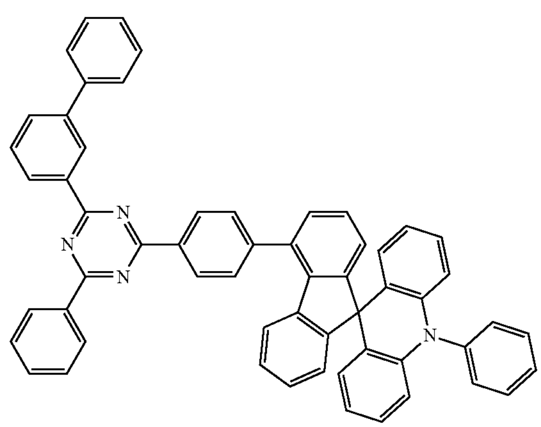

-continued
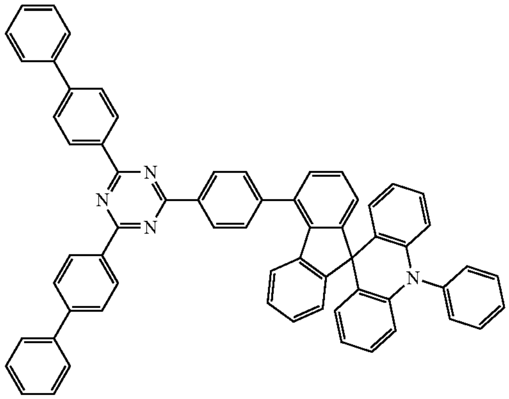
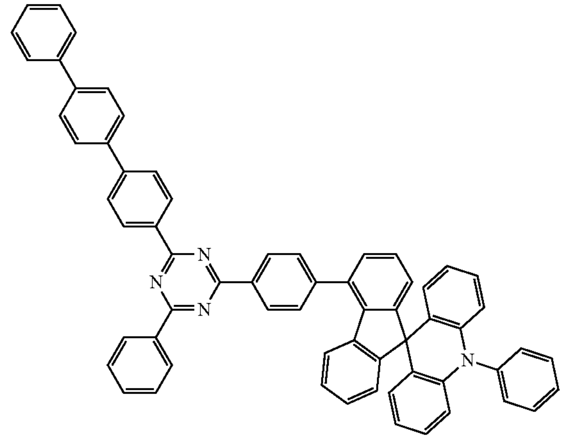
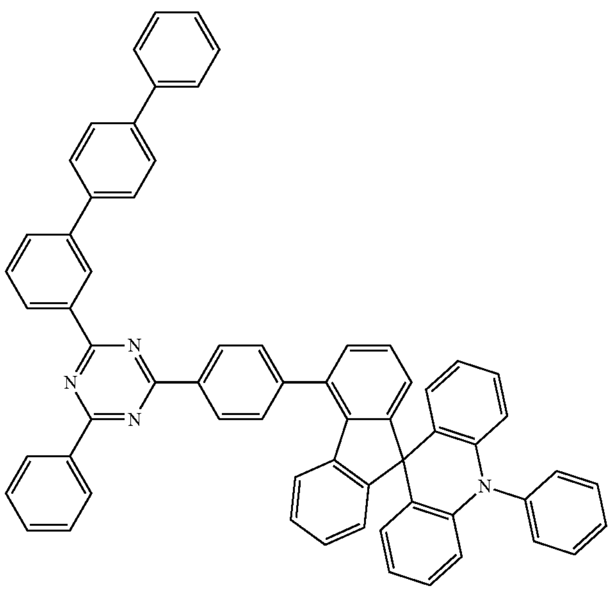
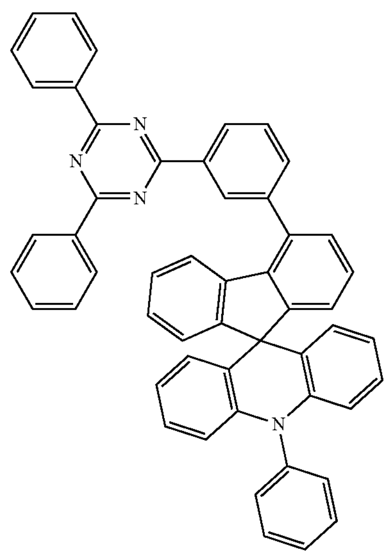
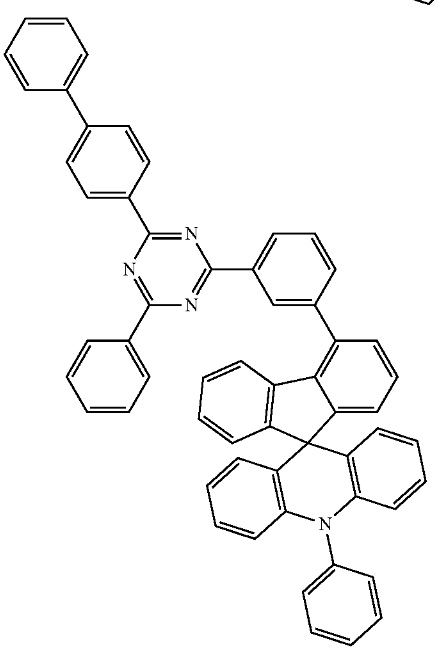
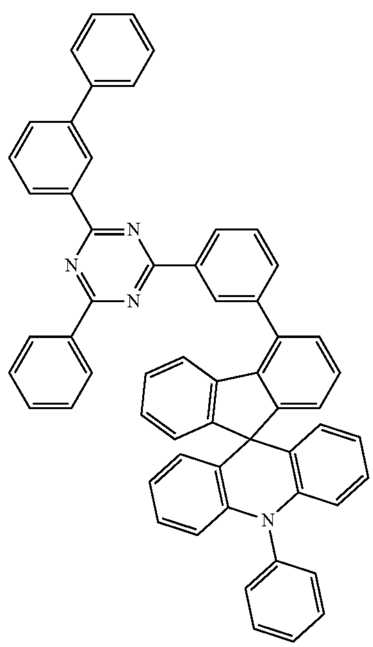

-continued
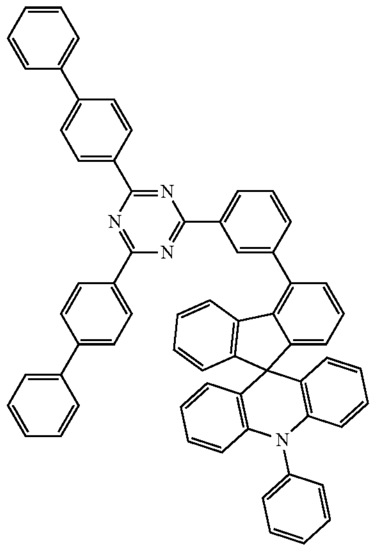
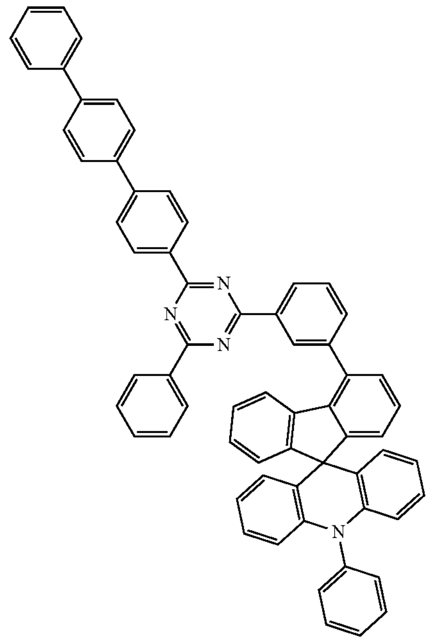
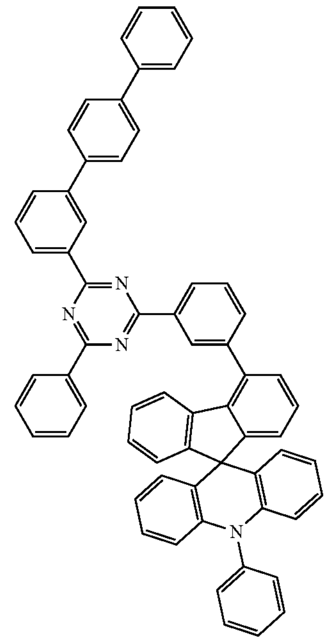
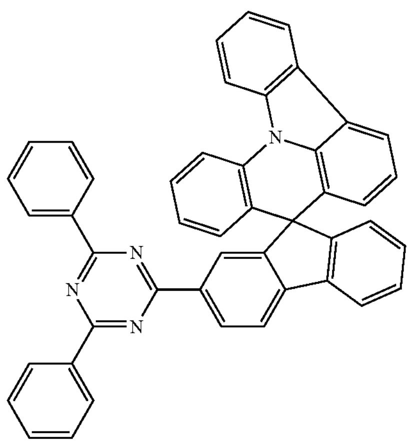
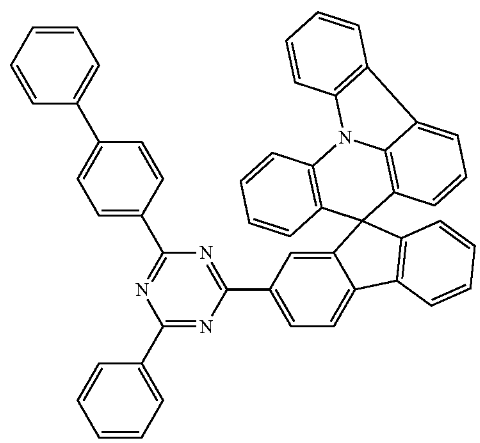
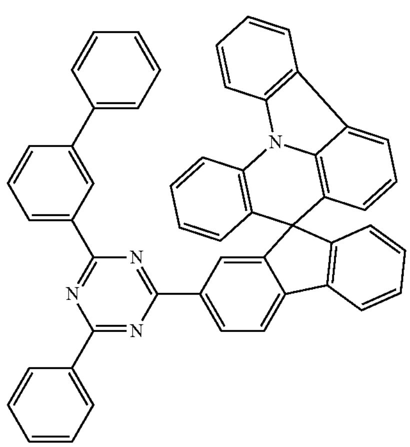
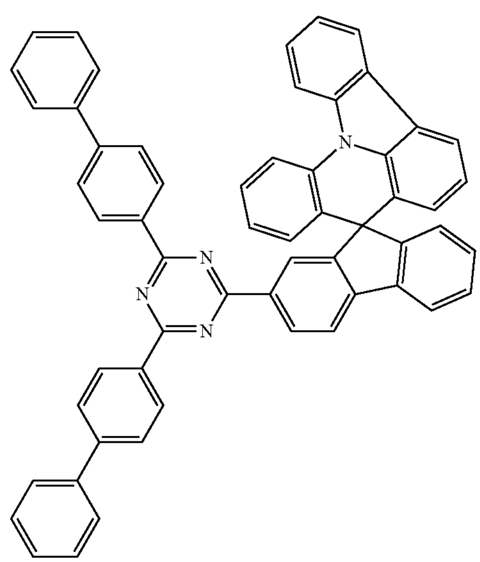

-continued
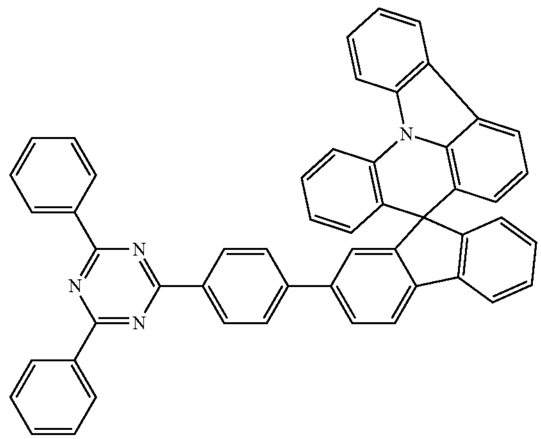
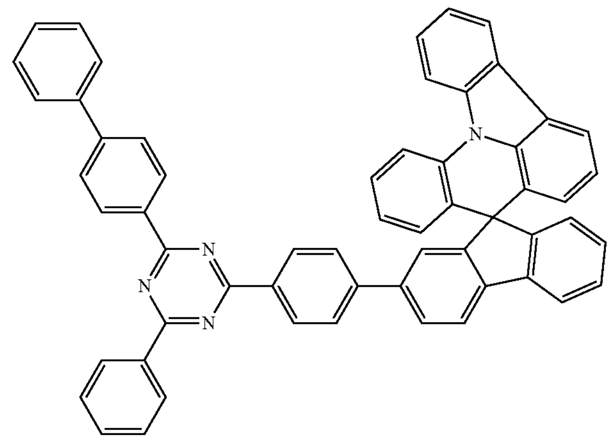
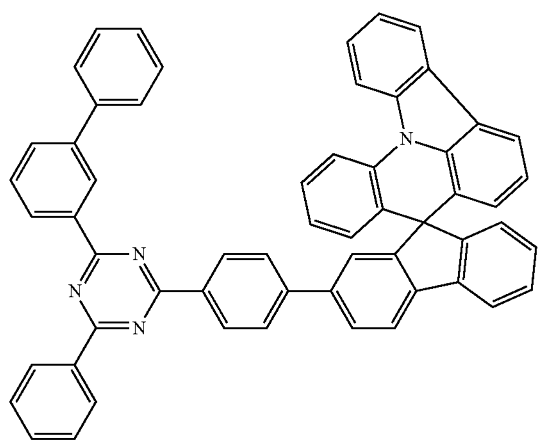
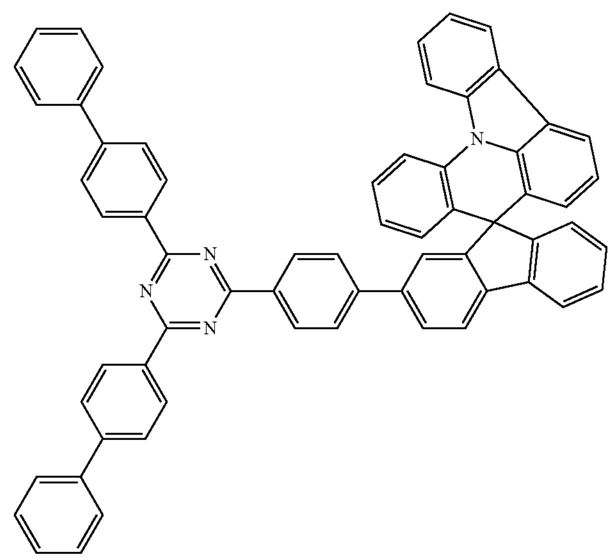
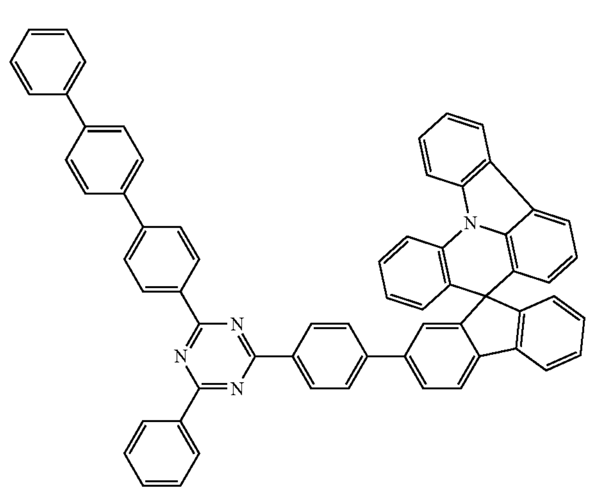
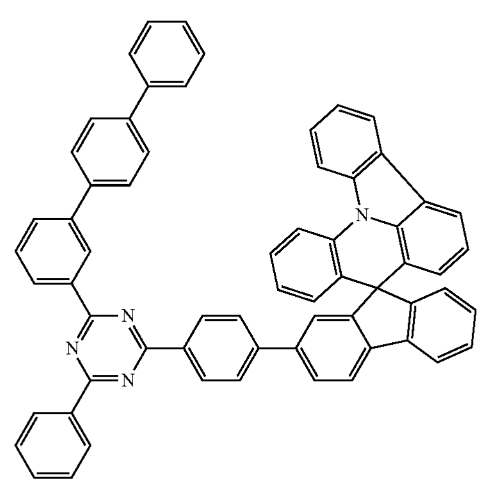

-continued
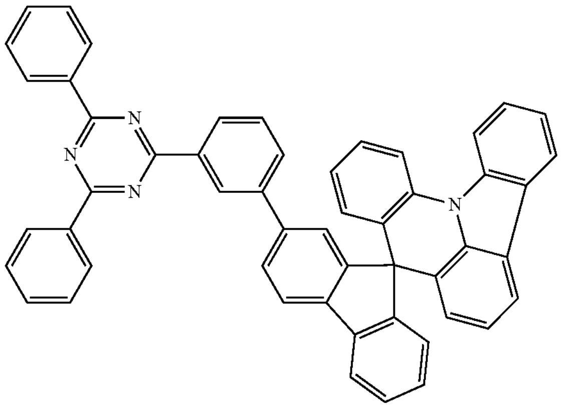
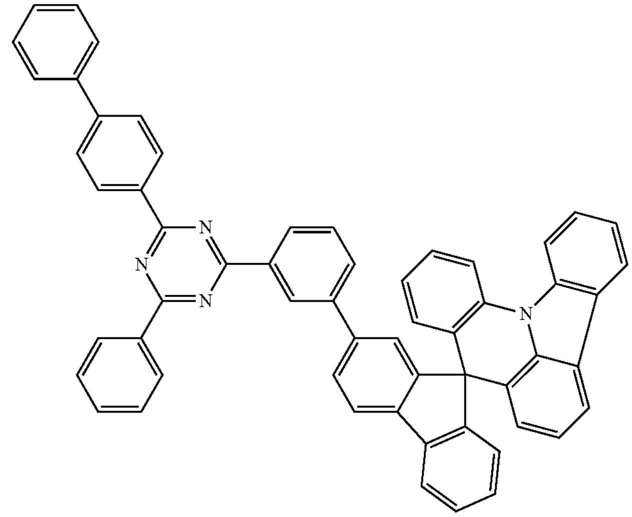
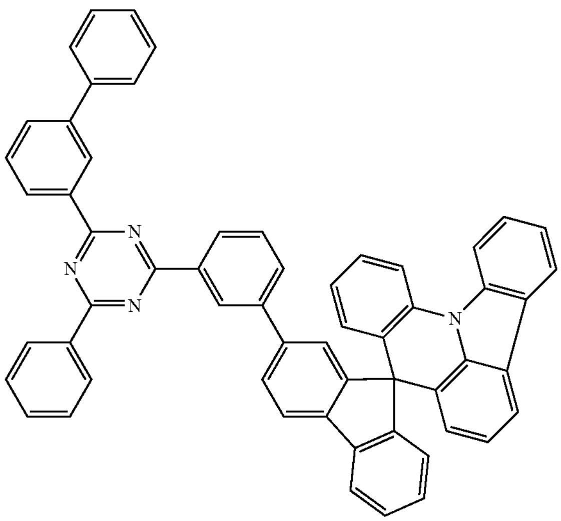
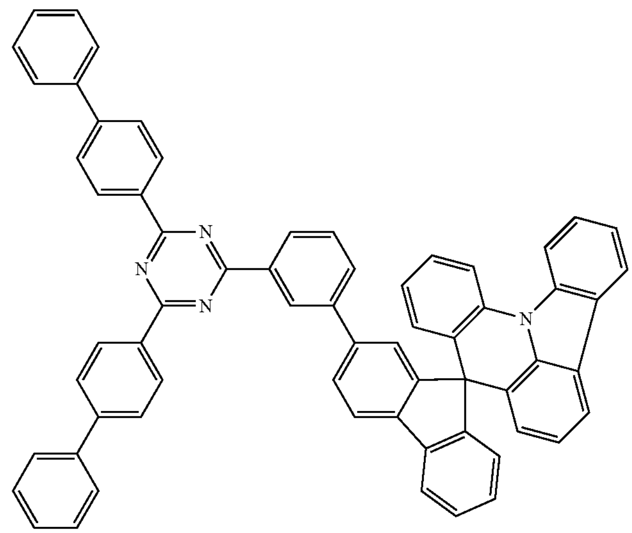
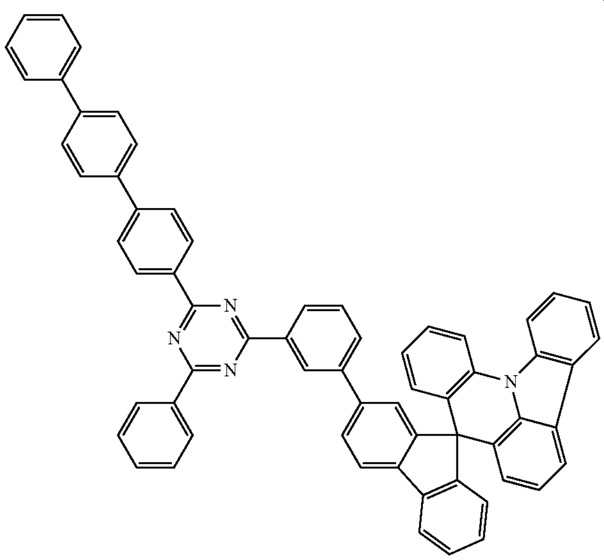
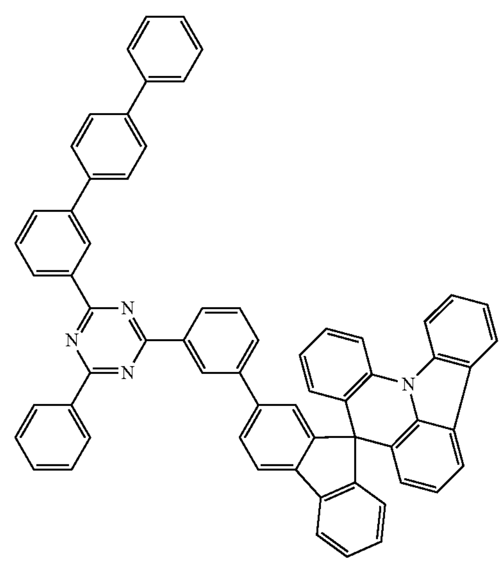

-continued
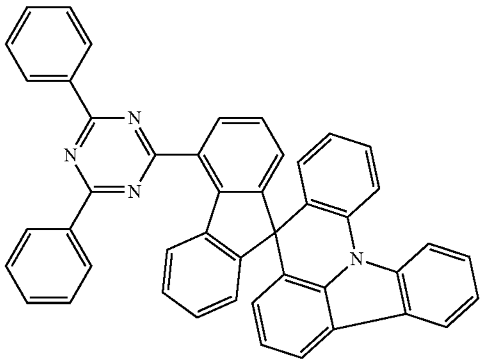
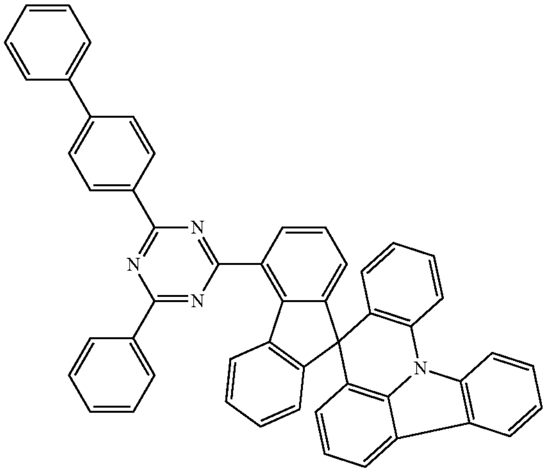
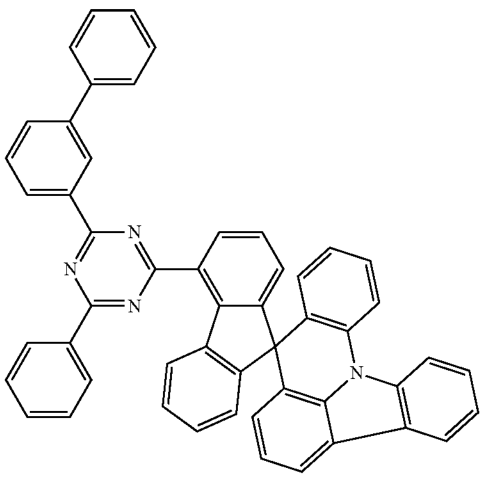
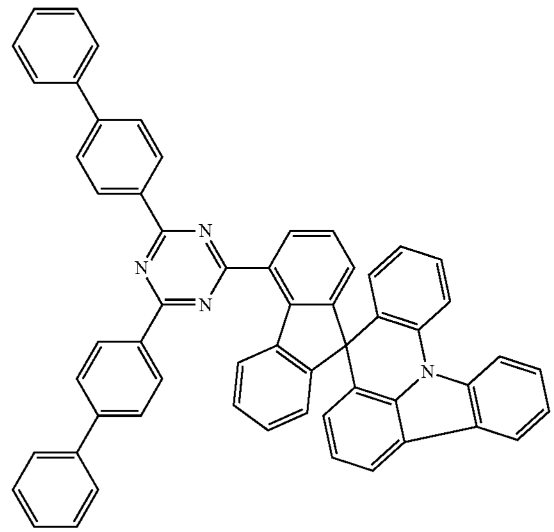
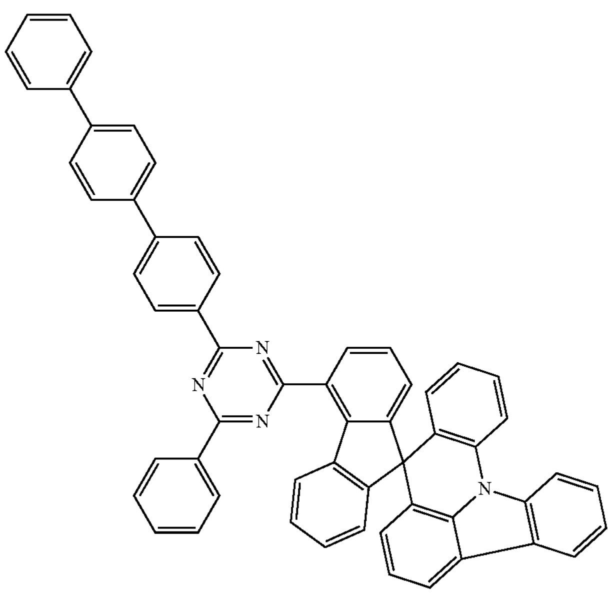
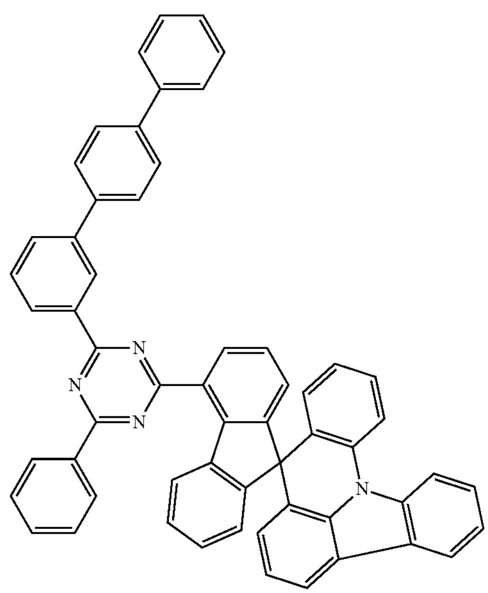

-continued
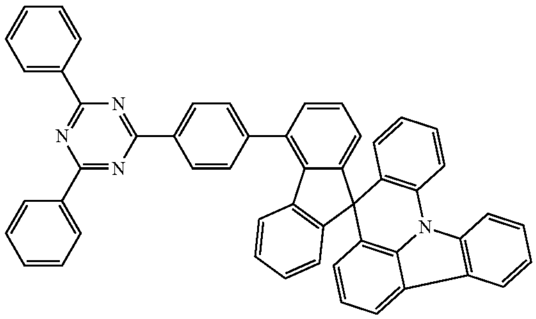
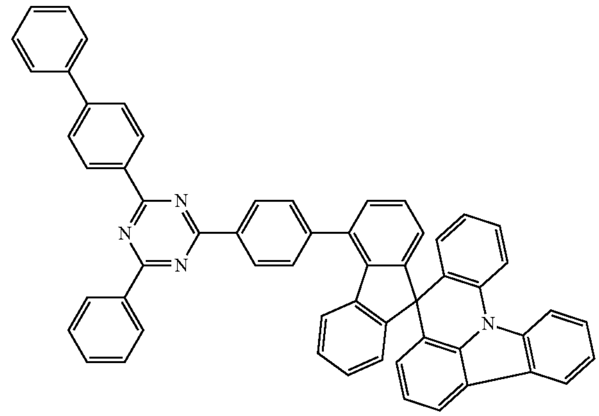
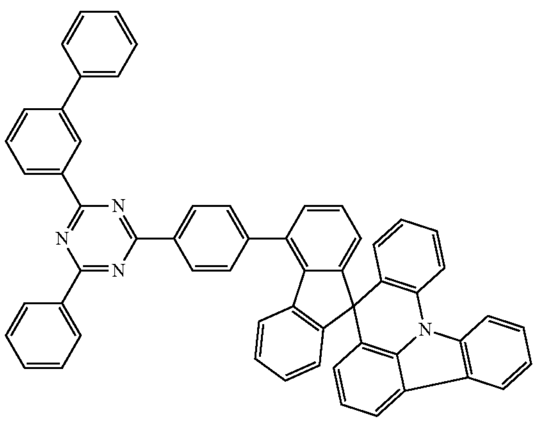
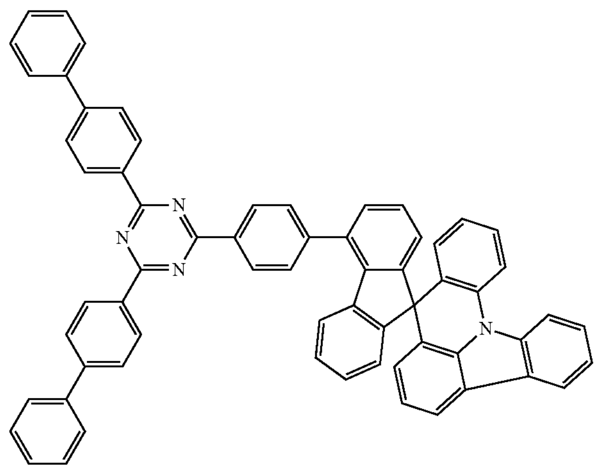
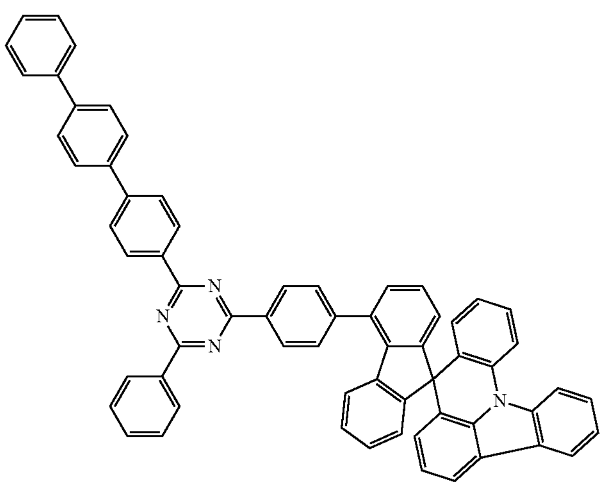
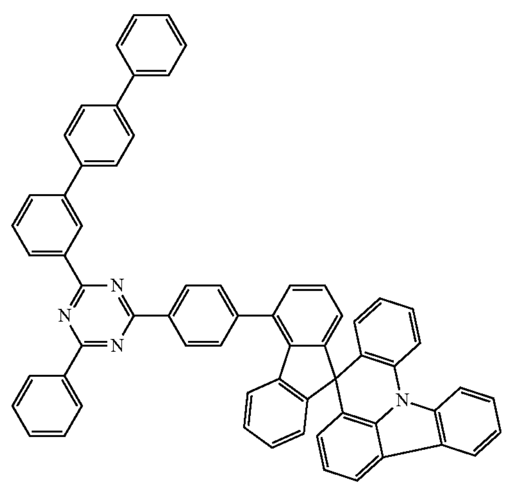

-continued
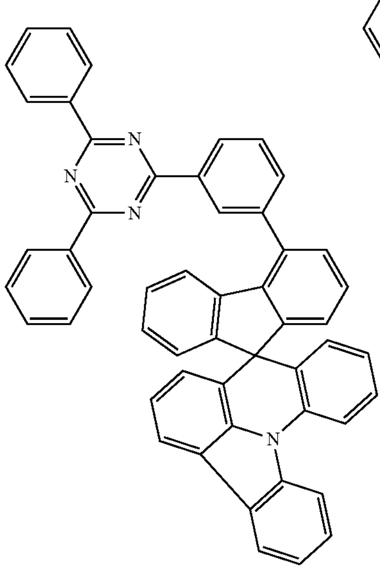
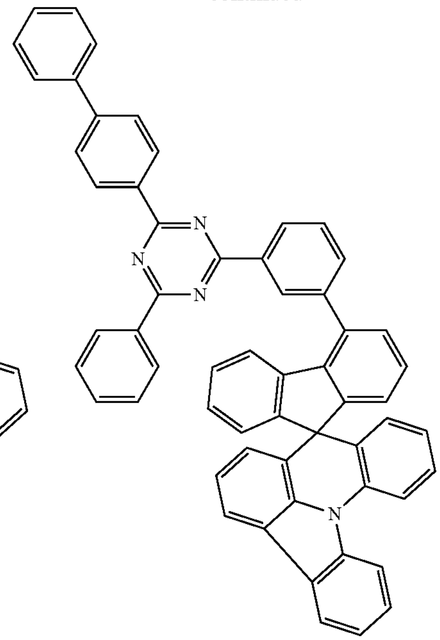
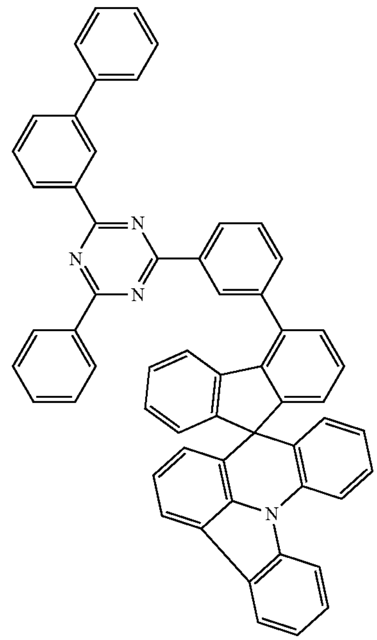
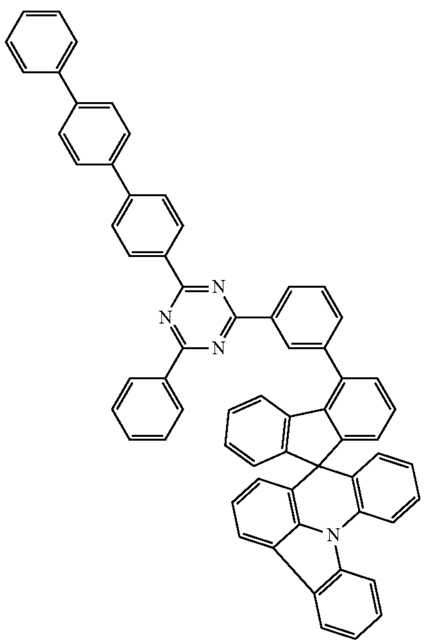
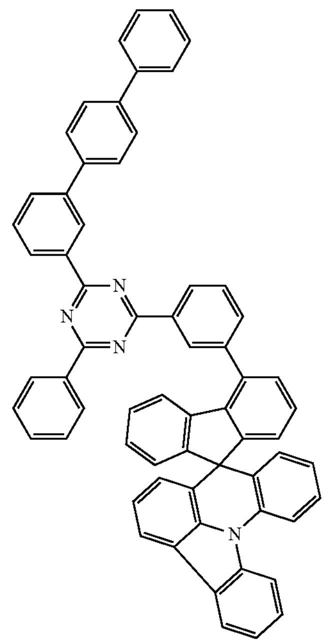
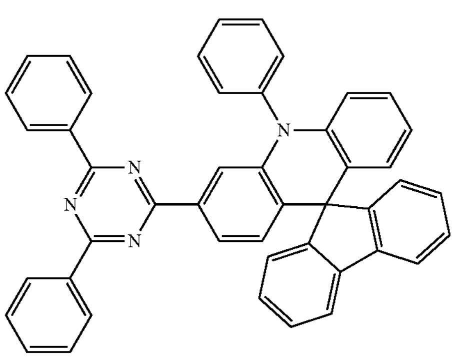
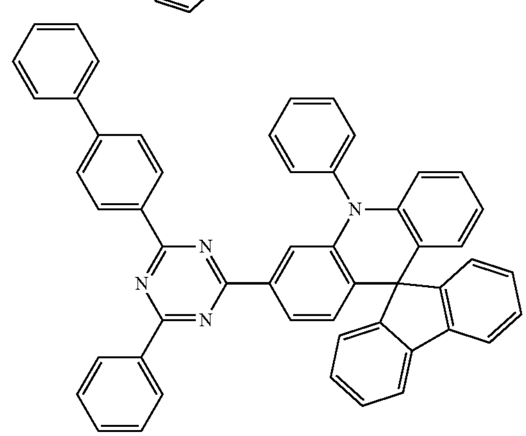

-continued
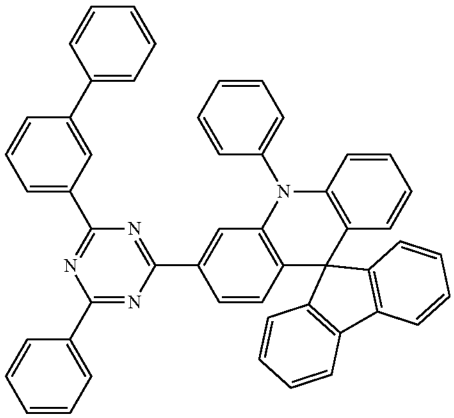
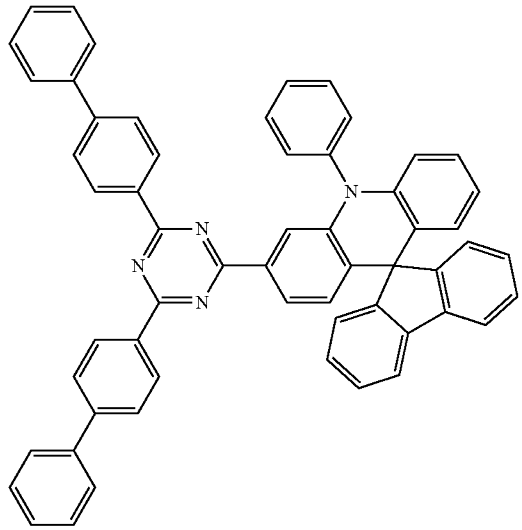
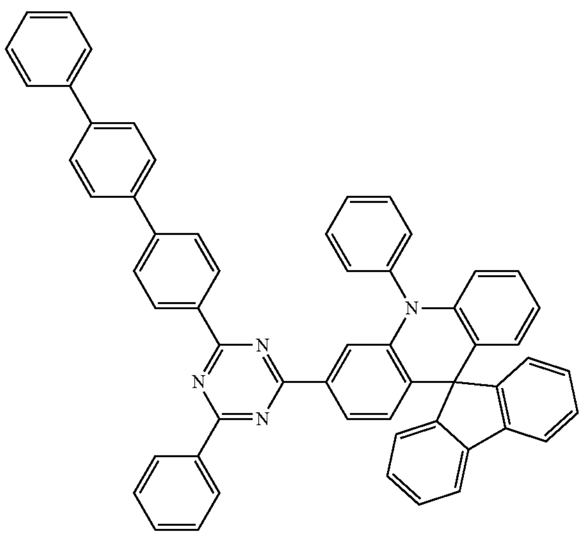
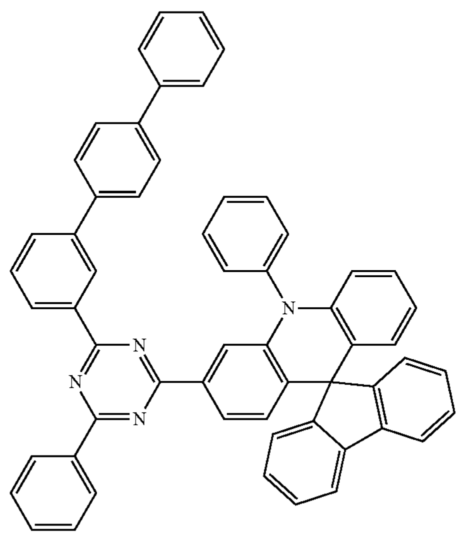
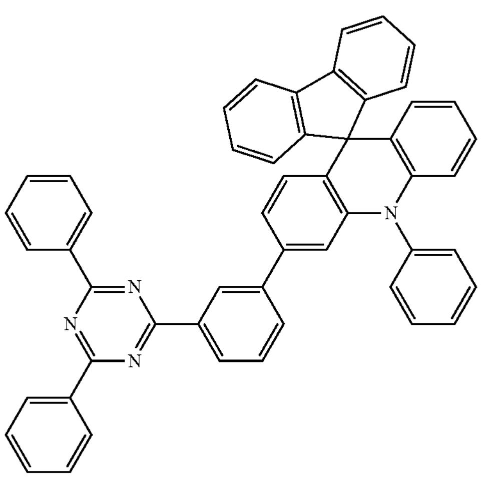
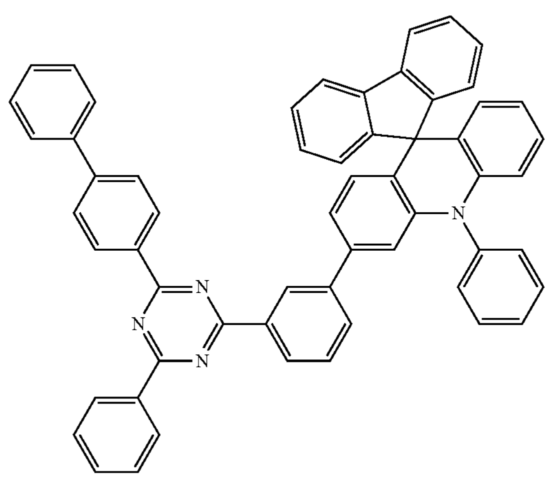

-continued
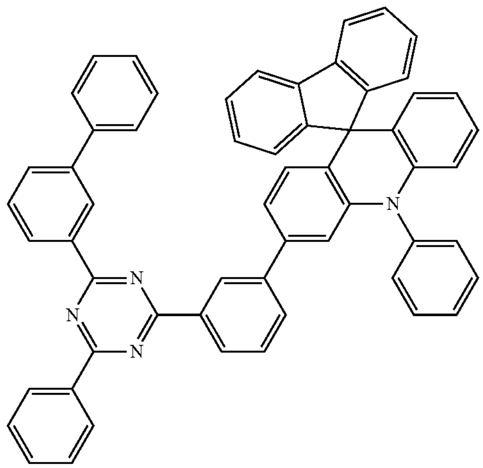
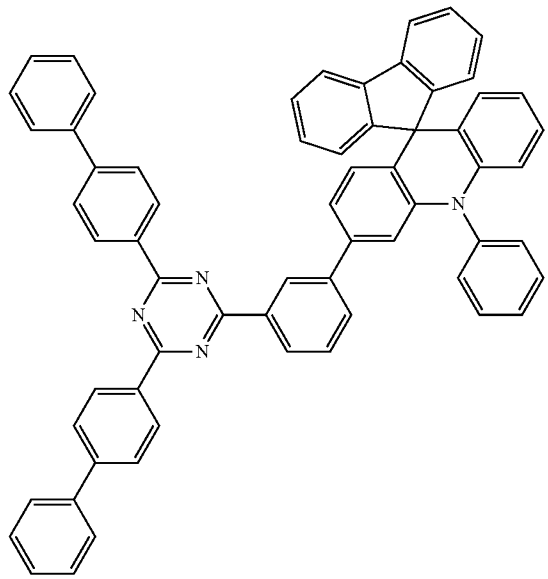
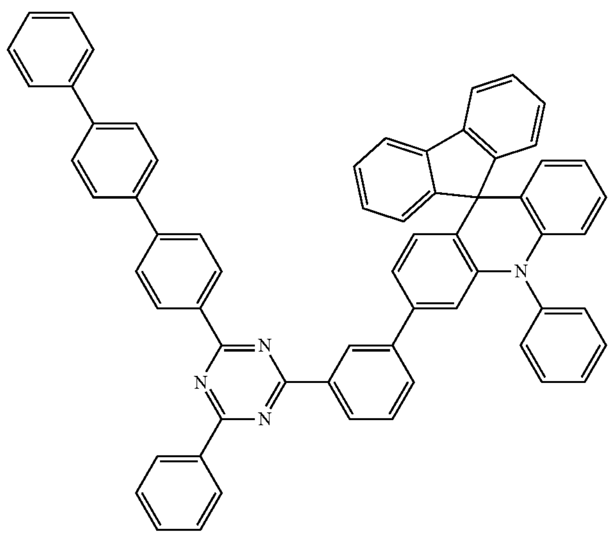
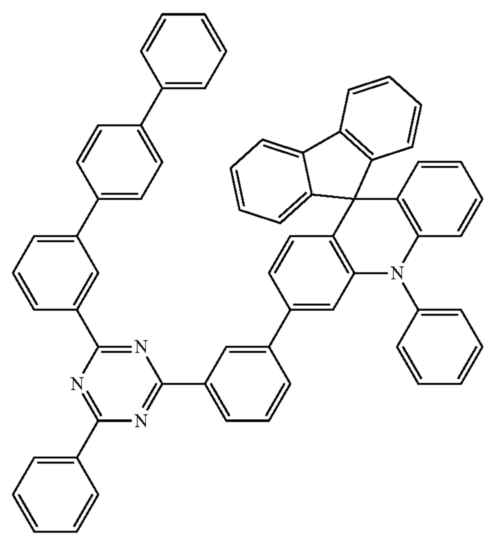
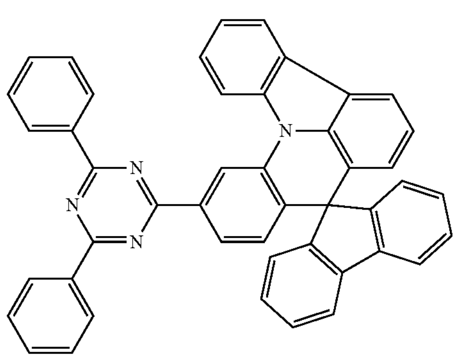
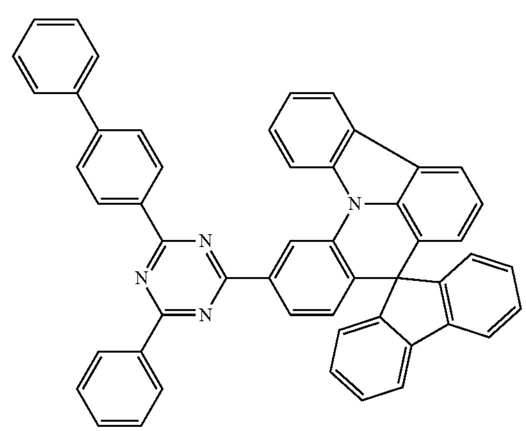

-continued
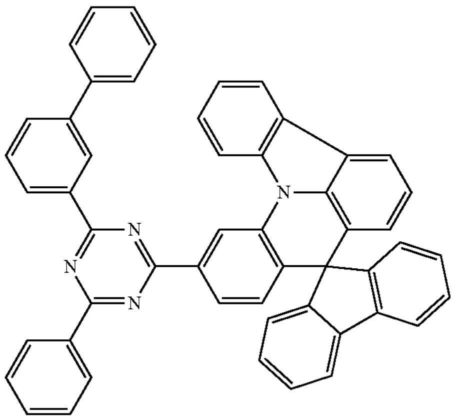
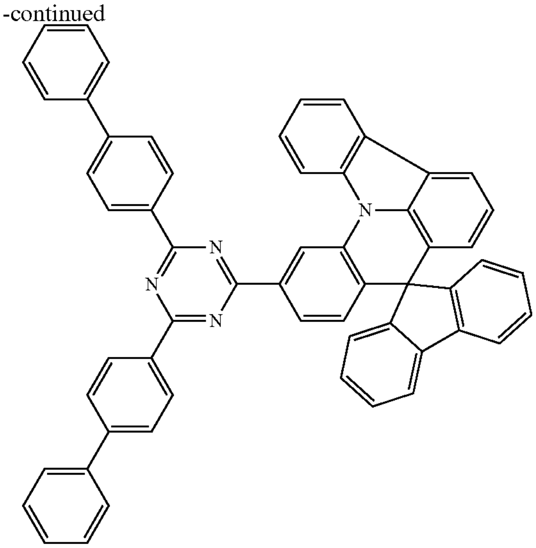
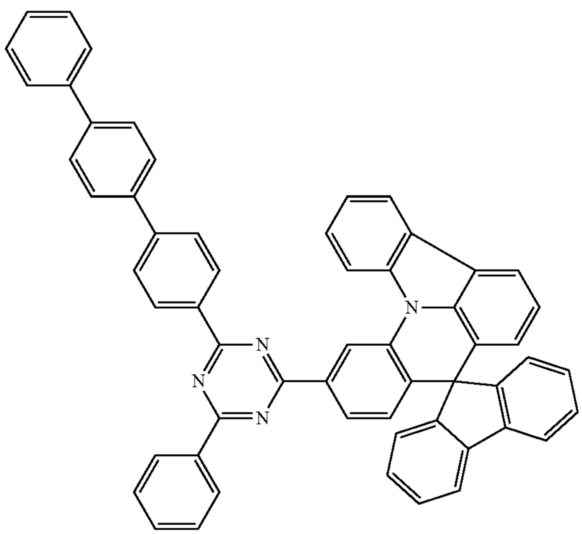
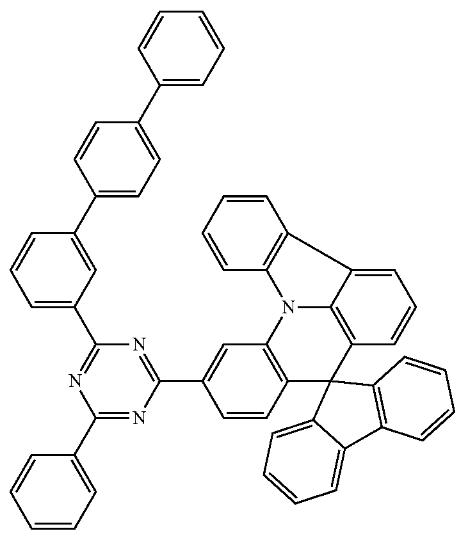
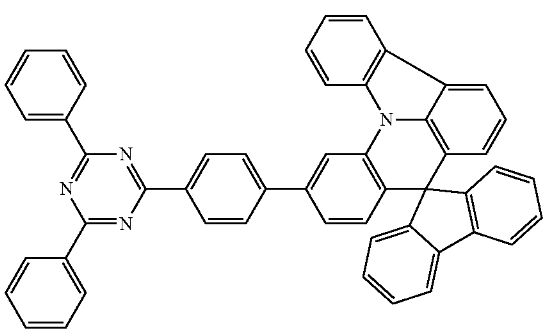
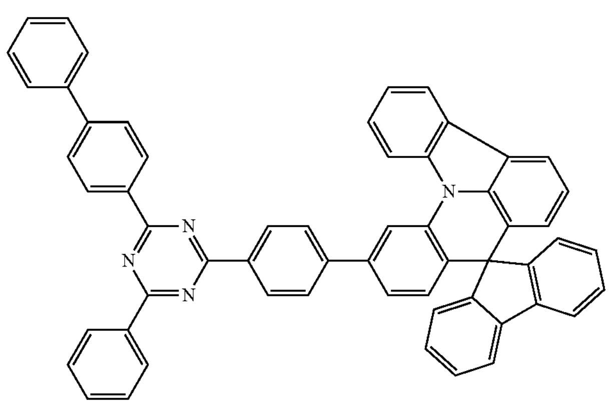

-continued
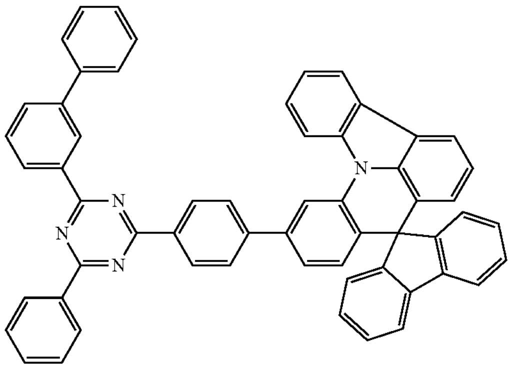
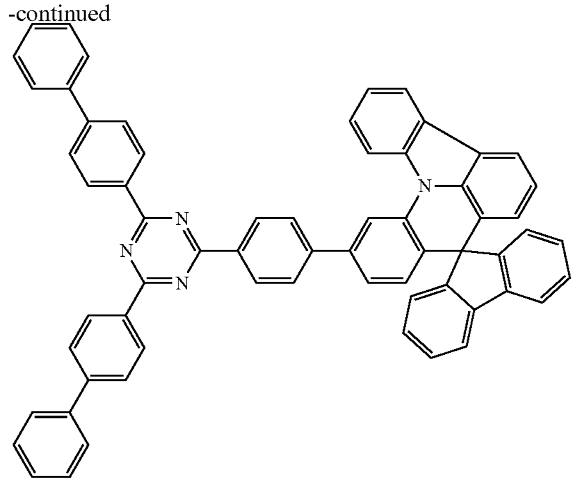
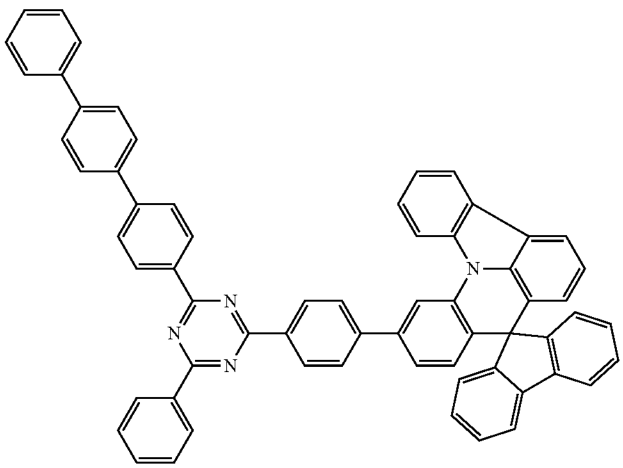
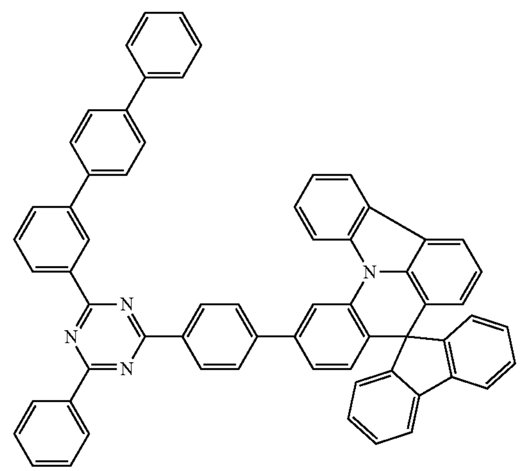
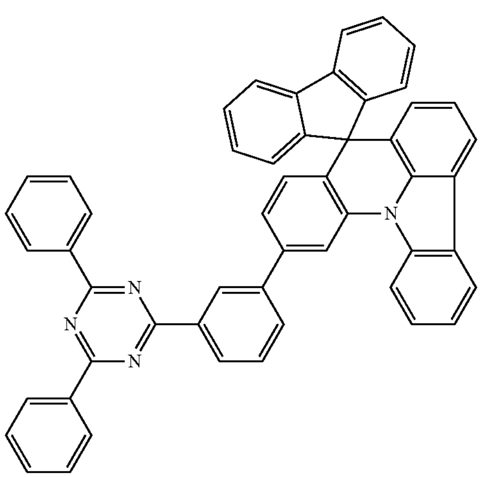
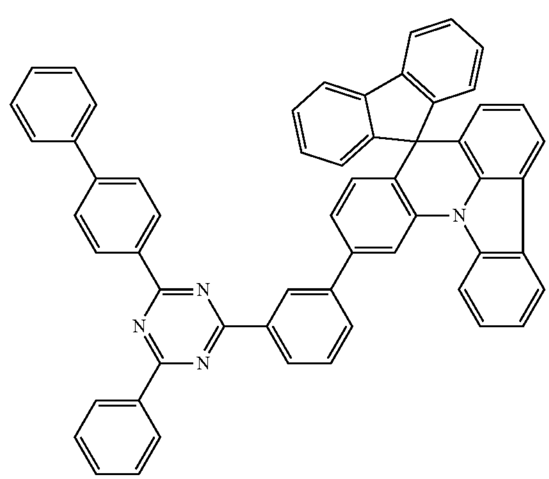

-continued
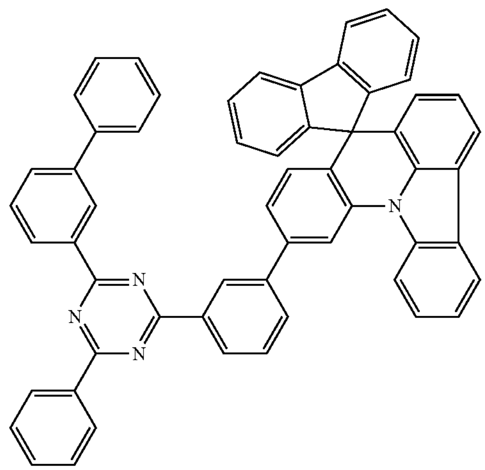
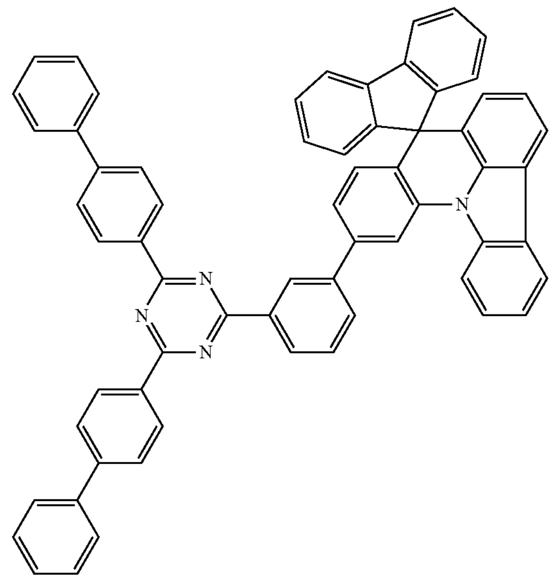
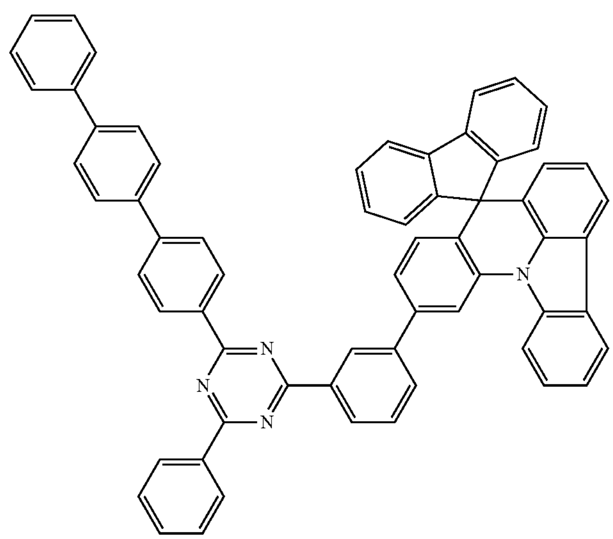
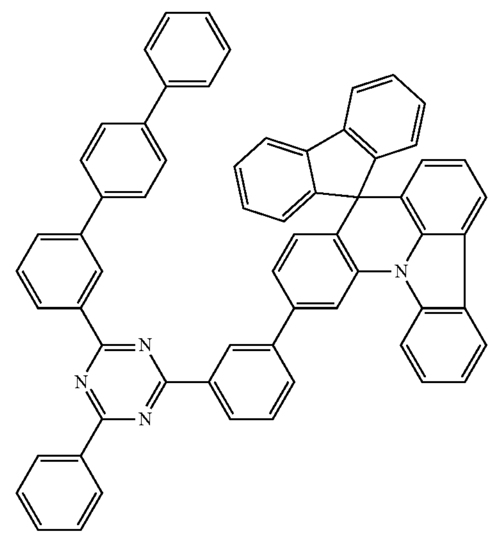
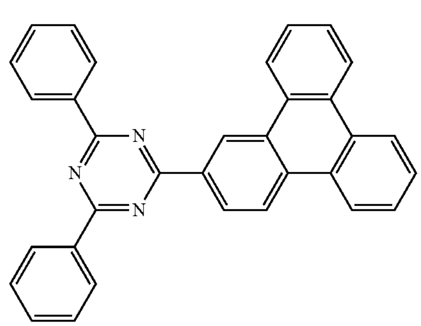
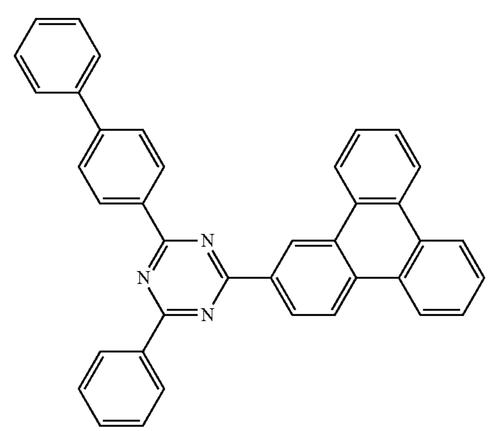

-continued
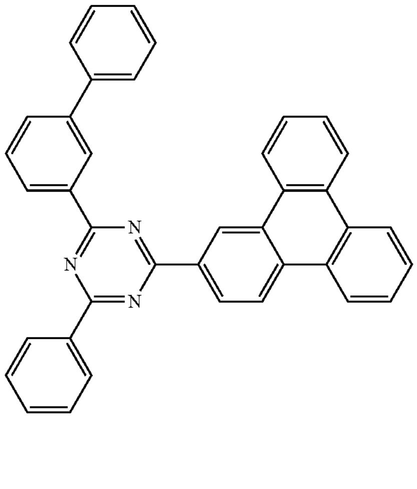
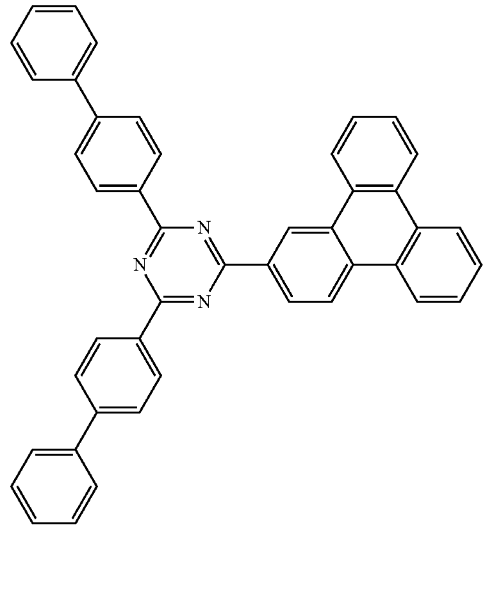
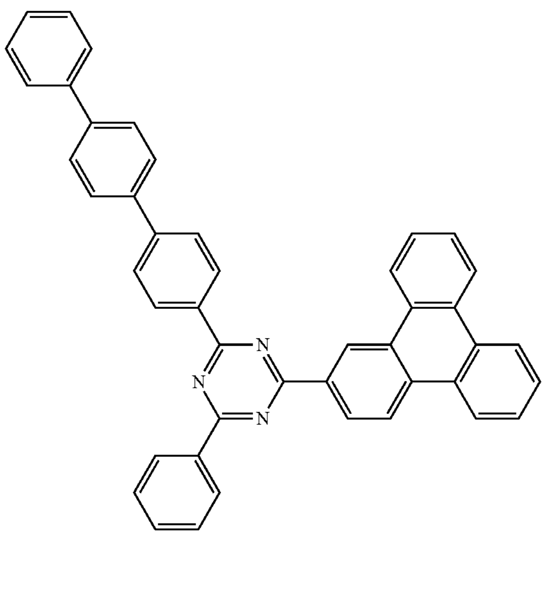
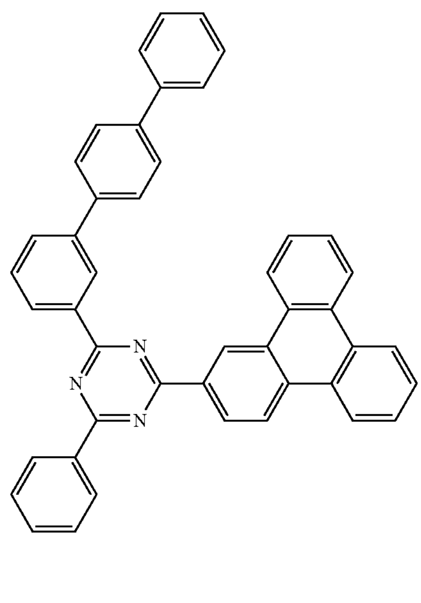
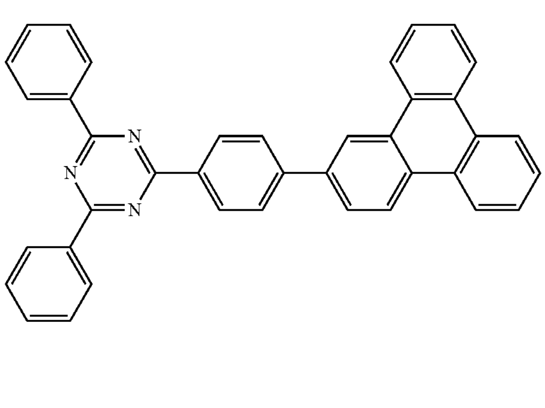
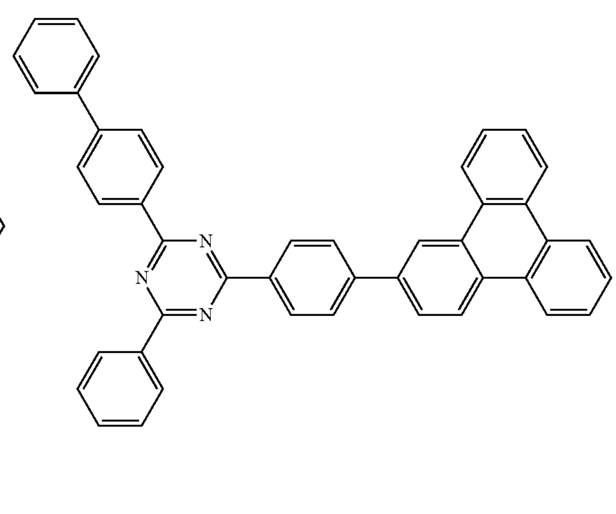

-continued
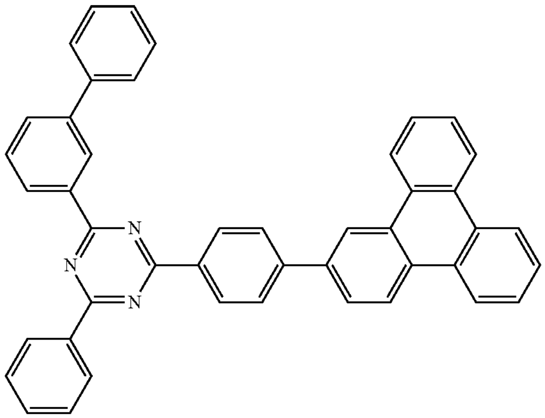
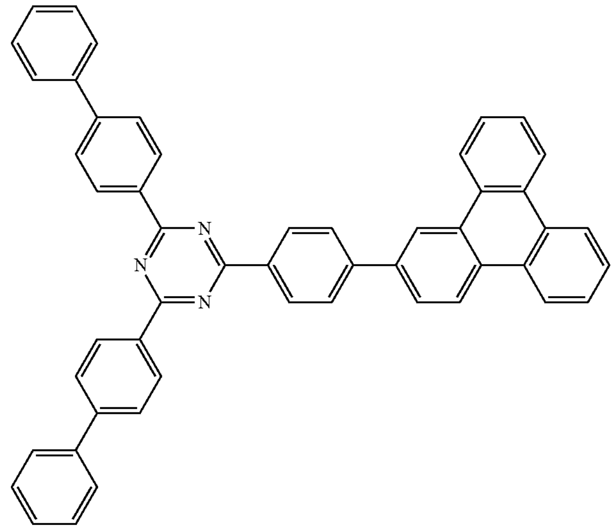
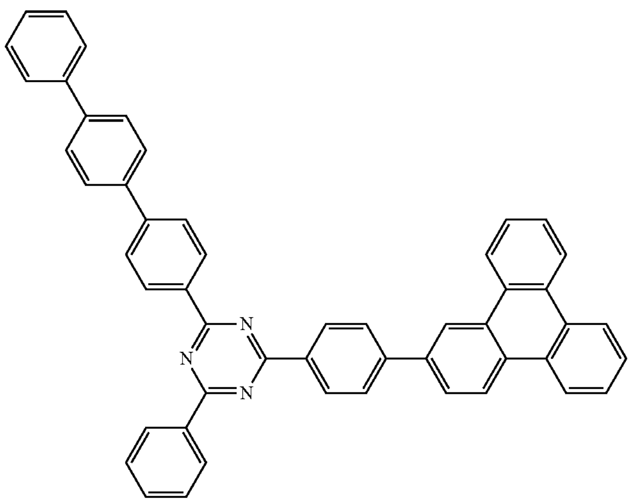
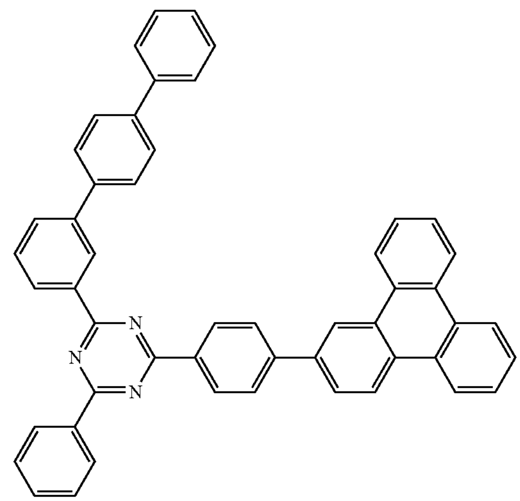
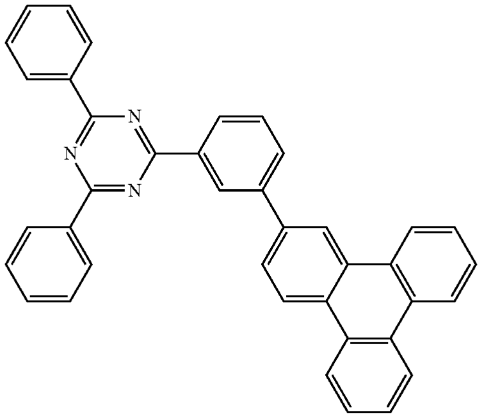
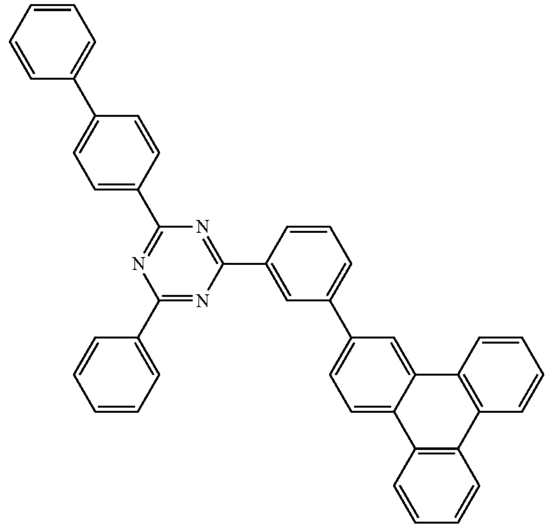

-continued
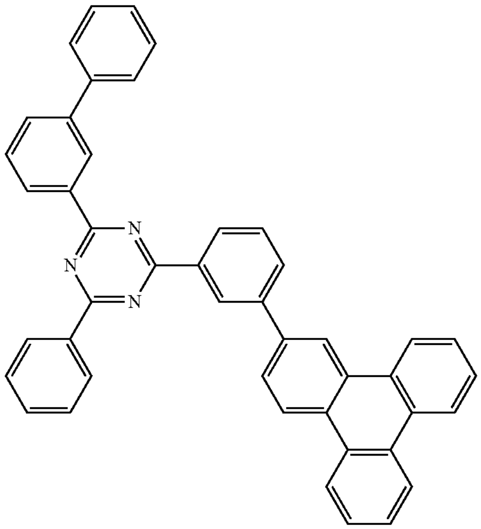
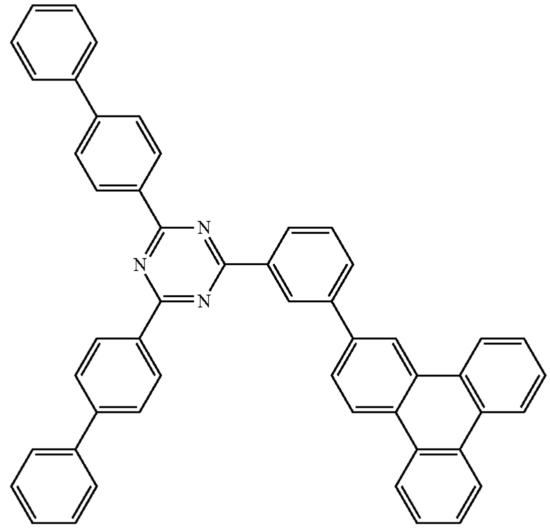
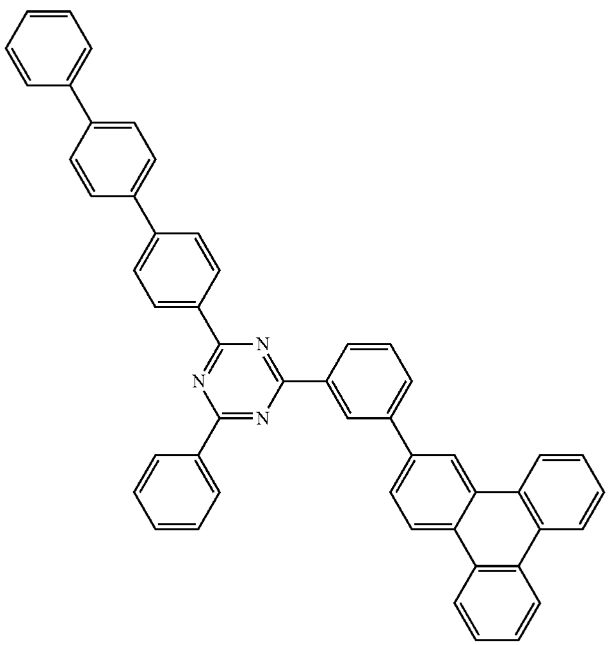
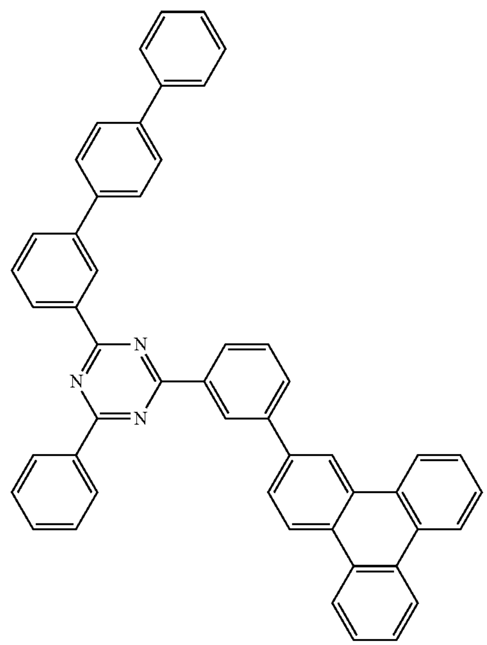
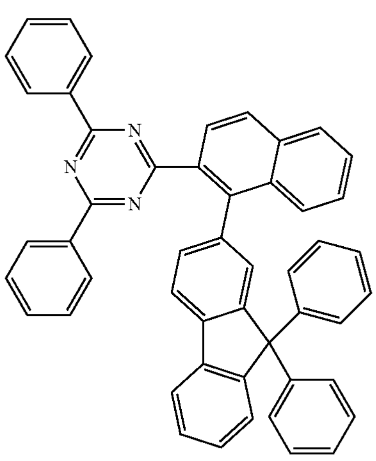
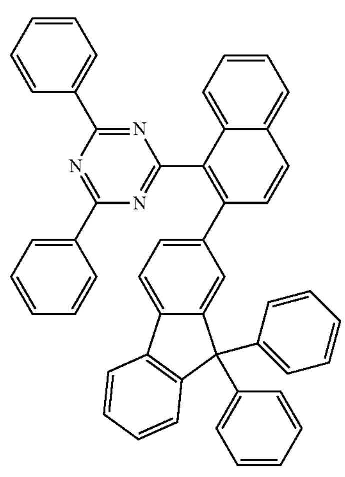

-continued
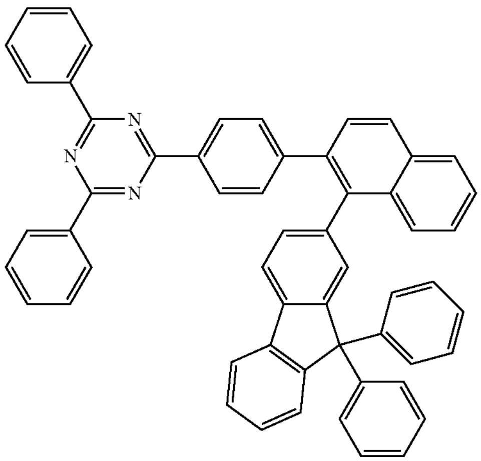
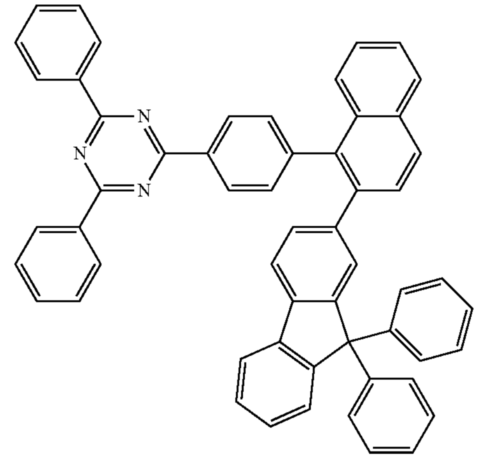
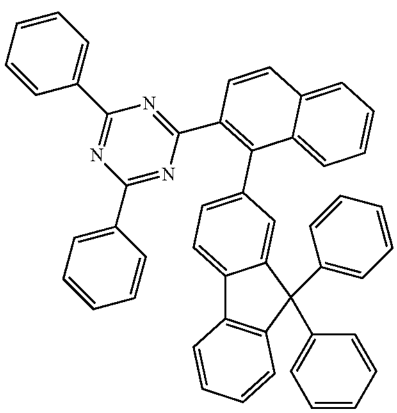
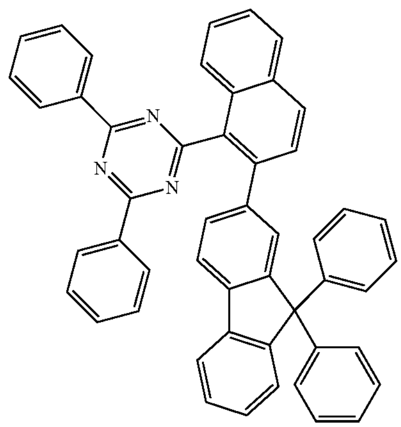
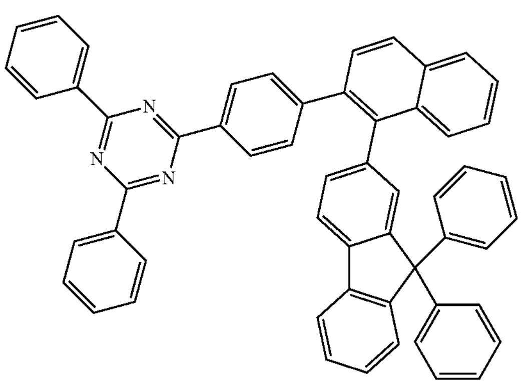
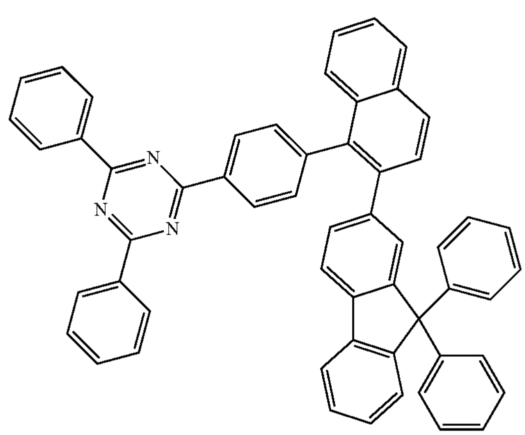

-continued
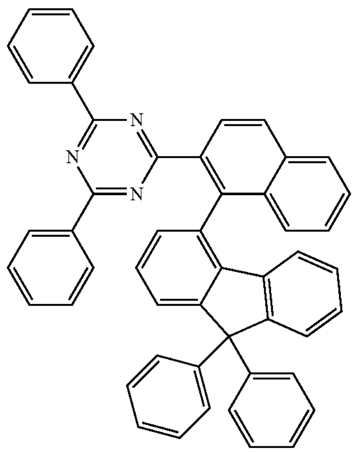
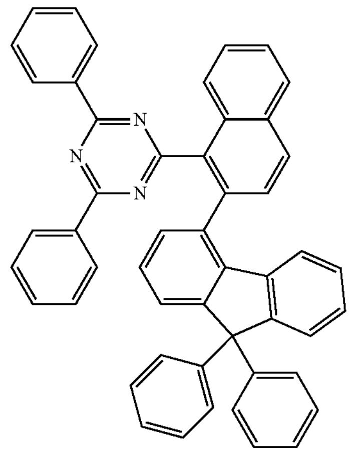
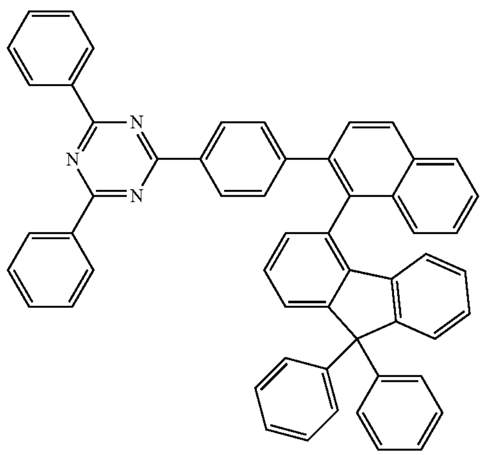
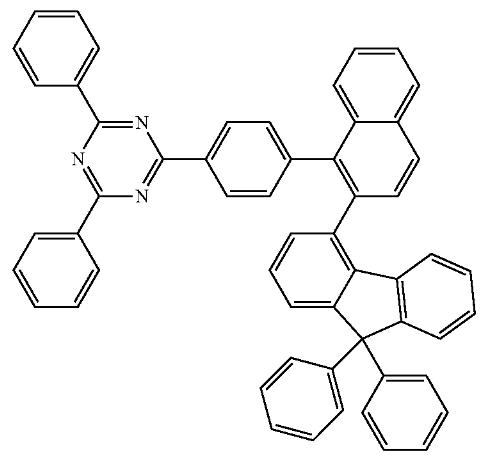
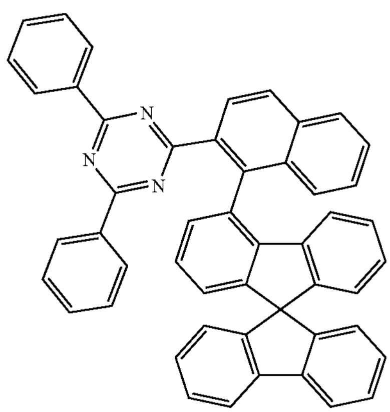
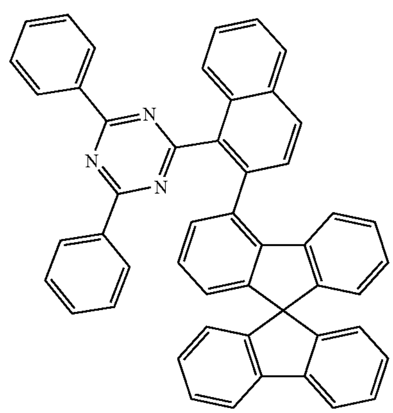
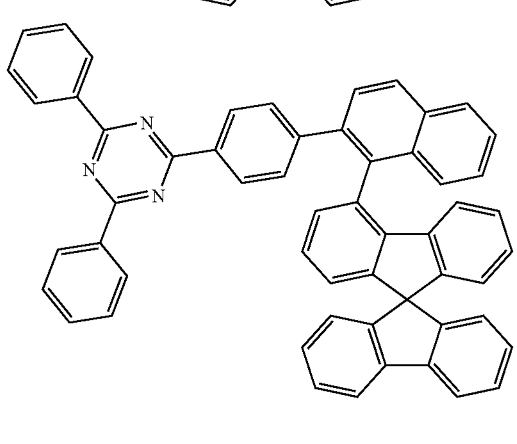
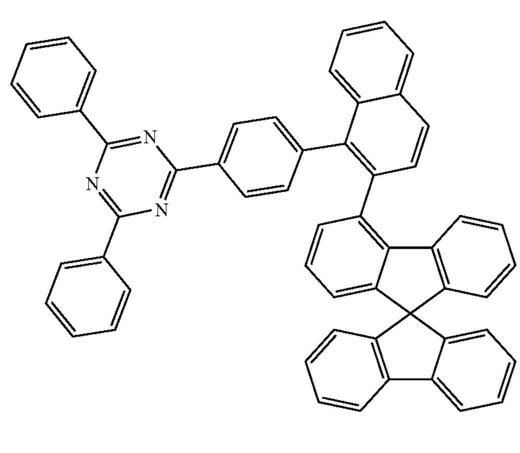

-continued
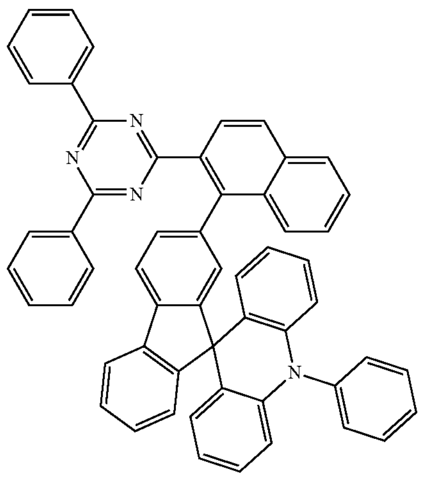
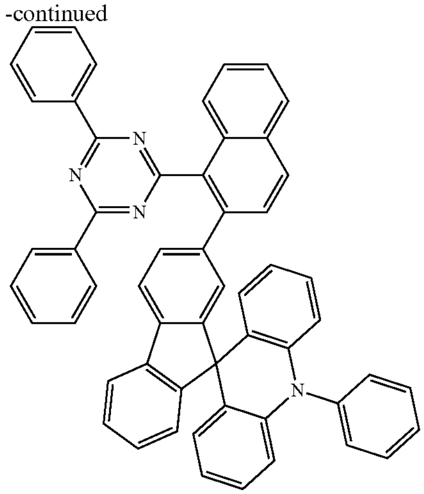
-continued
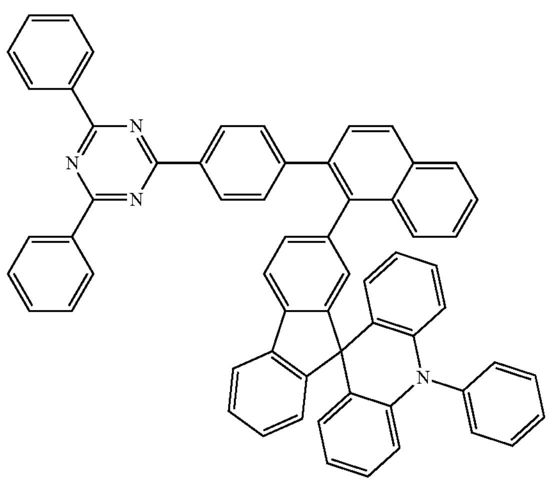
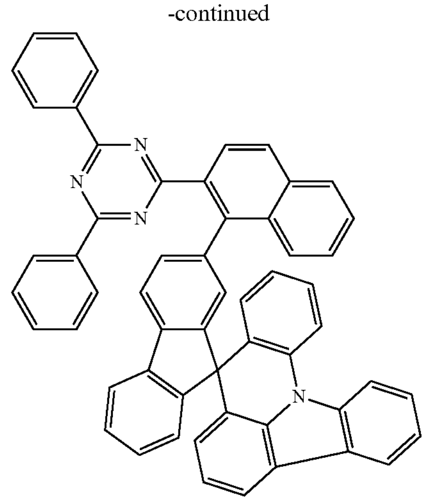
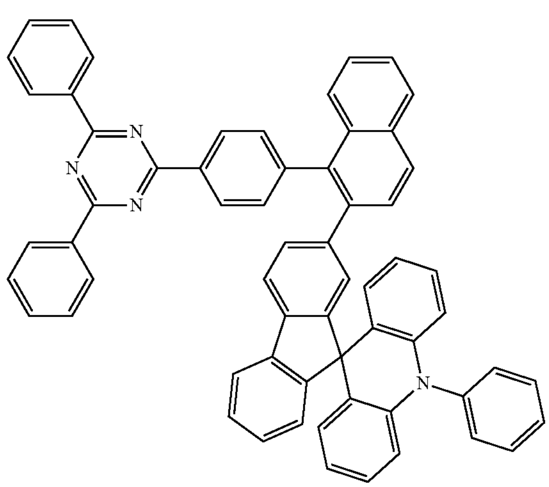
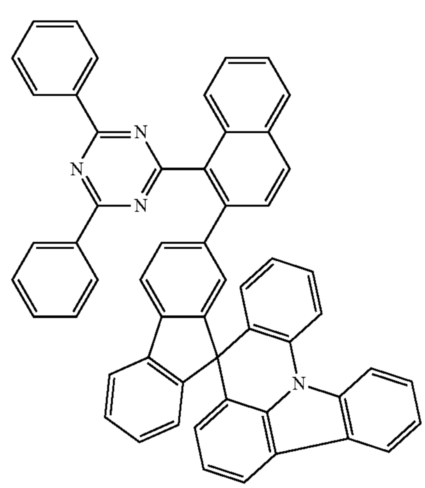

-continued
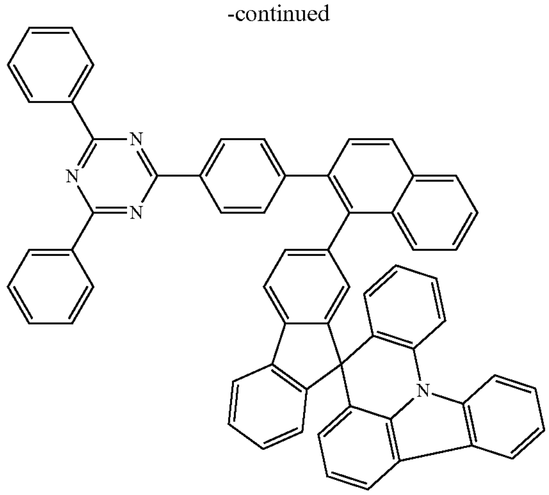
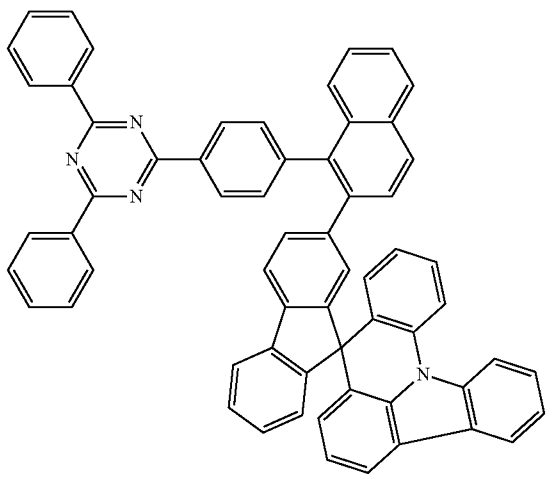
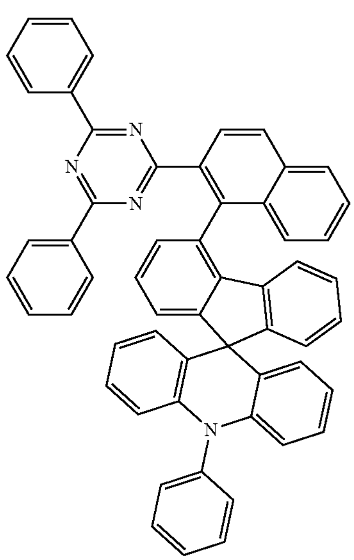
-continued
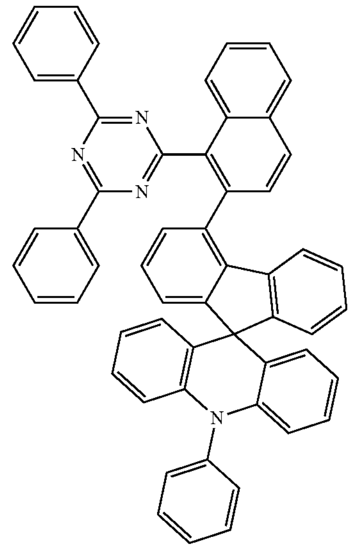
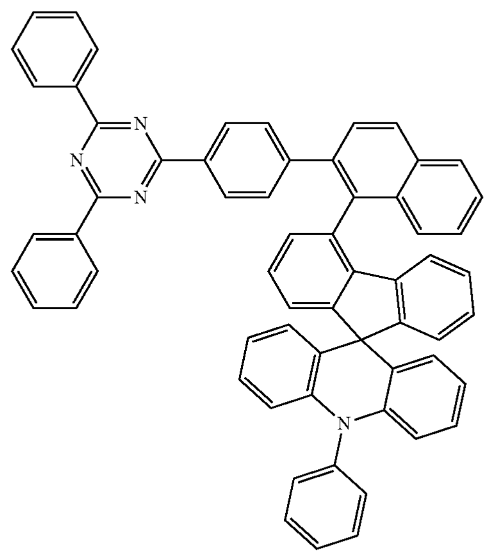
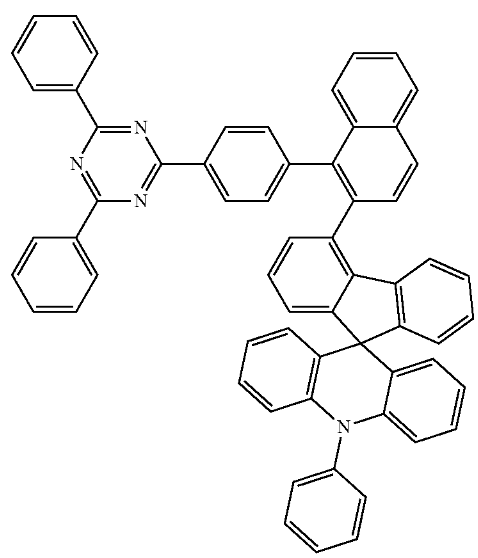

-continued
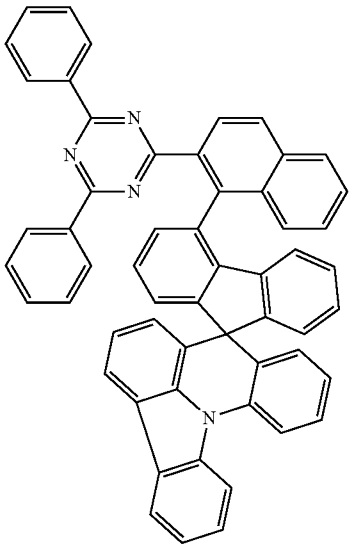
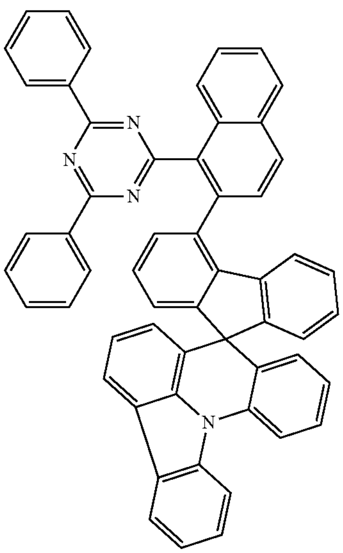
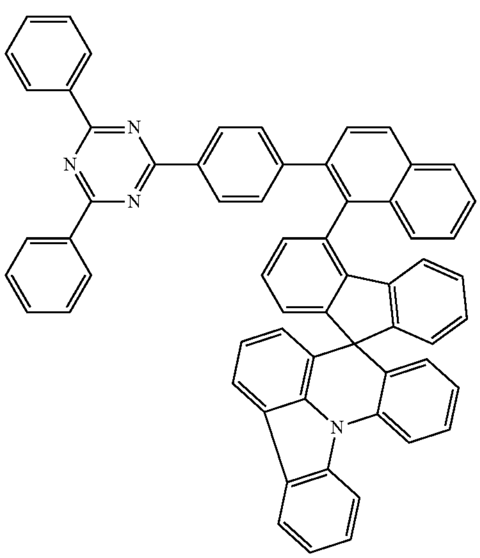
-continued
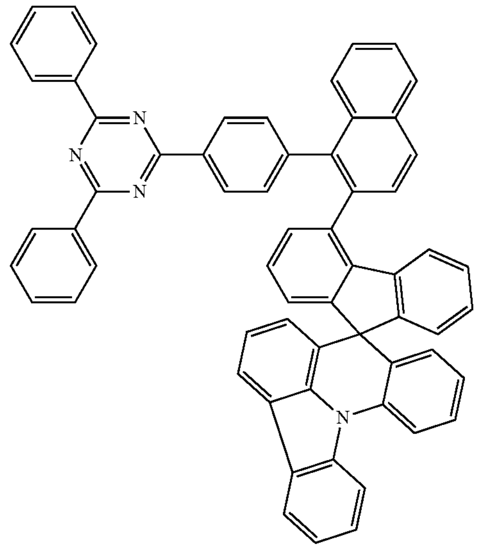
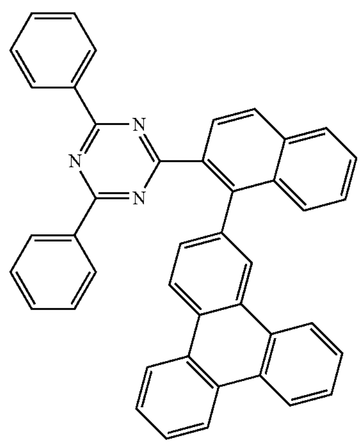
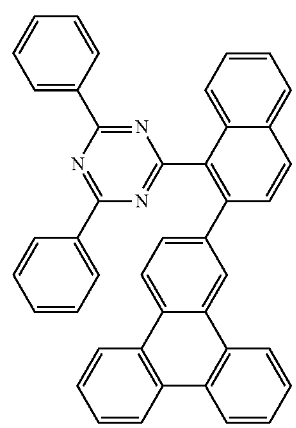

-continued
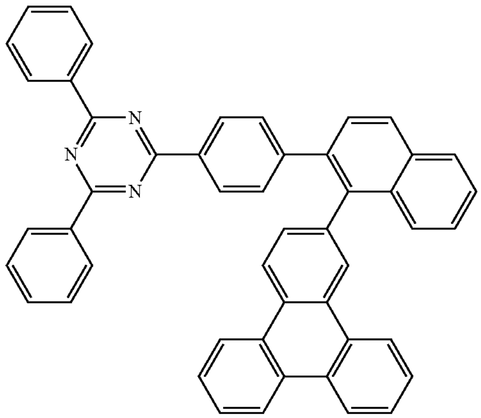
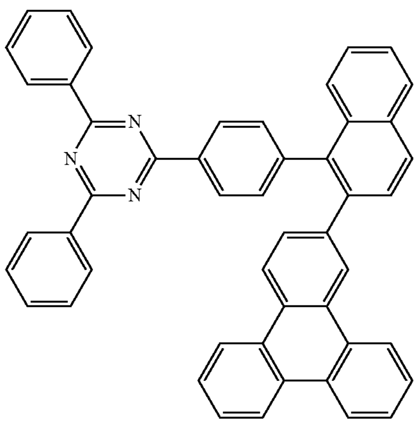
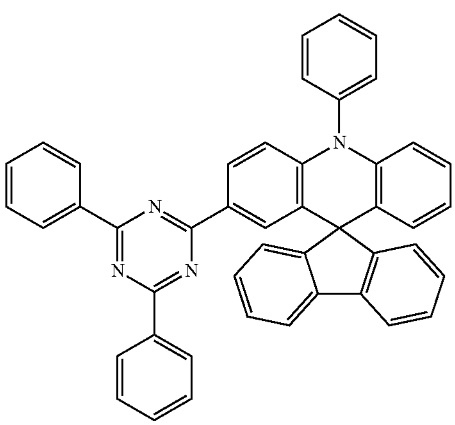
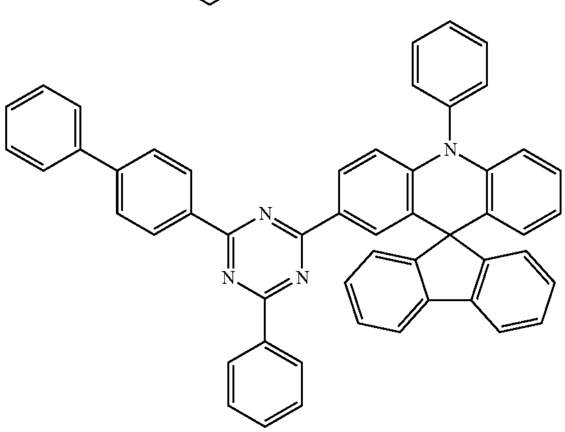
-continued
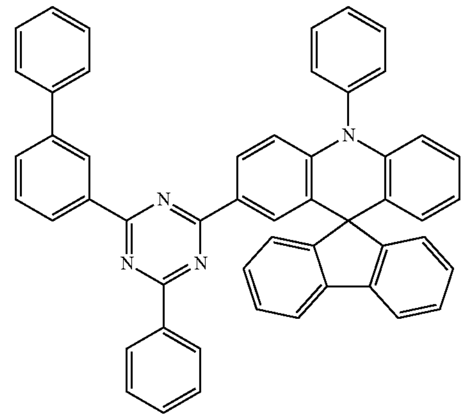
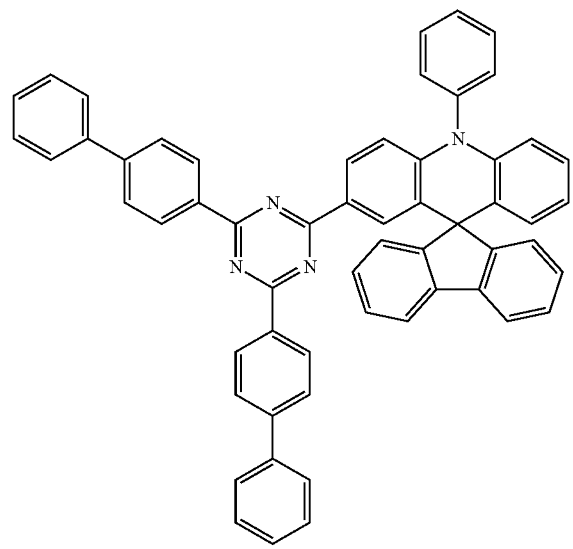
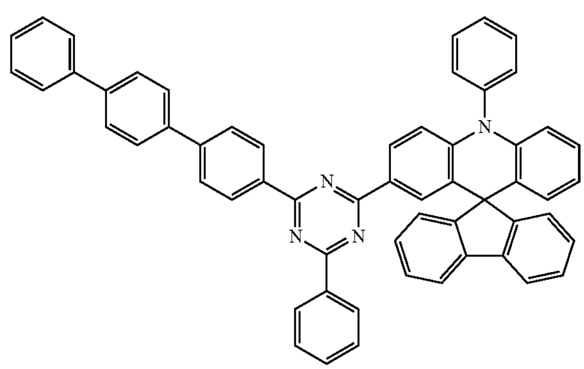

-continued
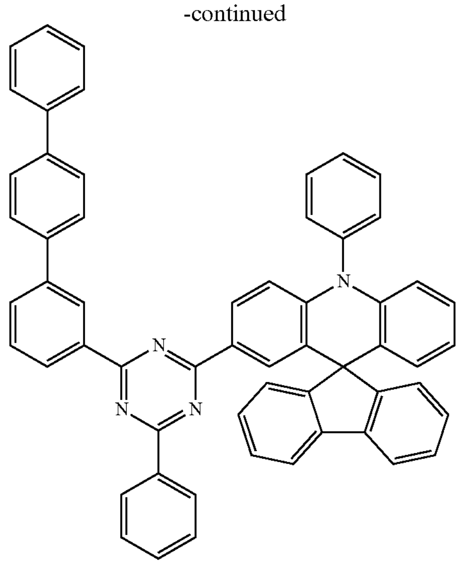
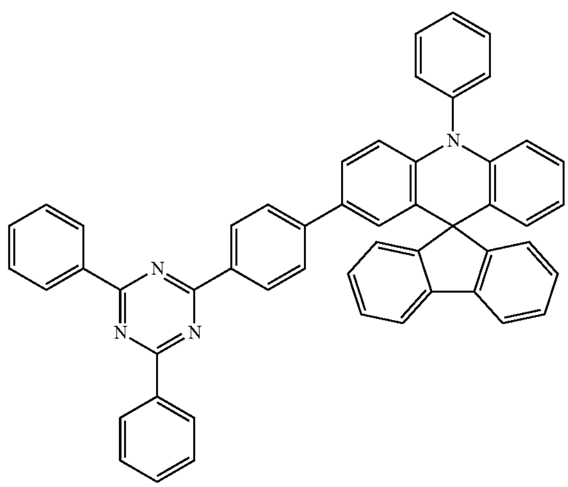
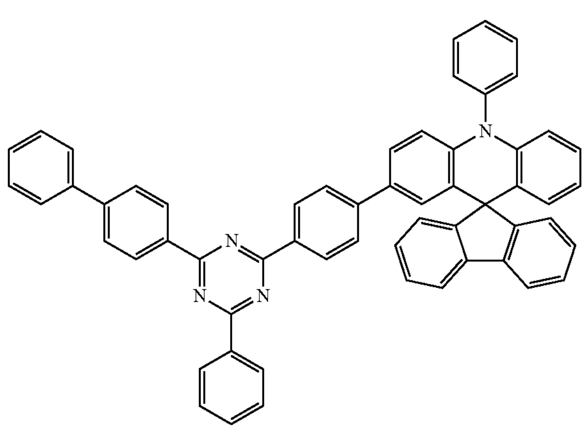
-continued
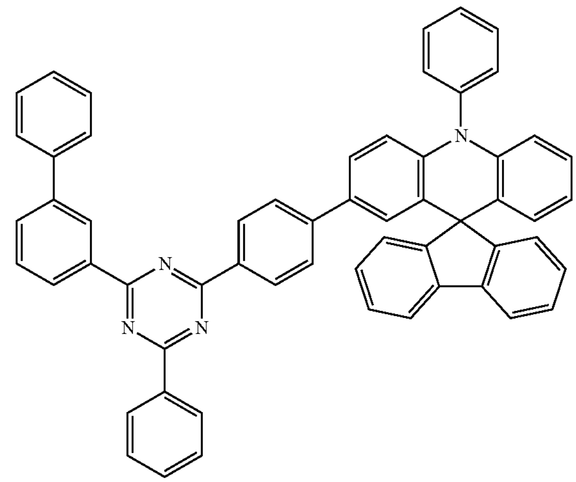
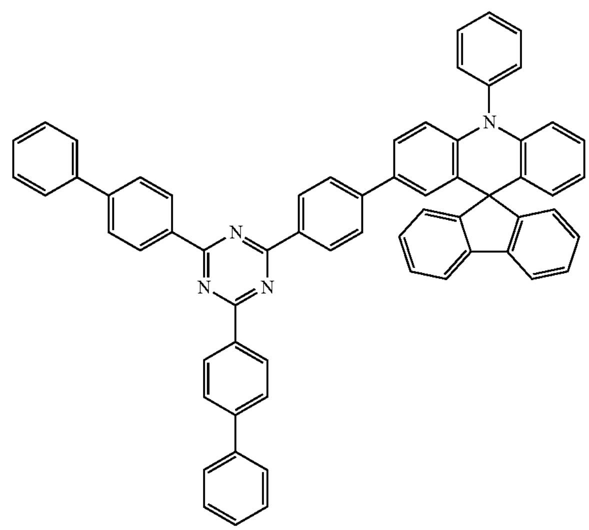
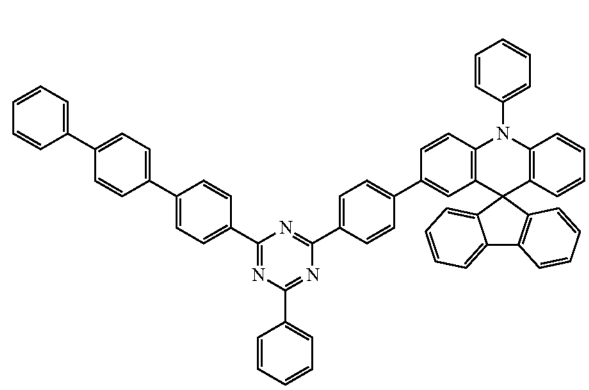

-continued
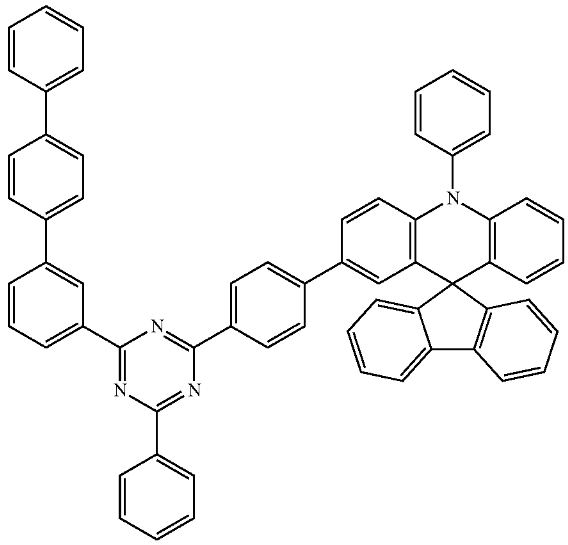
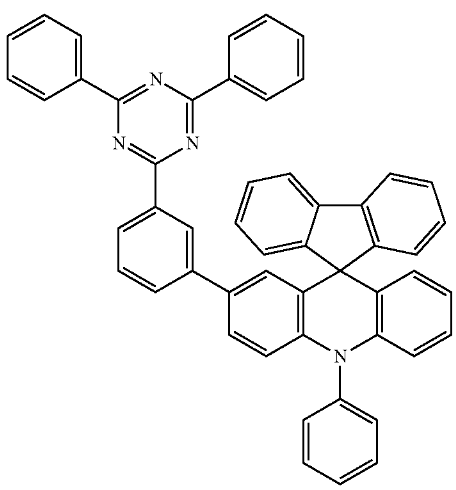
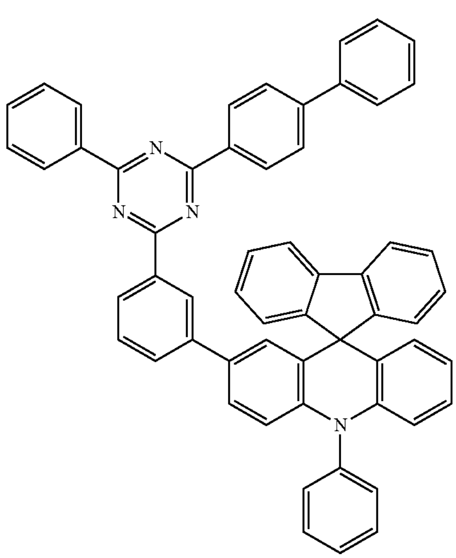
-continued
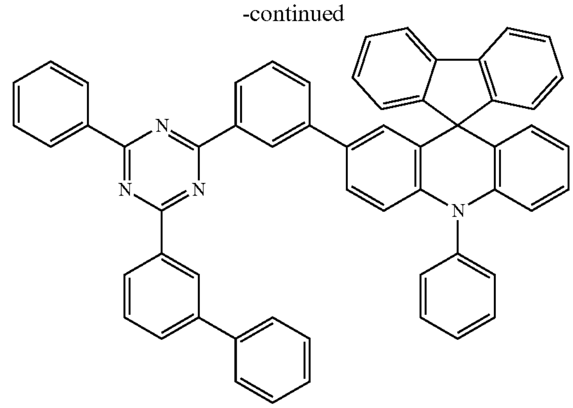
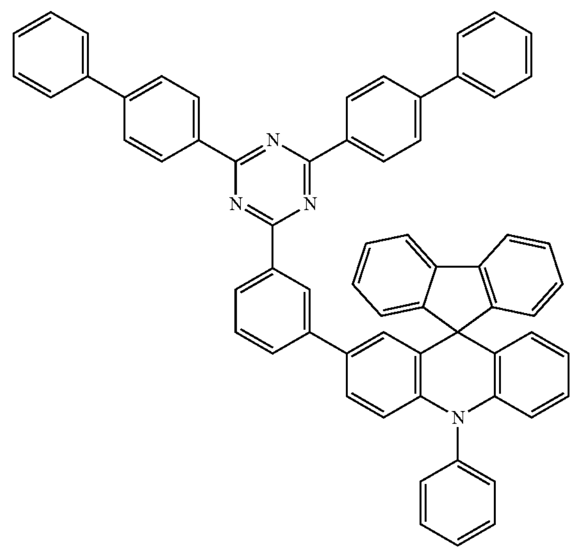
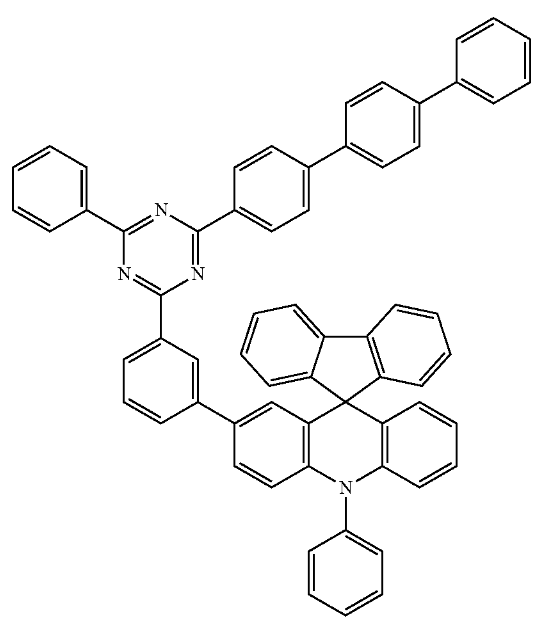

-continued
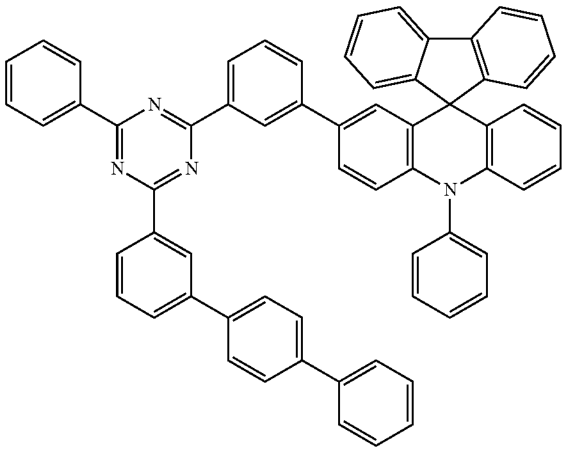
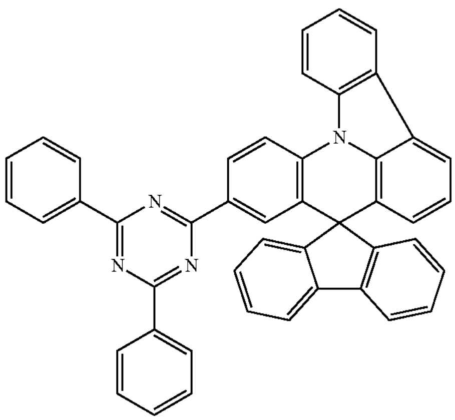
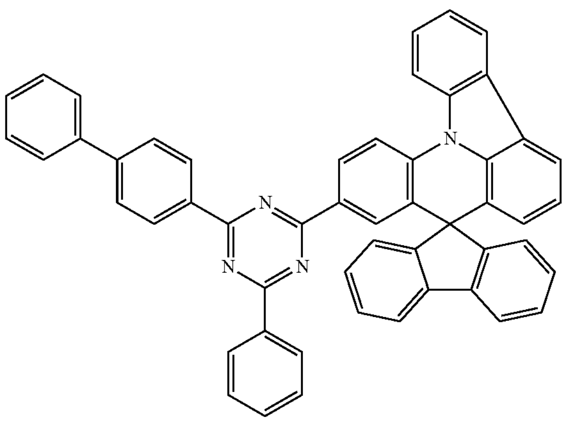
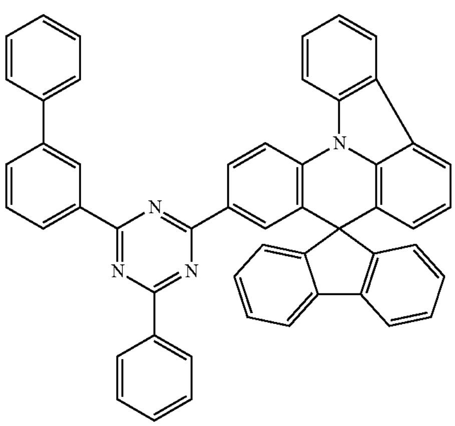
-continued
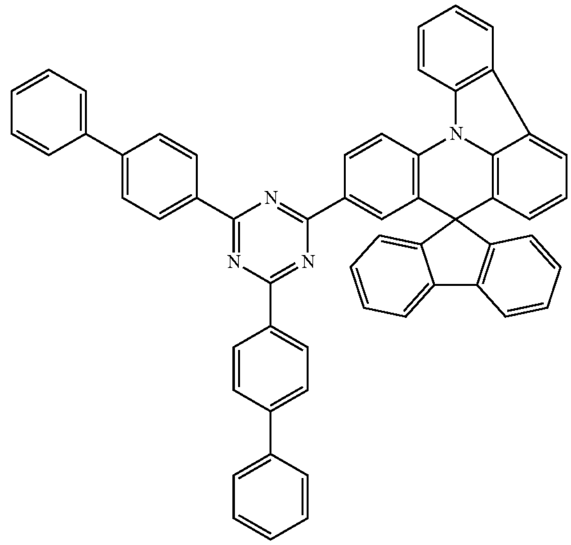
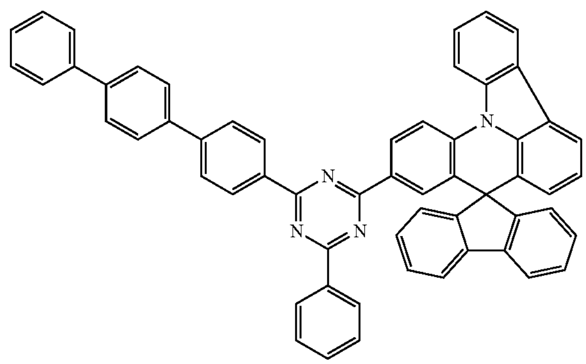
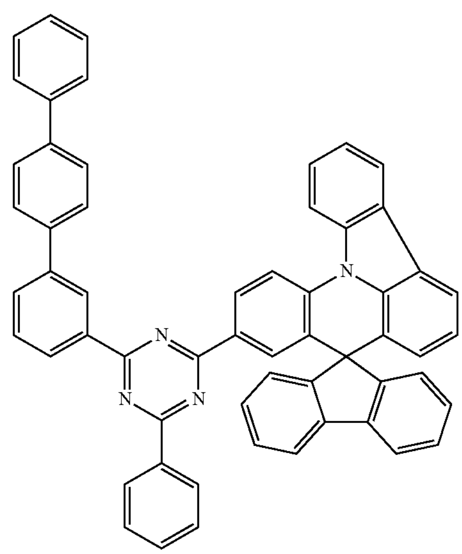

-continued
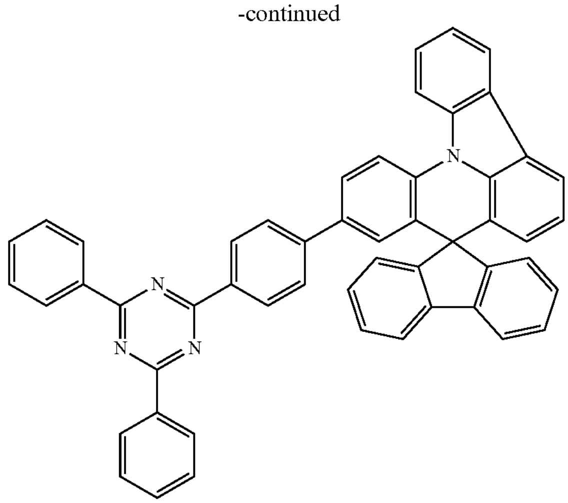
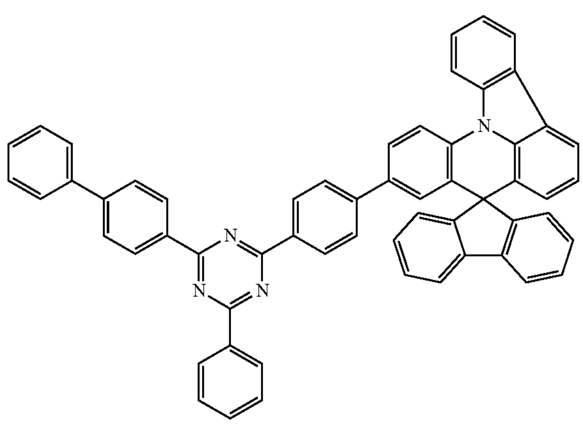
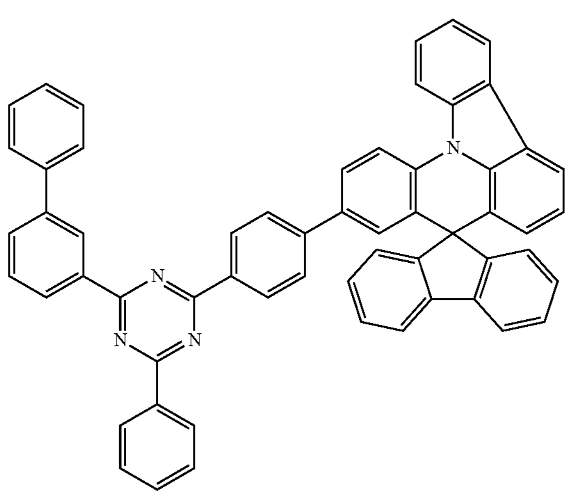
-continued
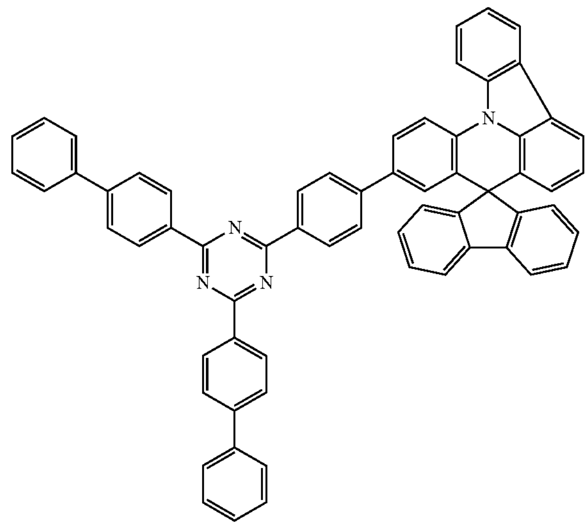
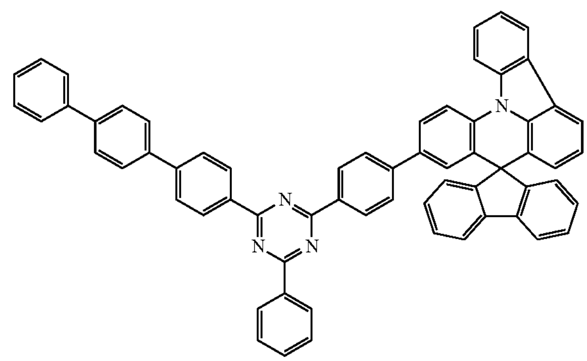
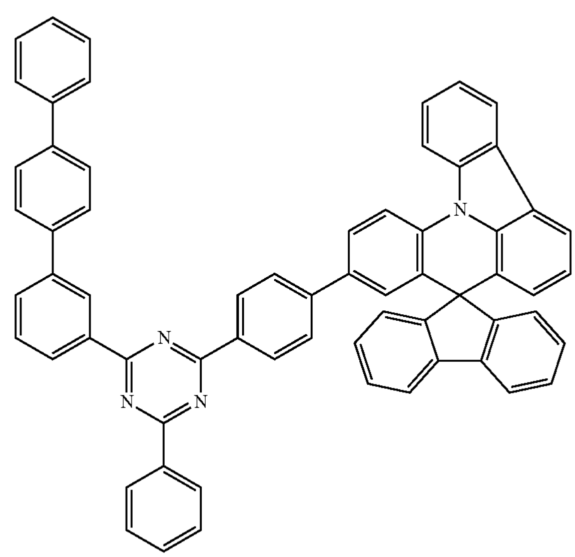

-continued
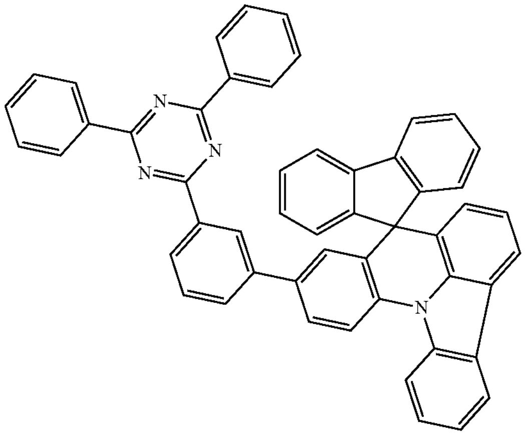
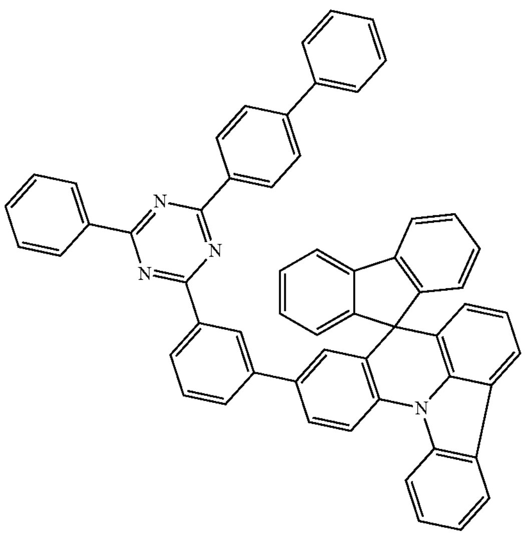
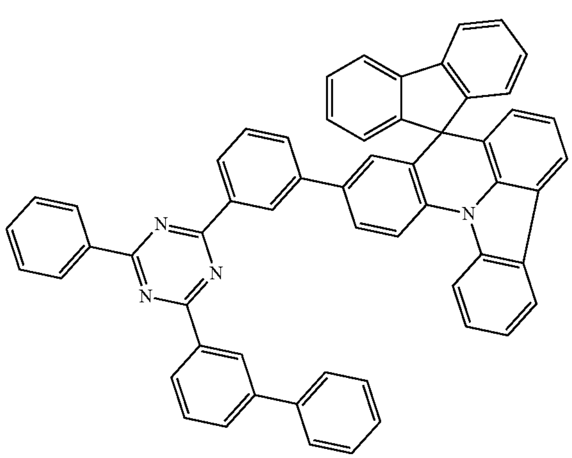
-continued
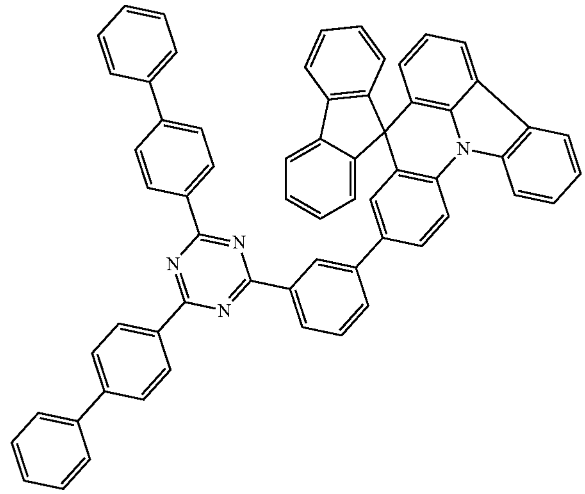
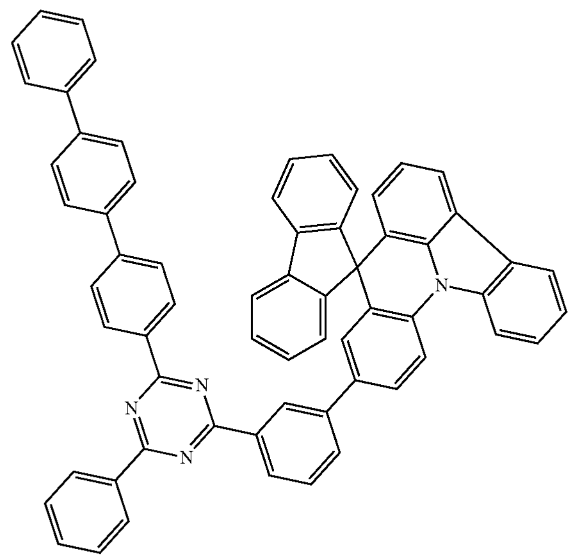
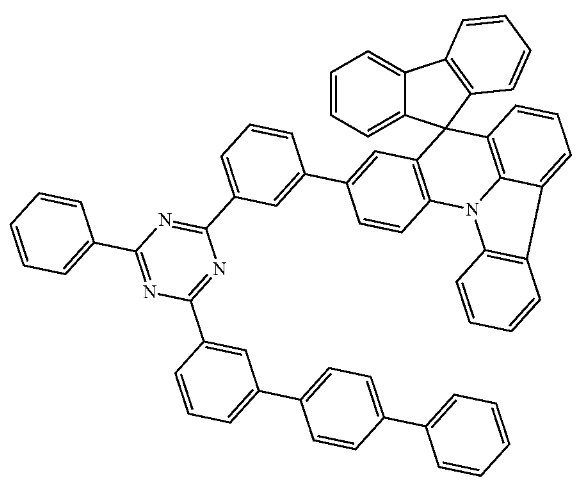

-continued
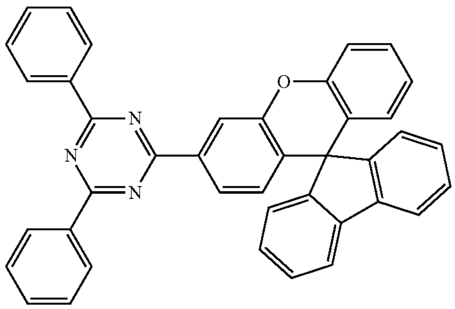
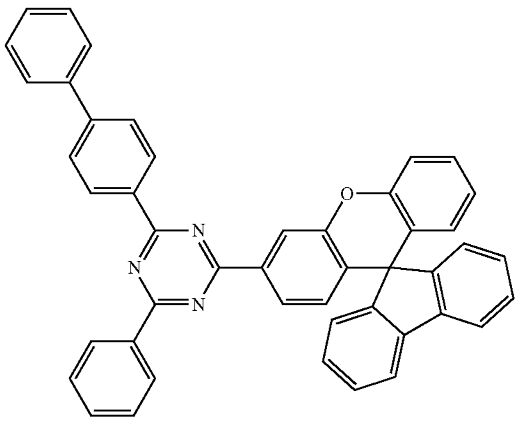
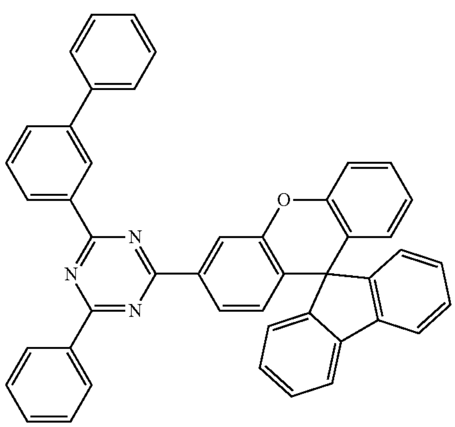
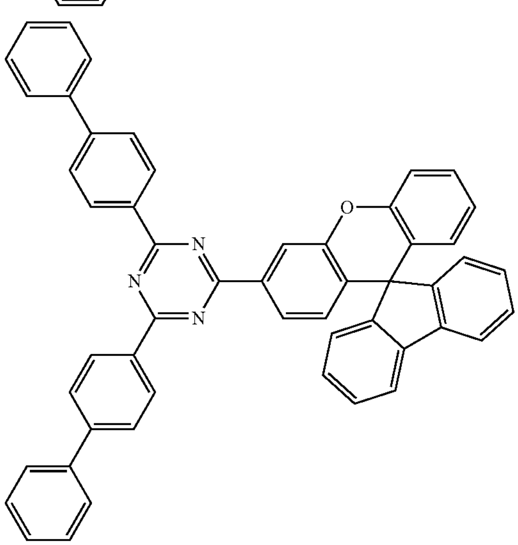
-continued
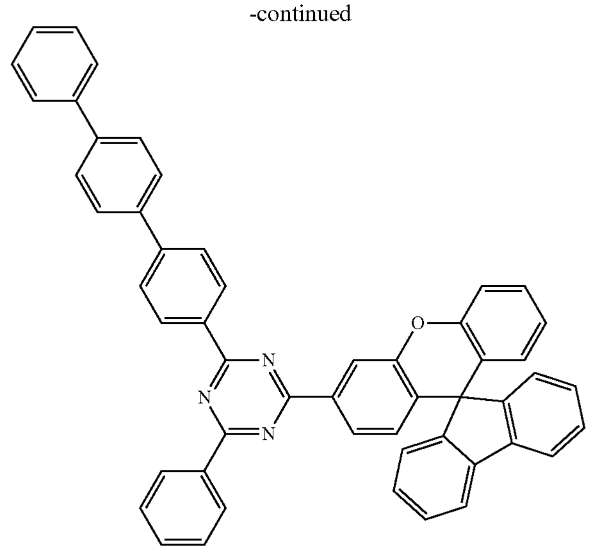
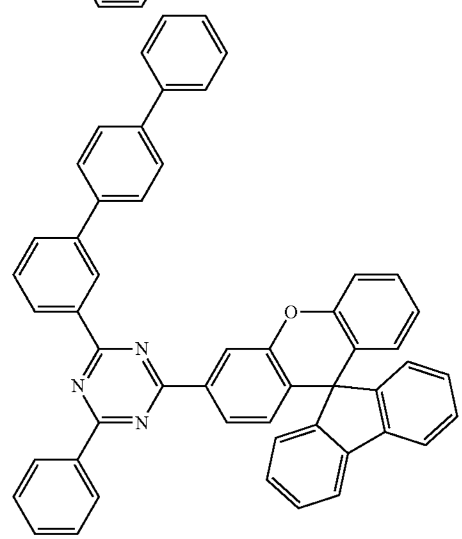
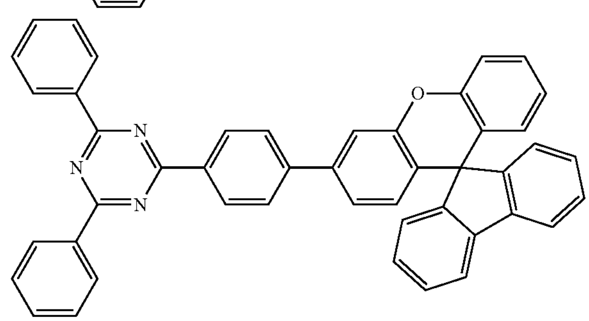
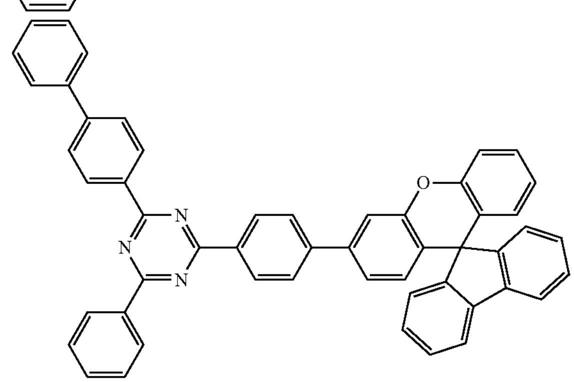

154
-continued
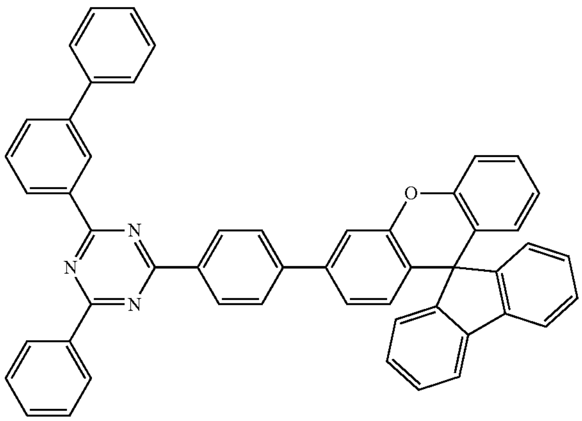
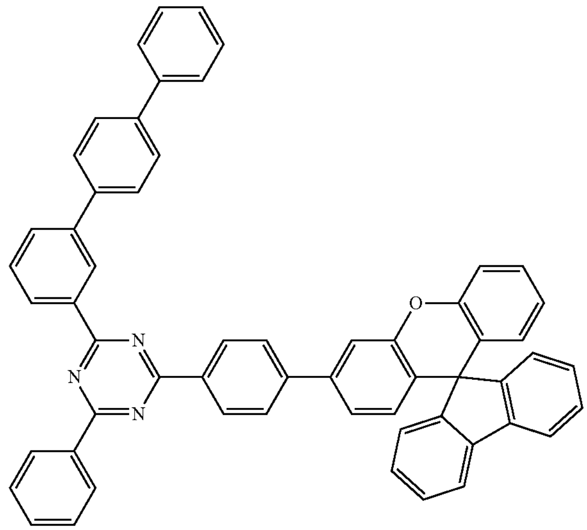
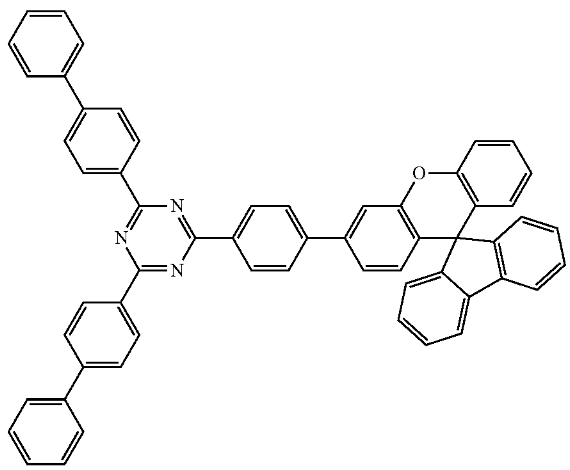
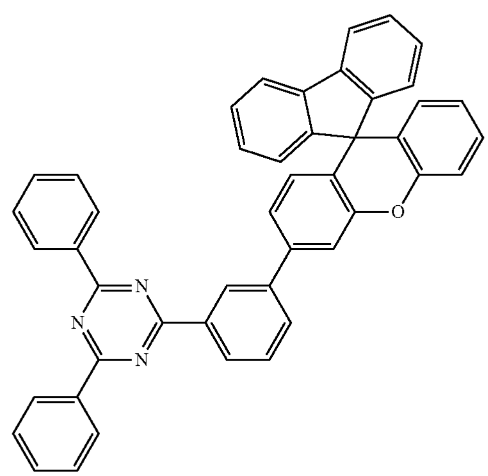
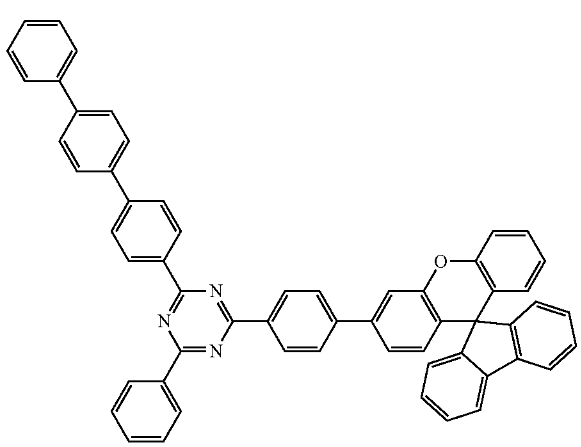
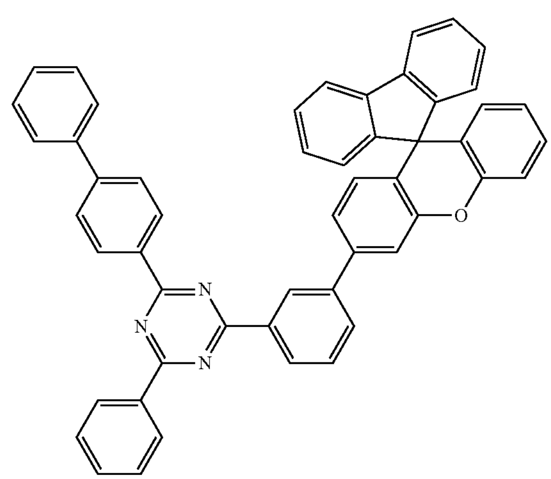

-continued
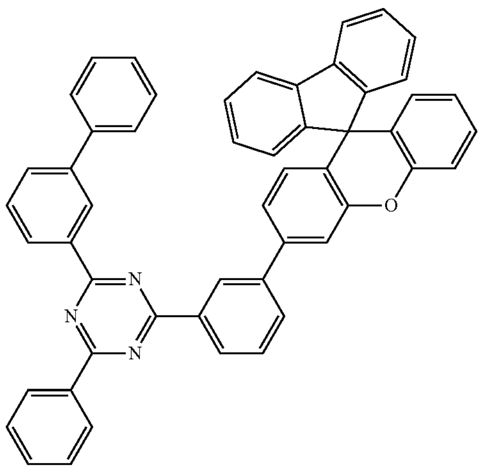
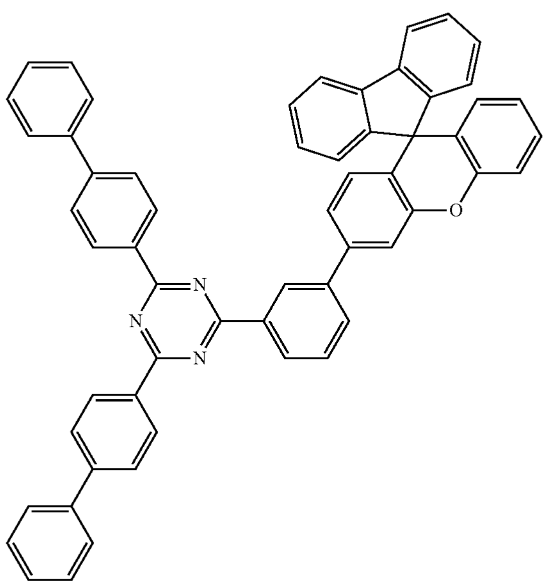
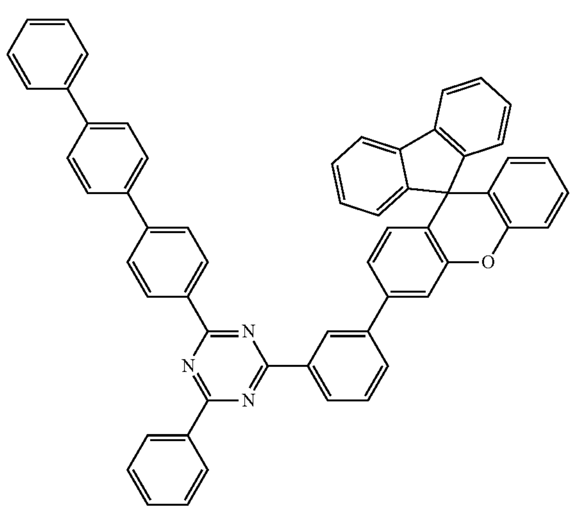
-continued
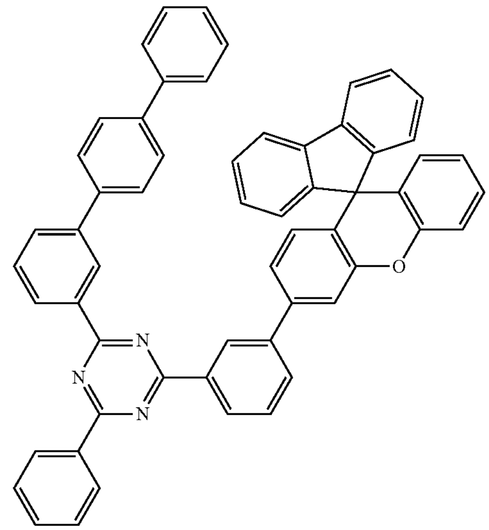
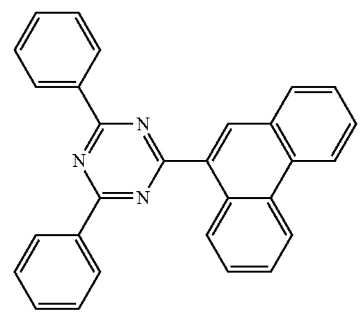
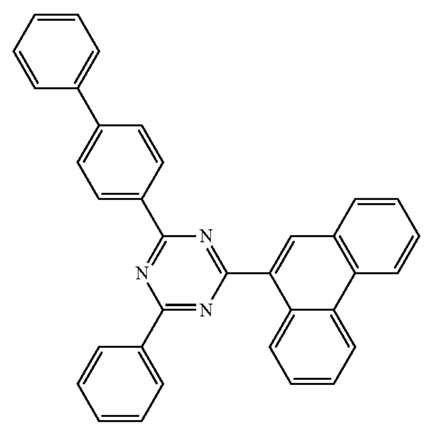
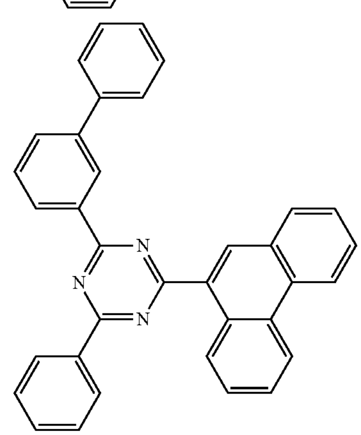

-continued
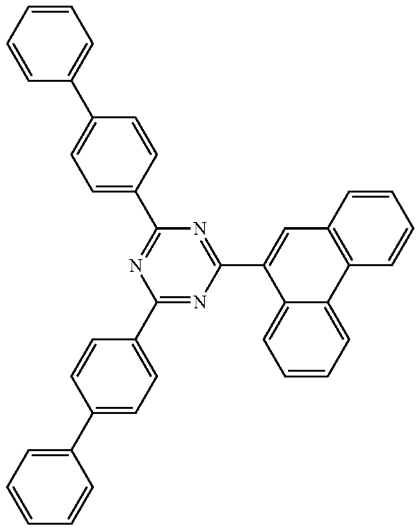
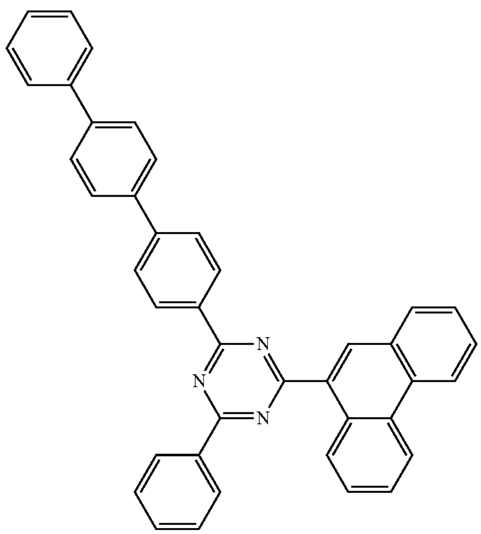
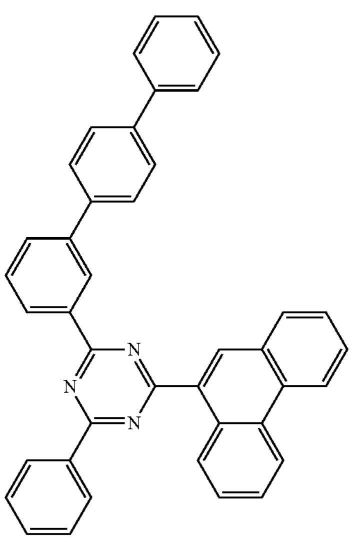
-continued
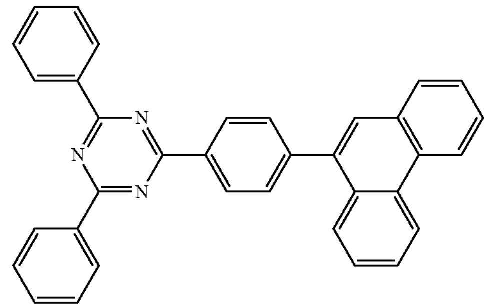
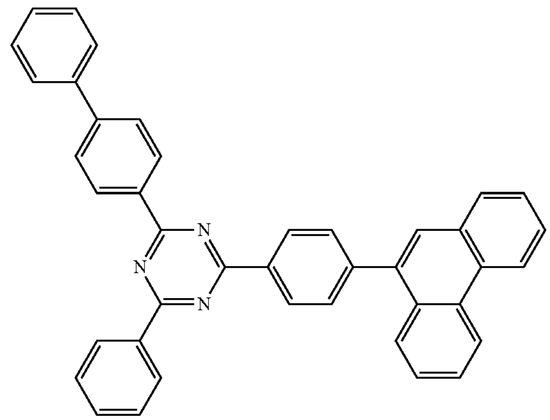
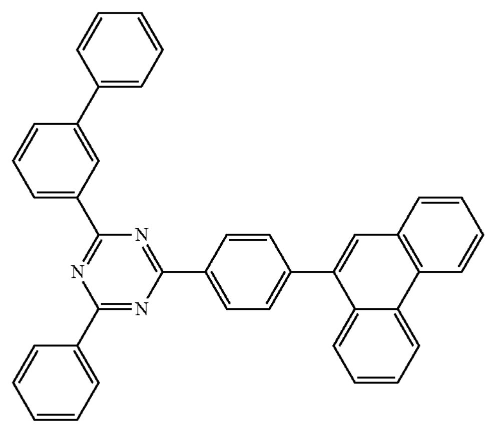
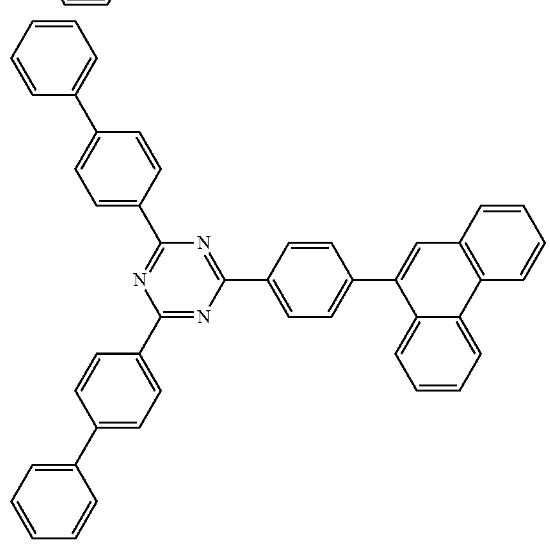

-continued
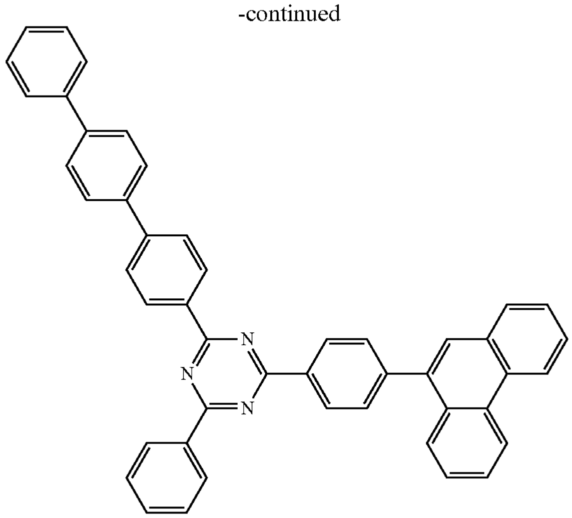
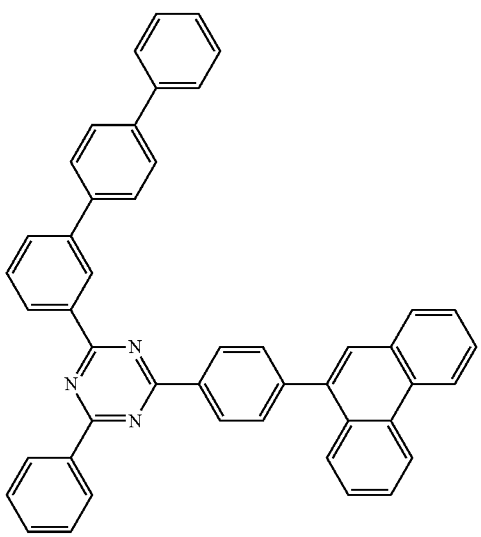
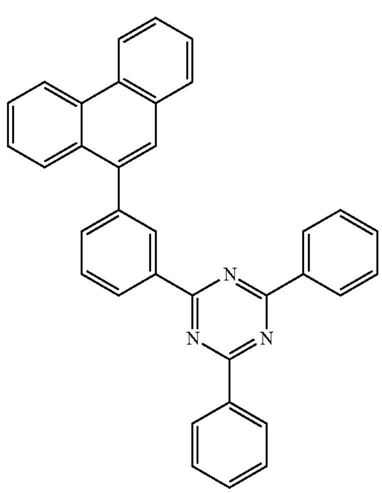
-continued
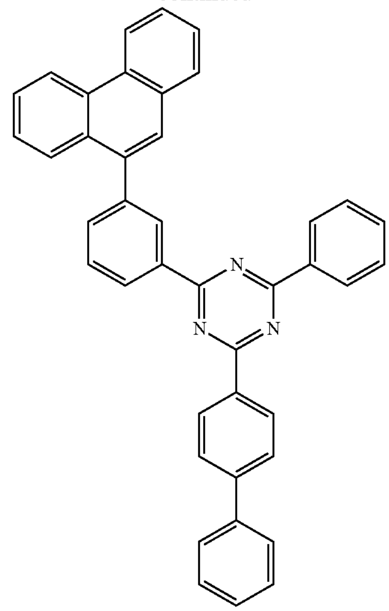
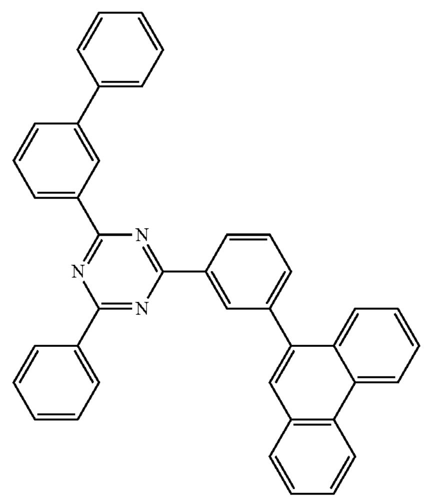
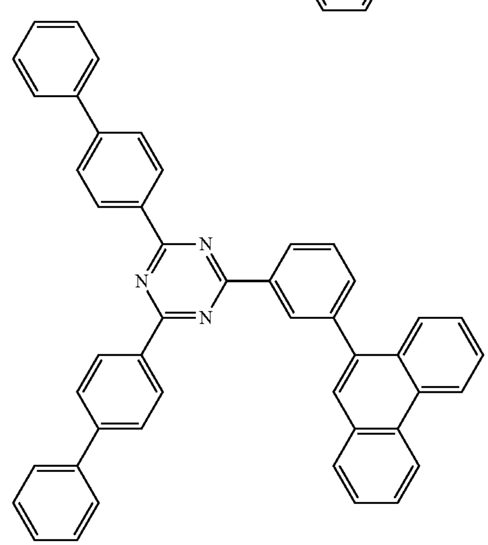

-continued
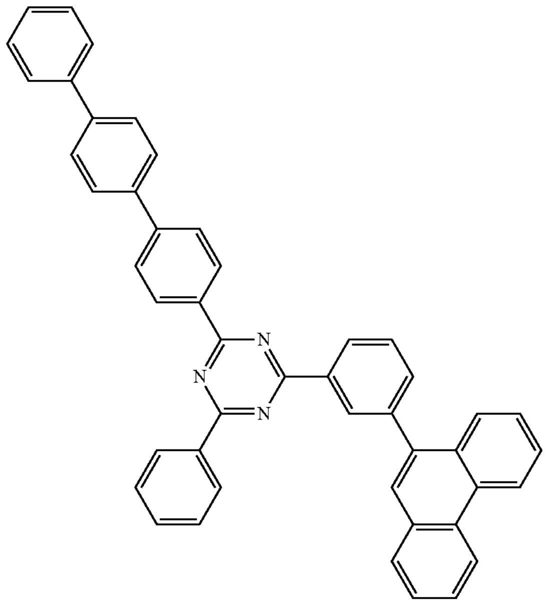
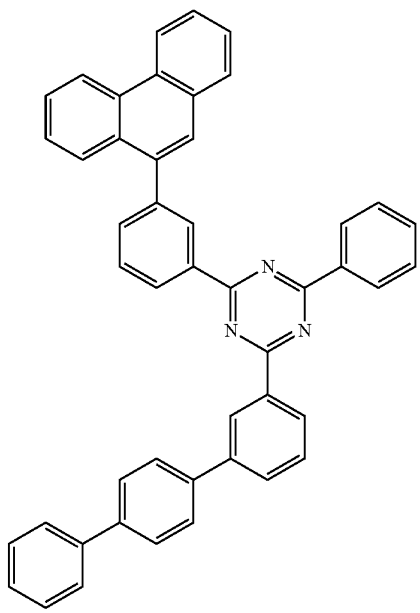
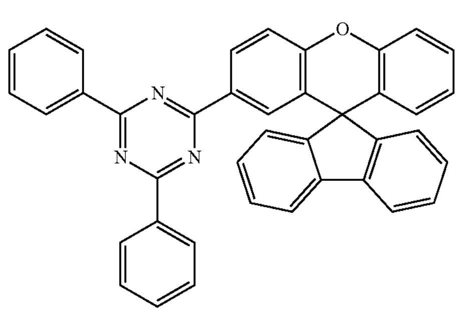
-continued
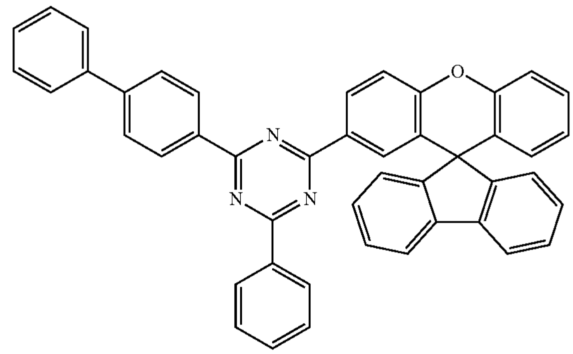
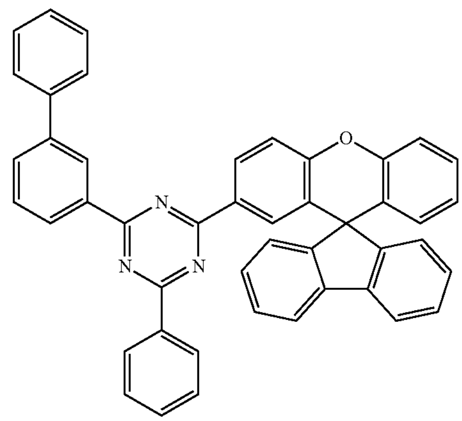
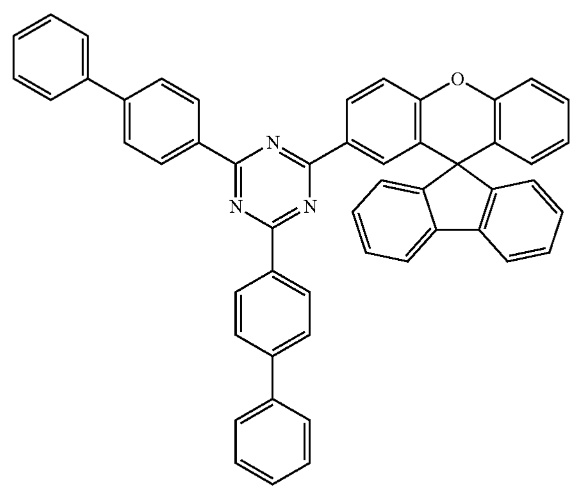
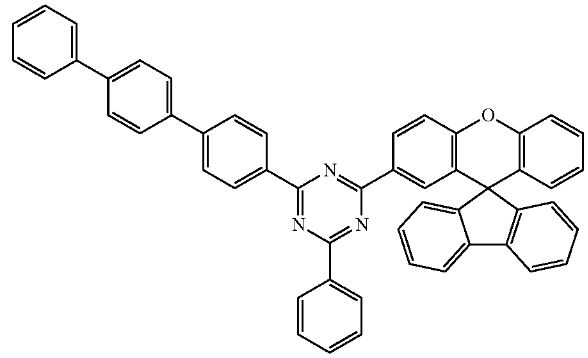

-continued
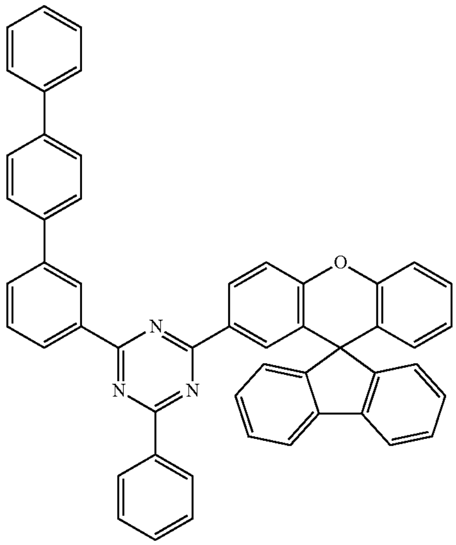
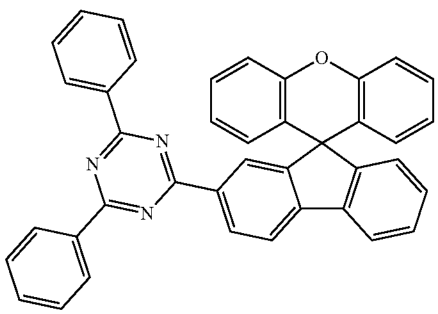
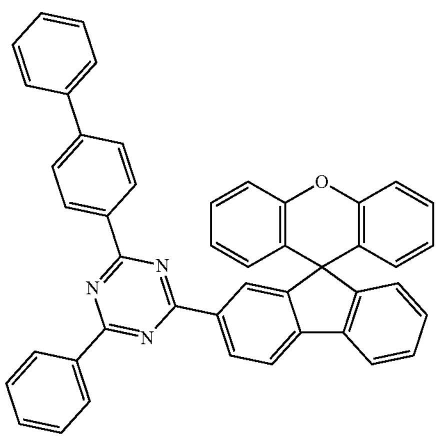
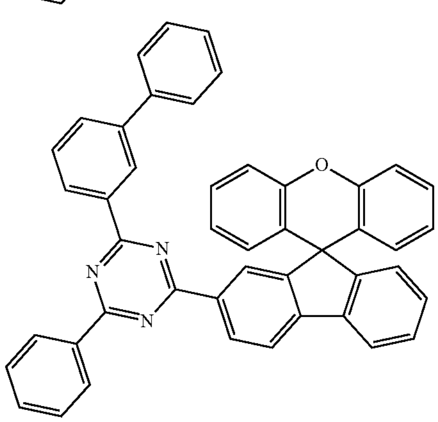
-continued
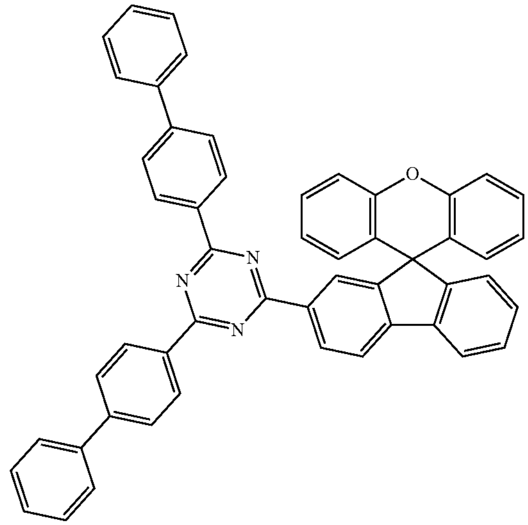
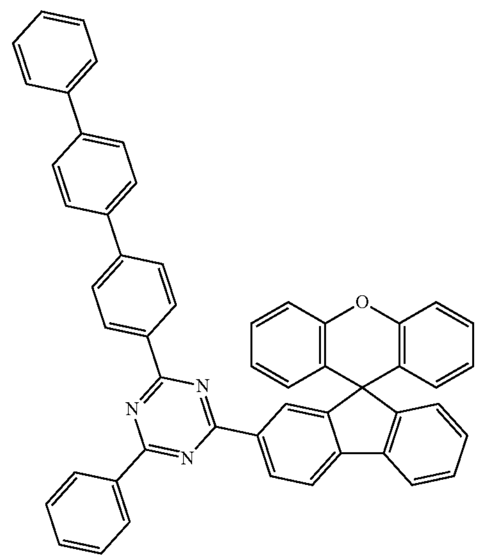
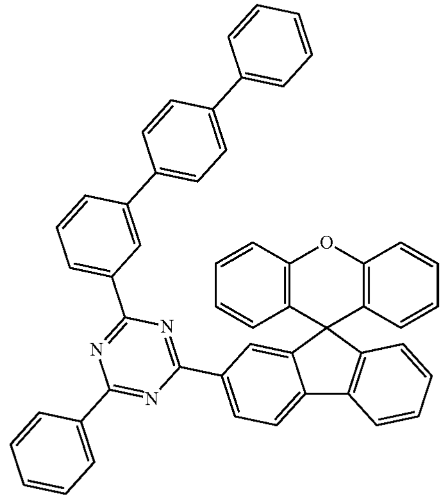

-continued
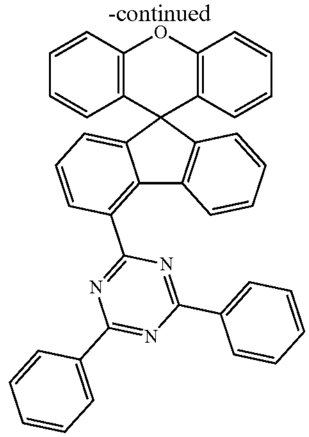
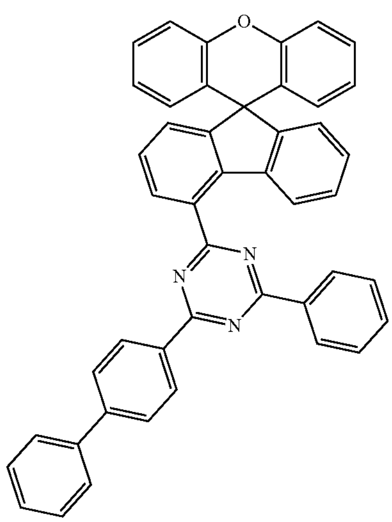
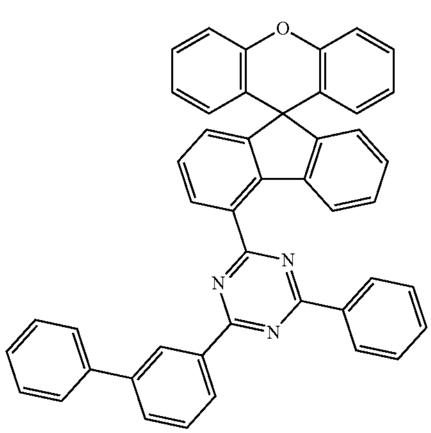
-continued
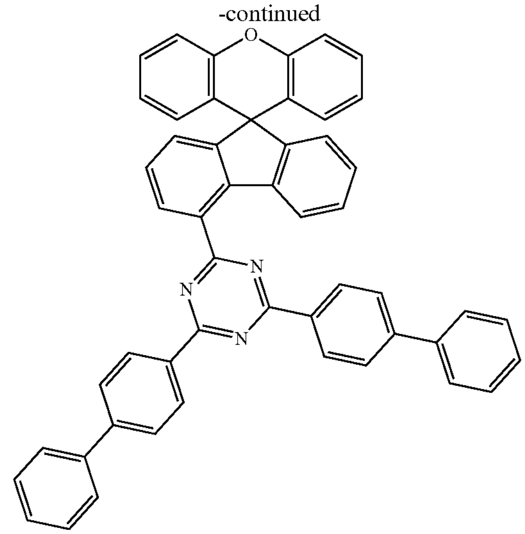
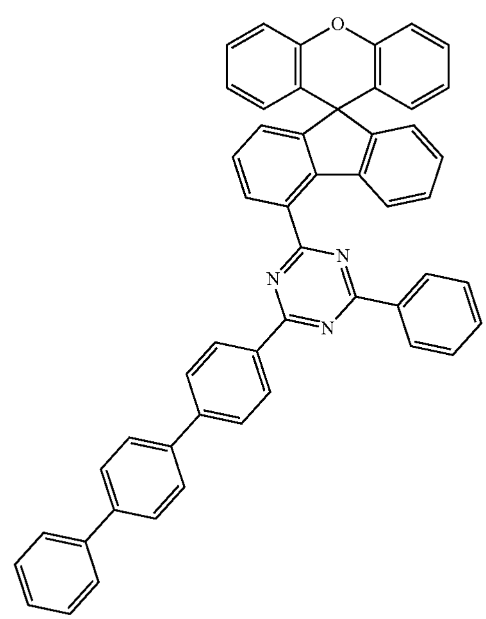
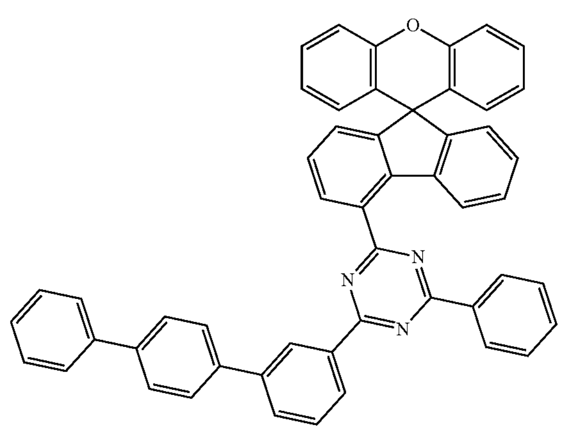

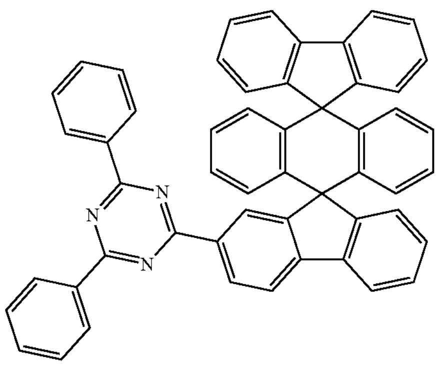
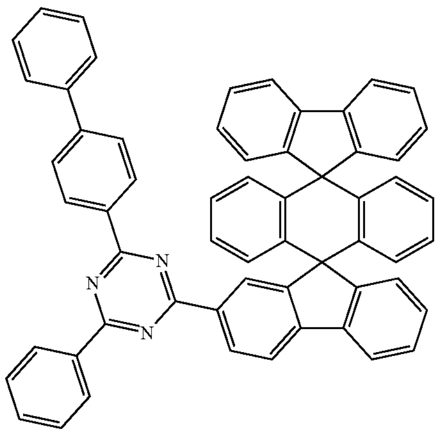
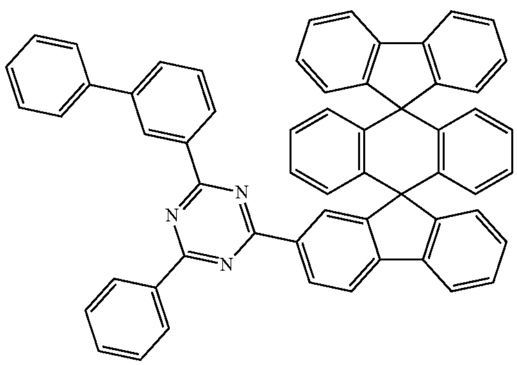
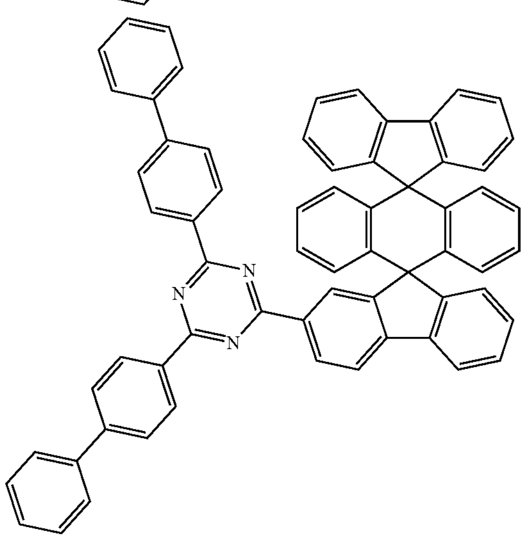
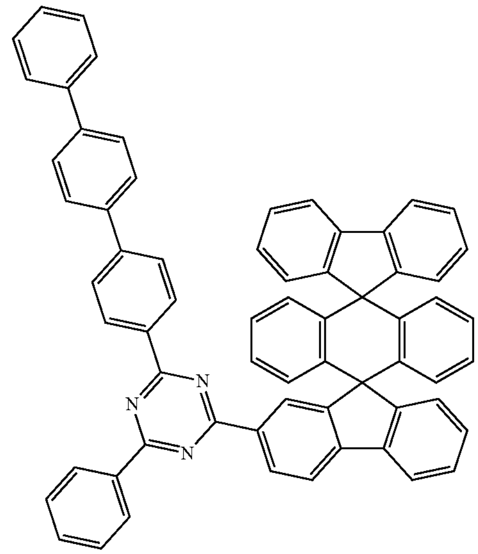
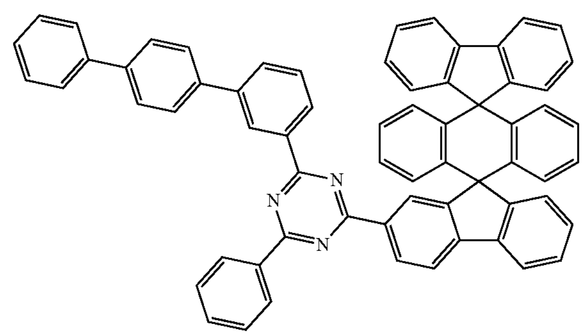
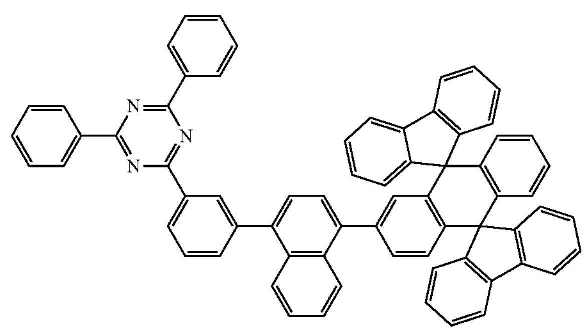
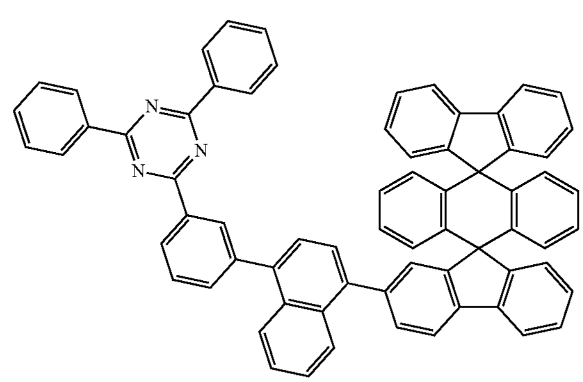

-continued

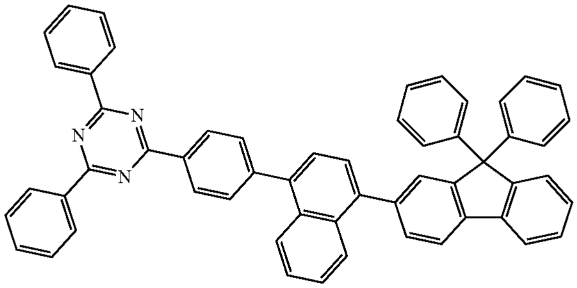

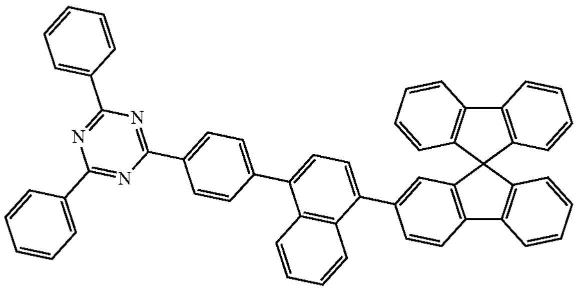

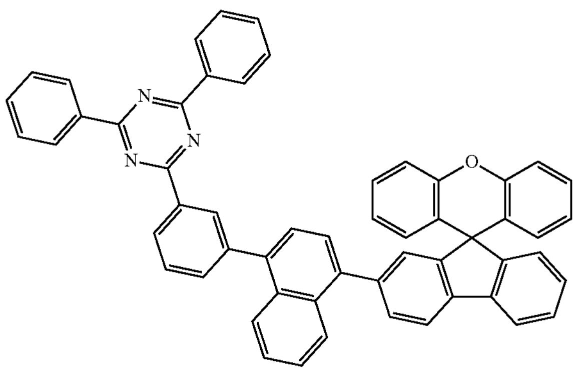

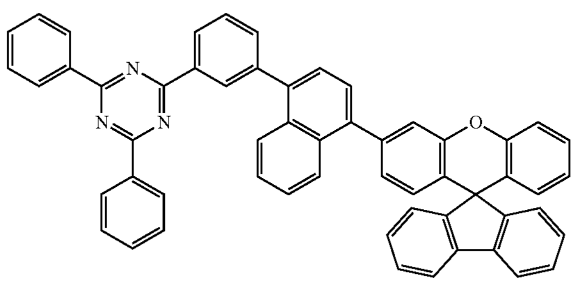

The compound represented by the Chemical Formula 2 can be prepared by a preparation method as the following Reaction Scheme 2.

[Reaction Scheme 2]

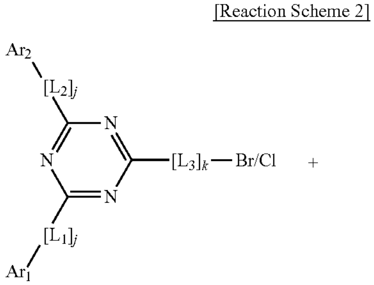

-continued

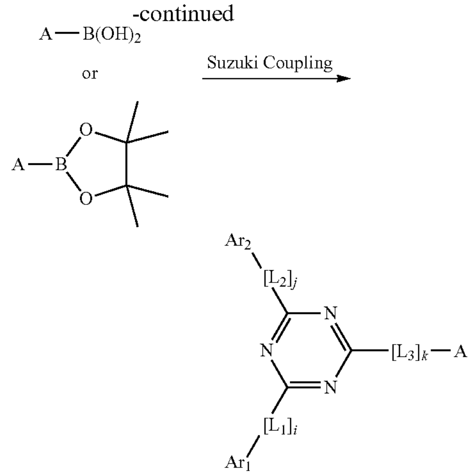

The above reaction is a Suzuki coupling reaction and can be further specified in the preparation examples described later.

Electron Injection Layer

The organic light emitting device according to the present invention may further include an electron injection layer between the electron transport layer and the cathode. The electron injection layer is a layer injecting the electrons from the electrode, and a compound which has an ability of transporting the electrons, an electron injecting effect from the cathode, and an excellent electron injecting effect to the light emitting layer or the light emitting material, prevents movement of an exciton generated in the light emitting layer to the hole injection layer, and has an excellent thin film forming ability is preferable.

Specific examples of materials that can be used for the electron injection layer include fluorenone, anthraquinodimethane, diphenoquinone, thiopyran dioxide, oxazole, oxadiazole, triazole, imidazole, perylene tetracarboxylic acid, fluorenylidene methane, anthrone, and the like, and its derivative, a metal complex compound, a nitrogen-containing 5-membered cycle derivative, and the like, but are not limited thereto.

Examples of the metal complex compound include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium, and the like, but are not limited thereto.

Organic Light Emitting Device

The structure of the organic light emitting device according to the present invention is illustrated in FIG. 1. FIG. 1 shows an example of an organic light emitting device comprising a substrate 1, an anode 2, a light emitting layer 3, an electron transport region 4, and a cathode 5. FIG. 2 shows an example of an organic light emitting device comprising a substrate 1, an anode 2, a light emitting layer 3, a hole blocking layer 6, an electron transport layer 7, and a cathode 5. FIG. 3 shows an example of an organic light emitting device comprising a substrate 1, an anode 2, a hole transport layer 8, a light emitting layer 3, a hole blocking layer 6, an electron transport layer 7, and a cathode 5.

The organic light emitting device according to the present invention can be manufactured by sequentially stacking the above-described structures. In this case, the organic light emitting device may be manufactured by depositing a metal, metal oxides having conductivity, or an alloy thereof on the substrate by using a PVD (physical vapor deposition) method such as a sputtering method or an e-beam evaporation method to form the anode, forming the respective layers described above thereon, and then depositing a material that can be used as the cathode thereon. In addition to such a method, the organic light emitting device may be manufactured by sequentially depositing a cathode material, an organic material layer and an anode material on a substrate. Further, the light emitting layer may be formed by subjecting a host and a dopant to a vacuum deposition method and a solution coating method. Herein, the solution coating method means a spin coating, a dip coating, a doctor blading, an inkjet printing, a screen printing, a spray method, a roll coating, or the like, but is not limited thereto.

In addition to such a method, the organic light emitting device may be manufactured by sequentially depositing a cathode material, an organic material layer, and an anode material on a substrate (International Publication WO 2003/012890). However, the manufacturing method is not limited thereto.

The organic light emitting device according to the present invention may be a front side emission type, a back side emission type, or a double side emission type according to the used material.

Hereinafter, preferred examples of the present invention will be described to help understanding of the present invention. However, these examples are presented for illustrative purposes only, and the scope of the present invention is not limited thereto.

Preparation Example

Preparation Example 1-1: Preparation of Compound 1-1

Step 1) Preparation of Compound 1-1-a

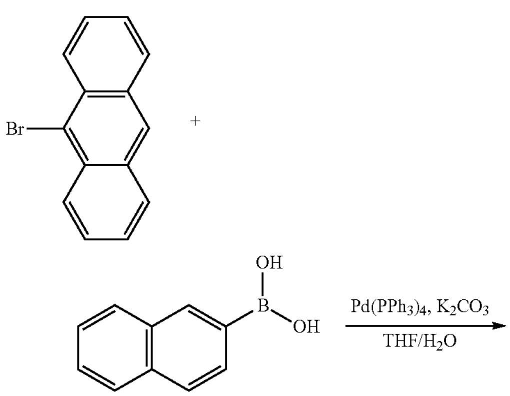

-continued

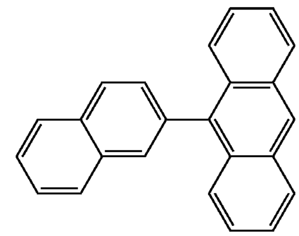

1-1-a

To a three-necked flask was added a solution where 9-bromoanthracene (20.0 g, 77.8 mmol) and naphthalene-2-ylboronic acid (14.7 g, 85.6 mmol) was dissolved in THF (300 mL), and $K_2CO_3$ (43.0 g, 311.1 mmol) was dissolved in water (150 mL). $Pd(PPh_3)_4$ (3.6 g, 3.1 mmol) was added thereto, and the mixture was stirred under reflux under argon atmosphere for 8 hours. After completion of the reaction, the reaction solution was cooled to room temperature, transferred to a separating funnel and then extracted with water and ethyl acetate. The extract was dried with $MgSO_4$, followed by filtration and concentration. The sample was purified by silica gel column chromatography to obtain Compound 1-1-a (18.5 g, yield 78%, MS: $[M+H]^+$=304).

Step 2) Preparation of Compound 1-1-b

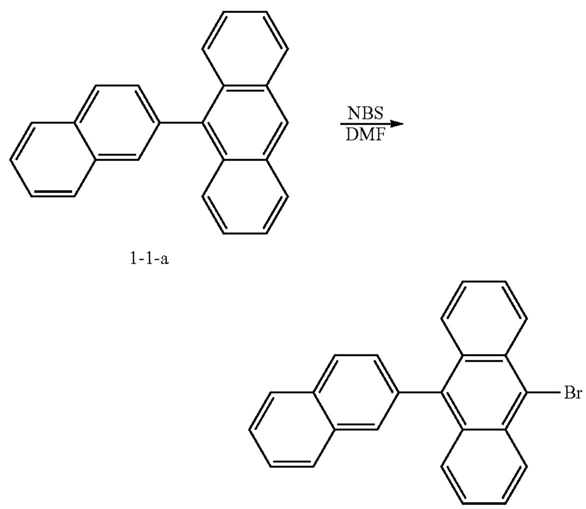

1-1-a 1-1-b

Compound 1-1-a (15.0 g, 49.3 mmol), NBS (9.2 g, 51.7 mmol) and DMF (300 mL) were added to a two-necked flask, and the mixture was stirred at room temperature under argon atmosphere for 8 hours. After completion of the reaction, the reaction solution was transferred to a separating funnel and the organic layer was extracted with water and ethyl acetate. The extract was dried with $MgSO_4$, followed by filtration and concentration. The sample was purified by silica gel column chromatography to obtain Compound 1-1-b (16.6 g, yield 88%, MS: $[M+H]^+$=383).

Step 3) Preparation of Compound 1-1

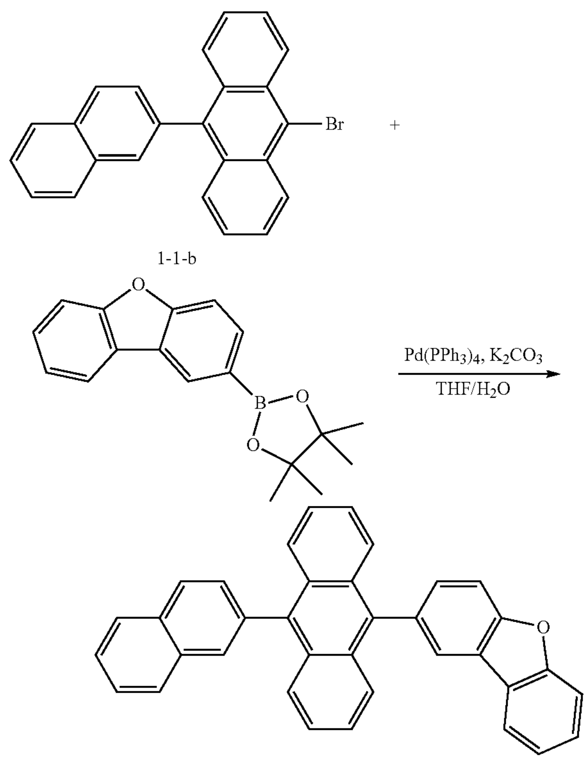

1-1-b 1-1

To a three-necked flask was added a solution where Compound 1-1-b (15.0 g, 39.1 mmol) and 2-(dibenzo[b,d]furan-2-yl)-4,4,5,5-tetramethyl-1,3,2-dioxaborolane (12.7 g, 43.0 mmol) were dissolved in THF (225 mL) and $K_2CO_3$ (21.6 g, 156.5 mmol) was dissolved in water (113 mL). $Pd(PPh_3)_4$ (1.8 g, 1.6 mmol) was added thereto, and the mixture was stirred under reflux under argon atmosphere for 8 hours. After completion of the reaction, the reaction solution was cooled to room temperature, transferred to a separating funnel and then extracted with water and ethyl acetate. The extract was dried with $MgSO_4$, followed by filtration and concentration. The sample was purified by silica gel column chromatography, and then subjected to sublimation purification to obtain Compound 1-1 (6.4 g, yield 35%, MS: $[M+H]^+$=471).

Preparation Example 1-2: Preparation of Compound 1-2

Step 1) Preparation of Compound 1-2-a

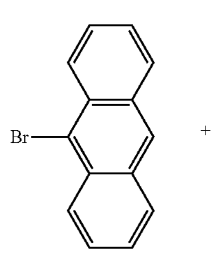

-continued

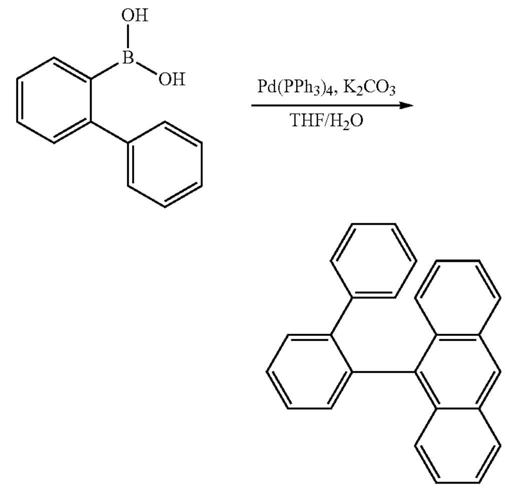

1-2-a

Compound 1-2-a (19.3 g, yield 75%, MS: $[M+H]^+$=330) was prepared in the same manner as in the preparation method of Compound 1-1-a, except that [1,1'-biphenyl]-2-ylboronic acid was used instead of naphthalene-2-ylboronic acid in Step 1 of Preparation Example 1-1.

Step 2) Preparation of Compound 1-2-b

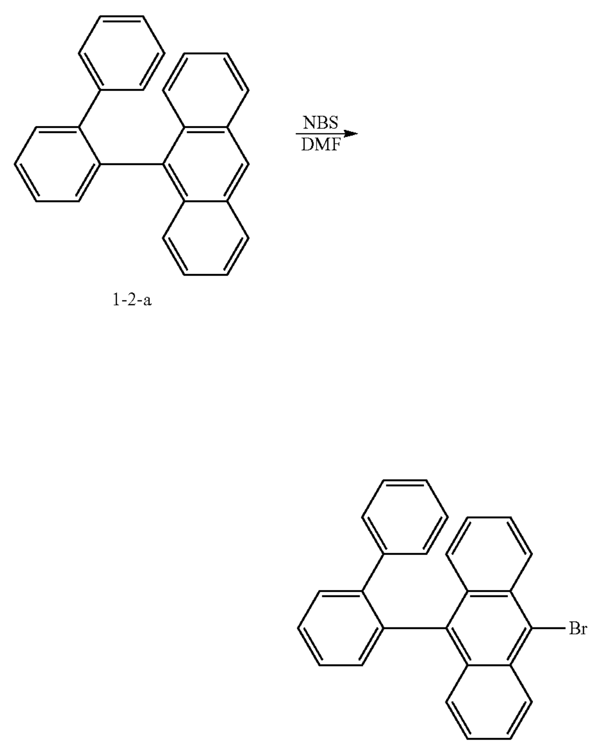

1-2-a 1-2-b

Compound 1-2-b (16.9 g, yield 91%, MS: $[M+H]^+$=409) was prepared in the same manner as in the preparation method of Compound 1-1-b, except that Compound 1-2-a was used instead of Compound 1-1-a in Step 2 of Preparation Example 1-1.

Step 3) Preparation of Compound 1-2

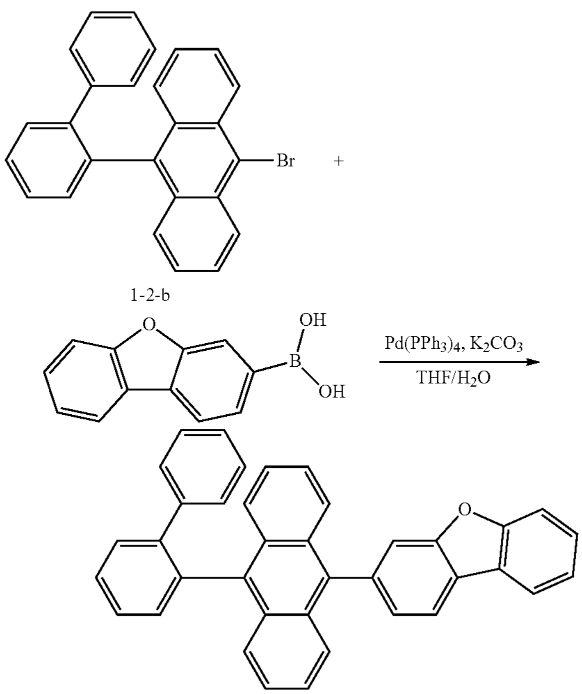

1-2-b 1-2

Compound 1-2 (5.8 g, yield 32%, MS: $[M+H]^+$=497) was prepared in the same manner as in the preparation method of Compound 1-1, except that Compound 1-2-b was used instead of Compound 1-1-1 b and dibenzo[b,d]furan-3-ylboronic acid was used instead of 2-(dibenzo[b,d] furan-2-yl)-4,4,5,5-tetramethyl-1,3,2-dioxaborolane, in Step 3 of Preparation Example 1-1.

Preparation Example 1-3: Preparation of Compound 1-3

Step 1) Preparation of Compound 1-3-a

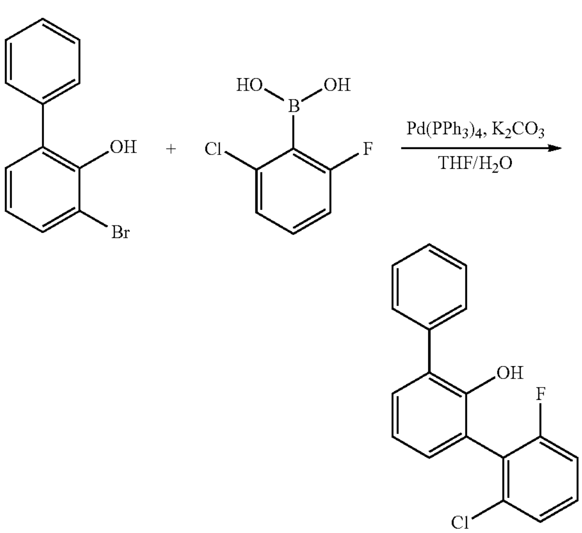

1-3-a

To a three-necked flask was added a solution where 3-bromo-[1,1'-biphenyl]-2-ol (30.0 g, 120.4 mmol), (2-chloro-6-fluorophenyl)boronic acid were dissolved in THF (450 mL) and $K_2CO_3$ (66.6 g, 481.7 mmol) was dissolved in water (225 mL). $Pd(PPh_3)_4$ (5.6 g, 4.8 mmol) was added thereto, and the mixture was stirred under reflux under argon atmosphere for 8 hours. After completion of the reaction, the reaction solution was cooled to room temperature, transferred to a separating funnel and then extracted with water and ethyl acetate. The extract was dried with $MgSO_4$, followed by filtration and concentration. The sample was purified by silica gel column chromatography to obtain Compound 1-3-a (27.0 g, yield 75%, MS: $[M+H]^+$= −299).

Step 2) Preparation of Compound 1-3-b

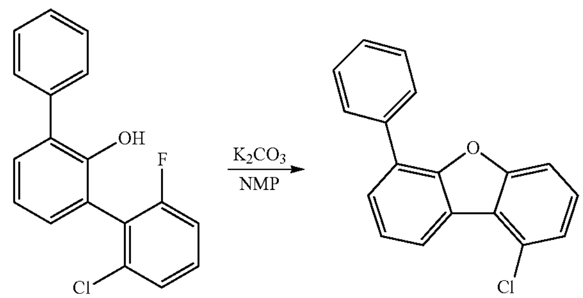

1-3-a 1-3-b

Compound 1-3-a (25.0 g, 83.7 mmol), $K_2CO_3$ (23.1 g, 167.4 mmol) and NMP (325 mL) were added to a three-necked flask, and the mixture was stirred at 120° C. overnight. After completion of the reaction, the reaction solution was cooled to room temperature, and water (300 mL) was added dropwise thereto little by little. Then, the reaction solution was transferred to a separating funnel, and the organic layer was extracted with water and ethyl acetate. The extract was dried with $MgSO_4$, followed by filtration and concentration. The sample was purified by silica gel column chromatography to obtain Compound 1-3-b (19.8 g, yield 85%, MS: $[M+H]^+$=279).

Step 3) Preparation of Compound 1-3-c

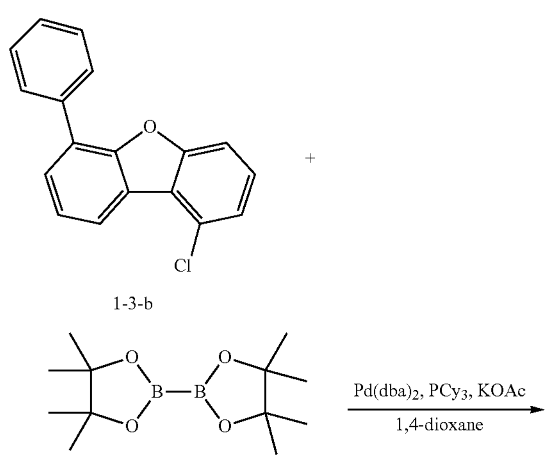

-continued

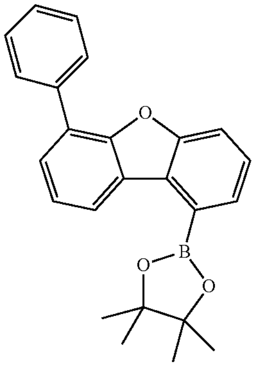

1-3-c

Compound 1-3-b (18.0 g, 64.6 mmol), bis(pinacolato) diboron (19.7 g, 77.5 mmol), $Pd(dba)_2$ (0.7 g, 1.3 mmol), tricyclohexyl phosphine (0.7 g, 2.6 mmol), KOAc (12.7 g, 129.2 mmol), and 1,4-dioxane (270 mL) were added to a three-necked flask and the mixture was stirred under reflux under argon atmosphere for 12 hours. After completion of the reaction, the reaction solution was cooled to room temperature and then transferred to a separating funnel, to which water (200 mL) was added and extracted with ethyl acetate. The extract was dried with $MgSO_4$, followed by filtration and concentration. The sample was purified by silica gel column chromatography to obtain Compound 1-3-c (20.5 g, yield 73%, MS: $[M+H]^+$=370)

Step 4) Preparation of Compound 1-3-d

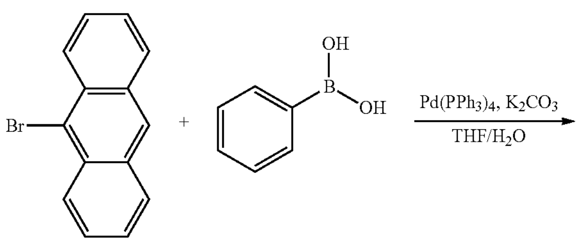

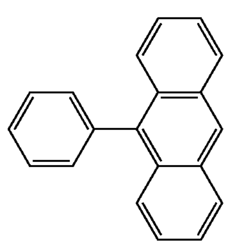

1-3-d

Compound 1-3-d (15.6 g, yield 79%, MS: $[M+H]^+$=254) was prepared in the same manner as in the preparation method of Compound 1-1-a, except that phenylboronic acid was used instead of naphthalene-2-ylboronic acid in Step 1 of Preparation Example 1-1.

Step 5) Preparation of Compound 1-3-e

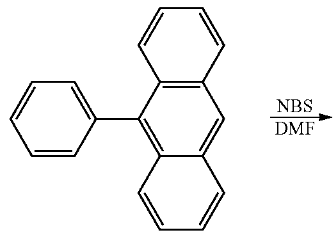

1-3-d

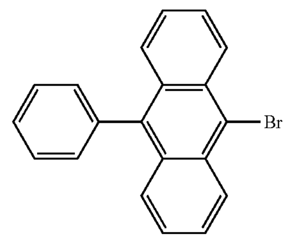

1-3-e

Compound 1-3-e (17.3 g, yield 88%, MS: $[M+H]^+$=333) was prepared in the same manner as in the preparation method of Compound 1-1-b, except that Compound 1-3-d was used instead of Compound 1-1-a in Step 2 of Preparation Example 1-1.

Step 6) Preparation of Compound 1-3

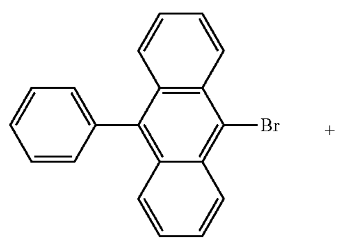

1-3-e

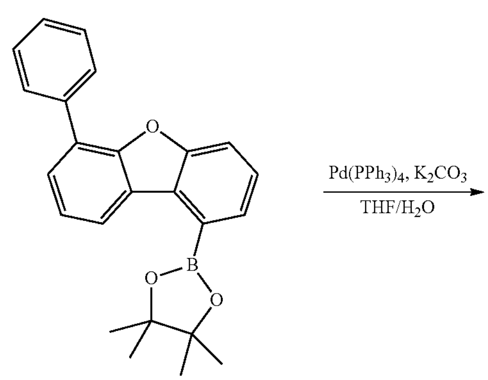

1-3-c

-continued

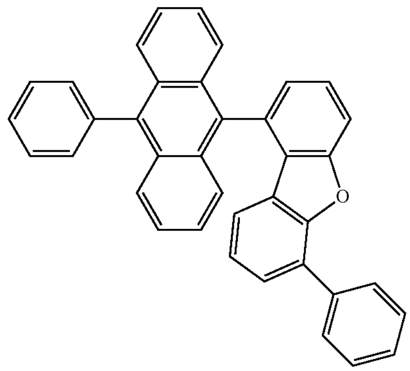

1-3

Compound 1-3 (7.4 g, yield 32%, MS: [M+H]+=497) was prepared in the same manner as in the preparation method of Compound 1-1, except that Compound 1-3-e was used instead of Compound 1-1-b and Compound 1-3-c was used instead of 2-(dibenzo[b,d]furan-2-yl)-4,4,5,5-tetramethyl-1,3,2-dioxaborolane in Step 3 of Preparation Example 1-1.

Preparation Example 1-4: Preparation of Compound 1-4

Step 1) Preparation of Compound 1-4-a

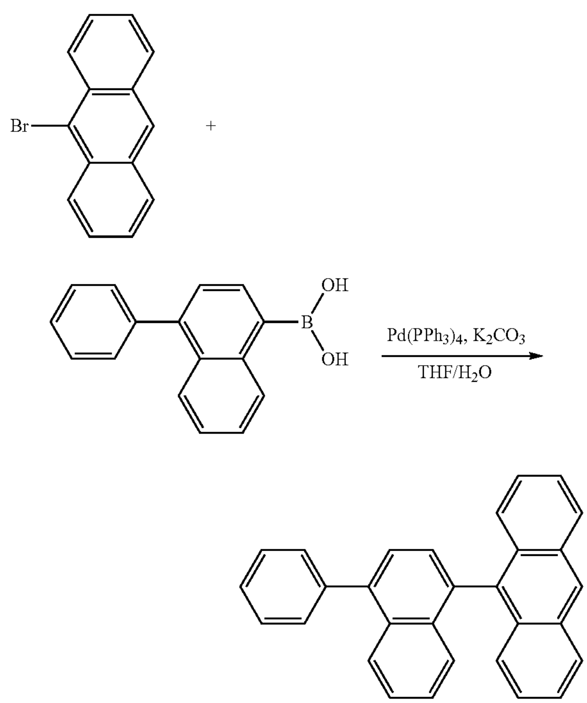

1-4-a

Compound 1-4-a (20.1 g, yield 68%, MS: [M+H]+=380) was prepared in the same manner as in the preparation method of Compound 1-1-a, except that (4-phenylnaphthalen-1-yl)boronic acid was used instead of naphthalene-2-yl boronic acid in Step 1 of Preparation Example 1-1.

Step 2) Preparation of Compound 1-4-b

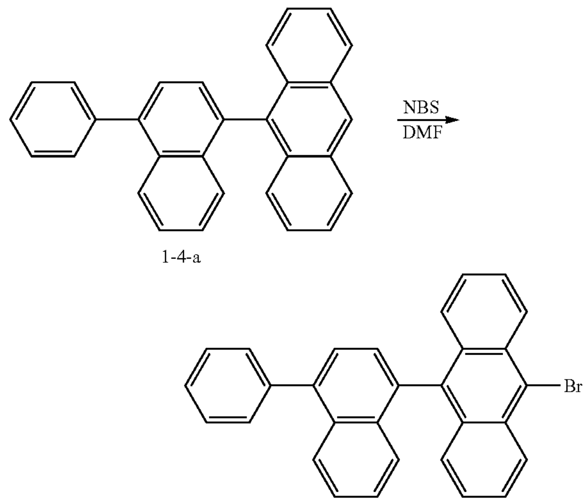

1-4-b

Compound 1-4-b (15.4 g, yield 85%, MS: [M+H]+=459) was prepared in the same manner as in the preparation method of Compound 1-1-b, except that Compound 1-4-a was used instead of Compound 1-1-a in Step 2 of Preparation Example 1-1.

Step 3) Preparation of Compound 1-4

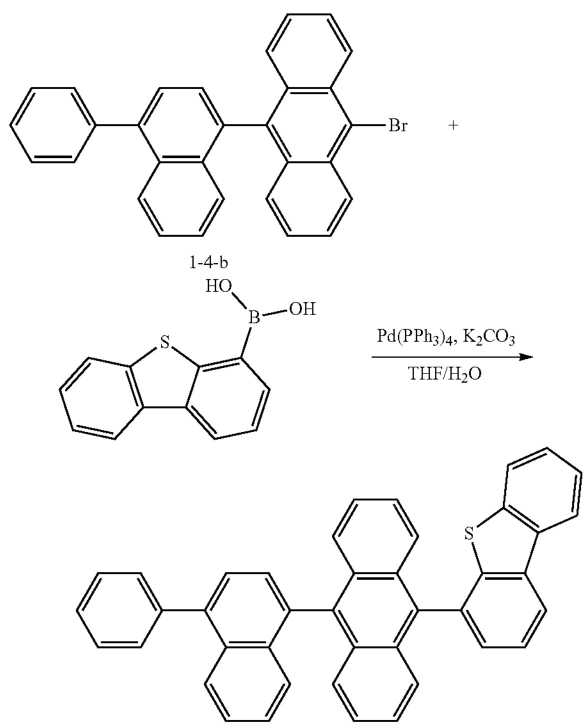

1-4

Compound 1-4 (5.1 g, yield 28%, MS: [M+H]+=563) was prepared in the same manner as in the preparation method of Compound 1-1, except that Compound 1-4-b was used instead of Compound 1-1-b and dibenzo[b,d]thiophen-4- ylboronic acid was used instead of 2-(dibenzo[b,d]furan-2-yl)-4,4,5,5-tetramethyl-1,3,2-dioxaborolane in Step 3 of Preparation Example 1-1.

Preparation Example 2-1: Preparation of Compound 2-1

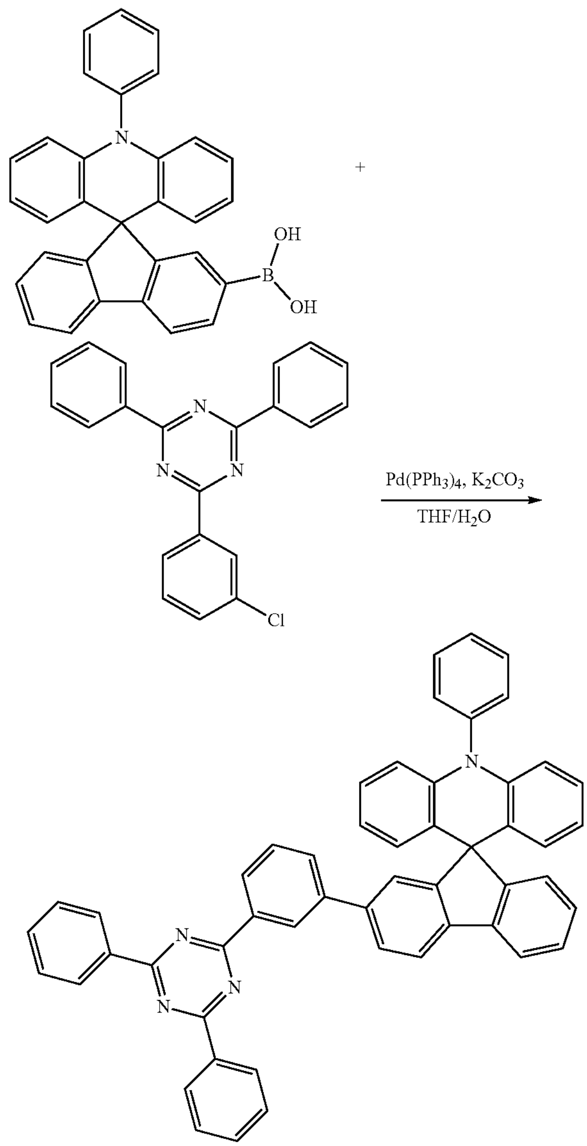

2-1

To a three-necked flask was added a solution where (10-phenyl-10H-spiro[acridine-9,9'-fluorene]-2'-yl)boronic acid (20.0 g, 44.3 mmol), 2-(3-chlorophenyl)-4,6-diphenyl-1,3,5-triazine (16.8 g, 48.7 mmol) were dissolved in THF (300 mL) and $K_2CO_3$ (24.5 g, 177.3 mmol) was dissolved in water (150 mL). $Pd(PPh_3)_4$ (2.0 g, 1.8 mmol) was added thereto, and the mixture was stirred under reflux under argon atmosphere for 8 hours. After completion of the reaction, the reaction solution was cooled to room temperature, transferred to a separating funnel and then extracted with water and ethyl acetate. The extract was dried with $MgSO_4$, followed by filtration and concentration. The sample was purified by silica gel column chromatography and then subjected to sublimation purification to obtain Compound 2-1 (9.8 g, yield 31%, MS: $[M+H]^+$=715).

Preparation Example 2-2: Preparation of Compound 2-2

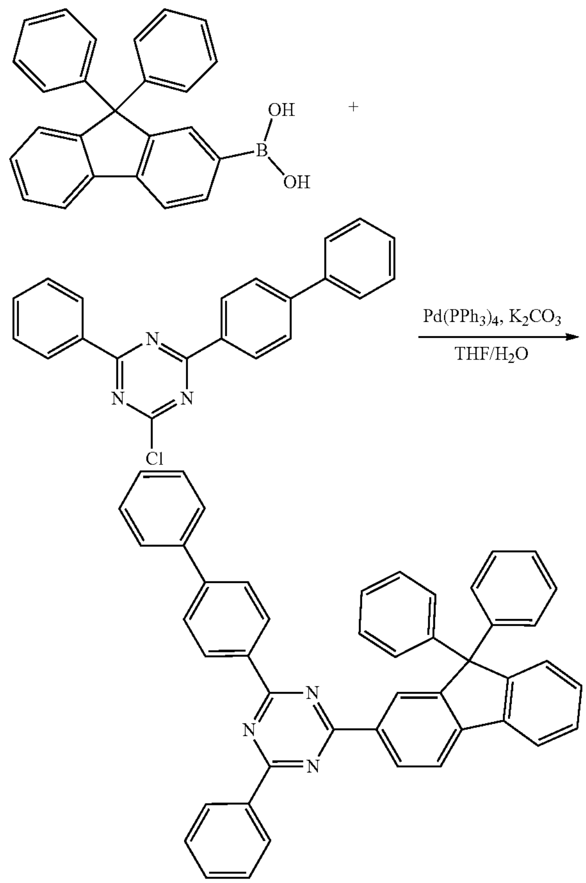

2-2

Compound 2-2 (9.7 g, yield 28%, MS: $[M+H]^+$=626) was prepared in the same manner as in the preparation method of Compound 2-1, except that (9,9-diphenyl-9H-fluoren-2-yl) boronic acid was used instead of (10-phenyl-10H-spiro [acridine-9,9'-fluorene]-2'-yl)boronic acid and 2-([1,1'-biphenyl]-4-yl)-4-chloro-6-phenyl-1,3,5-triazine was used instead of 2-(3-chlorophenyl)-4,6-diphenyl-1,3,5-triazine in Preparation Example 2-1.

Preparation Example 2-3: Preparation of Compound 2-3

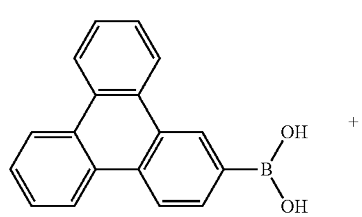

-continued

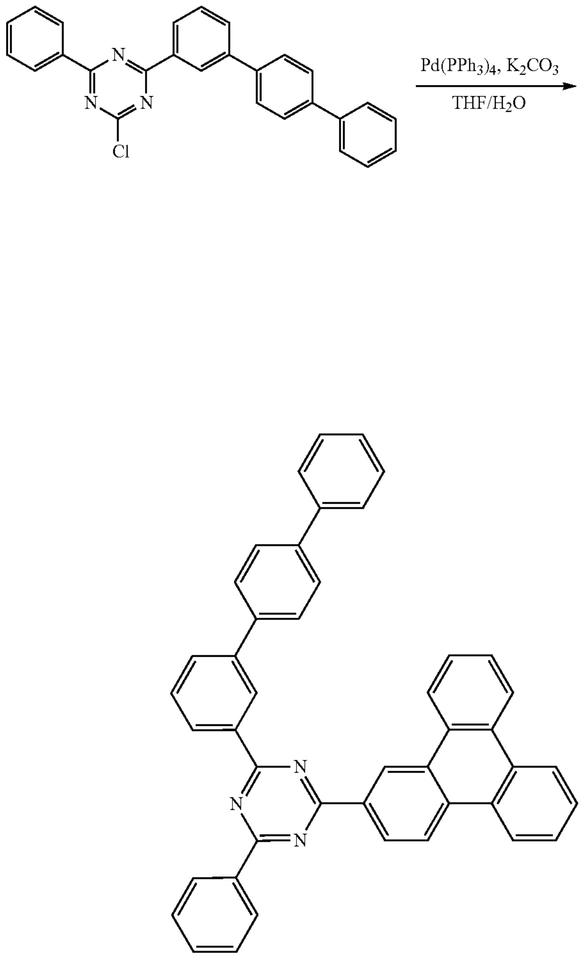

2-3

Compound 2-3 (13.9 g, yield 31%, MS: $[M+H]^{+}$=612) was prepared in the same manner as in the preparation method of Compound 2-1, except that triphenylene-2-ylboronic acid was used instead of (10-phenyl-10H-spiro[acridine-9,9'-fluorene]-2'-yl)boronic acid and 2-([1,1':4',1"-terphenyl]-3-yl)-4-chloro-6-phenyl-1,3,5-triazine was used instead of 2-(3-chlorophenyl)-4,6-diphenyl-1,3,5-triazine in Preparation Example 2-1.

Preparation Example 2-4: Preparation of Compound 2-4

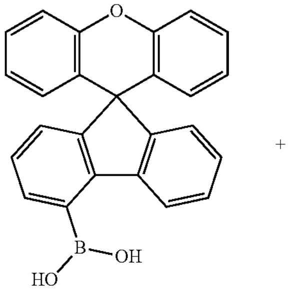

-continued

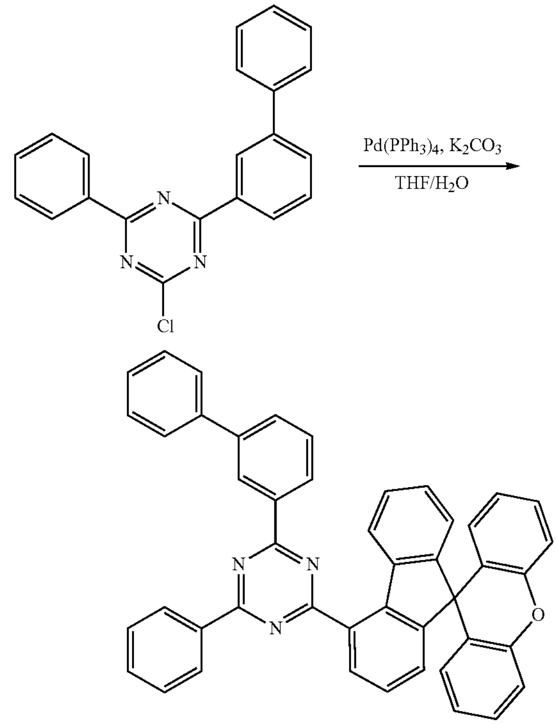

2-4

Compound 2-4 (9.9 g, yield 29%, MS: $[M+H]^{+}$=640) was prepared in the same manner as in the preparation method of Compound 2-1, except that spiro[fluorene-9,9'-xanthene]-4-ylboronic acid was used instead of (10-phenyl-10H-spiro[acridine-9,9'-fluorene]-2'-yl) boronic acid and 2-([1,1'-biphenyl]-3-yl)-4-chloro-6-phenyl-1,3,5-triazine was used instead of 2-(3-chlorophenyl)-4,6-diphenyl-1,3,5-triazine in Preparation Example 2-1.

Preparation Example 2-5: Preparation of Compound 2-5

Step 1) Preparation of Compound 2-5-a

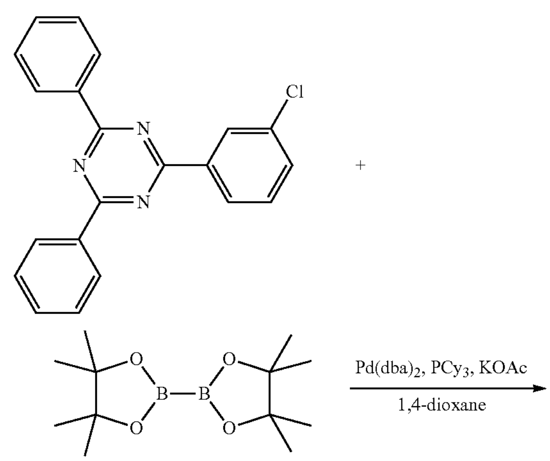

-continued

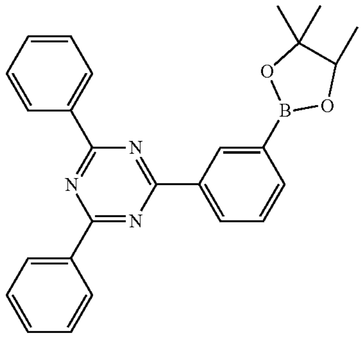

2-5-a 2-(3-Chlorophenyl)-4,6-diphenyl-1,3,5-triazine (20.0 g, 58.2 mmol), bis(pinacolato)diboron (17.7 g, 69.8 mmol), $Pd(dba)_2$ (0.7 g, 1.2 mmol), tricyclohexylphosphine (0.7 g, 2.3 mmol), KOAc (11.4 g, 116.3 mmol), and 1,4-dioxane (300 mL) were added to a three-necked flask, and the mixture was stirred under reflux under argon atmosphere for 12 hours. After completion of the reaction, the reaction solution was cooled to room temperature, transferred to a separating funnel, to which water (200 mL) was added and extracted with ethyl acetate. The extract was dried with $MgSO_4$, followed by filtration and concentration. The sample was purified by silica gel column chromatography to obtain Compound 2-5-a (17.2 g, yield 68%, MS: $[M+H]^+$= 435).

Step 2) Preparation of Compound 2-5-b

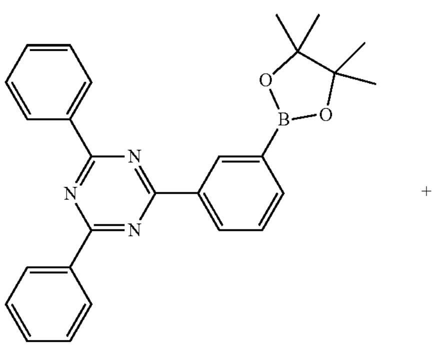

2-5-a

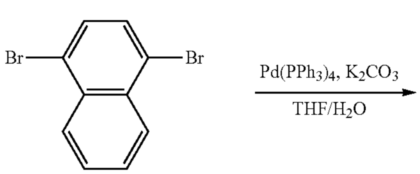

-continued

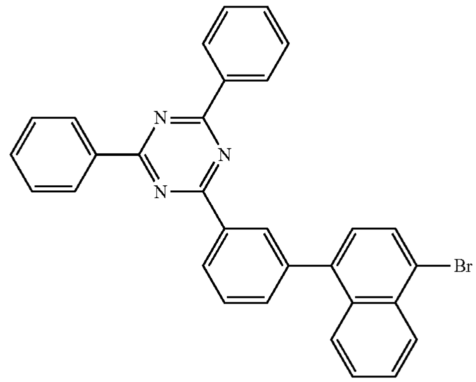

2-5-b

To a three-necked flask was added a solution where Compound 2-5-a (15.0 g, 34.5 mmol) and 1,4-dibromonaphthalene (10.3 g, 36.2 mmol) were dissolved in THF (225 mL) and $K_2CO_3$ (19.0 g, 137.8 mmol) was dissolved in water (113 mL). $Pd(PPh_3)_4$ (1.6 g, 1.4 mmol) was added thereto, and the mixture was stirred under reflux under argon atmosphere for 8 hours. After completion of the reaction, the reaction solution was cooled to room temperature, transferred to a separating funnel and then extracted with water and ethyl acetate. The extract was dried with $MgSO_4$, followed by filtration and concentration. The sample was purified by silica gel column chromatography to obtain Compound 2-5-b (13.3 g, yield 75%, MS: $[M+H]^+$=514).

Step 3) Preparation of Compound 2-5

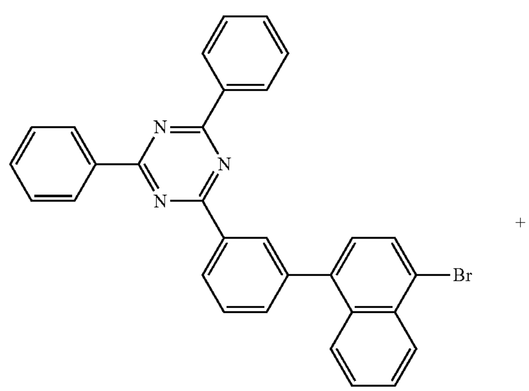

2-5-b

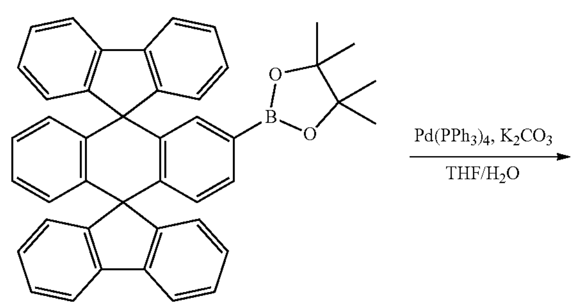

-continued

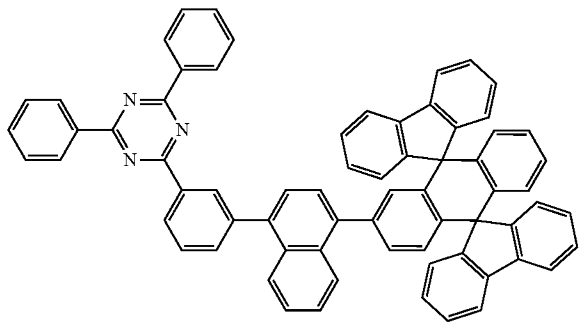

2-5

To a three-necked flask was added a solution where Compound 2-5-b (13.0 g, 25.3 mmol) and 2-(dispiro[fluorene-9,9'-anthracene-10',9''-fluorene]-2'-yl)-4,4,5,5-tetramethyl-1,3,2-dioxaborolane (16.9 g, 27.8 mmol) were dissolved in THF (195 mL) and $K_2CO_3$ (14.0 g, 101.1 mmol) was dissolved in water (98 mL). $Pd(PPh_3)_4$ (1.2 g, 1.0 mmol) was added thereto, and the mixture was stirred under reflux under argon atmosphere for 8 hours. After completion of the reaction, the reaction solution was cooled to room temperature, transferred to a separating funnel and then extracted with water and ethyl acetate. The extract was dried with $MgSO_4$, followed by filtration and concentration. The sample was purified by silica gel column chromatography and then subjected to sublimation purification to obtain Compound 2-5 (8.1 g, yield 35%, MS: $[M+H]^+$=914).

Preparation Example 2-6: Preparation of Compound 6

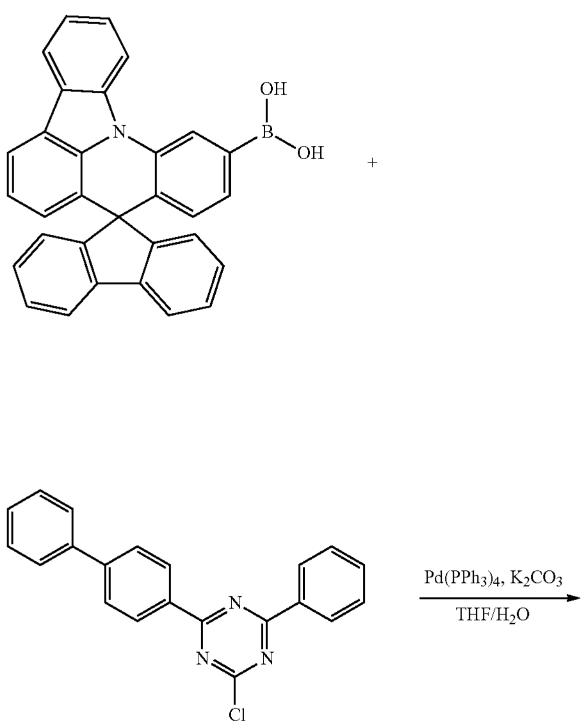

-continued

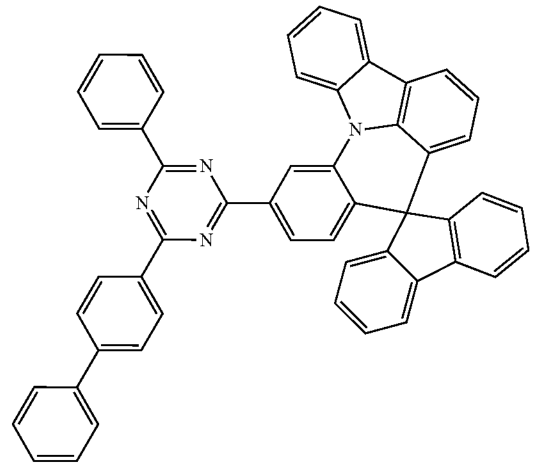

2-6

Compound 2-6 (9.8 g, yield 31%, MS: $[M+H]^+$=713) was prepared in the same manner as in the preparation method of Compound 2-1, except that spiro[fluorene-9,8'-indolo[3,2,1-de]acridine]-11'-ylboronic acid was used instead of (10-phenyl-10H-spiro[acridine-9,9'-fluorene]-2-yl)boronic acid and 2-([1,1'-biphenyl]-4-yl)-4-chloro-6-phenyl-1,3,5-triazine was used instead of 2-(3-chlorophenyl)-4,6-diphenyl-1,3,5-triazine in Preparation Example 2-1.

Preparation Example 2-7: Preparation of Compound 2-7

Step 1) Preparation of Compound 2-7-a

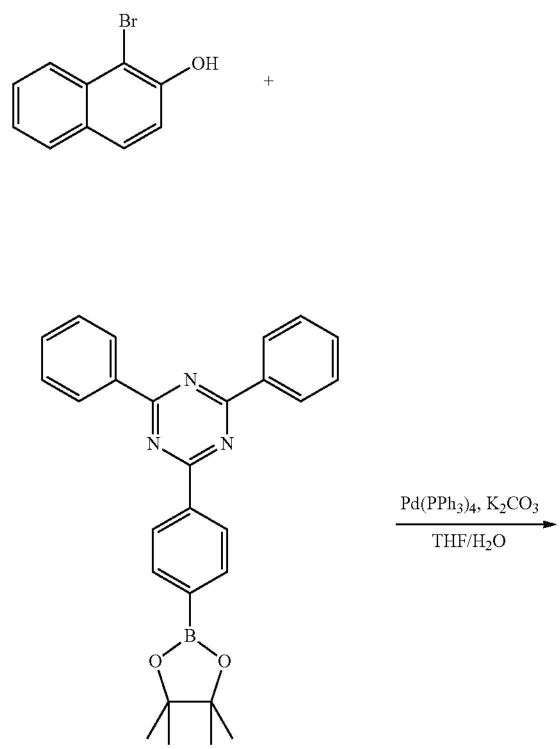

-continued

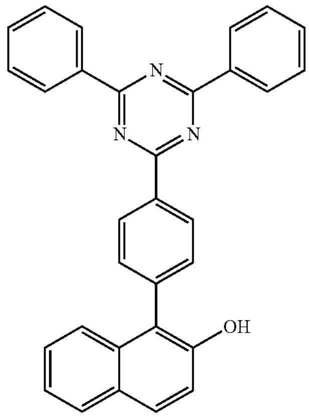

2-7-a

To a three-necked flask was added a solution where 1-bromonaphthalene-2-ol (20.0 g, 89.7 mmol) and 2,4-diphenyl-6-(4-(4,4,5,5-tetramethyl-1,3,2-dioxaborolan-2-yl)phenyl)-1,3,5-triazine (42.9 g, 98.6 mmol) were dissolved in THF (300 mL) and $K_2CO_3$ (49.6 g, 358.6 mmol) was dissolved in water (150 mL). $Pd(PPh_3)_4$ (4.1 g, 3.6 mmol) was added thereto, and the mixture was stirred under reflux under argon atmosphere for 8 hours. After completion of the reaction, the reaction solution was cooled to room temperature, transferred to a separating funnel and then extracted with water and ethyl acetate. The extract was dried with $MgSO_4$, followed by filtration and concentration. The sample was purified by silica gel column chromatography to obtain Compound 2-7-a (30.0 g, yield 74%, MS: $[M+H]^+$= 452).

Step 2) Preparation of Compound 2-7-b

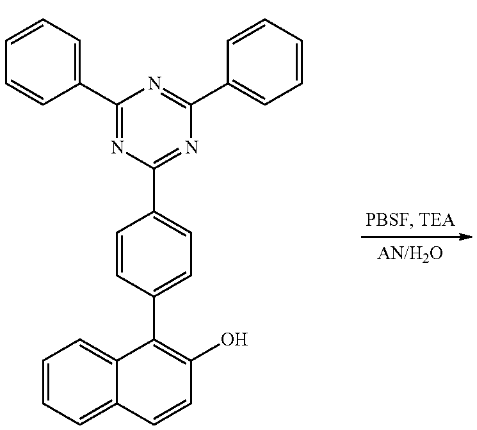

2-7-a

-continued

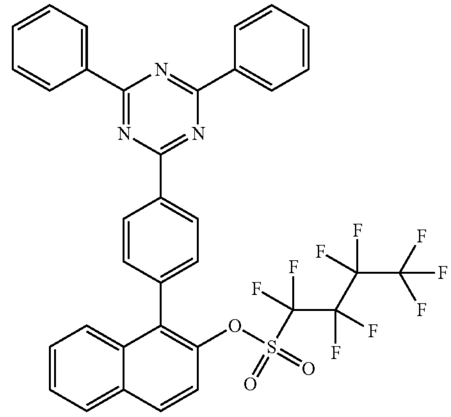

2-7-b

In a three-necked flask, Compound 2-7-a (30.0 g, 66.4 mmol) was dissolved in acetonitrile (840 mL), to which triethylamine (15 mL, 106.3 mmol) and perfluoro-1-butanesulfonyl fluoride (18 mL, 99.7 mmol) were added, and the mixture was stirred at room temperature overnight. After completion of the reaction, the reaction solution was diluted with ethyl acetate, and transferred to a separating funnel, washed with 0.5 M sodium bisulfite aqueous solution, and then an organic layer was extracted. The extract was dried with $MgSO_4$, followed by filtration and concentration. The sample was purified by silica gel column chromatography to obtain Compound 2-7-b (29.7 g, yield 61%, MS: $[M+H]^+$= 734).

Step 3) Preparation of Compound 2-7

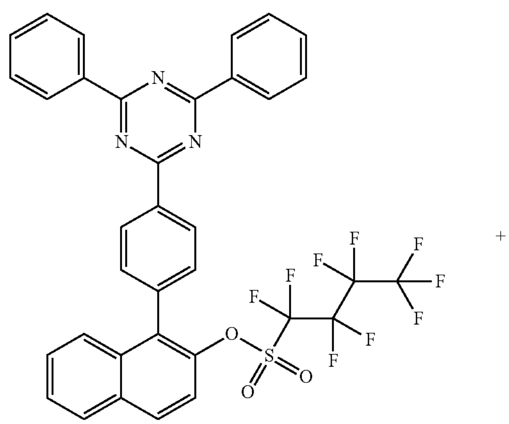

2-7-b

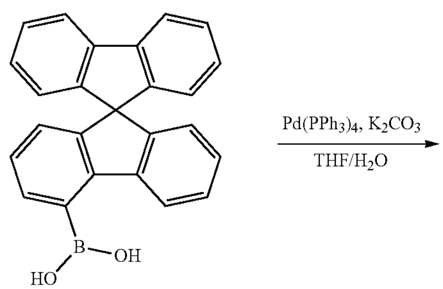

-continued

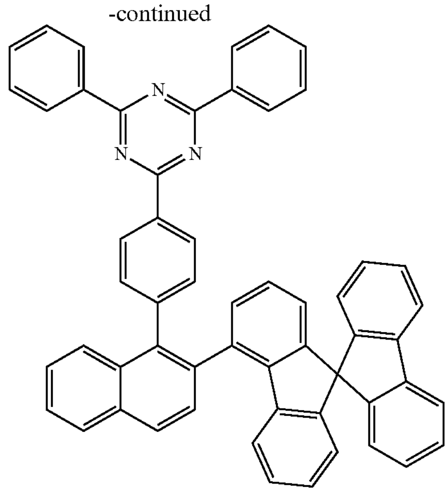

2-7

To a three-necked flask was added a solution where Compound 2-7-b (25.0 g, 34.1 mmol) and 9,9'-spirobi[fluorene]-4-ylboronic acid (13.5 g, 37.5 mmol) were dissolved in THF (375 mL) and $K_2CO_3$ (18.8 g, 136.3 mmol) was dissolved in water (188 mL). $Pd(PPh_3)_4$ (1.6 g, 1.4 mmol) was added thereto, and the mixture was stirred under reflux under argon atmosphere for 8 hours. After completion of the reaction, the reaction solution was cooled to room temperature, transferred to a separating funnel and then extracted with water and ethyl acetate. The extract was dried with $MgSO_4$, followed by filtration and concentration. The sample was purified by silica gel column chromatography and then subjected to sublimation purification to obtain Compound 2-7 (7.9 g, yield 31%, MS: $[M+H]^+$=750).

Example 1

Example 1-1

A glass substrate on which a thin film of ITO (indium tin oxide) was coated in a thickness of 1,400 Å was put into distilled water containing the detergent dissolved therein and washed by the ultrasonic wave. In this case, the used detergent was a product commercially available from Fisher Co. and the distilled water was one which had been twice filtered by using a filter commercially available from Millipore Co. The ITO was washed for 30 minutes, and ultrasonic washing was then repeated twice for 10 minutes by using distilled water. After the washing with distilled water was completed, the substrate was ultrasonically washed with isopropyl alcohol, acetone, and methanol solvent, and dried, after which it was transported to a plasma cleaner. Then, the substrate was cleaned with oxygen plasma for 5 minutes, and then transferred to a vacuum evaporator.

On the ITO transparent electrode thus prepared, a compound represented by Formula HI-A below and a compound represented by Formula HAT below were sequentially subjected to thermal vacuum-deposition in a thickness of 650 Å and 50 Å, respectively, to form a hole injection layer. A compound represented by Formula HT-A below was vacuum-deposited thereon in a thickness of 600 Å as a hole transport layer, and a compound represented by Formula HT-B below was thermally vacuum-deposited in a thickness of 50 Å as an electron blocking layer. Then, the Compound 1-1 prepared in Preparation Example 1-1 and a compound represented by Formula BD below were vacuum-deposited at a weight ratio of 96:4 as a light emitting layer in a thickness of 200 Å. Then, the compound 2-1 prepared in Preparation Example 2-1 and a compound represented by Formula Liq below were thermally vacuum-deposited at a weight ratio of 1:1 in a thickness of 360 Å as an electron transport layer and an electron injection layer, and then the compound represented by Formula Liq was vacuum-deposited in a thickness of 5 Å. Magnesium and silver were sequentially deposited at a weight ratio of 10:1 on the electron injection layer in a thickness of 220 Å, and aluminum was deposited in a thickness of 1000 Å to form a cathode, thereby preparing an organic light emitting device.

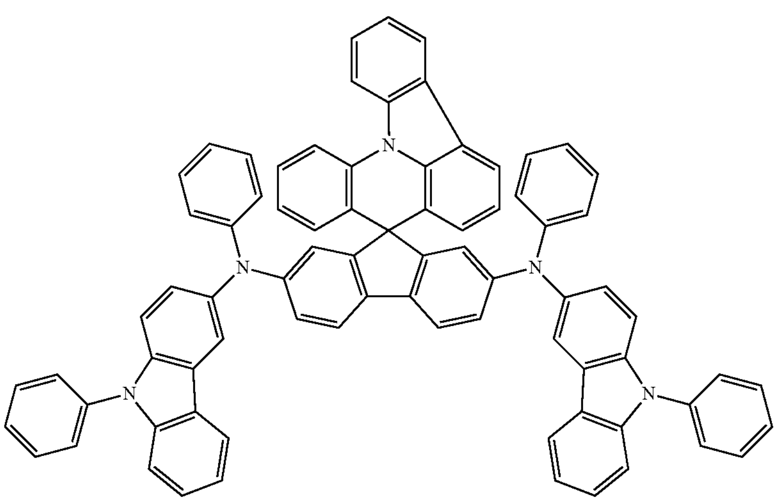

HI-A

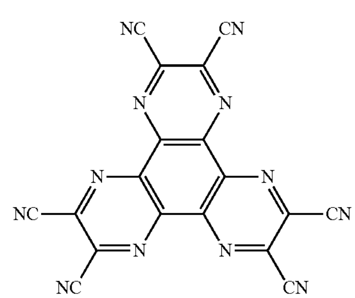

HAT

-continued

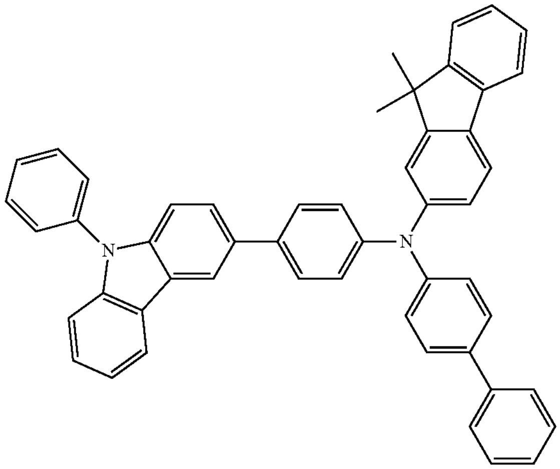

HT-A

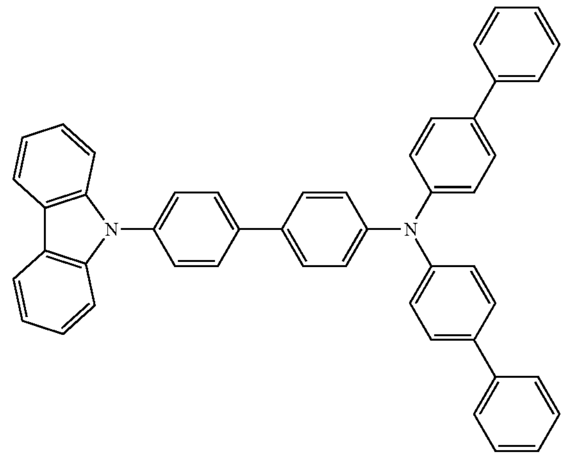

HT-B 1-1

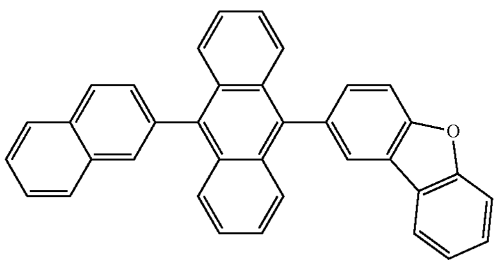

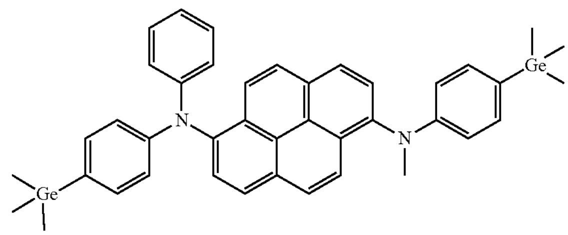

BD 2-1

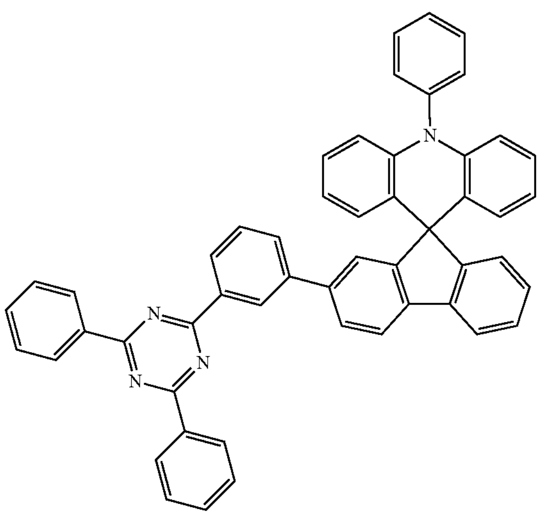

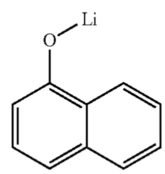

Liq

Example 1-2 to 1-16

The organic light emitting device was manufactured in the same manner as in Example 1-1, except that the compounds shown in Table 1 below were used as the host materials and the electron transport layer materials in Example 1-1.

Comparative Examples 1-2 to 1-11

The organic light emitting device was manufactured in the same manner as in Example 1-1, except that the compounds shown in Table 1 below were used as the host materials and the electron transport layer materials in Example 1-1. In Table 1, BH-A, BH-B, BH-C, BH-D, ET-A, ET-B, ET-C, ET-D, and ET-E are as follows.

-continued
BH-A
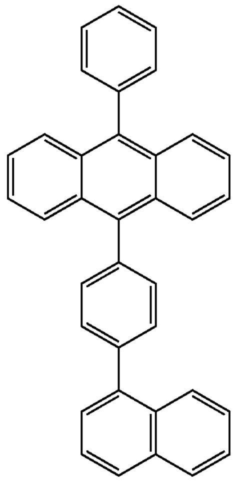
BH-B
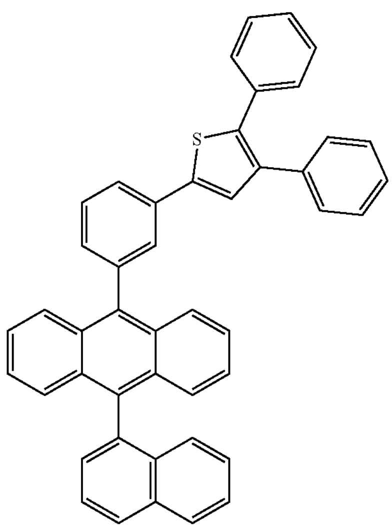
BH-C
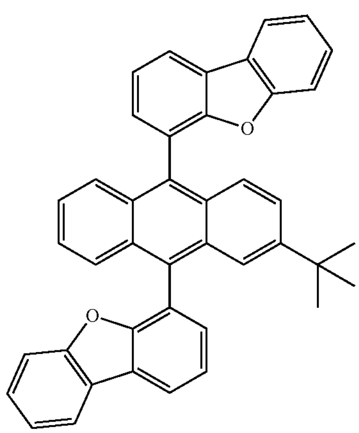
BH-D
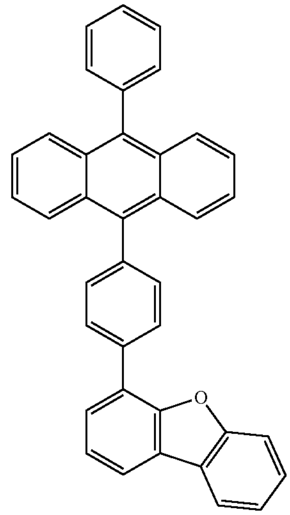
ET-A
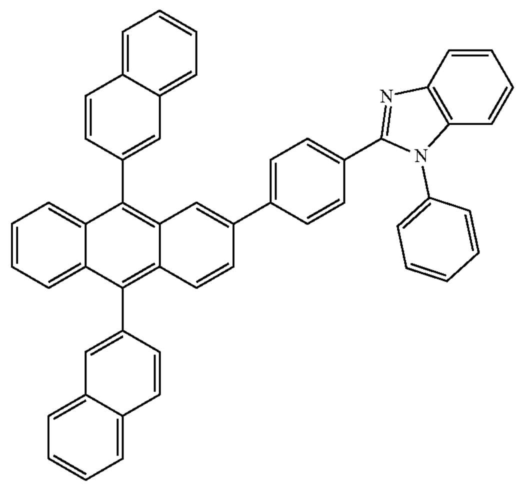
ET-B
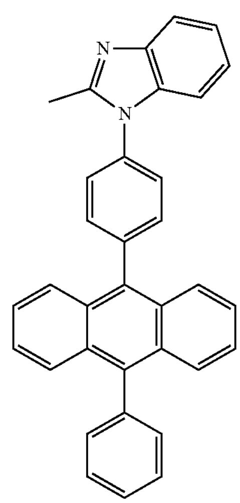

-continued

ET-C

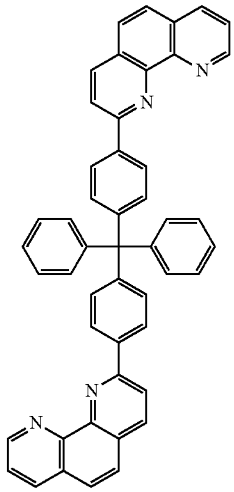

ET-D

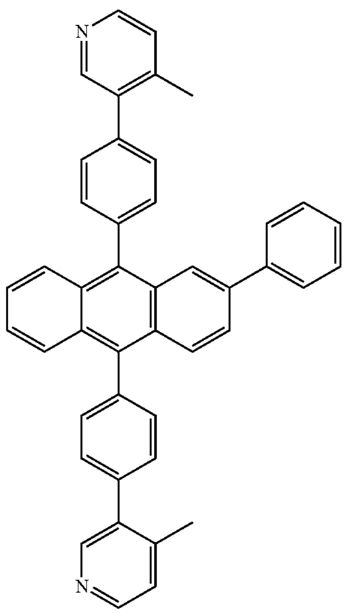

-continued

ET-E

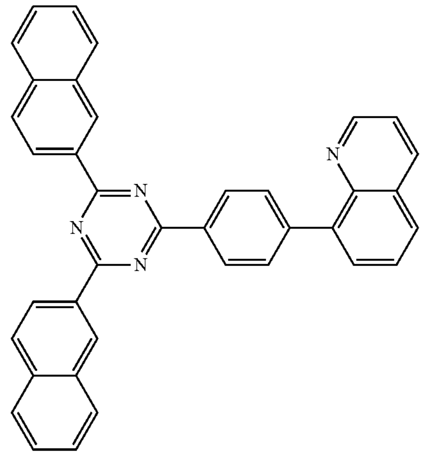

The device performance was measured at the current density of 10 mA/$cm^2$ for the organic light emitting devices manufactured in the Examples and Comparative Examples, and the time required until the initial luminance was decreased by 90% at the current density of 20 mA/$cm^2$ was measured. The results are shown in Table 1 below.

TABLE 1

| | | Electron transport | @ 10 mA/$cm^2$ | | | | @ 20 mA/$cm^2$ |
|---|---|---|---|---|---|---|---|
| Ex. | Host | layer | V | cd/A | CIE-x | CIE-y | Lifetime (hr) |
| Ex. 1-1 | Com. 1-1 | Com. 2-1 | 3.89 | 5.21 | 0.138 | 0.131 | 151 |
| Ex. 1-2 | Com. 1-1 | Com. 2-2 | 3.81 | 5.28 | 0.138 | 0.130 | 148 |
| Ex. 1-3 | Com. 1-1 | Com. 2-3 | 3.85 | 5.26 | 0.139 | 0.130 | 161 |
| Ex. 1-4 | Com. 1-1 | Com. 2-4 | 3.88 | 5.21 | 0.138 | 0.129 | 147 |
| Ex. 1-5 | Com. 1-2 | Com. 2-1 | 3.92 | 5.20 | 0.139 | 0.131 | 150 |
| Ex. 1-6 | Com. 1-2 | Com. 2-2 | 3.95 | 5.24 | 0.137 | 0.130 | 152 |
| Ex. 1-7 | Com. 1-2 | Com. 2-3 | 3.98 | 5.21 | 0.138 | 0.132 | 161 |
| Ex. 1-8 | Com. 1-2 | Com. 2-4 | 3.97 | 5.23 | 0.138 | 0.130 | 158 |
| Ex. 1-9 | Com. 1-3 | Com. 2-1 | 3.89 | 5.27 | 0.137 | 0.130 | 146 |
| Ex. 1-10 | Com. 1-3 | Com. 2-2 | 3.90 | 5.21 | 0.138 | 0.130 | 152 |
| Ex. 1-11 | Com. 1-3 | Com. 2-3 | 3.88 | 5.26 | 0.138 | 0.130 | 156 |
| Ex. 1-12 | Com. 1-3 | Com. 2-4 | 3.87 | 5.13 | 0.139 | 0.130 | 141 |
| Ex. 1-13 | Com. 1-4 | Com. 2-1 | 3.98 | 5.15 | 0.138 | 0.131 | 147 |
| Ex. 1-14 | Com. 1-4 | Com. 2-2 | 3.94 | 5.12 | 0.138 | 0.130 | 138 |
| Ex. 1-15 | Com. 1-4 | Com. 2-3 | 4.01 | 5.19 | 0.138 | 0.130 | 129 |
| Ex. 1-16 | Com. 1-4 | Com. 2-4 | 4.00 | 5.16 | 0.138 | 0.129 | 131 |
| Comparative Ex. 1-1 | BH-A | ET-A | 4.54 | 4.87 | 0.138 | 0.130 | 100 |

TABLE 1-continued

| Ex. | Host | Electron transport layer | @ 10 mA/cm² V | cd/A | CIE-x | CIE-y | @ 20 mA/cm² Lifetime (hr) |
|---|---|---|---|---|---|---|---|
| Comparative Ex. 1-2 | BH-A | Com. 2-1 | 4.73 | 5.08 | 0.141 | 0.130 | 80 |
| Comparative Ex. 1-3 | BH-A | Com. 2-4 | 4.41 | 5.19 | 0.142 | 0.130 | 76 |
| Comparative Ex. 1-4 | BH-B | Com. 2-2 | 4.68 | 5.00 | 0.141 | 0.130 | 91 |
| Comparative Ex. 1-5 | Com. 1-1 | ET-A | 3.93 | 4.18 | 0.140 | 0.131 | 75 |
| Comparative Ex. 1-6 | Com. 1-1 | ET-D | 3.85 | 4.08 | 0.139 | 0.130 | 80 |
| Comparative Ex. 1-7 | Com. 1-2 | ET-B | 3.91 | 4.15 | 0.139 | 0.131 | 83 |
| Comparative Ex. 1-8 | Com. 1-3 | ET-C | 3.88 | 3.98 | 0.138 | 0.132 | 68 |
| Comparative Ex. 1-9 | Com. 1-4 | ET-D | 3.99 | 3.79 | 0.141 | 0.131 | 35 |
| Comparative Ex. 1-10 | BH-C | ET-C | 4.09 | 4.53 | 0.137 | 0.130 | 5 |
| Comparative Ex. 1-11 | BH-D | ET-E | 4.08 | 4.36 | 0.138 | 0.130 | 30 |

As shown in Table 1, the compounds represented by Chemical Formula 1 of the present invention is advantageous for the injection of holes and electrons into the light emitting layer, and exhibits low voltage characteristics when used as host materials. The compounds represented by Chemical Formula 2 have excellent electron transporting characteristics, and when applied to an electron transport layer, a highly efficient device can be obtained. Particularly, when both of them are applied at the same time, it can be confirmed that the balance of the hole and electron in the light emitting layer is well matched, so that it has remarkable effect in not only voltage and efficiency but also lifetime.

Example 2

Example 2-1

A glass substrate on which a thin film of ITO (indium tin oxide) was coated in a thickness of 1,400 Å was put into distilled water containing the detergent dissolved therein and washed by the ultrasonic wave. In this case, the used detergent was a product commercially available from Fisher Co. and the distilled water was one which had been twice filtered by using a filter commercially available from Millipore Co. The ITO was washed for 30 minutes, and ultrasonic washing was then repeated twice for 10 minutes by using distilled water. After the washing with distilled water was completed, the substrate was ultrasonically washed with isopropyl alcohol, acetone, and methanol solvent, and dried, after which it was transported to a plasma cleaner. Then, the substrate was cleaned with oxygen plasma for 5 minutes, and then transferred to a vacuum evaporator.

On the ITO transparent electrode thus prepared, a compound represented by Formula HI-A below and a compound represented by Formula HAT below were sequentially subjected to thermal vacuum-deposition in a thickness of 650 Å and 50 Å, respectively, to form a hole injection layer. A compound represented by Formula HT-A below was vacuum-deposited thereon in a thickness of 600 Å as a hole transport layer, and a compound represented by Formula HT-B below was thermally vacuum-deposited in a thickness of 50 Å as an electron blocking layer. Then, the Compound 1-1 prepared in Preparation Example 1-1 and a compound represented by Formula BD below were vacuum-deposited at a weight ratio of 96:4 as a light emitting layer in a thickness of 200 Å. Then, the compound 2-1 prepared in Preparation Example 2-1 was vacuum-deposited as a hole blocking layer in a thickness of 50 Å. A compound represented by Formula ET-A and a compound represented by Formula Liq below was thermally vacuum-deposited on the hole blocking layer at a weight ratio of 1:1 in a thickness of 319 Å, and then a compound represented by Formula Liq below was vacuum-deposited in a thickness of 5 Å to form an electron transport layer and an electron injection layer. Magnesium and silver were sequentially deposited at a weight ratio of 10:1 on the electron injection layer in a thickness of 220 Å, and aluminum was deposited in a thickness of 1000 Å to form a cathode, thereby preparing an organic light emitting device.

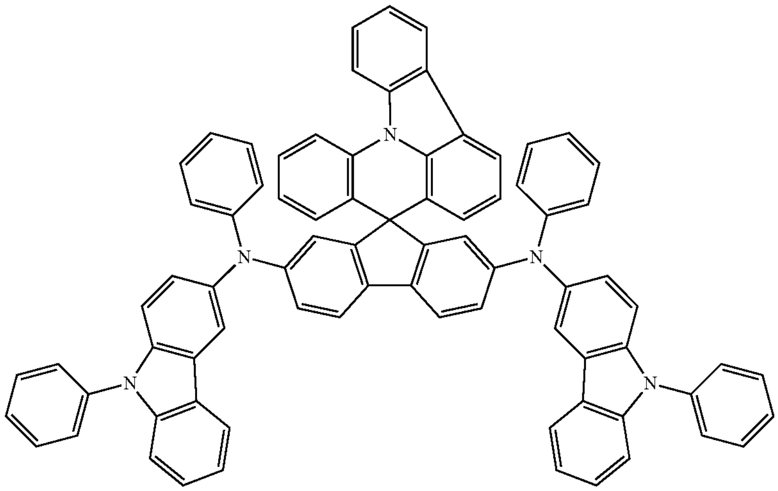
HI-A
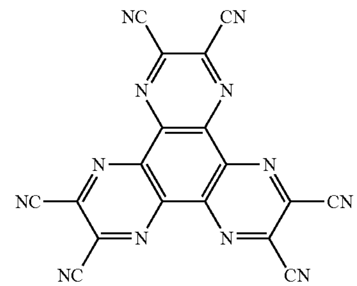
HAT
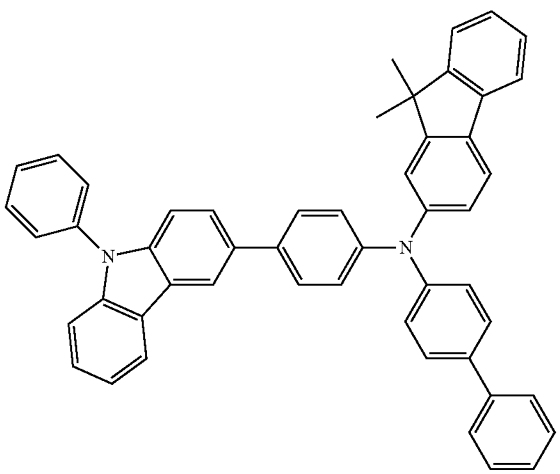
HT-A
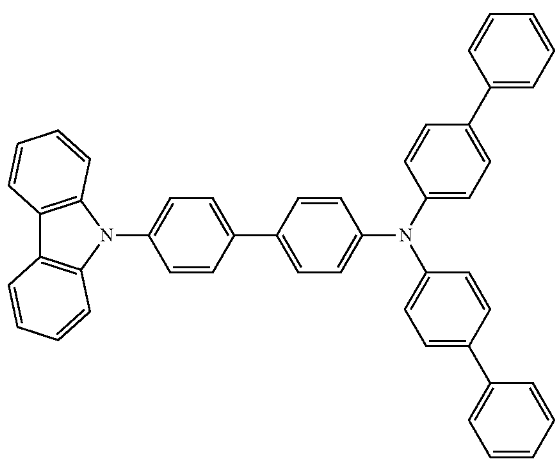
HT-B
1-1
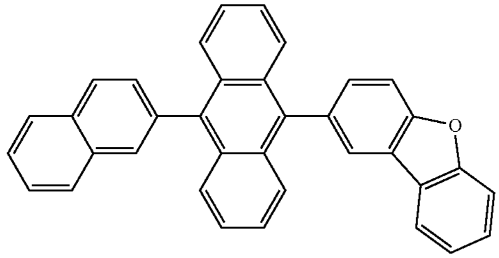
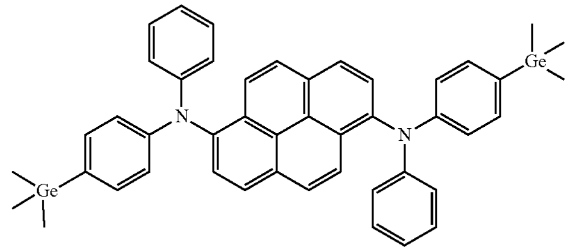
BD -continued 2-1

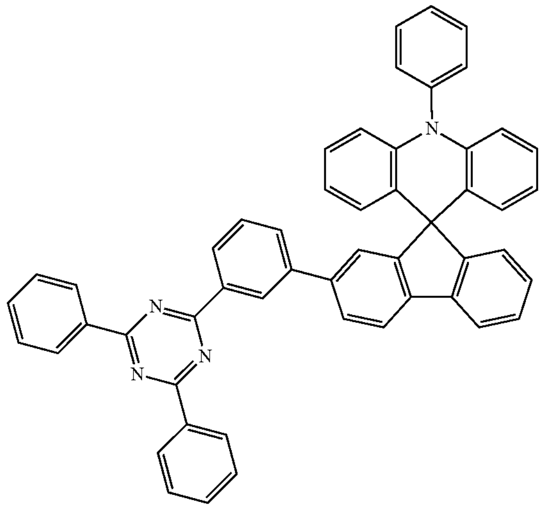

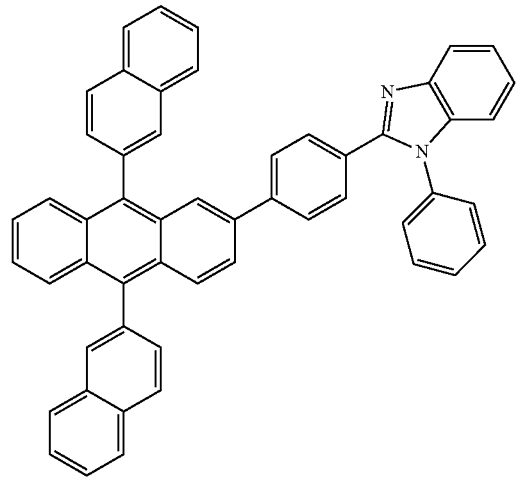

ET-A

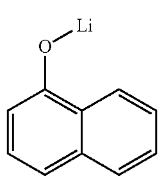

Liq

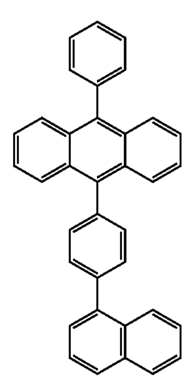

BH-A

Examples 2-2 to 2-16

The organic light emitting device was manufactured in the same manner as in Example 2-1, except that the compounds shown in Table 2 below was used as the host materials and the electron transport layer materials in Example 2-1.

Comparative Examples 2-2 to 2-8

The organic light emitting device was manufactured in the same manner as in Example 2-1, except that the compounds shown in Table 2 below was used as the host materials and the electron transport layer materials in Example 2-1. In Table 2, BH-A, BH-B, BH-C, BH-D, ET-A, HB-A, HB-B and HB-C are as follows.

-continued
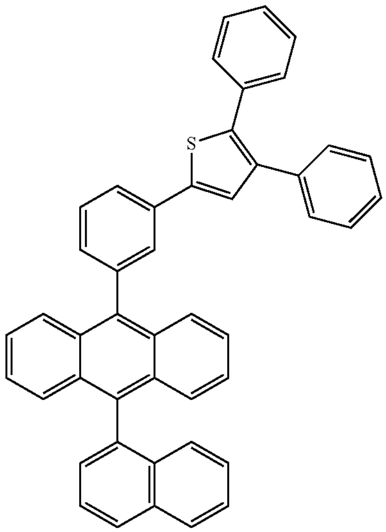
BH-B
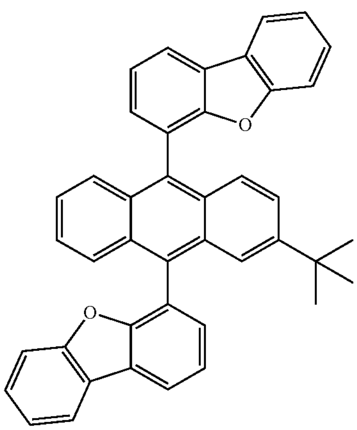
BH-C
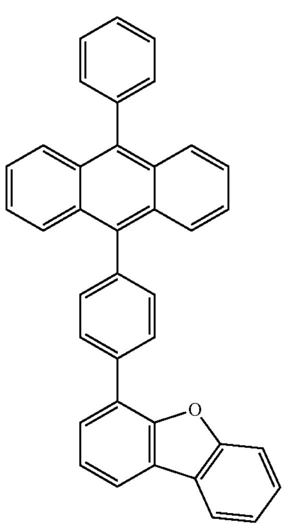
BH-D
-continued
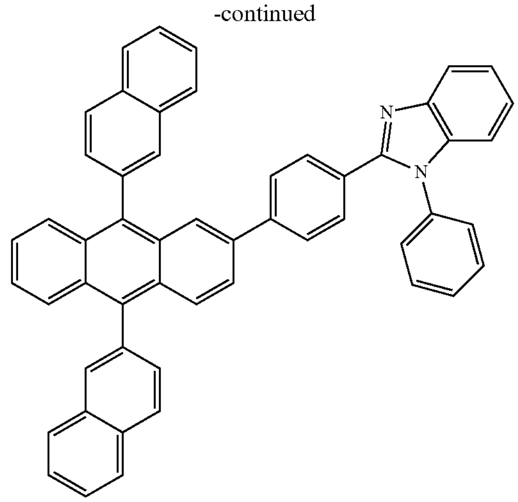
ET-A
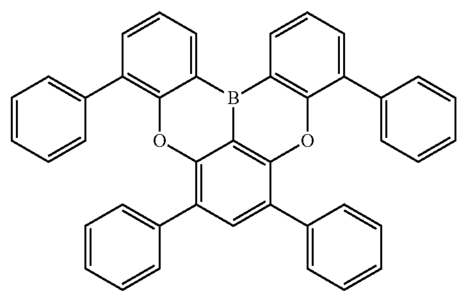
HB-A
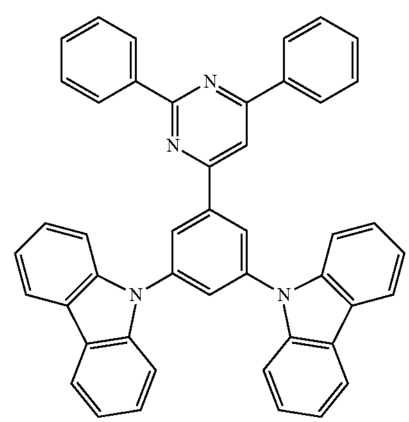
HB-B -continued

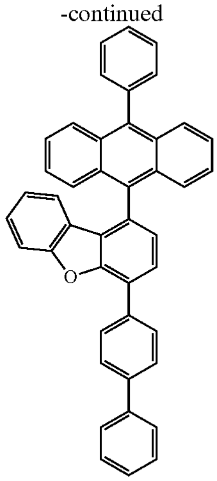

HB-C

The device performance was measured at the current density of 10 $mA/cm^2$ for the organic light emitting devices manufactured in the Examples and Comparative Examples, and the time required until the initial luminance was decreased by 90% at the current density of 20 $mA/cm^2$ was measured. The results are shown in Table 2 below.

TABLE 2

| Ex. | Host | Hole blocking layer | @ 10 mA/cm² V | cd/A | CIE-x | CIE-y | @ 20 mA/cm² Lifetime (hr) |
|---|---|---|---|---|---|---|---|
| Ex. 2-1 | Com. 1-1 | Com. 2-1 | 3.59 | 5.13 | 0.138 | 0.130 | 151 |
| Ex. 2-2 | Com. 1-1 | Com. 2-5 | 3.52 | 5.11 | 0.138 | 0.129 | 148 |
| Ex. 2-3 | Com. 1-1 | Com. 2-6 | 3.54 | 5.18 | 0.138 | 0.130 | 143 |
| Ex. 2-4 | Com. 1-1 | Com. 2-7 | 3.55 | 5.16 | 0.139 | 0.130 | 160 |
| Ex. 2-5 | Com. 1-2 | Com. 2-1 | 3.63 | 5.17 | 0.137 | 0.130 | 148 |
| Ex. 2-6 | Com. 1-2 | Com. 2-5 | 3.59 | 5.10 | 0.139 | 0.131 | 157 |
| Ex. 2-7 | Com. 1-2 | Com. 2-6 | 3.65 | 5.09 | 0.138 | 0.130 | 151 |
| Ex. 2-8 | Com. 1-2 | Com. 2-7 | 3.59 | 5.11 | 0.138 | 0.131 | 156 |
| Ex. 2-9 | Com. 1-3 | Com. 2-1 | 3.58 | 5.19 | 0.138 | 0.129 | 145 |
| Ex. 2-10 | Com. 1-3 | Com. 2-5 | 3.68 | 5.16 | 0.138 | 0.130 | 150 |
| Ex. 2-11 | Com. 1-3 | Com. 2-6 | 3.61 | 5.13 | 0.138 | 0.130 | 151 |
| Ex. 2-12 | Com. 1-3 | Com. 2-7 | 3.65 | 5.14 | 0.137 | 0.129 | 159 |
| Ex. 2-13 | Com. 1-4 | Com. 2-1 | 3.63 | 5.20 | 0.138 | 0.130 | 135 |
| Ex. 2-14 | Com. 1-4 | Com. 2-5 | 3.61 | 5.21 | 0.138 | 0.130 | 142 |
| Ex. 2-15 | Com. 1-4 | Com. 2-6 | 3.68 | 5.19 | 0.139 | 0.130 | 123 |
| Ex. 2-16 | Com. 1-4 | Com. 2-7 | 3.69 | 5.23 | 0.137 | 0.130 | 150 |
| Comparative Ex. 2-1 | BH-A | ET-A | 4.61 | 4.57 | 0.138 | 0.130 | 80 |
| Comparative Ex. 2-2 | BH-B | Com. 2-6 | 4.67 | 5.08 | 0.140 | 0.134 | 68 |
| Comparative Ex. 2-3 | BH-C | Com. 2-7 | 4.58 | 5.01 | 0.142 | 0.132 | 81 |
| Comparative Ex. 2-4 | Com. 1-1 | ET-A | 3.75 | 4.28 | 0.139 | 0.130 | 76 |
| Comparative Ex. 2-5 | Com. 1-1 | HB-A | 3.73 | 4.38 | 0.139 | 0.141 | 61 |
| Comparative Ex. 2-6 | Com. 1-2 | HB-B | 3.79 | 4.51 | 0.138 | 0.132 | 84 |
| Comparative Ex. 2-7 | Com. 1-3 | HB-C | 3.69 | 4.10 | 0.137 | 0.129 | 57 |
| Comparative Ex. 2-8 | BH-D | HB-C | 4.81 | 3.15 | 0.138 | 0.130 | 10 |

As shown in Table 2, it is confirmed that, when the compounds represented by Chemical Formula 1 of the present invention are used as a host material and the compound represented by Chemical Formula 2 is used in combination as a hole blocking material, a remarkable effect in terms of voltage, efficiency, and lifetime can be obtained. That is, it is confirmed that the voltage, efficiency, and lifetime are improved not only when the compounds represented by Chemical Formula 2 of the present invention were used as an electron transport layer but also when they are applied as a hole blocking layer.

| [Description of symbols] | |
|---|---|
| 1: substrate | 2: anode, |
| 3: light emitting layer | 4: electron transport region |
| 5: cathode | 6: hole blocking layer |
| 7: electron transport layer | 8: hole transport layer |

The invention claimed is:

1. An organic light emitting device comprising:

an anode;

a cathode;

a light emitting layer disposed between the anode and the cathode; and an electron transport region between the cathode and the light emitting layer, wherein the light emitting layer comprises a compound represented by Chemical Formula 1, and the electron transport region comprises a compound represented by Chemical Formula 2:

[Chemical Formula 1]

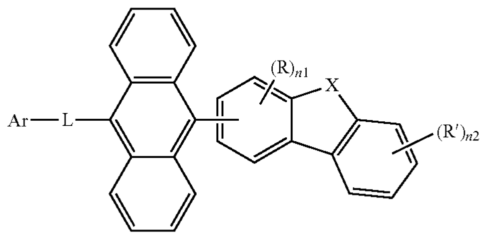

in Chemical Formula 1,

X is O or S,

L is a bond; or a substituted or unsubstituted $C_{6-60}$ arylene,

Ar is a substituted or unsubstituted $C_{6-60}$ aryl,

R and R' are each independently hydrogen; deuterium; halogen; nitrile; nitro; amino; a substituted or unsubstituted $C_{1-60}$ alkyl; a substituted or unsubstituted $C_{3-60}$ cycloalkyl; a substituted or unsubstituted $C_{2-60}$ alkenyl group; a substituted or unsubstituted $C_{6-60}$ aryl; or a substituted or unsubstituted $C_{2-60}$ heteroaryl containing at least one heteroatom selected from the group consisting of N, O and S, n1 is an integer of 0 to 3, and n2 is an integer of 0 to 4,

[Chemical Formula 2]

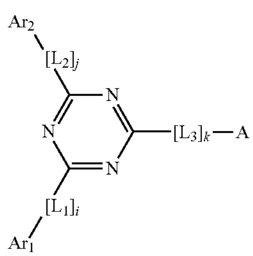

in Chemical Formula 2, $Ar_1$ and $Ar_2$ are each independently substituted or unsubstituted phenyl, substituted or unsubstituted biphenylyl, or substituted or unsubstituted terphenylyl, $L_1$, $L_2$ and $L_3$ are each independently a substituted or unsubstituted $C_{6-60}$ arylene, i, j, and k are each independently 0 or 1, A is represented by Chemical Formula 3,

[Chemical Formula 3]

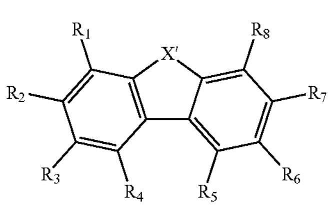

in Chemical Formula 3,

X' is

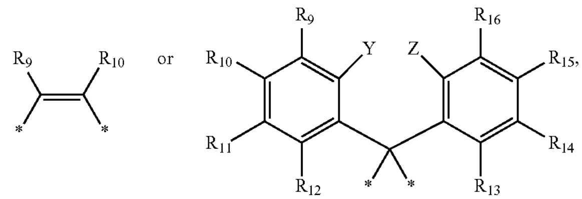

Y and Z are each independently hydrogen or deuterium, or Y and Z together form a bond or —W—, wherein W is $CR_{17}R_{18}$, $SiR_{19}R_{20}$, $NR_{21}$, O, or S, $R_1$ to $R_{21}$ are each independently hydrogen; deuterium; a substituted or unsubstituted $C_{1-60}$ aryl; or a substituted or unsubstituted $C_{2-60}$ heteroaryl containing at least one heteroatom selected from the group consisting of N, O and S, or two adjacent radicals of $R_1$ to $R_{21}$ are linked to form a substituted or unsubstituted $C_{6-60}$ aryl, and one of $R_1$ to $R_{16}$ is linked to $L_3$.

2. The organic light emitting device of claim 1, wherein L is a bond, phenylene, biphenylene, naphthylene, or anthracenylene.

3. The organic light emitting device of claim 1, wherein Ar is phenyl, biphenylyl, terphenylyl, naphthyl, phenylnaphthyl, naphthylphenyl, or phenanthrenyl.

4. The organic light emitting device of claim 1, wherein R and R' are each independently hydrogen, deuterium, phenyl, biphenylyl, or naphthyl.

5. The organic light emitting device of claim 1, wherein the compound represented by the Chemical Formula 1 is any one selected from the group consisting of the following:

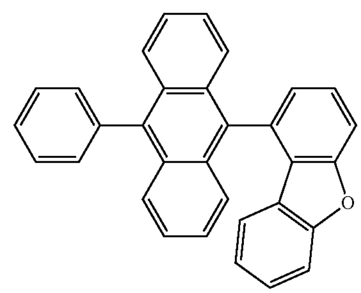

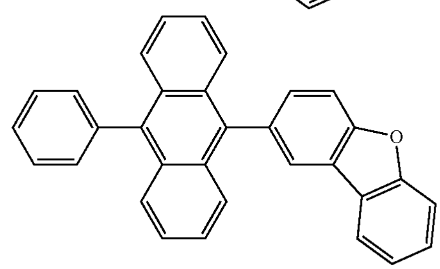

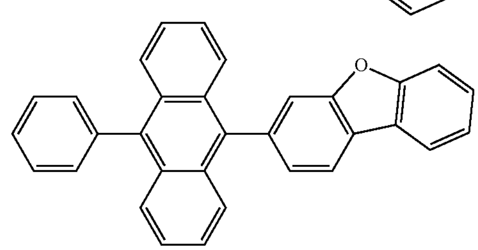

-continued
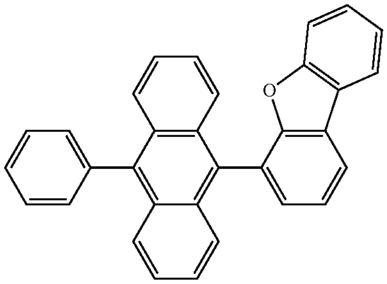
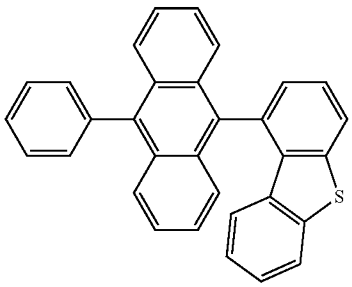
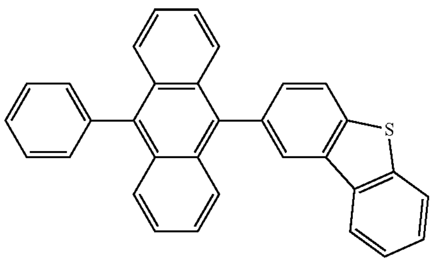
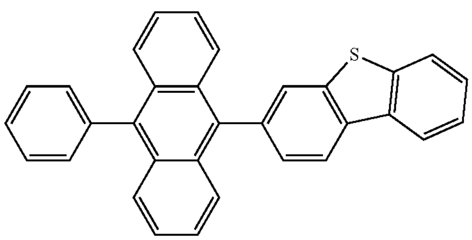
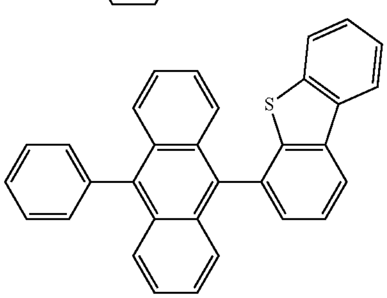
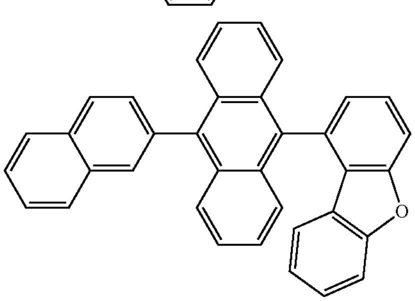
-continued
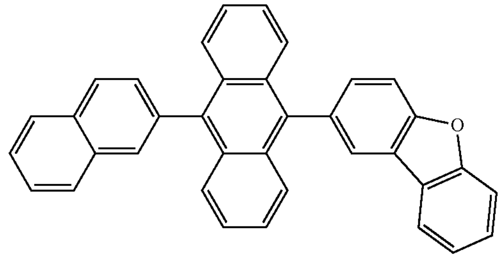
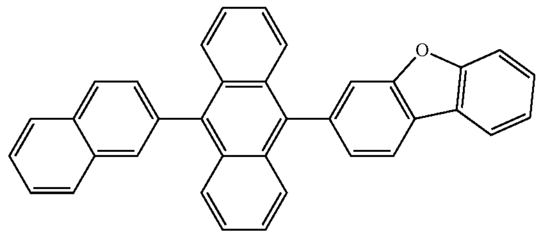
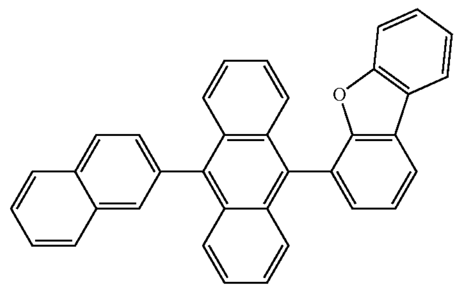
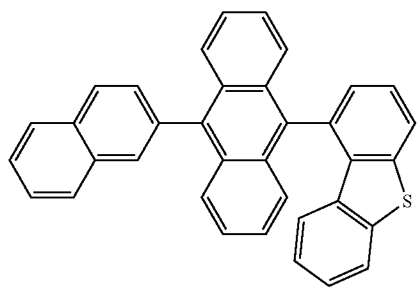
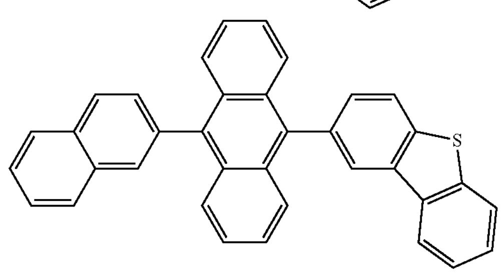
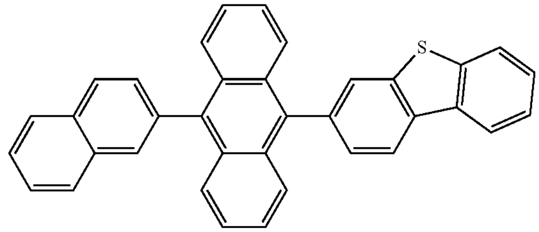

-continued
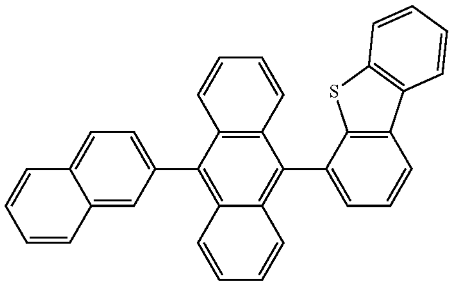
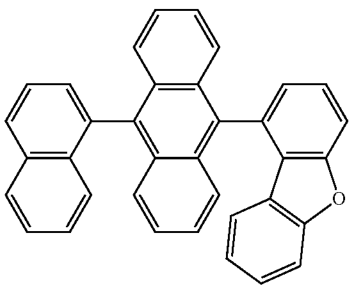
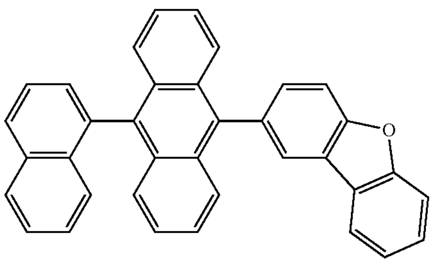
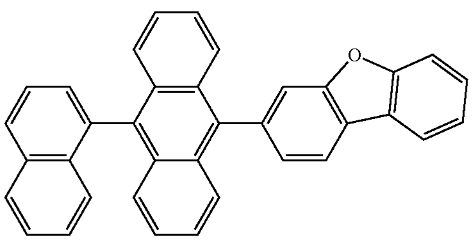
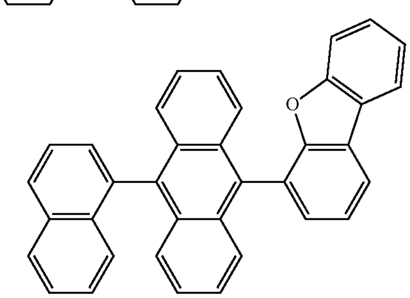
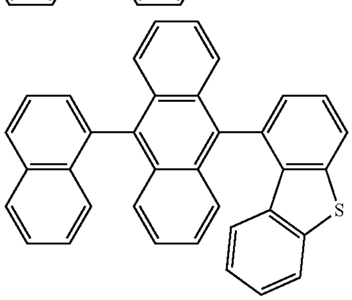
-continued
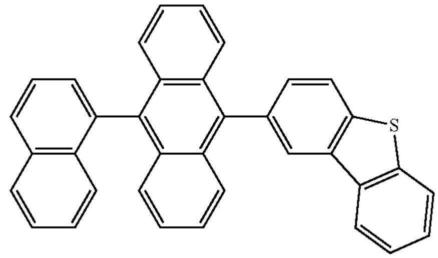
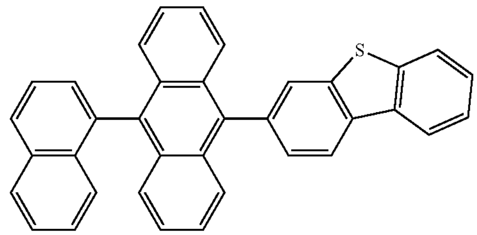
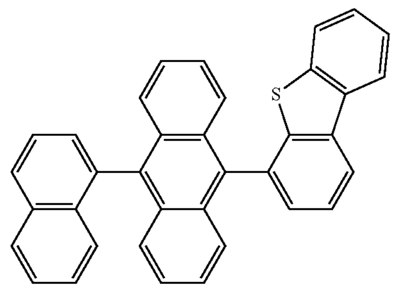
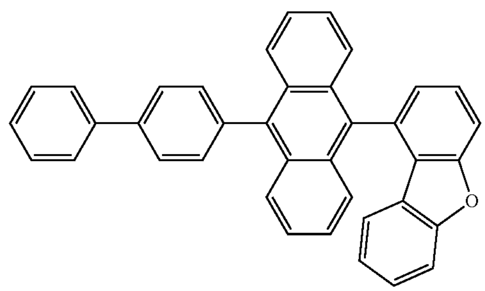
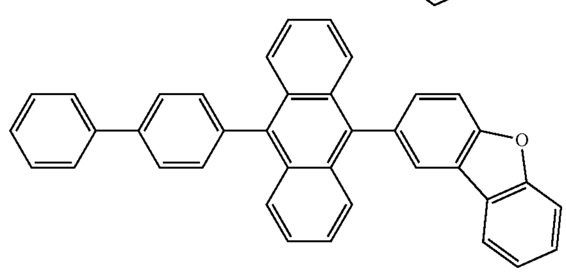
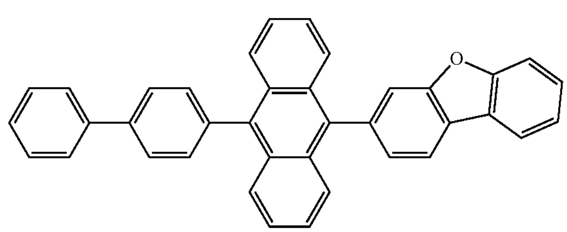

-continued
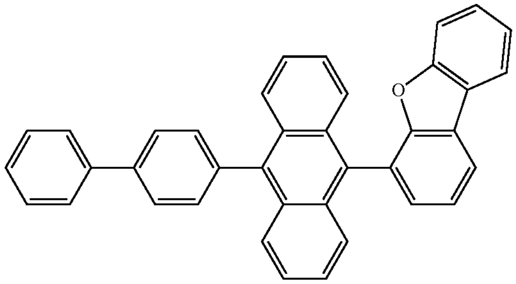
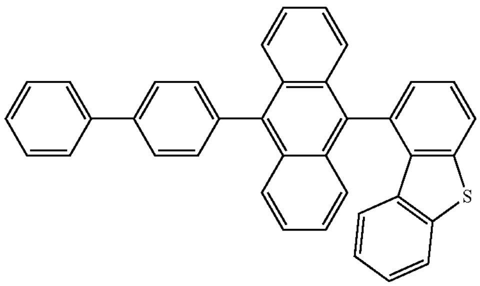
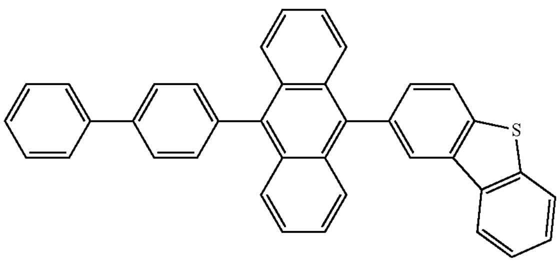
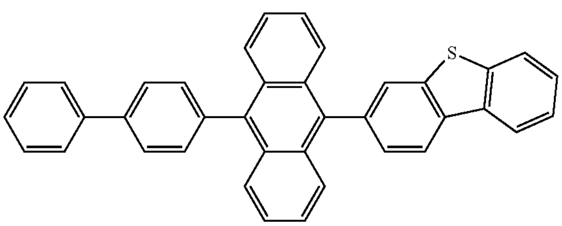
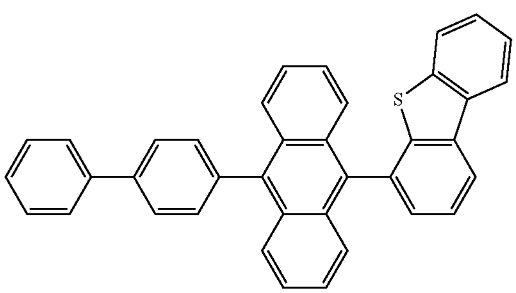
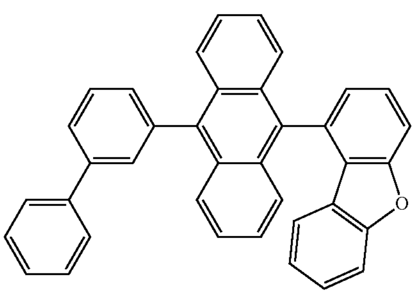
-continued
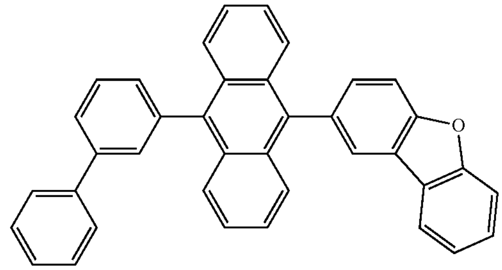
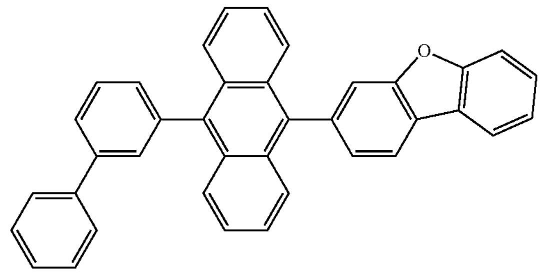
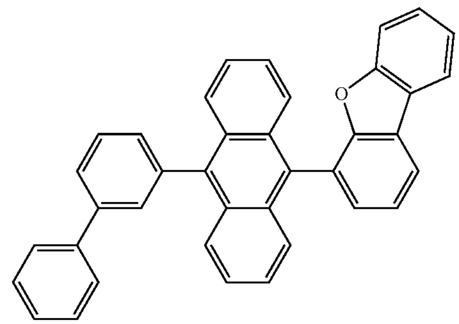
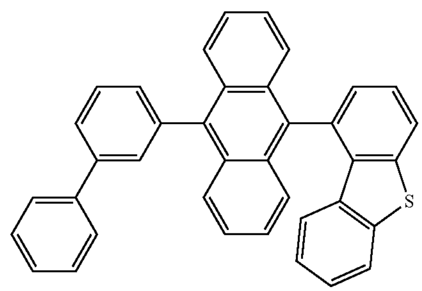
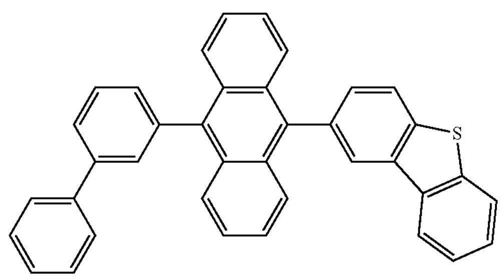
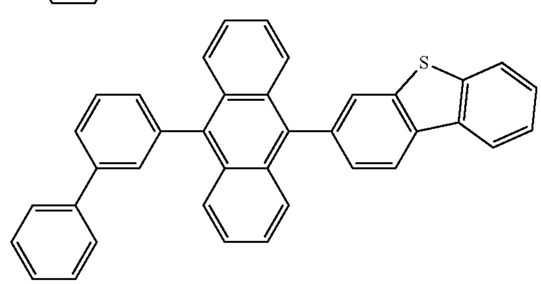

-continued
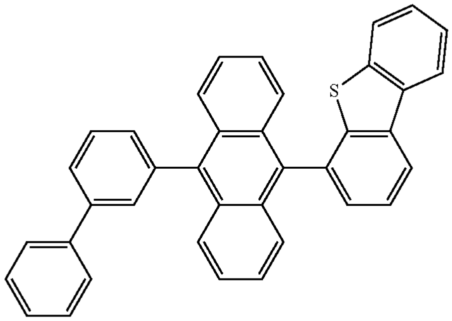
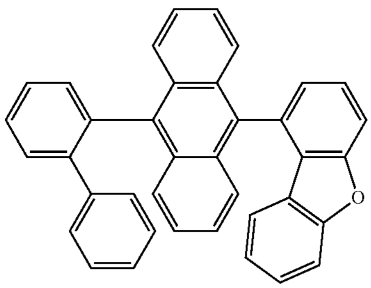
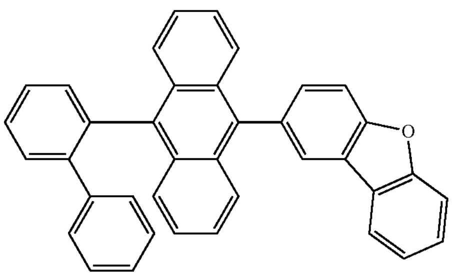
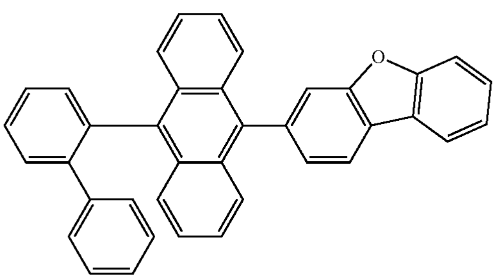
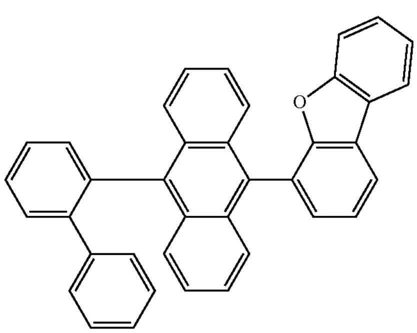
-continued
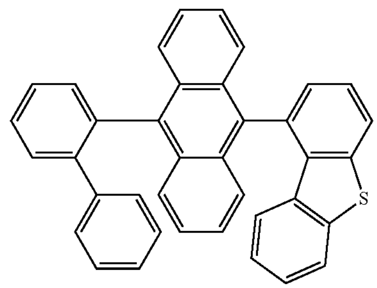
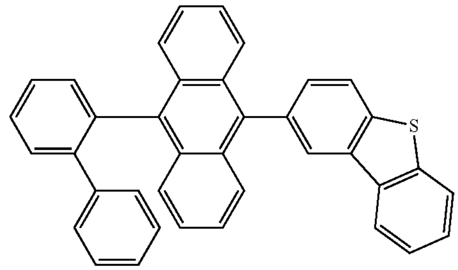
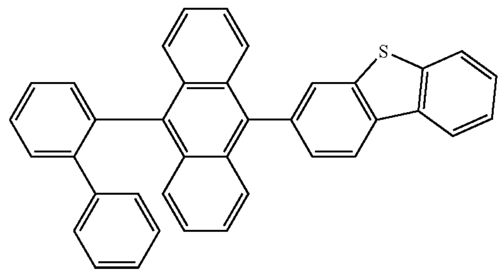
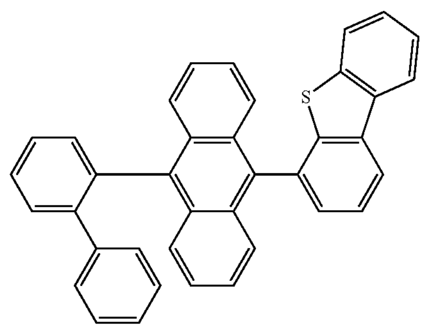
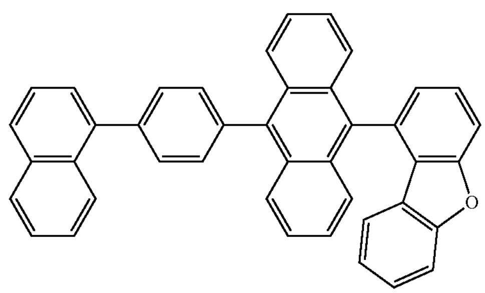
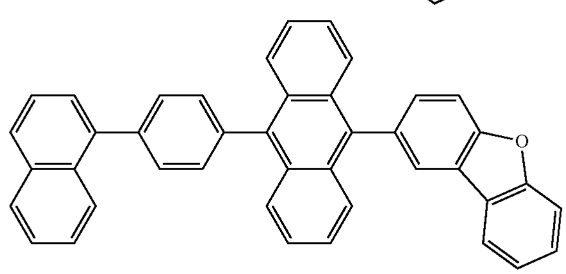

-continued
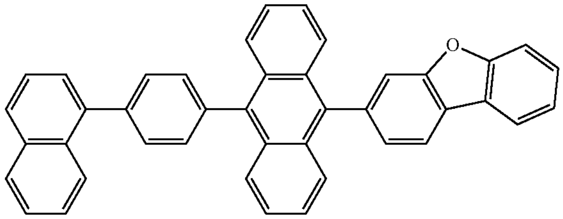
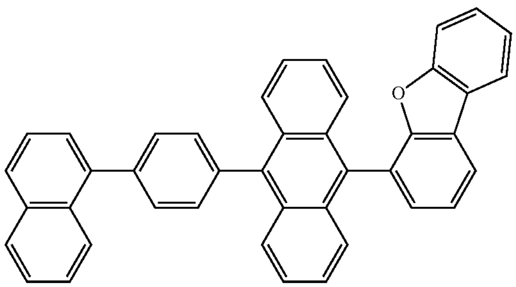
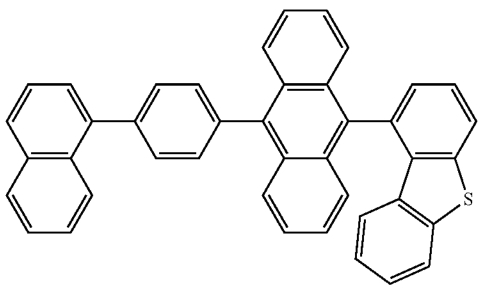
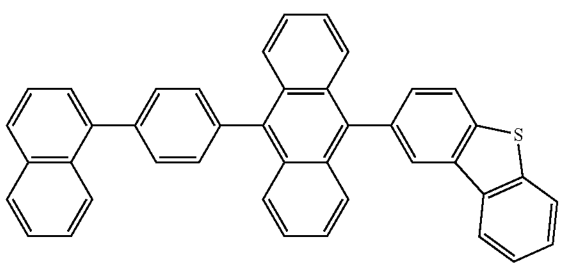
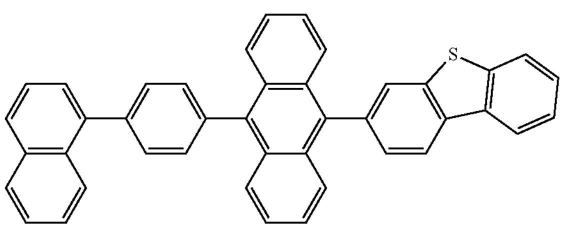
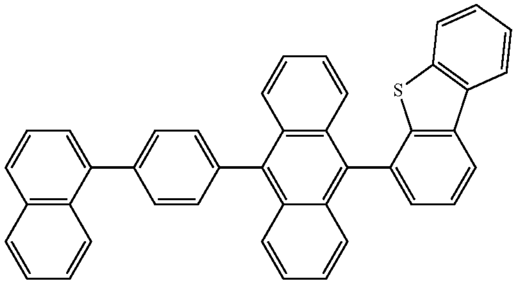
-continued
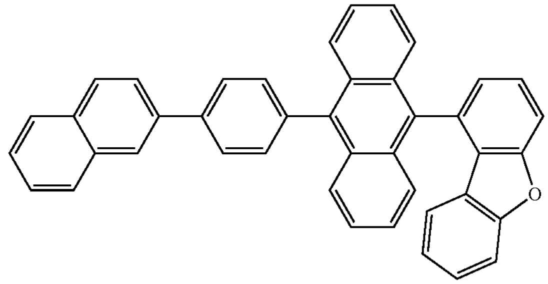
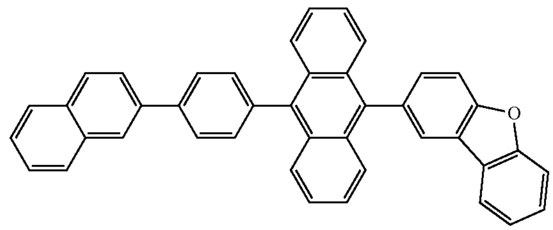
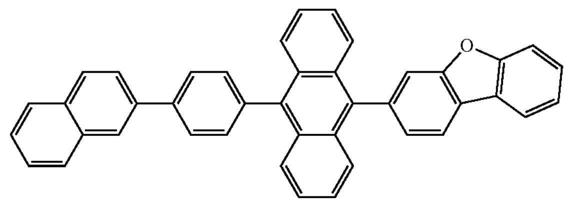
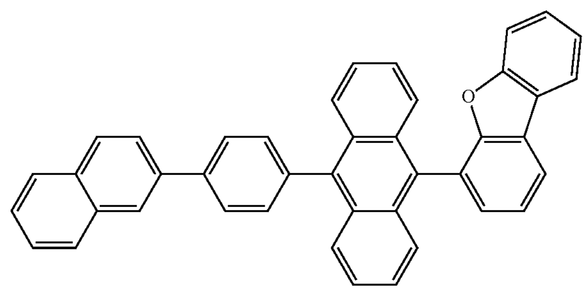
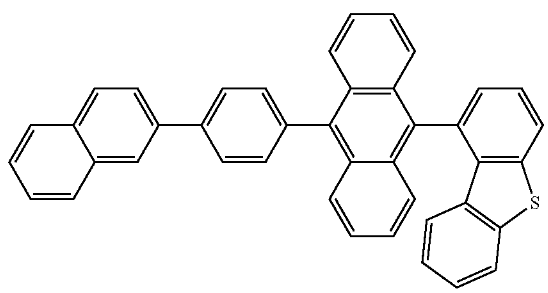
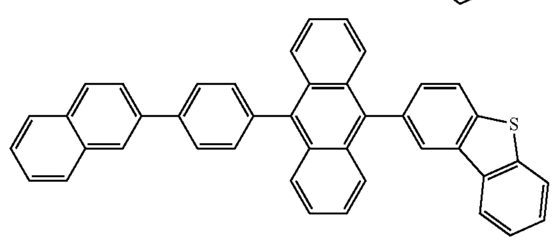
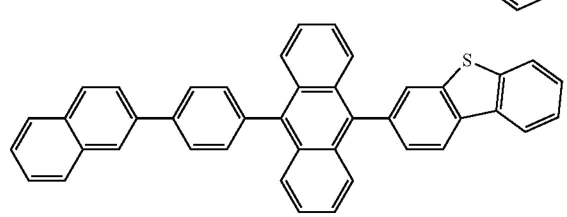

-continued
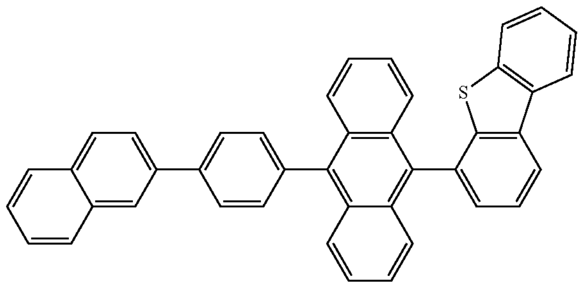
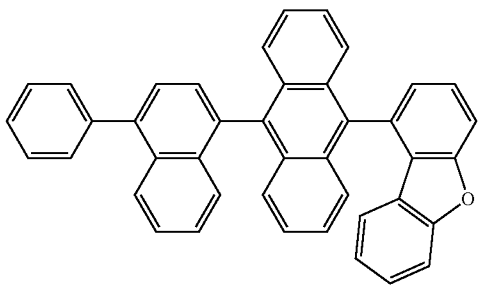
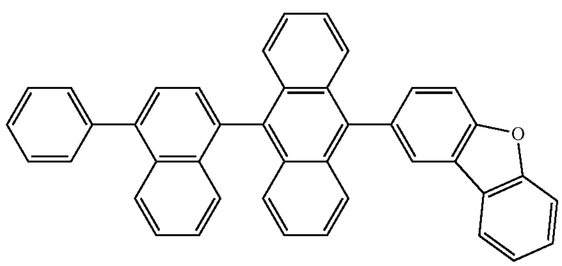
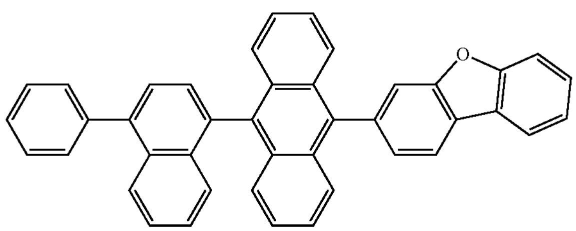
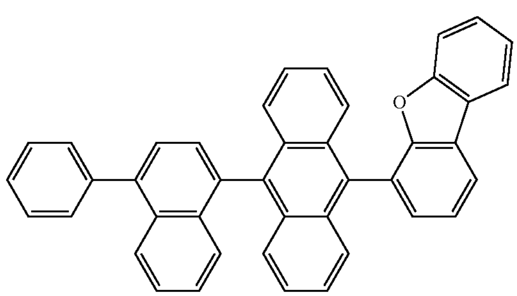
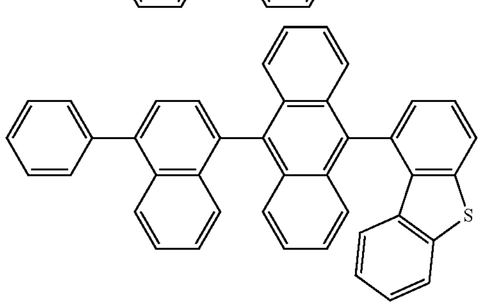
-continued
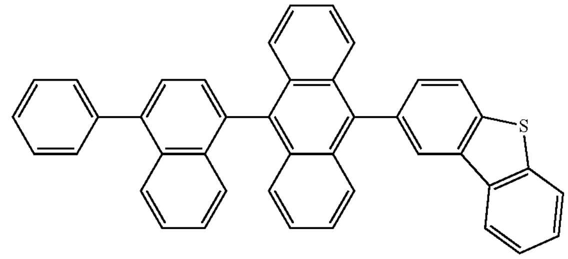
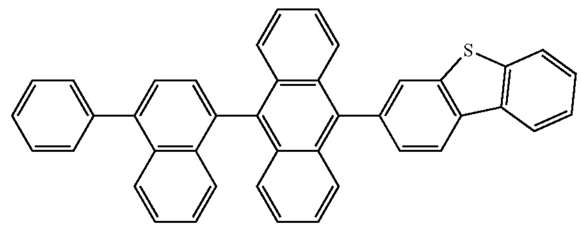
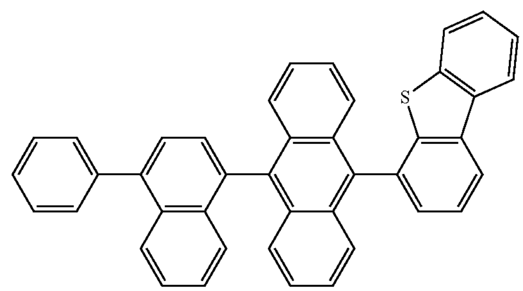
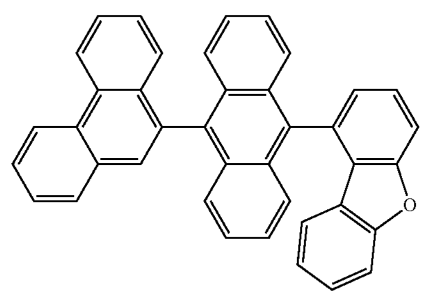
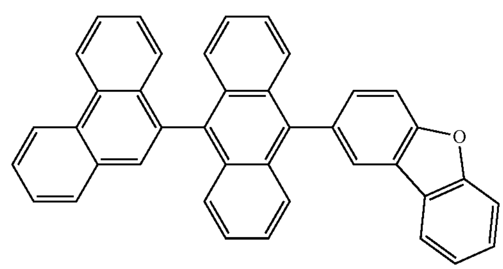
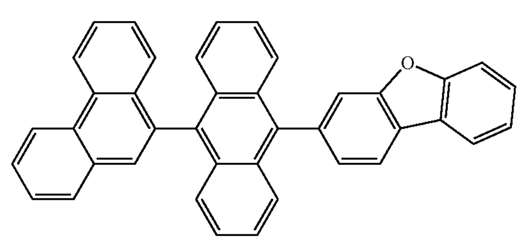

-continued
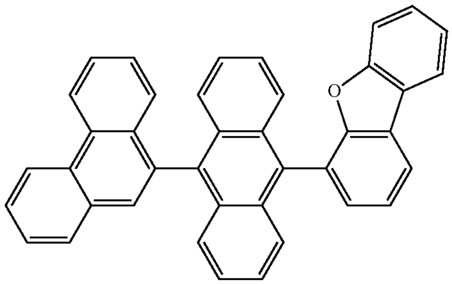
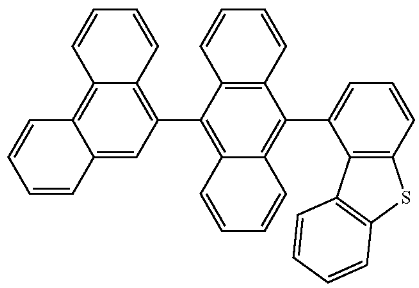
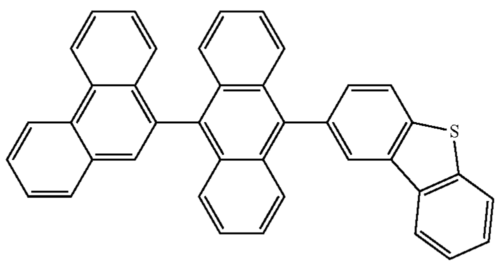
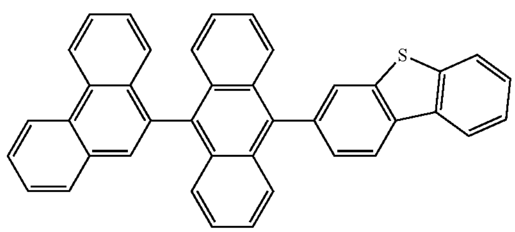
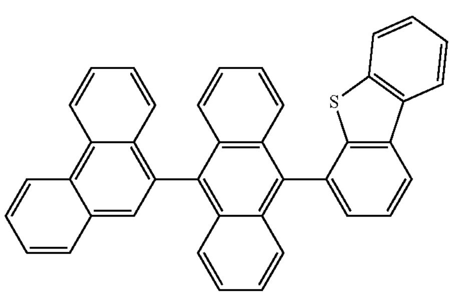
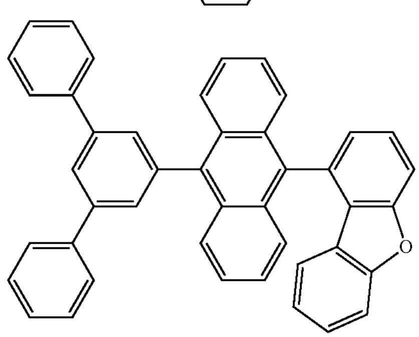
-continued
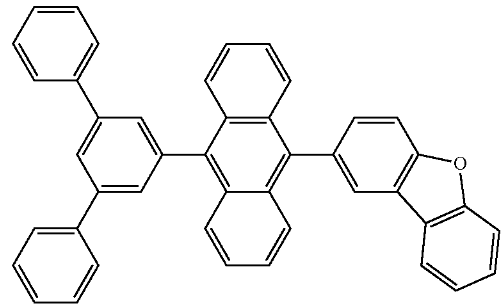
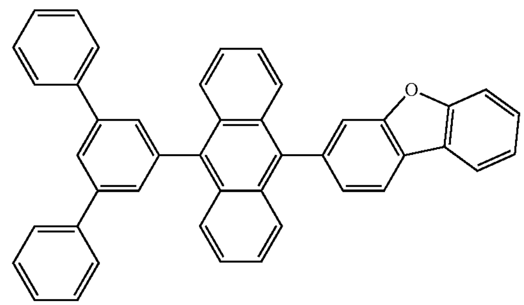
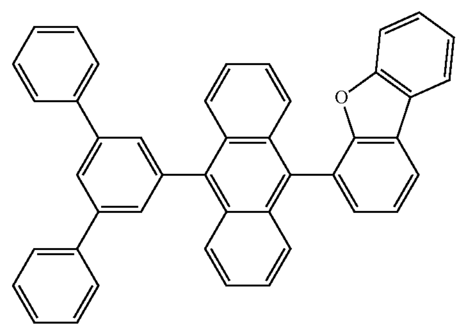
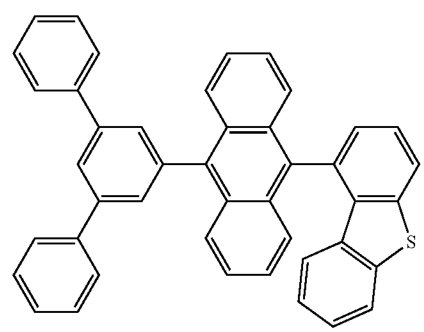
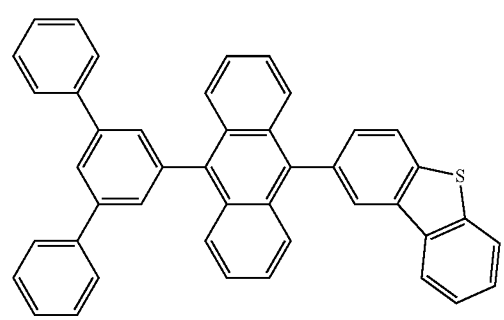

-continued
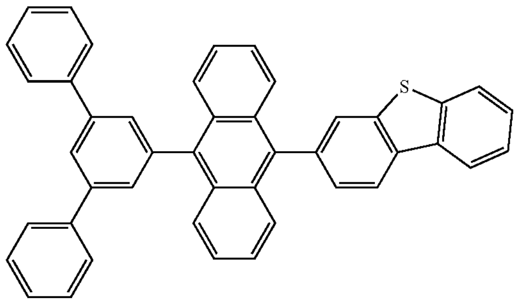
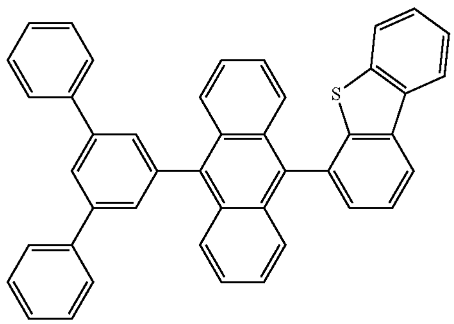
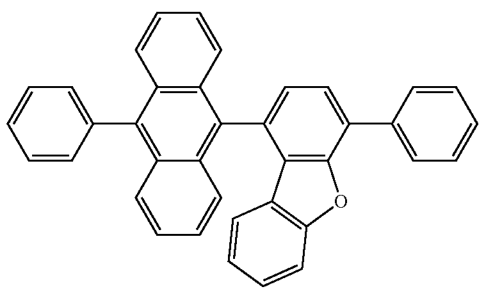
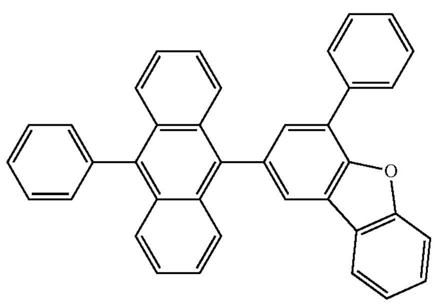
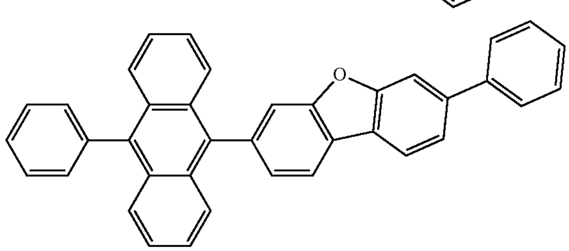
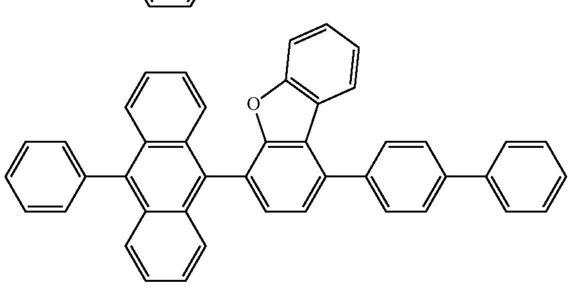
-continued
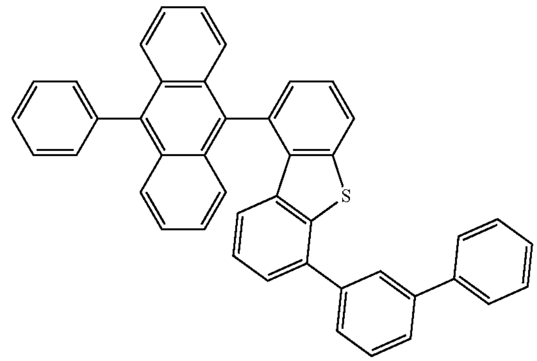
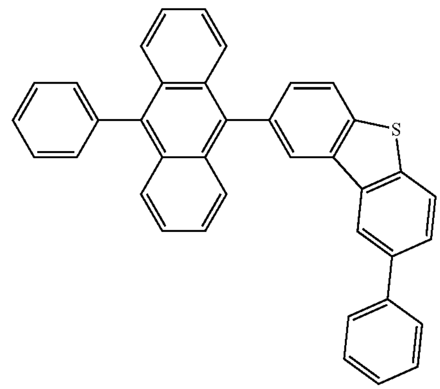
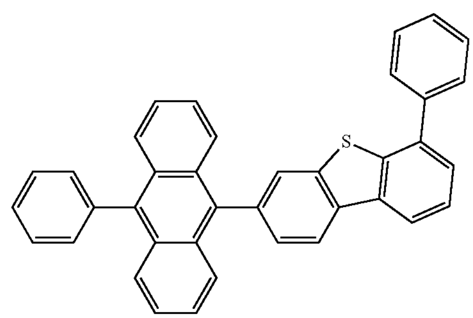
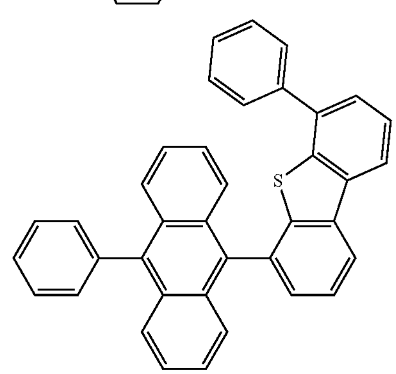
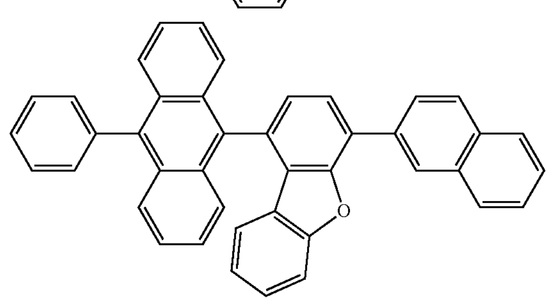

-continued
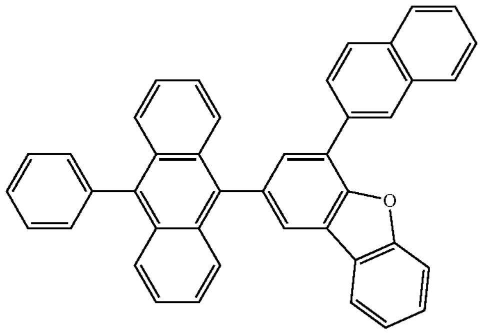
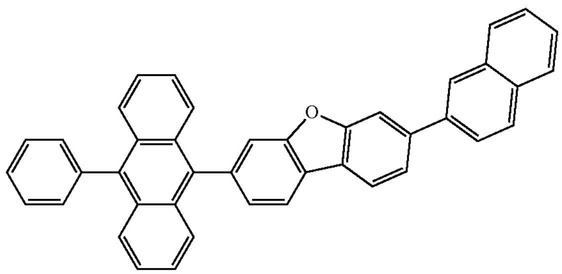
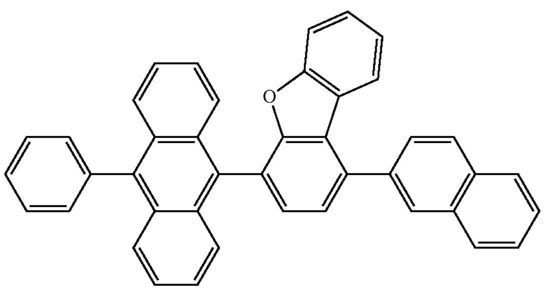
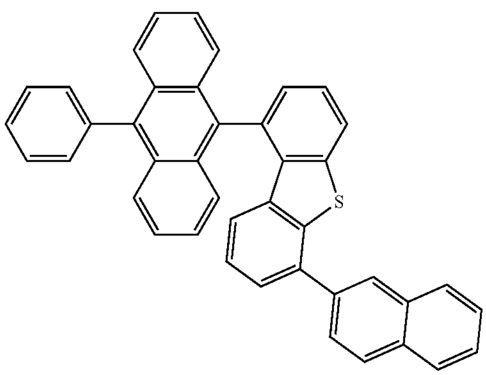
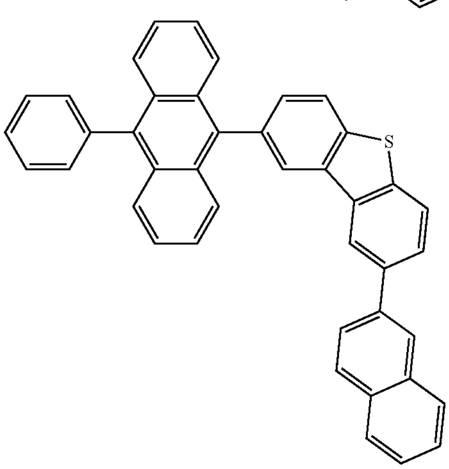
-continued
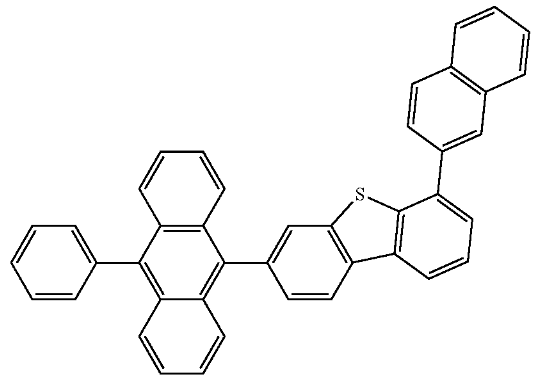
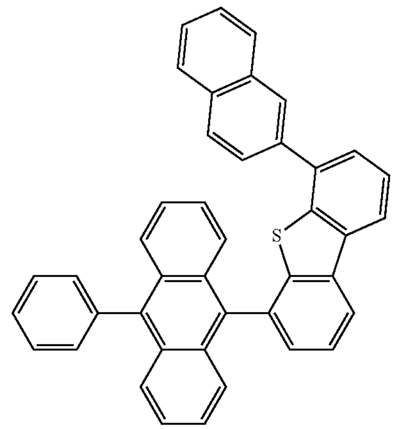
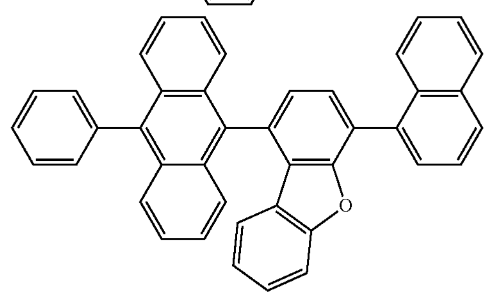
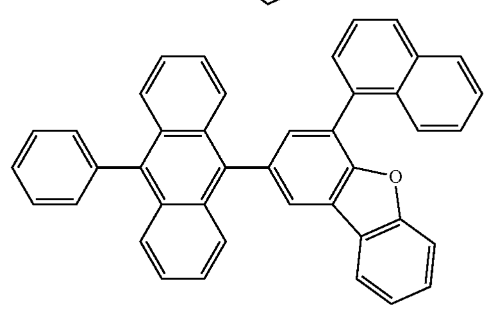
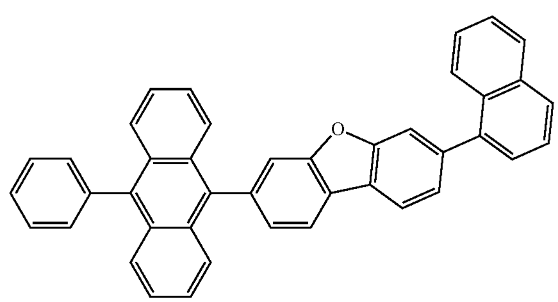

-continued
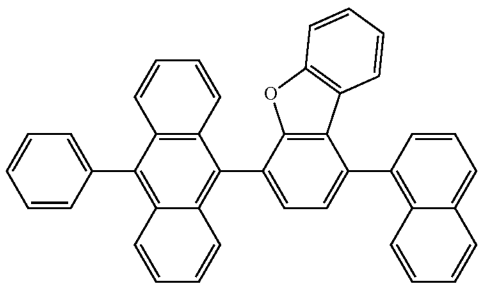
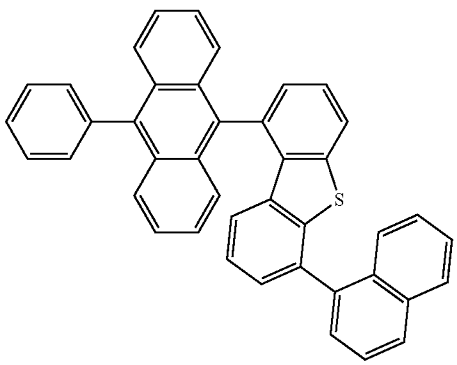
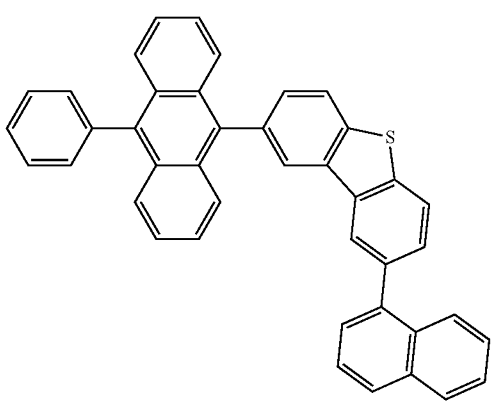
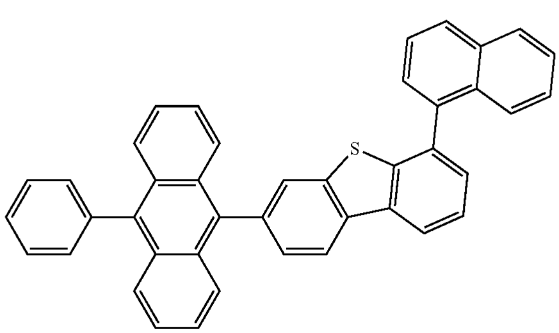
-continued
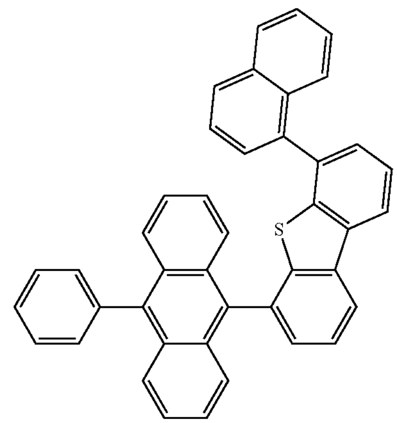
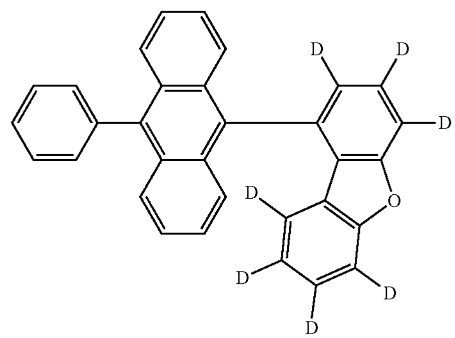
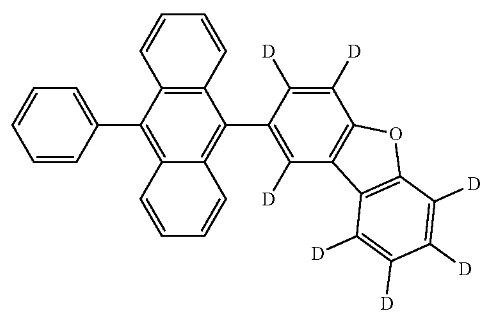
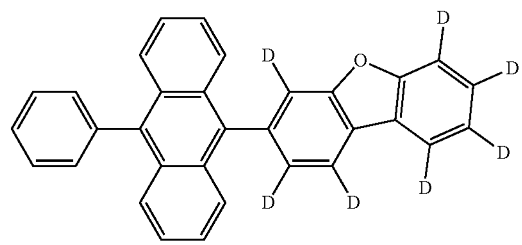
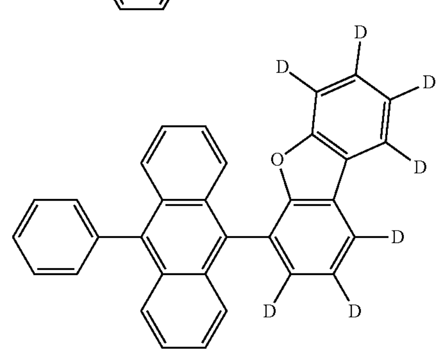

-continued
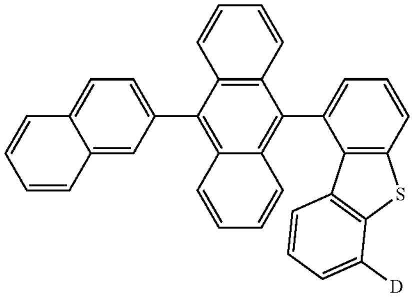
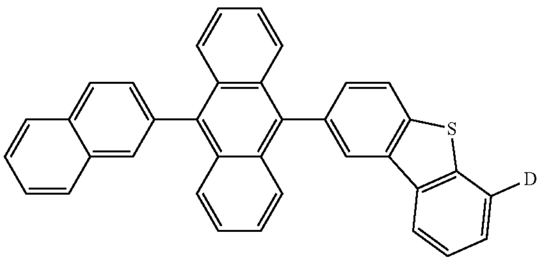
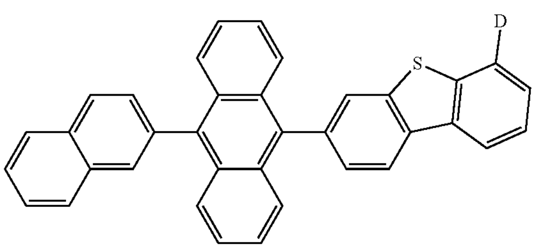
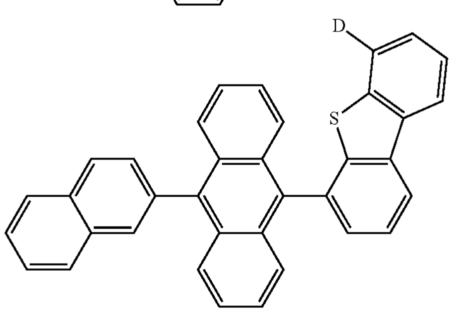
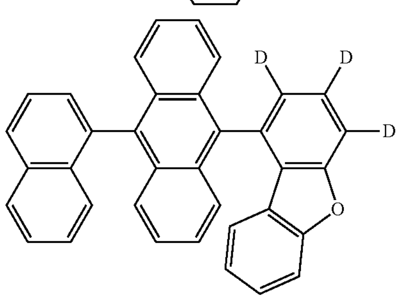
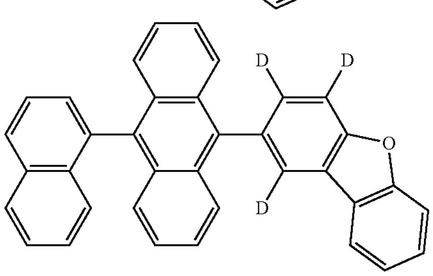
-continued
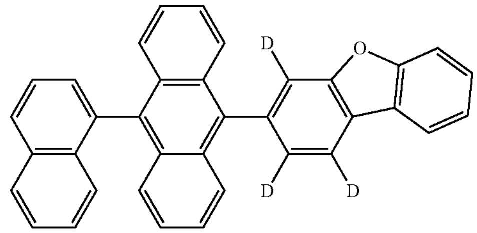
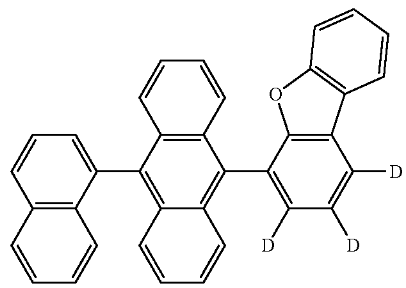
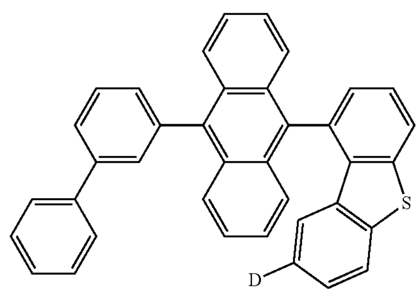
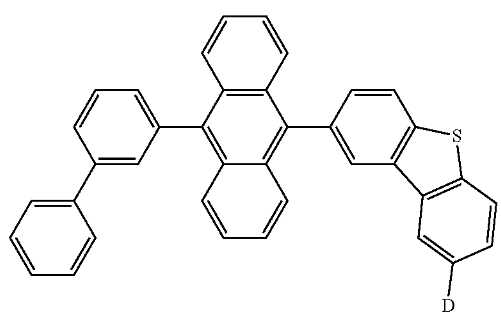
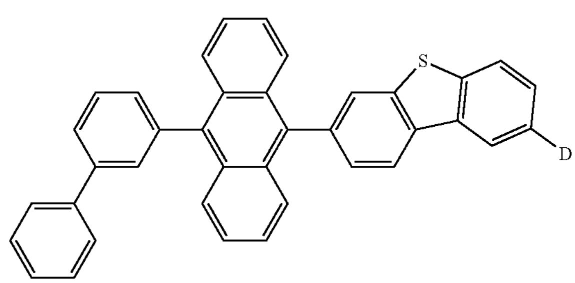

-continued
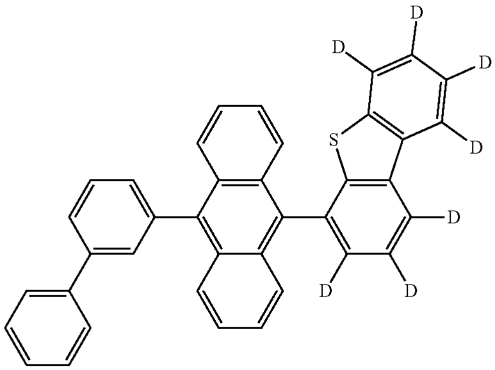
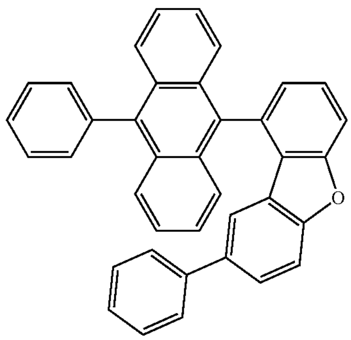
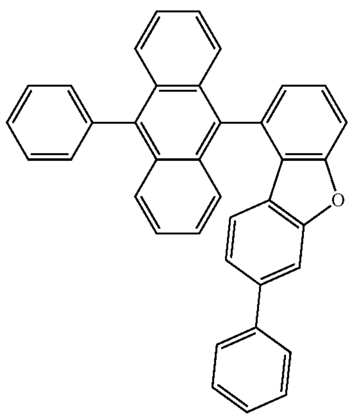
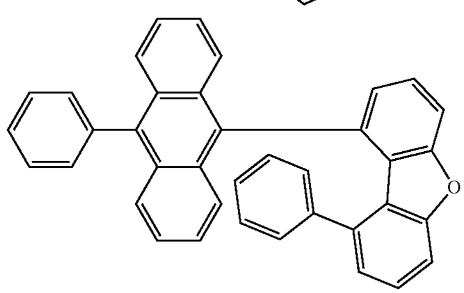
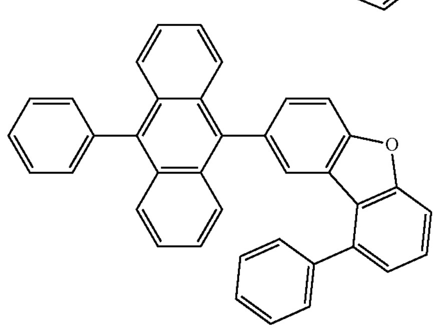
-continued
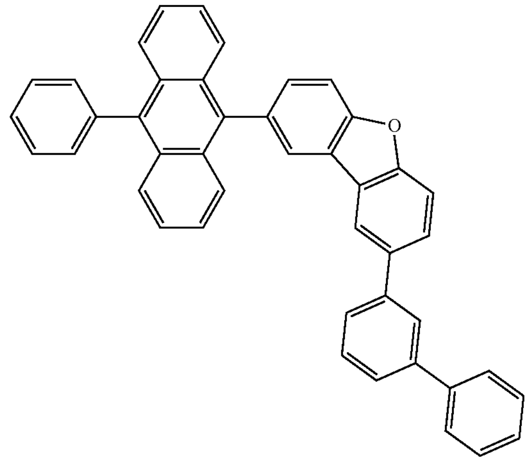
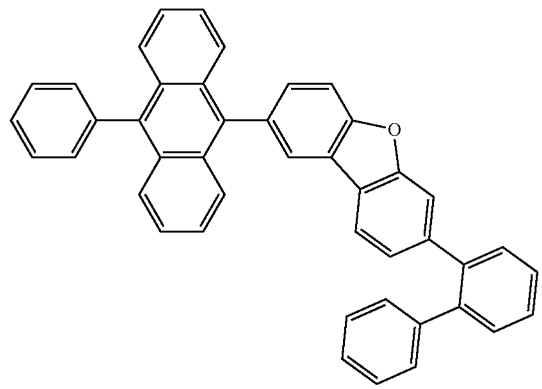
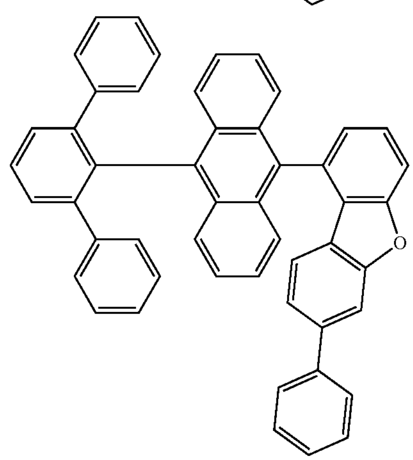
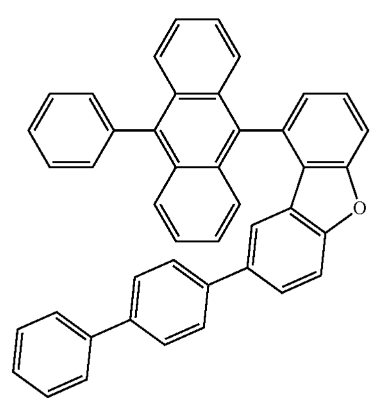

-continued
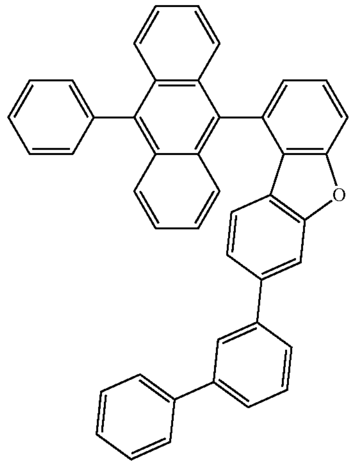
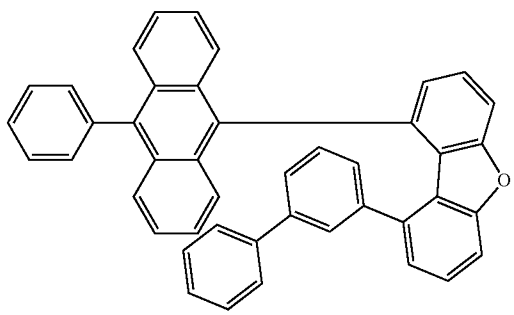
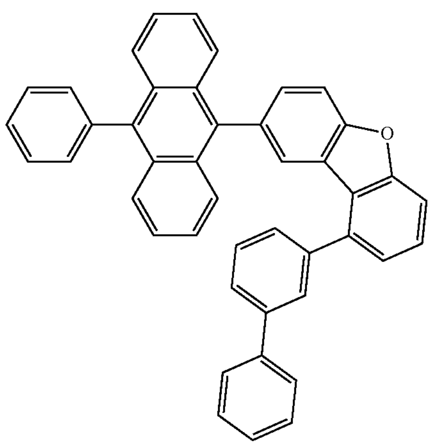
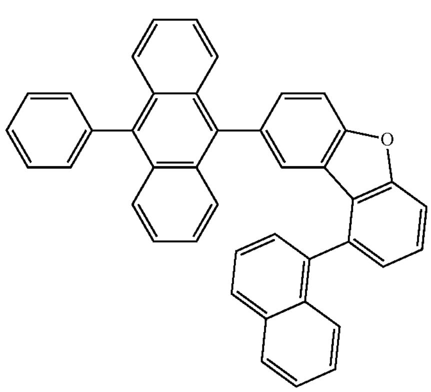
-continued
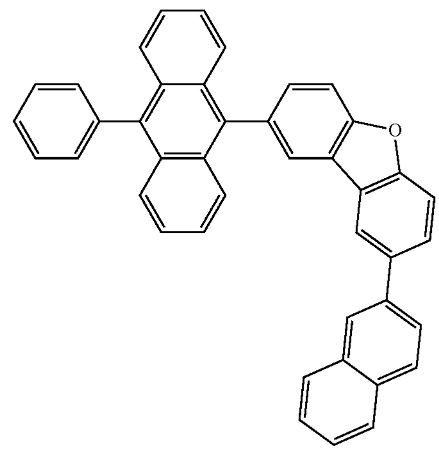
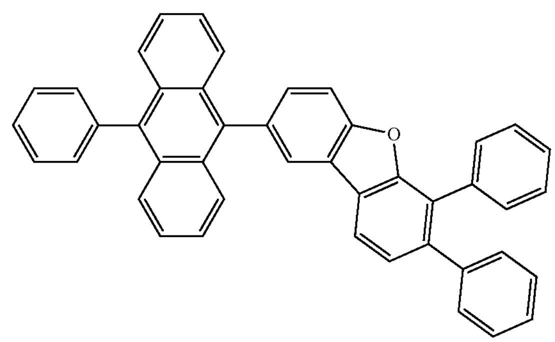
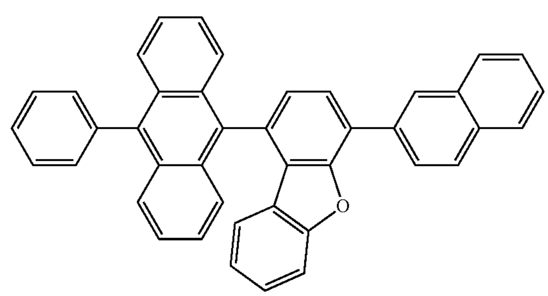
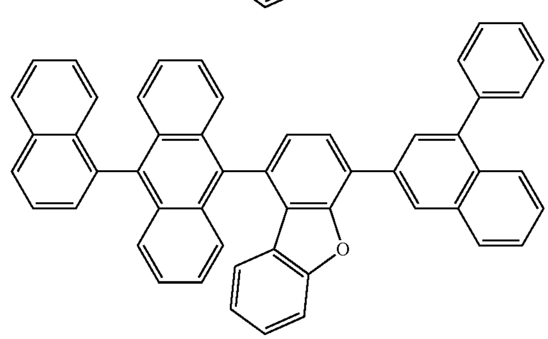

-continued
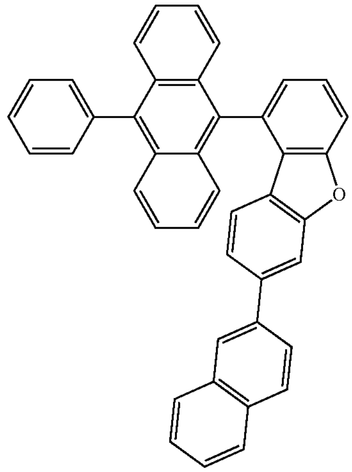
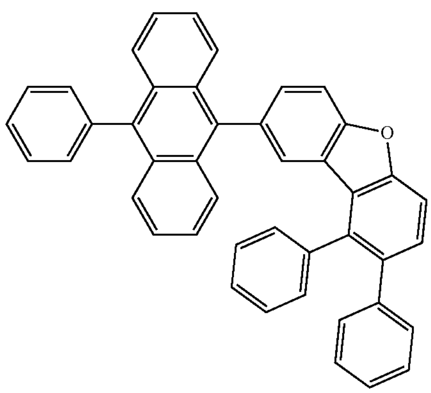
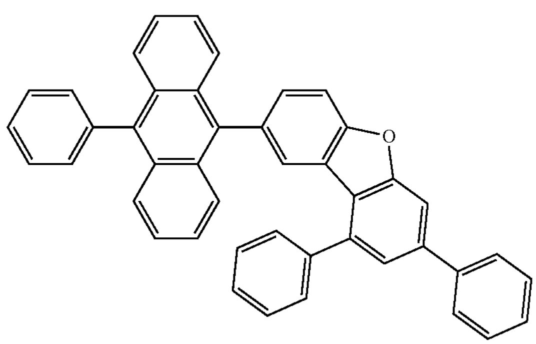
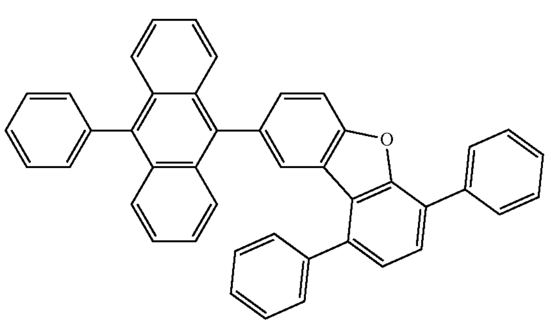
-continued
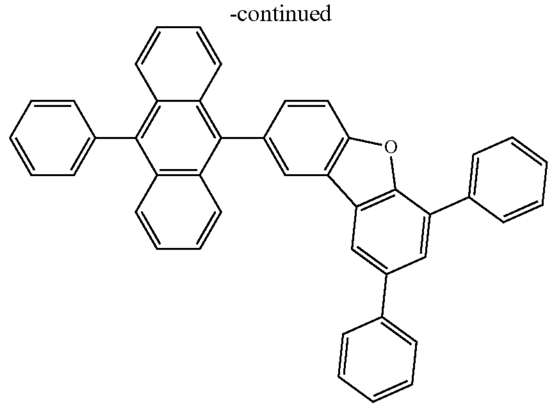
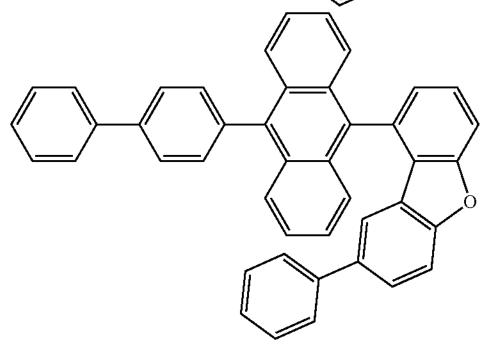
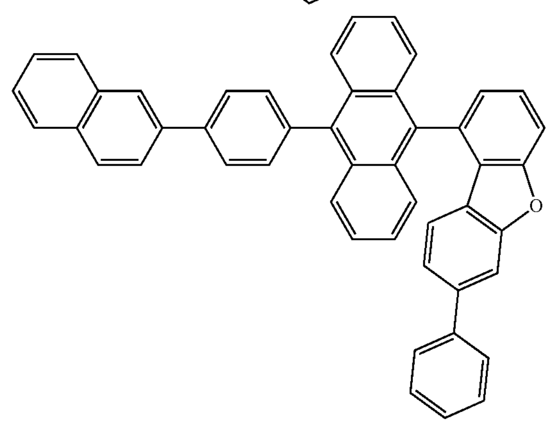
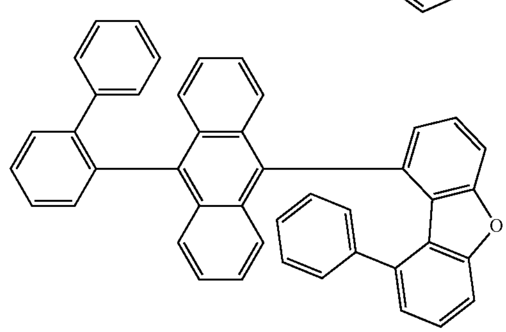
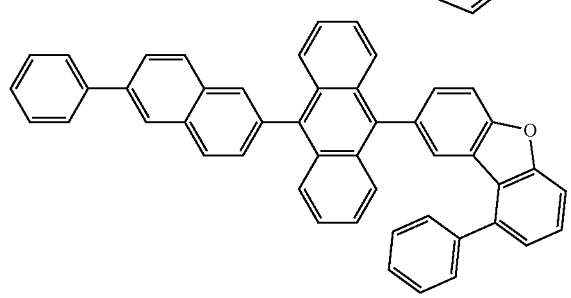

-continued
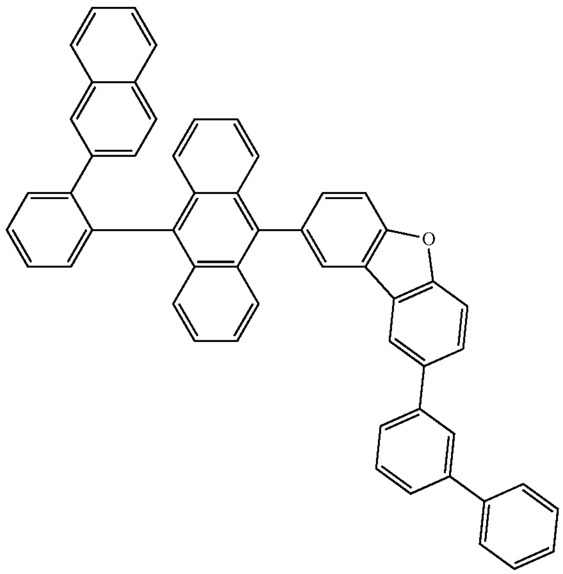
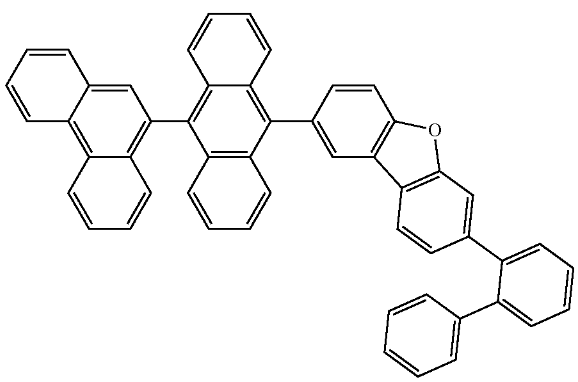
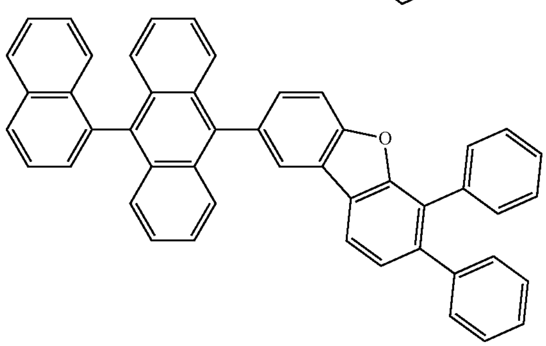
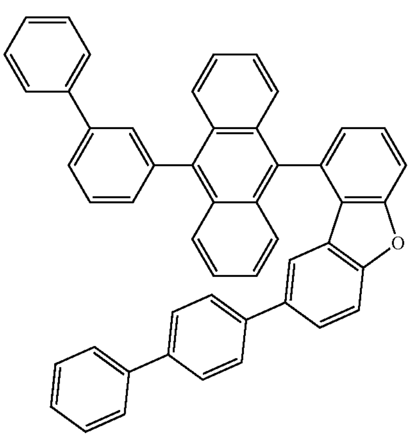
-continued
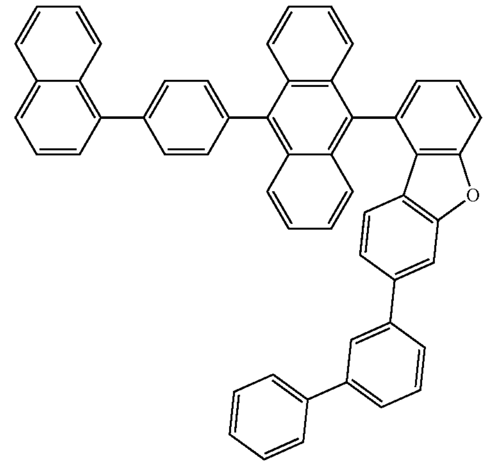
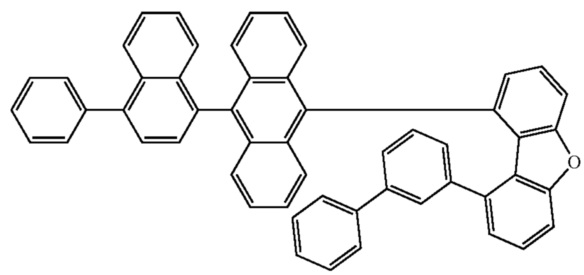
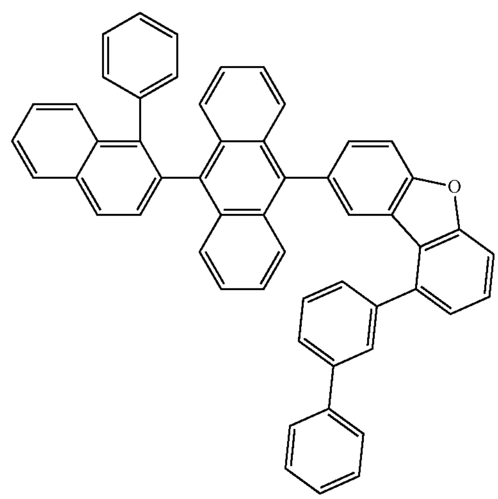
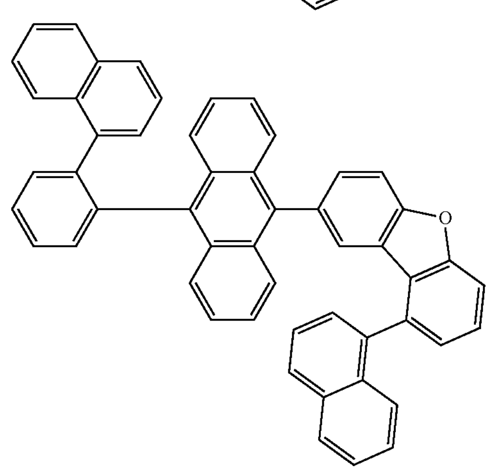

-continued

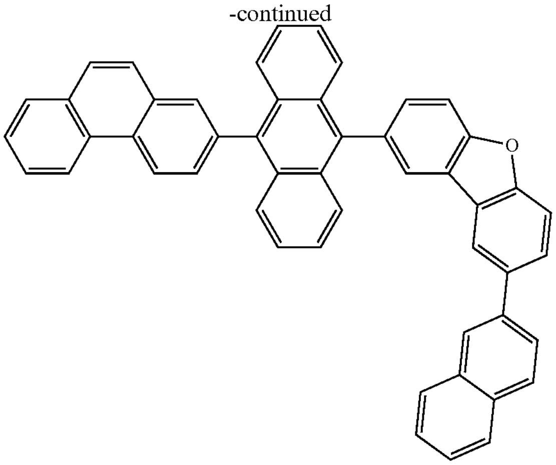

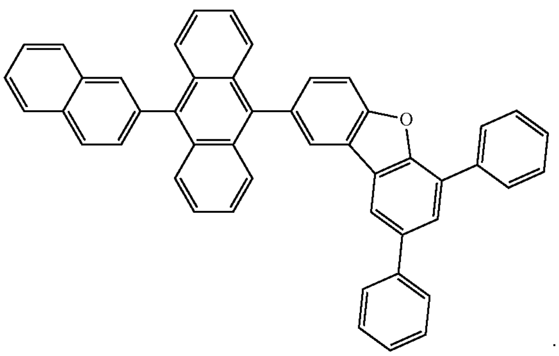 [SMILES: c1ccc(-c2cc(-c3ccccc3)c3oc4ccc(-c5c6ccccc6c(-c6ccc7ccccc7c6)c6ccccc56)cc4c3c2)cc1]

6. The organic light emitting device of claim 1, wherein $L_1$, $L_2$ and $L_3$ are each independently phenylene, naphthylene, or -(phenylene)-(naphthylene)-.

7. The organic light emitting device of claim 1, wherein i and j are 0, and k is 0 or 1.

8. The organic light emitting device of claim 1, wherein A is any one selected from the group consisting of the following:

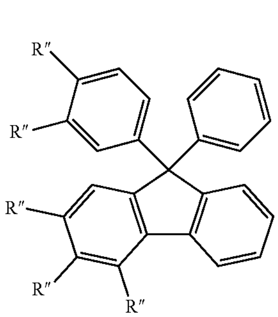

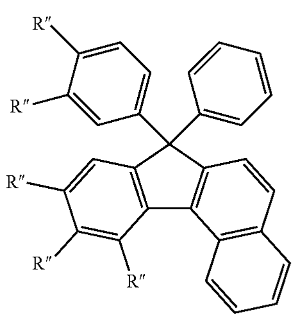

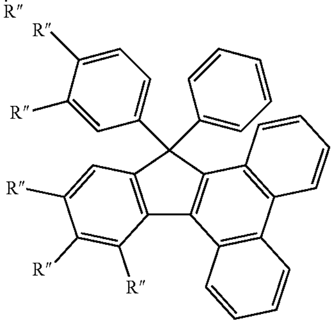

-continued

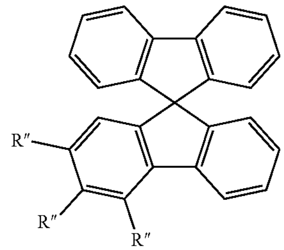

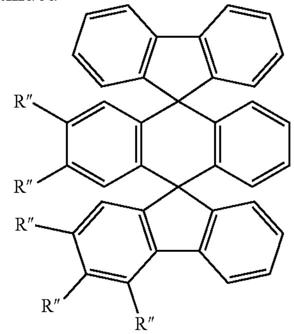

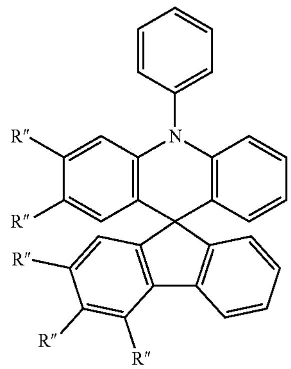

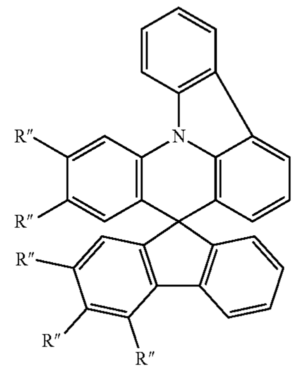

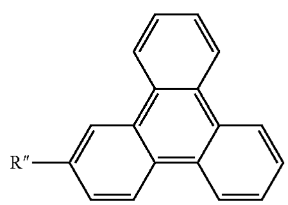

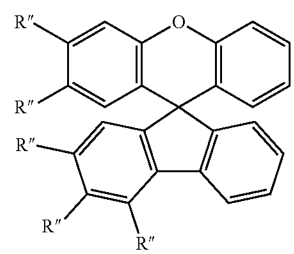

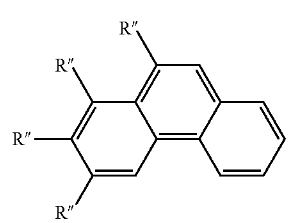

in each of Chemical Formulas, one of R" is linked to $L_3$, and the rest are hydrogen.

9. The organic light emitting device of claim 1, wherein the compound represented by the Chemical Formula 2 is any one selected from the group consisting of the following:

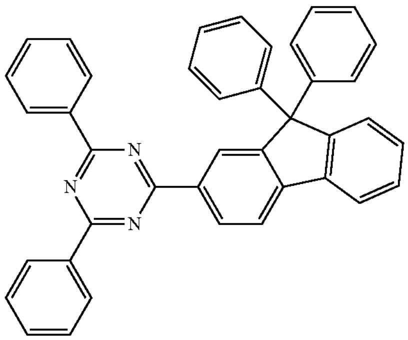
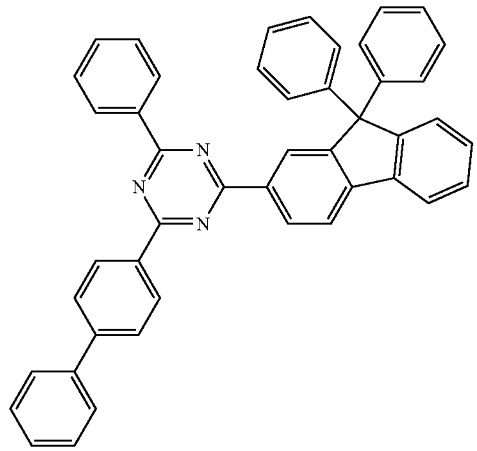
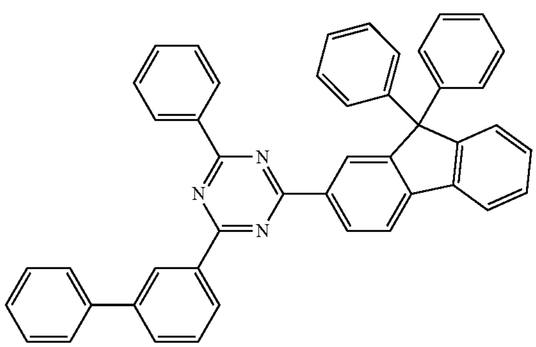
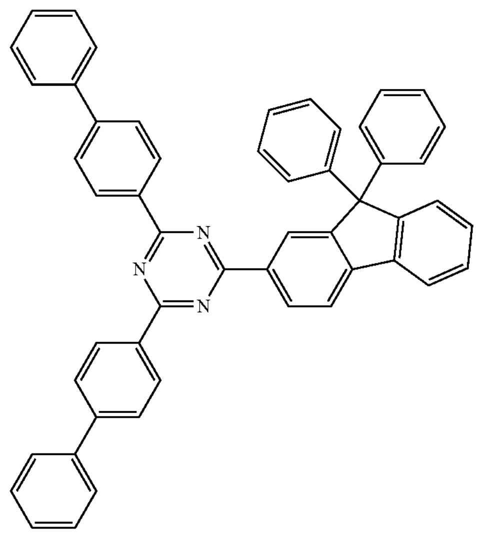
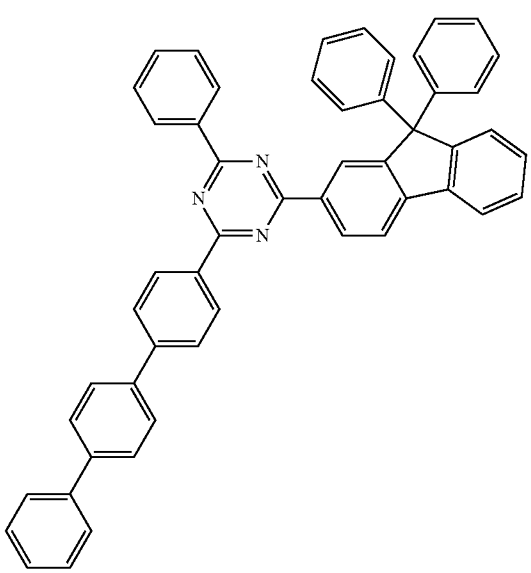
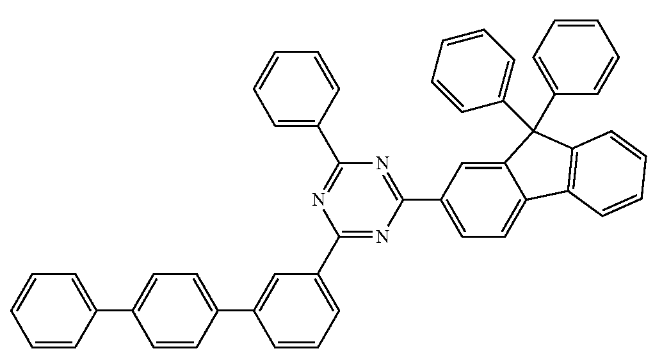

-continued
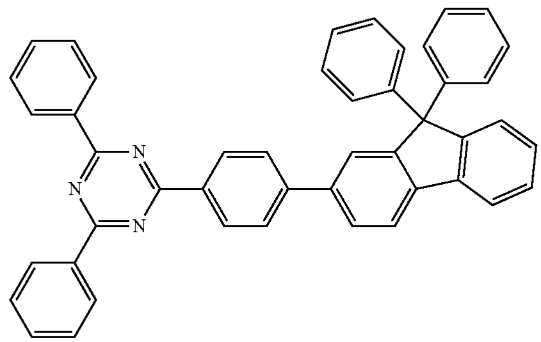
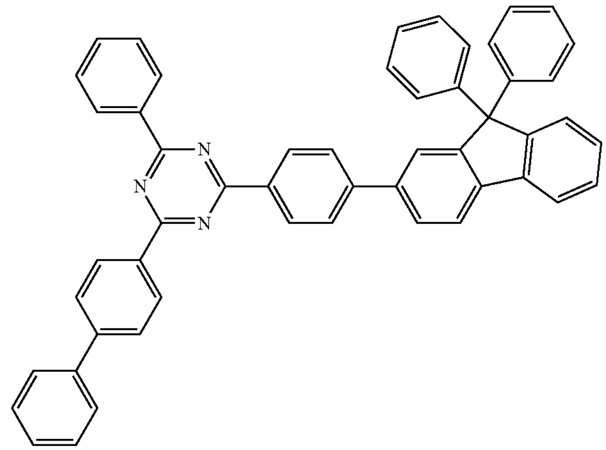
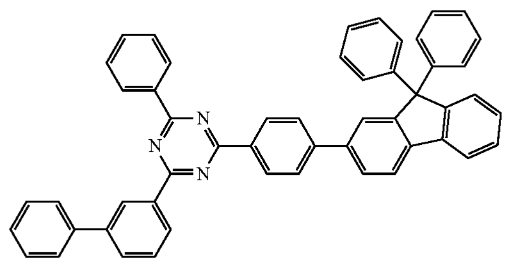
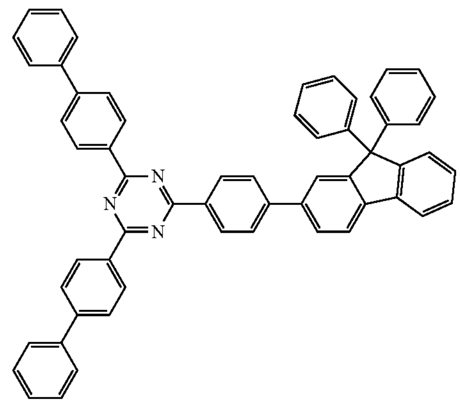
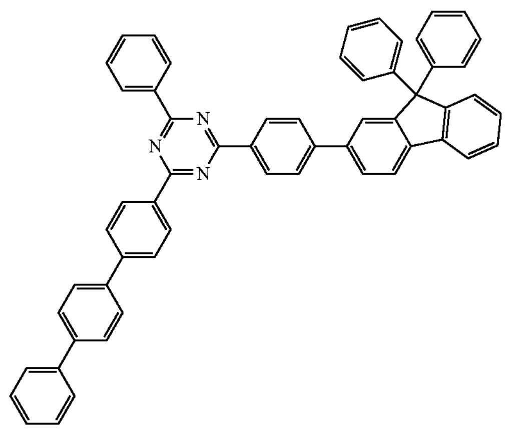
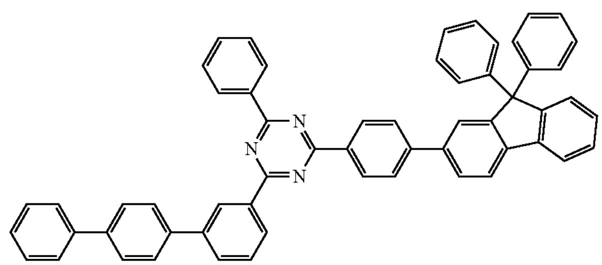
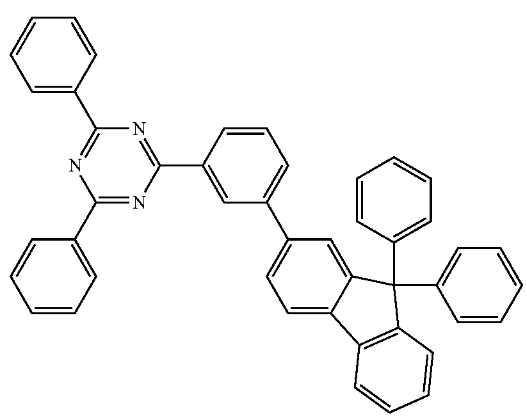
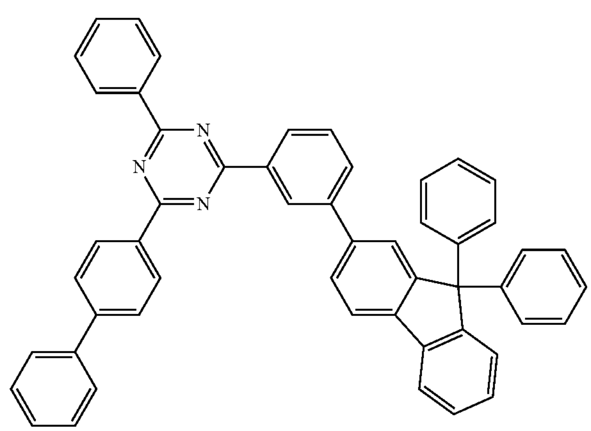

-continued
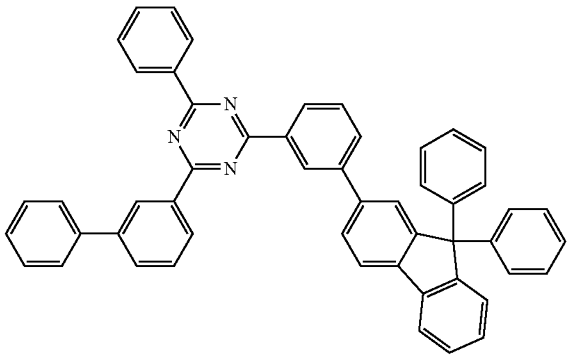
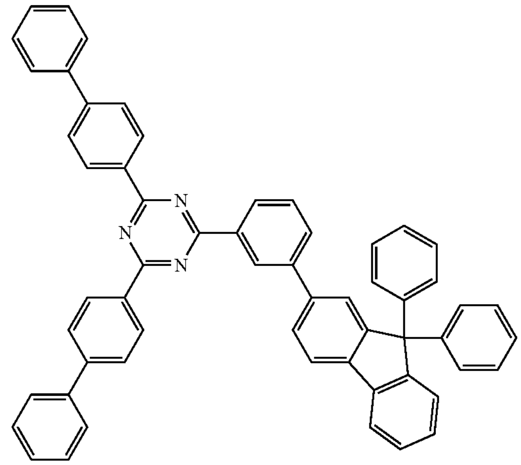
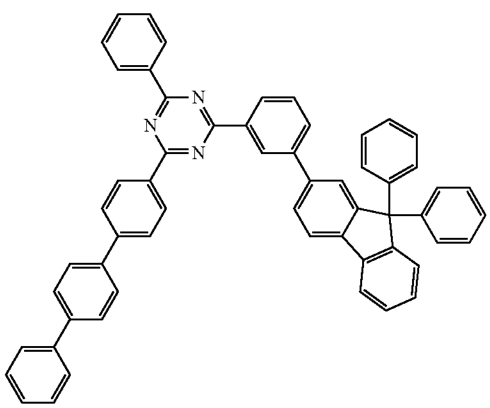
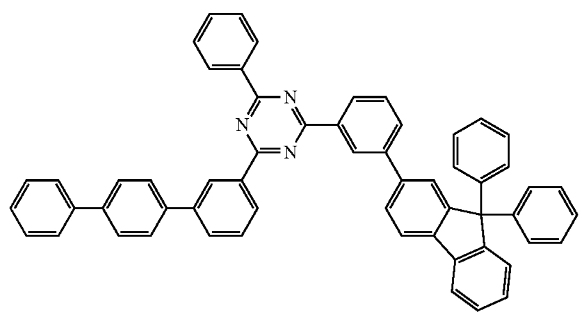
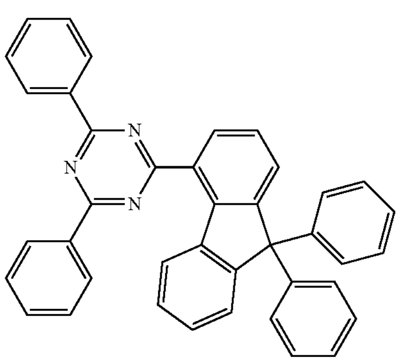
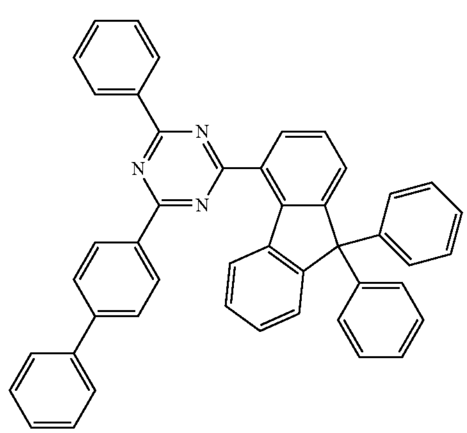

-continued
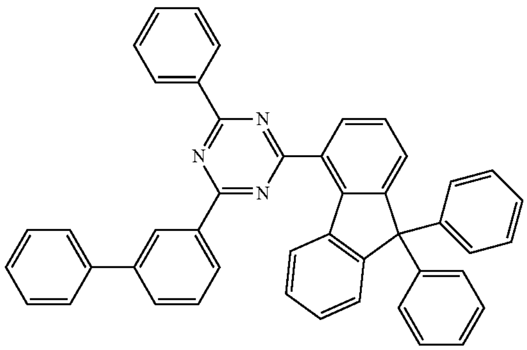
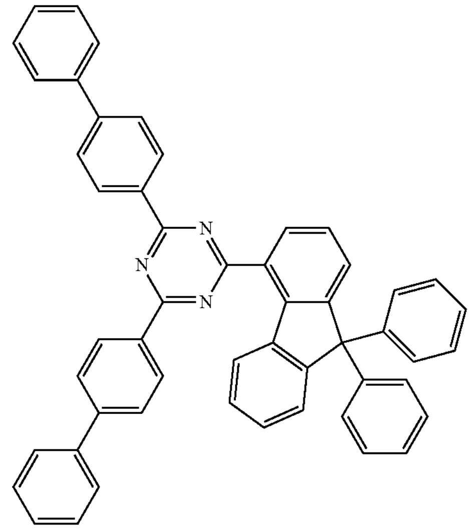
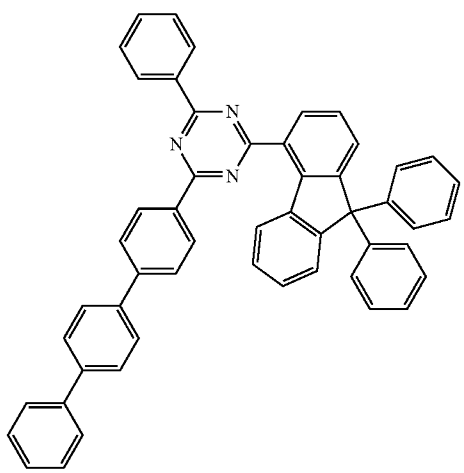
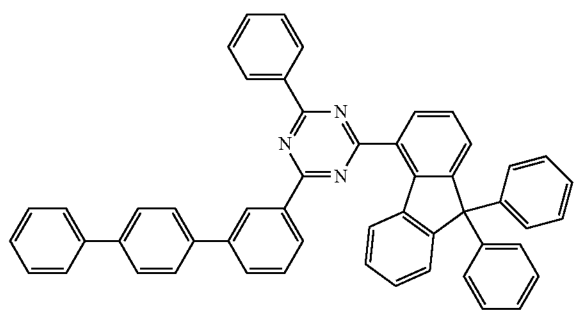
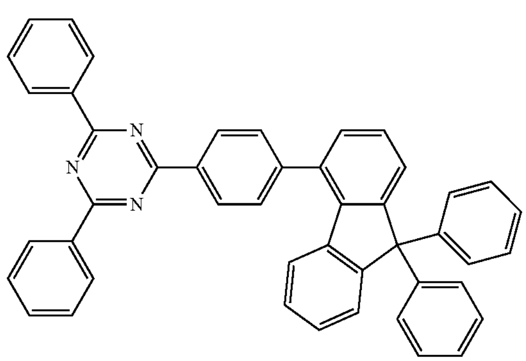
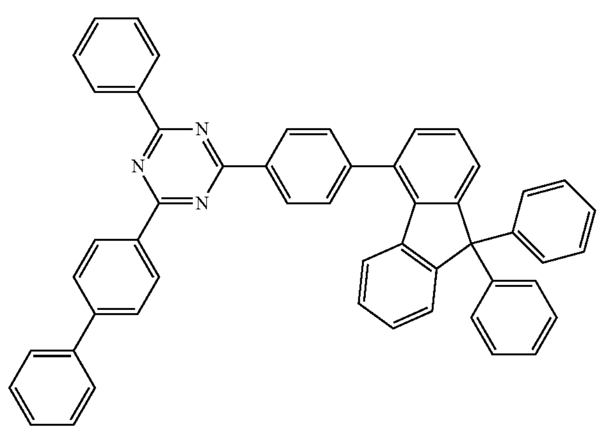

-continued
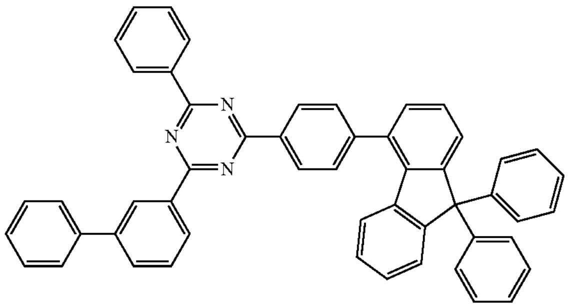
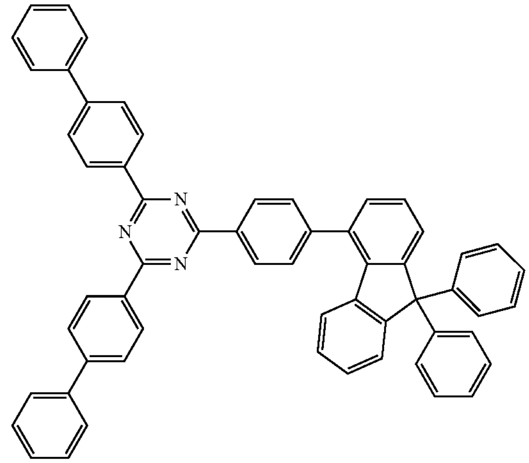
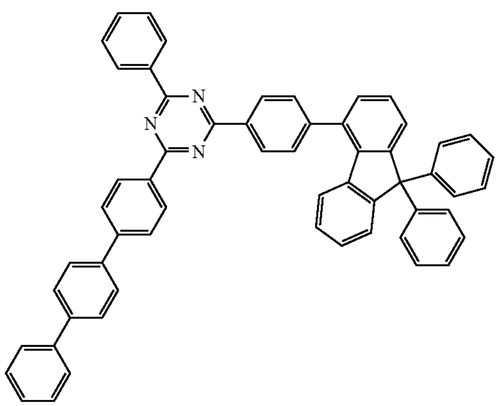
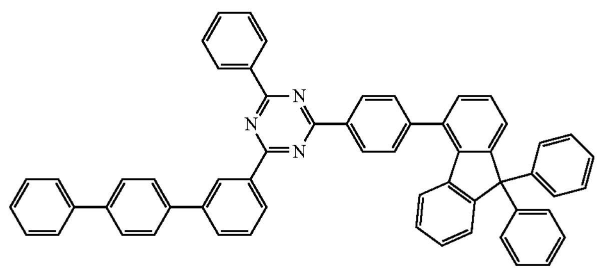
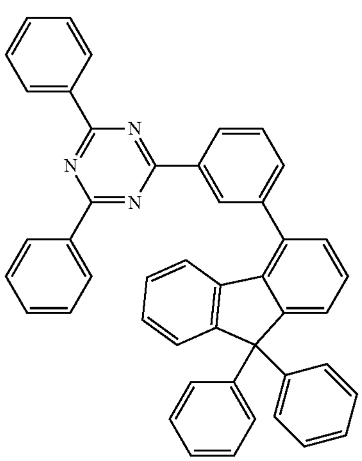
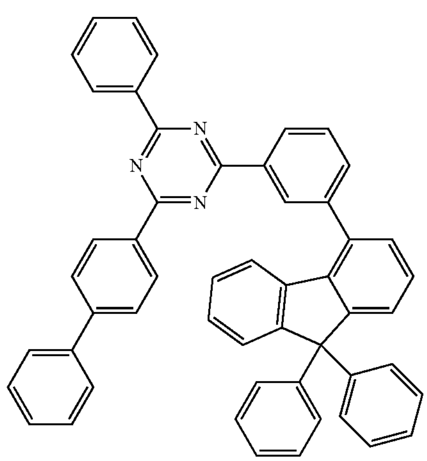

-continued
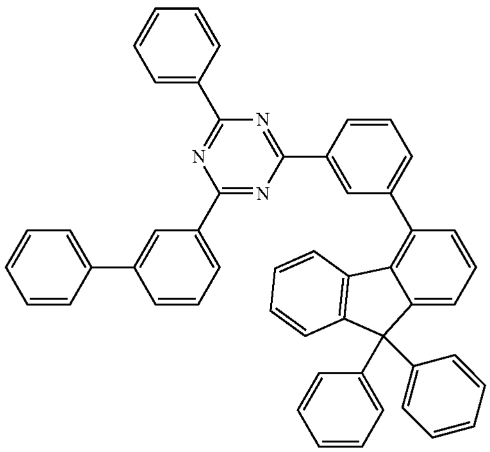
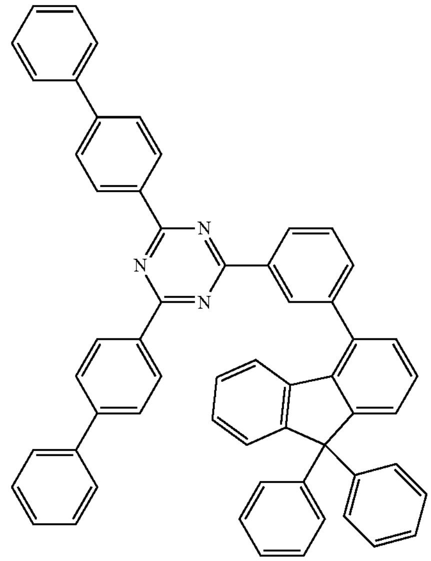
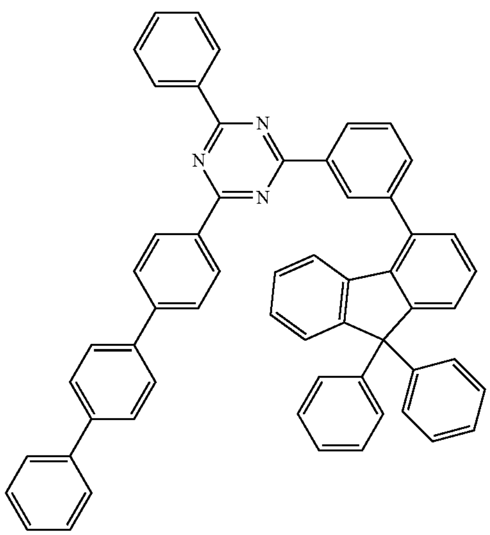
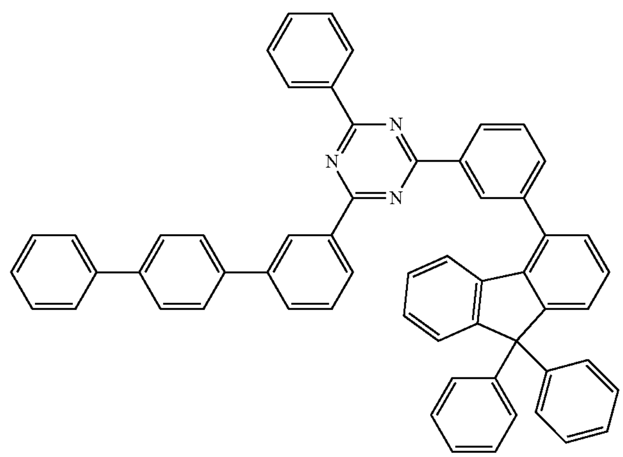
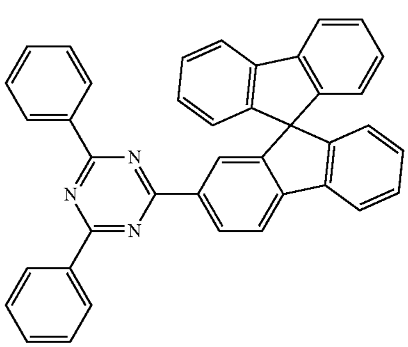
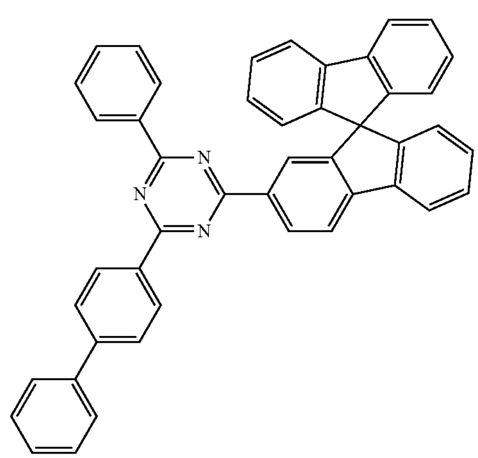

-continued
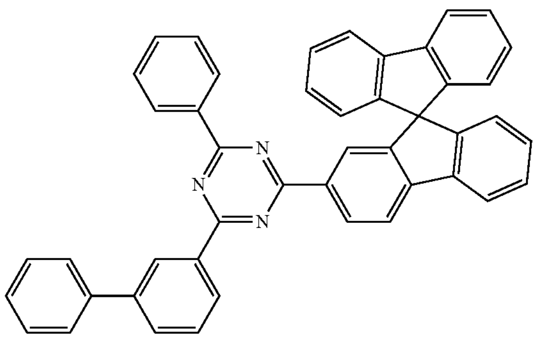
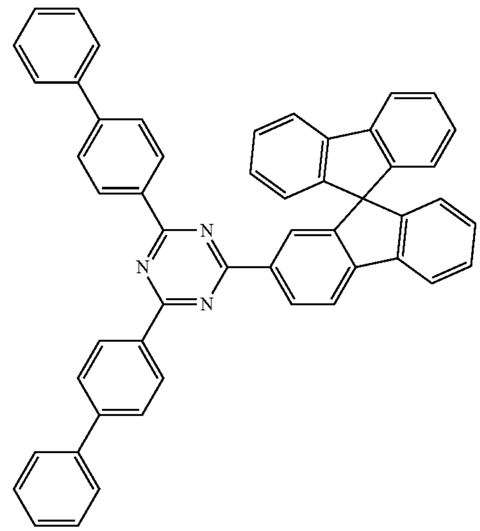
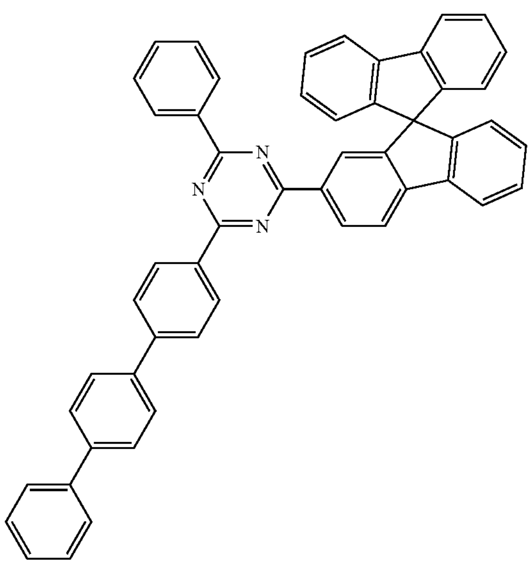
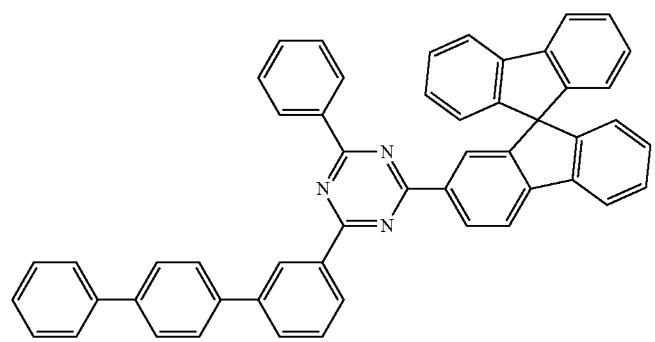
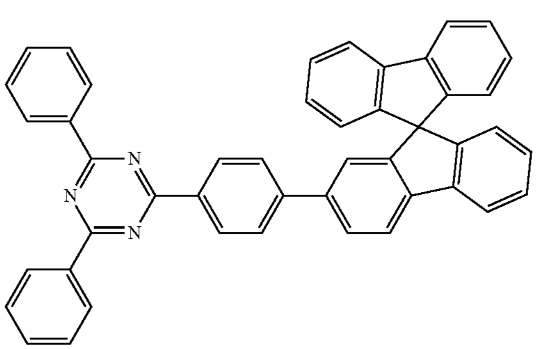
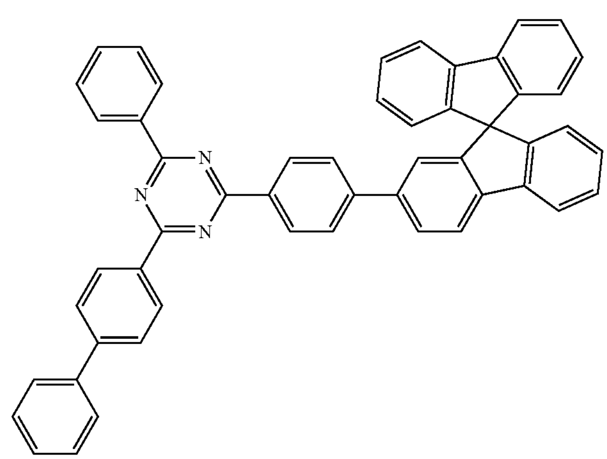

-continued
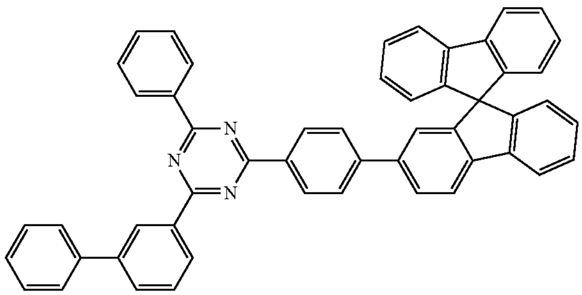
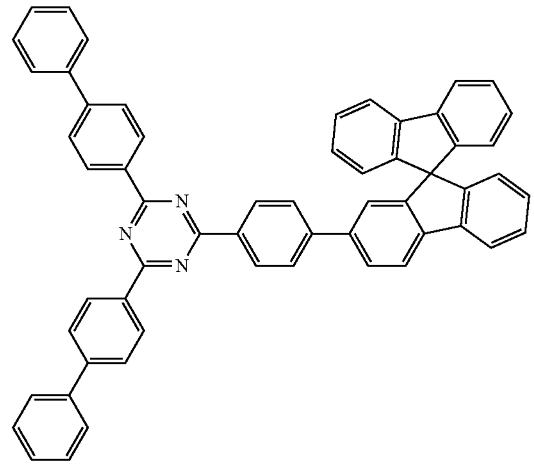
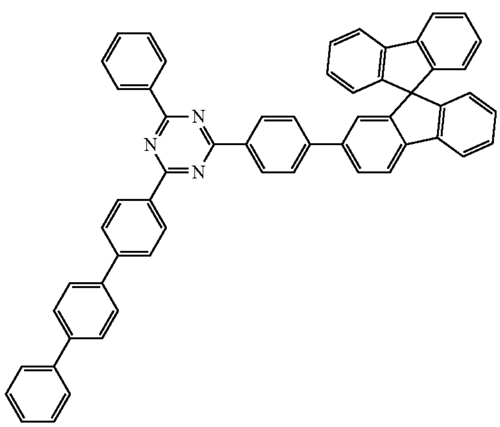
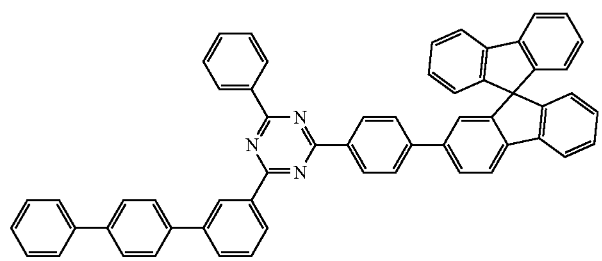
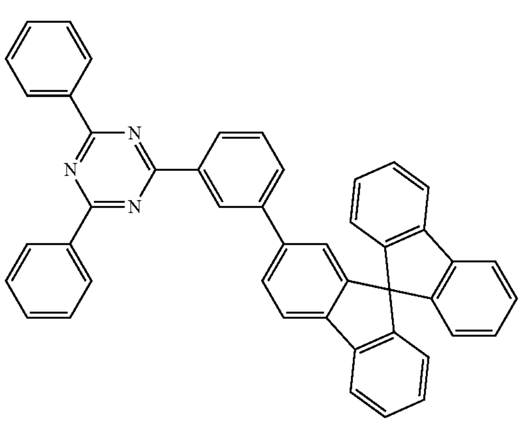
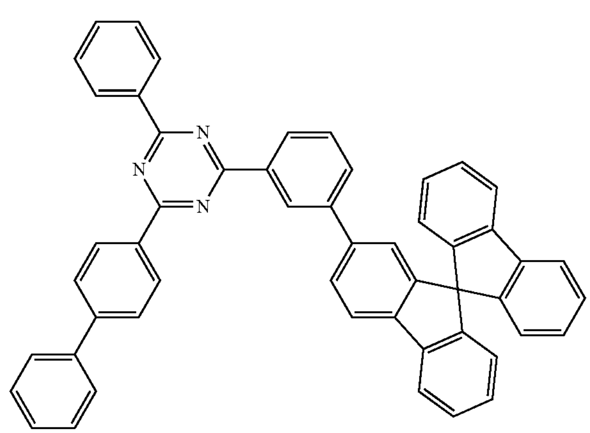

-continued
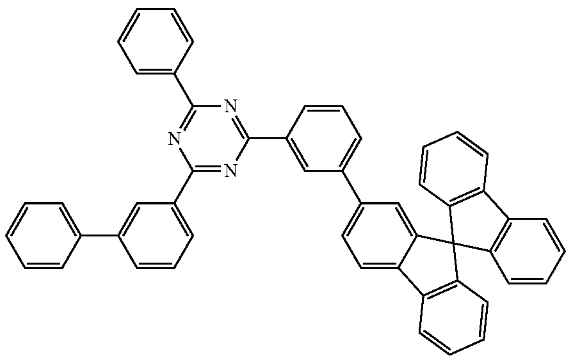
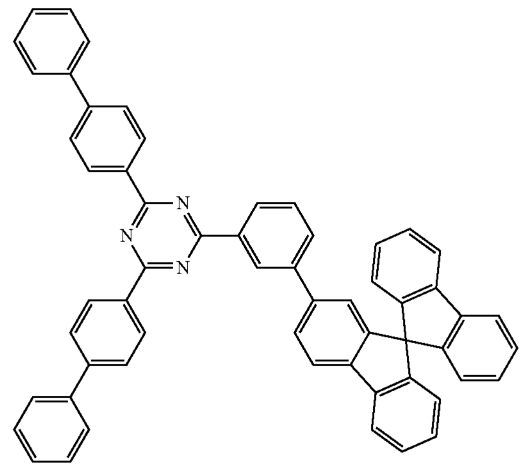
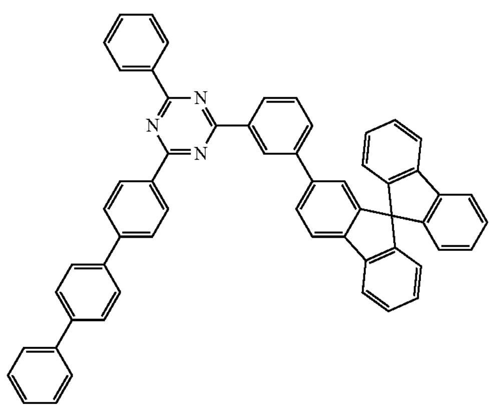
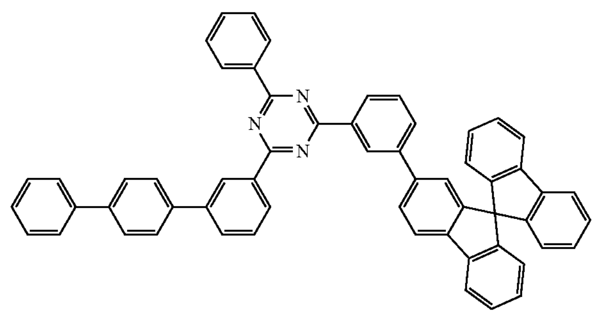
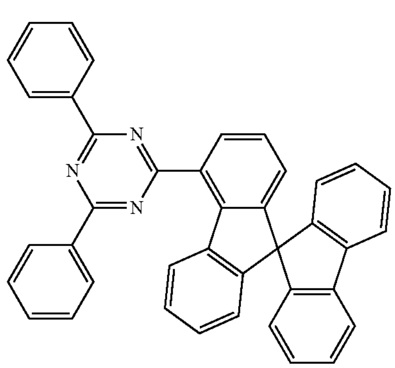
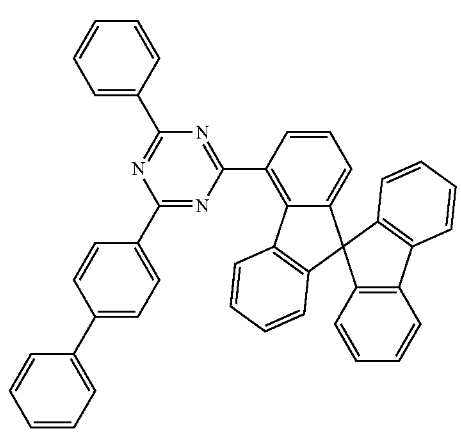

-continued
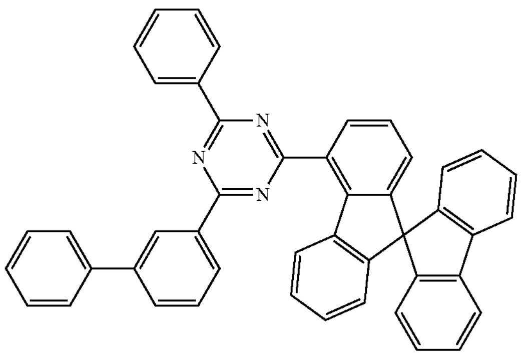
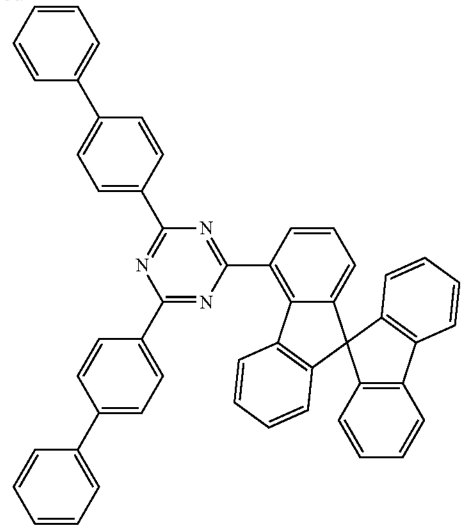
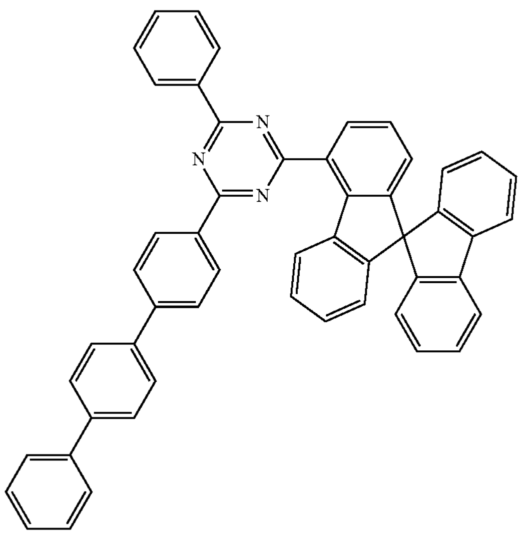
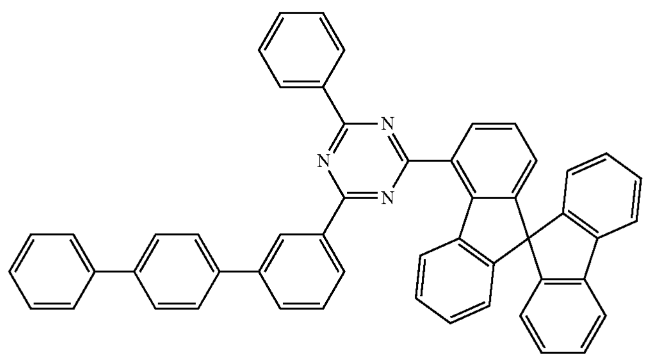
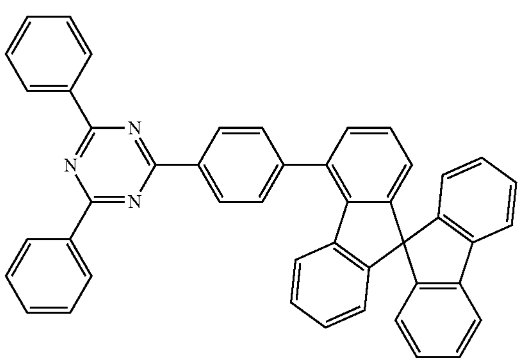
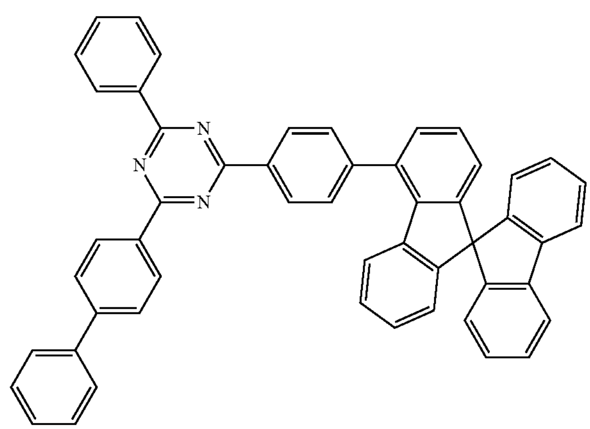

-continued
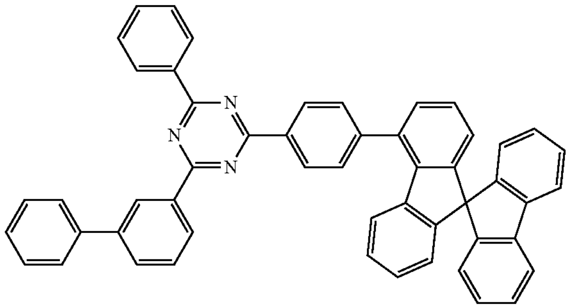
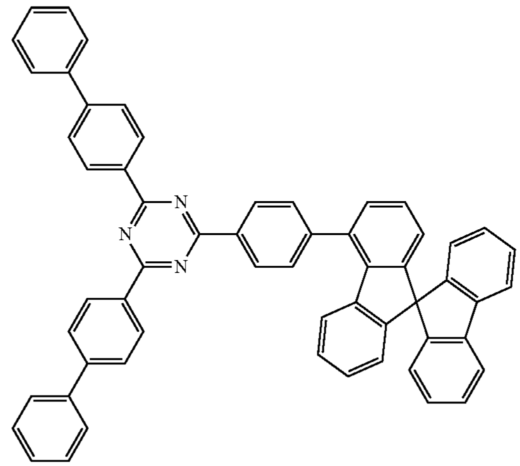
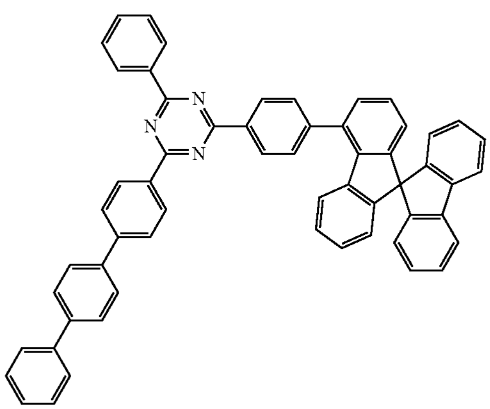
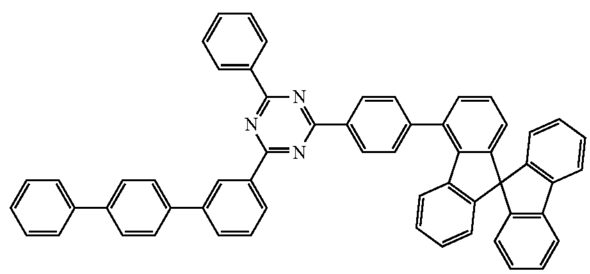
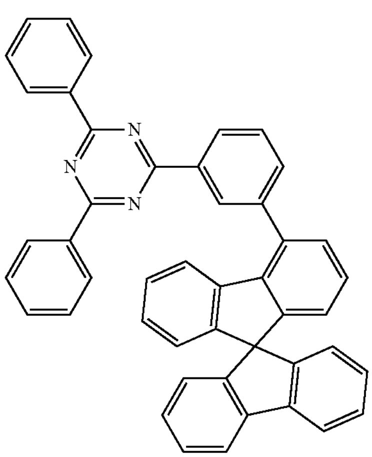
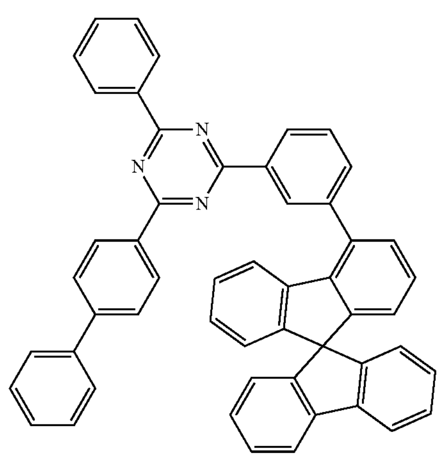

-continued
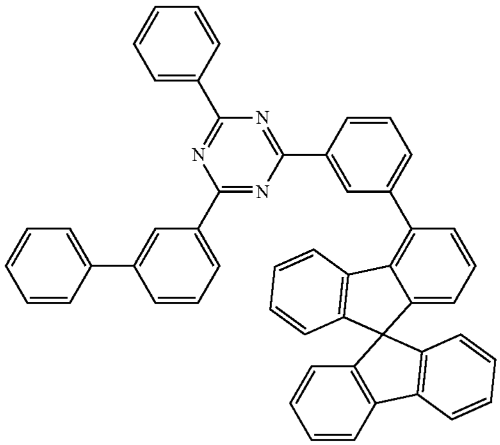
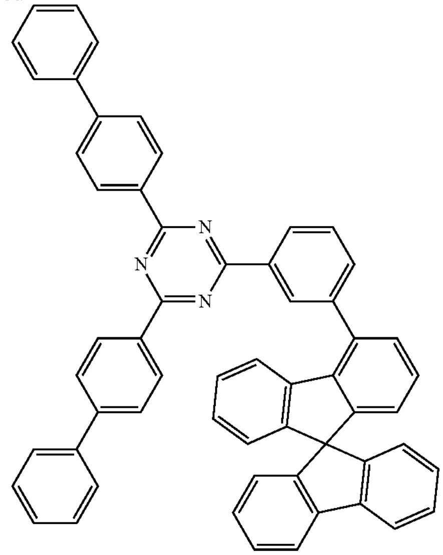
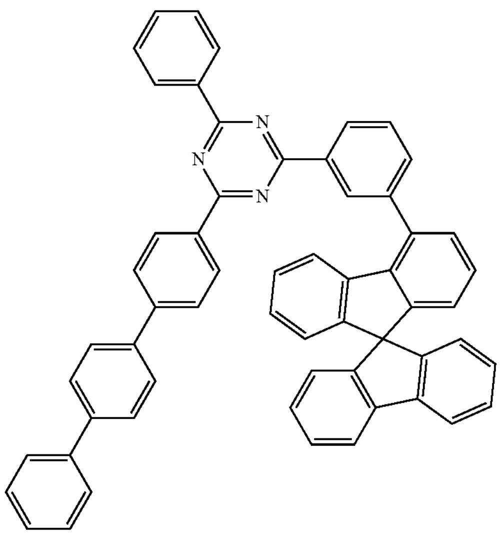
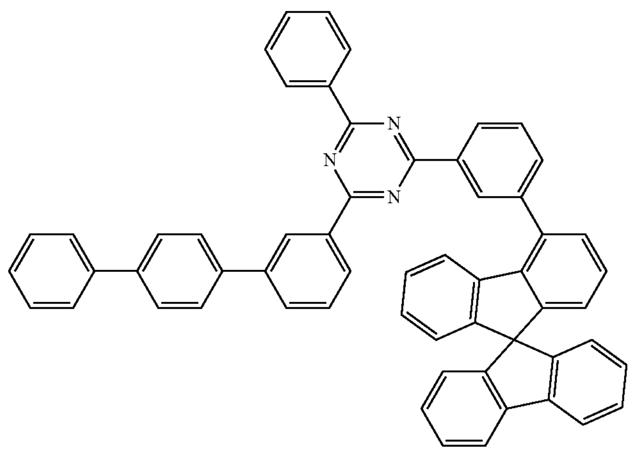
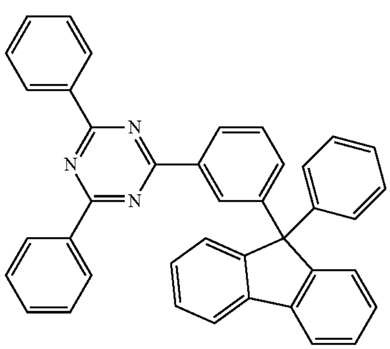
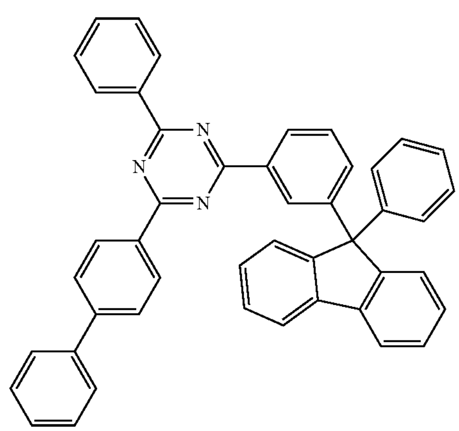

-continued
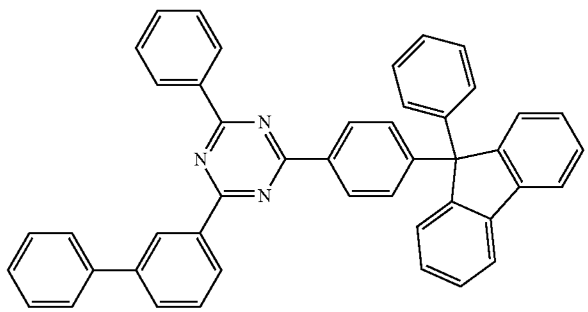
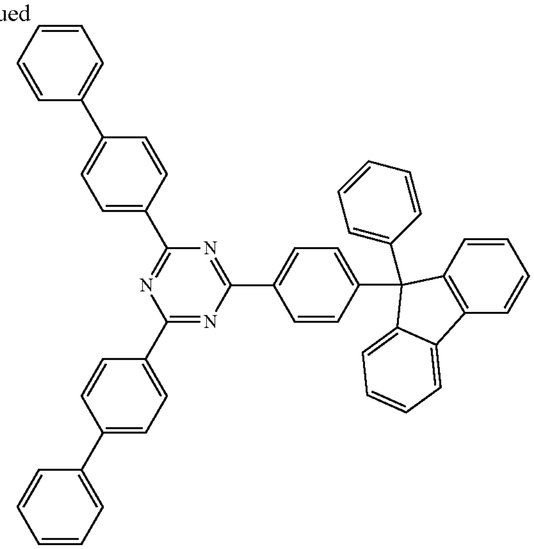
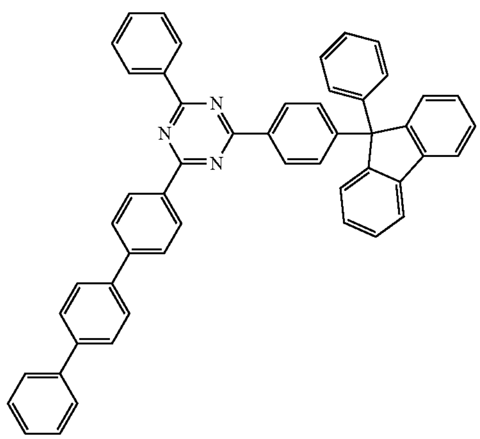
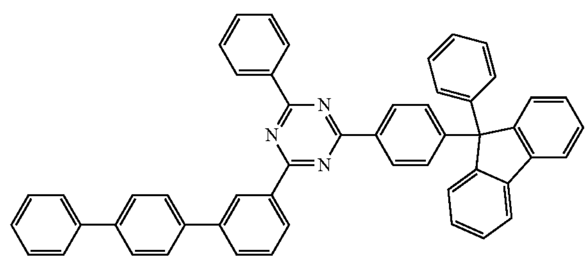
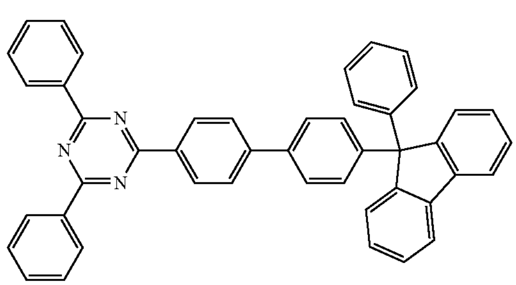
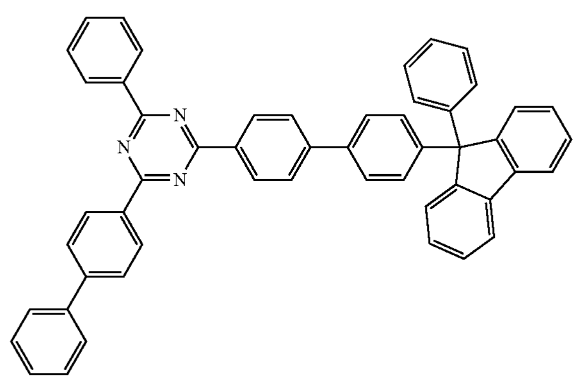
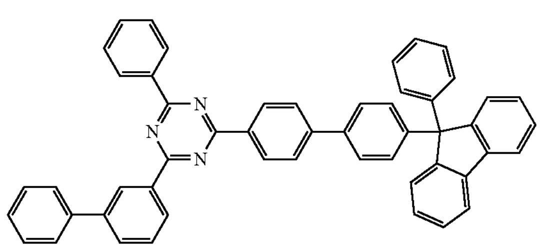
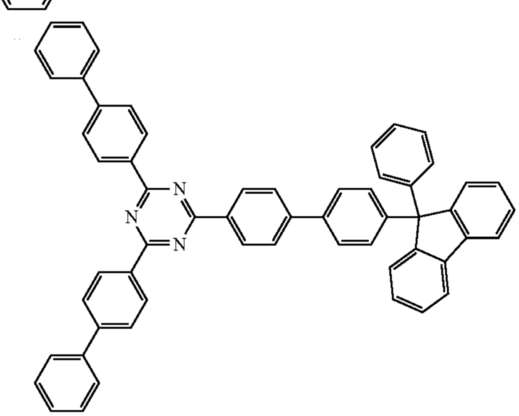

-continued
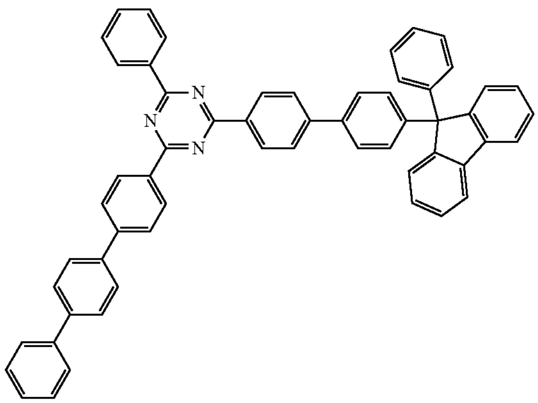
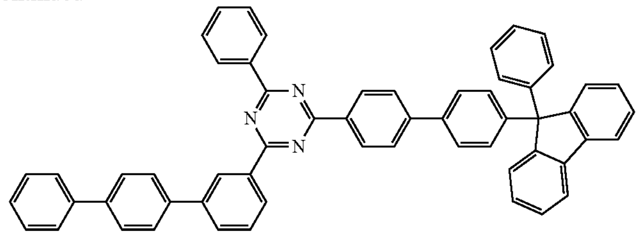
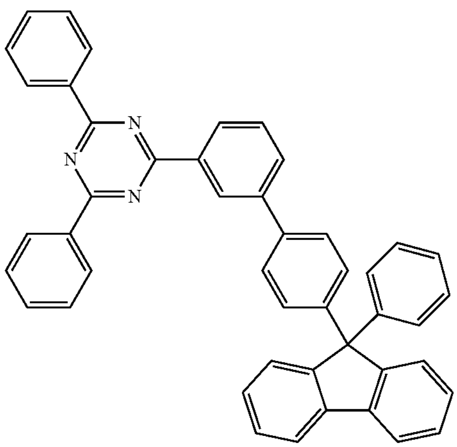
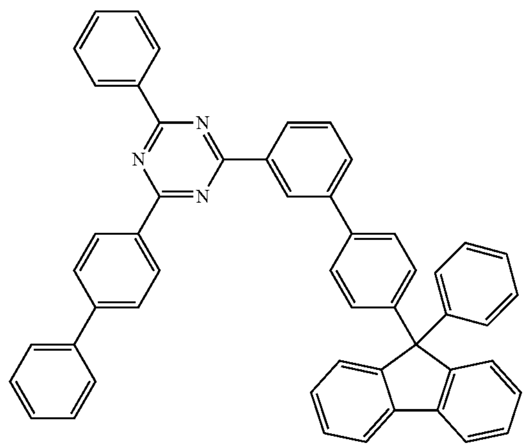
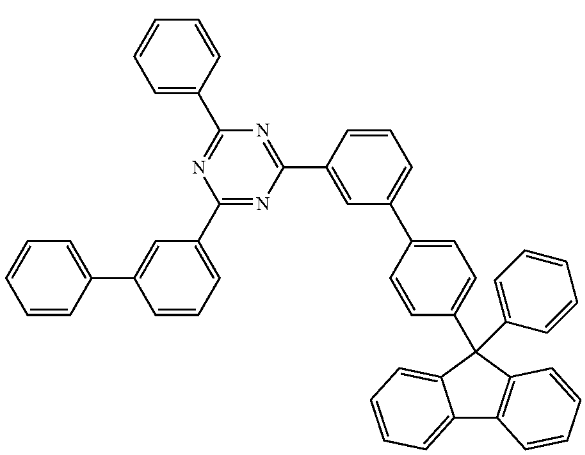
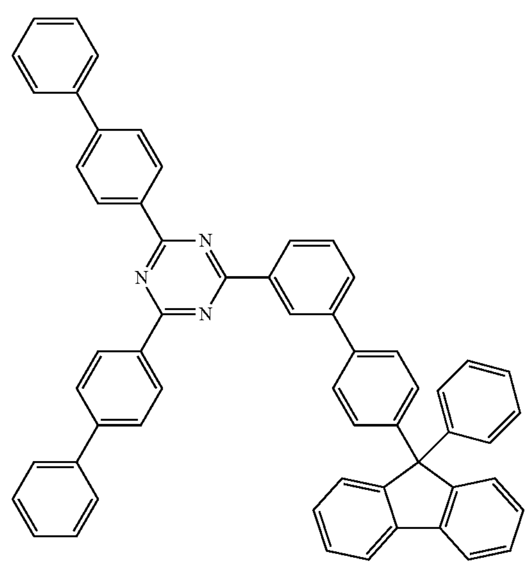

-continued
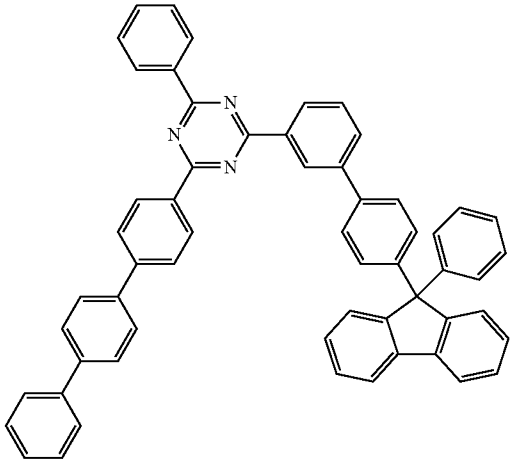
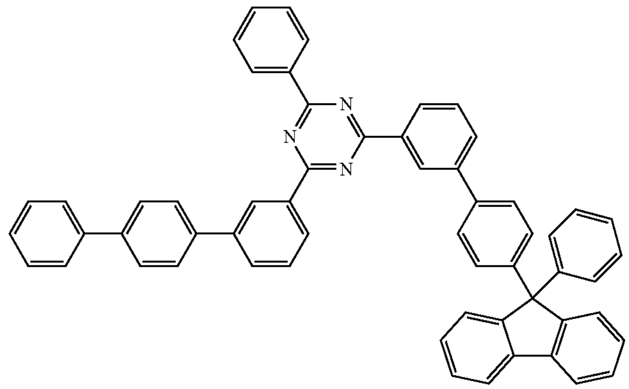
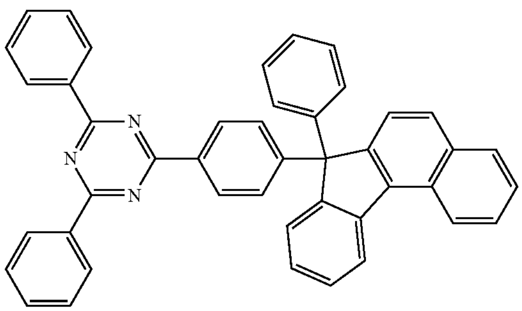
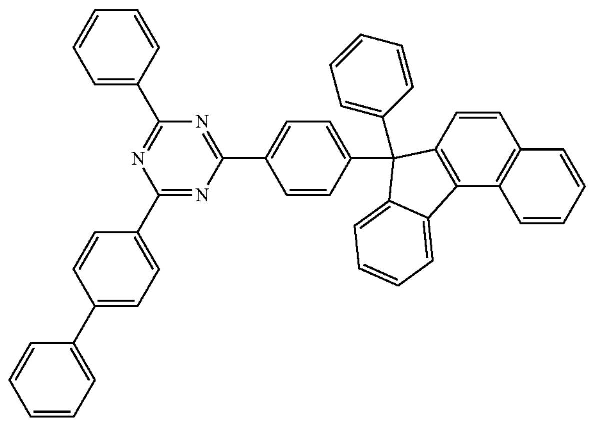
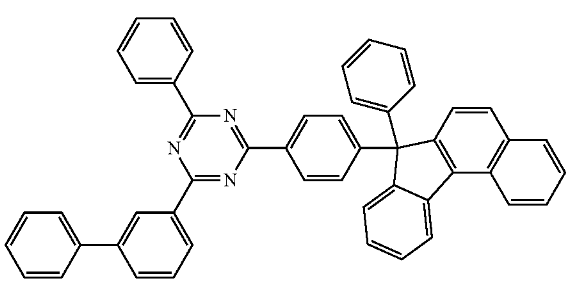
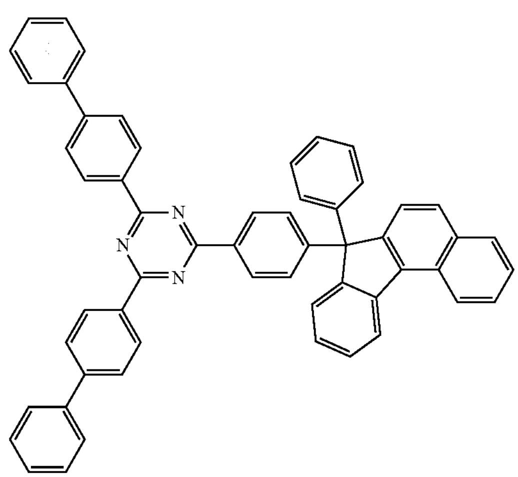

-continued
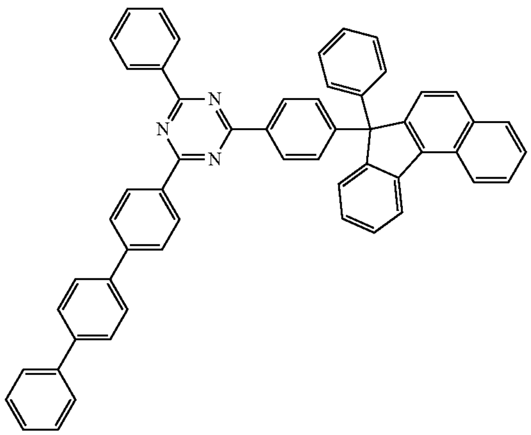
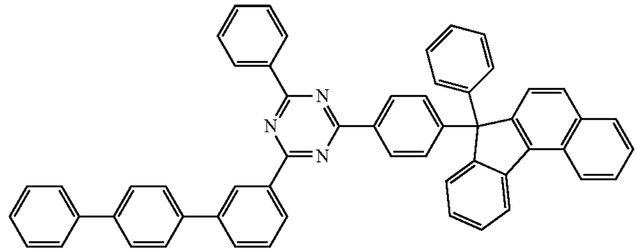
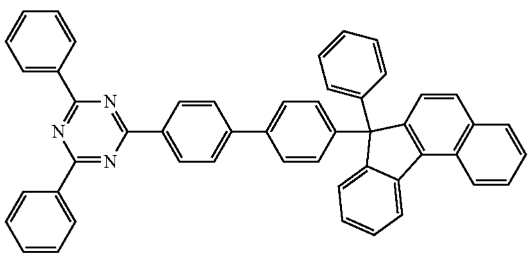
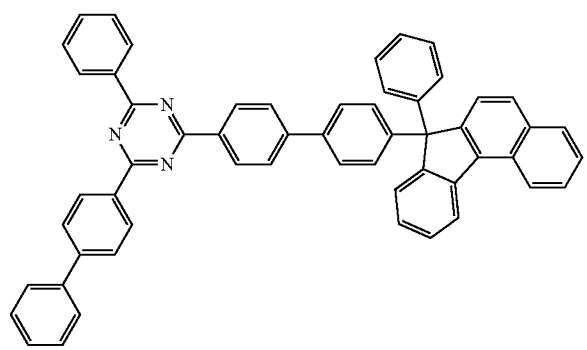
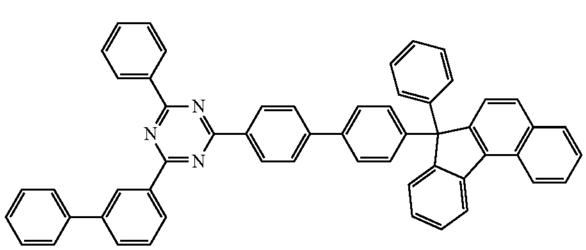
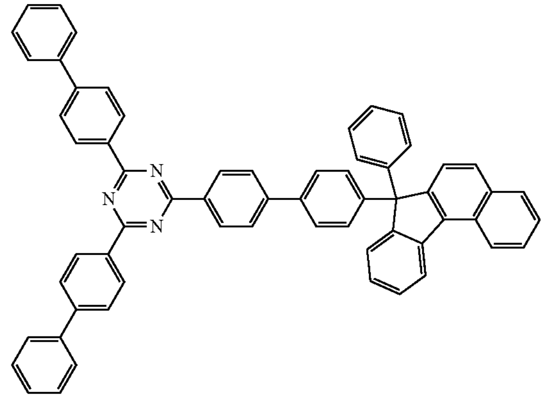

-continued
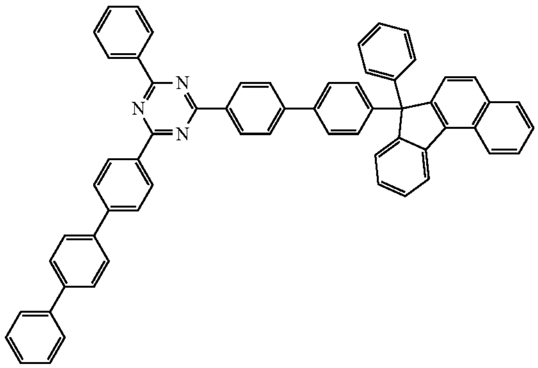
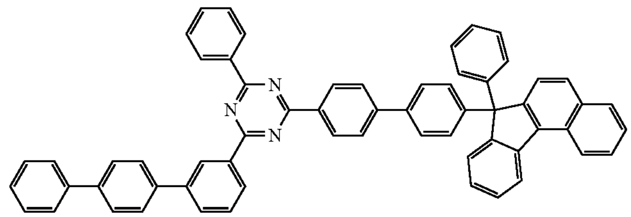
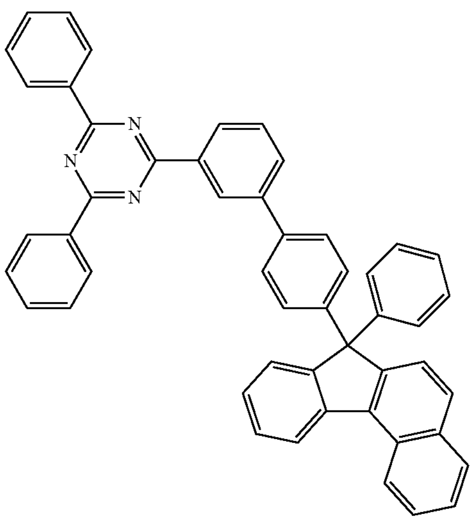
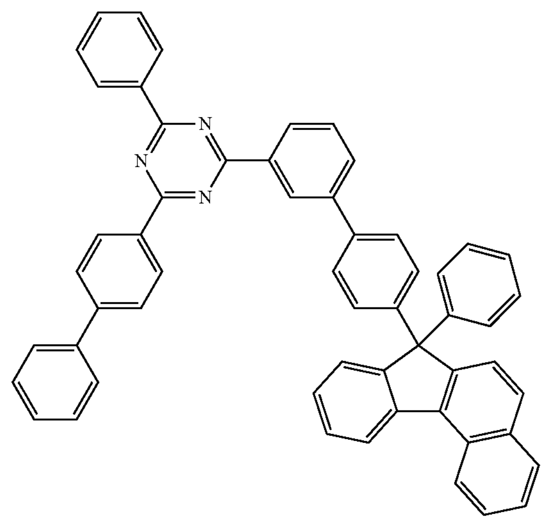
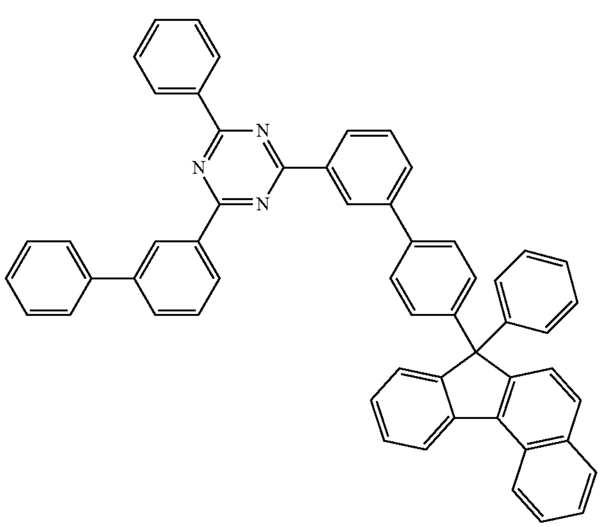
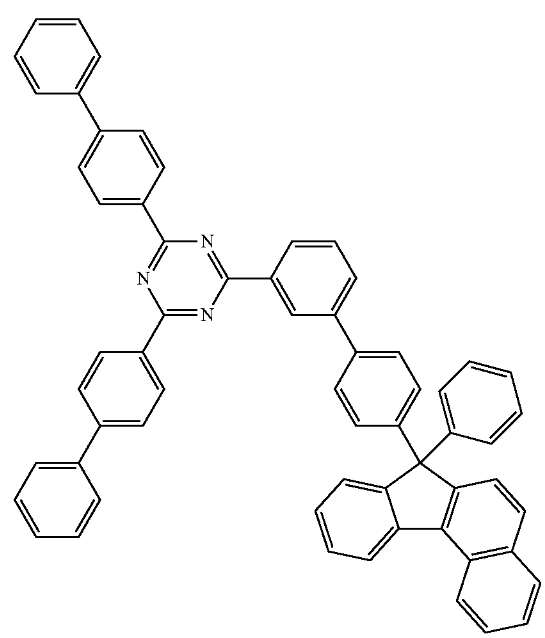

-continued
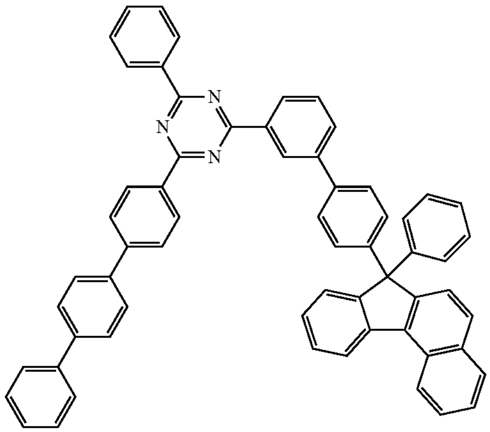
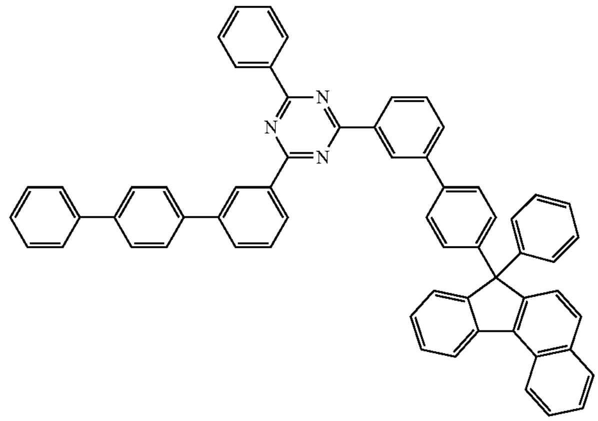
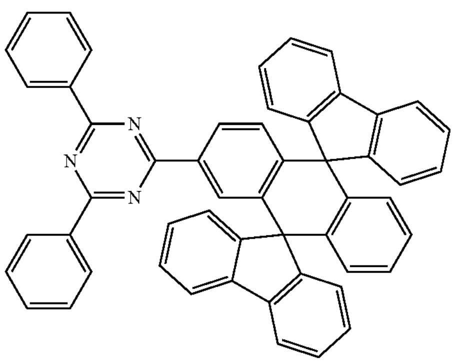
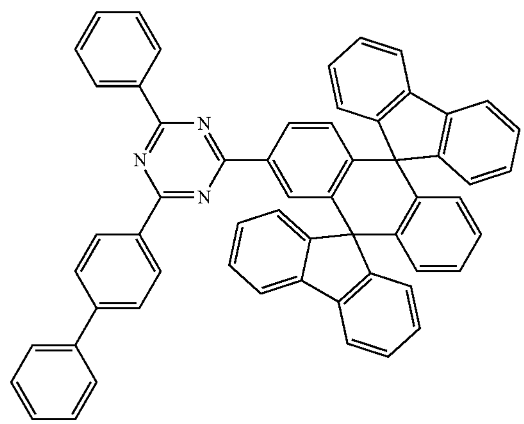
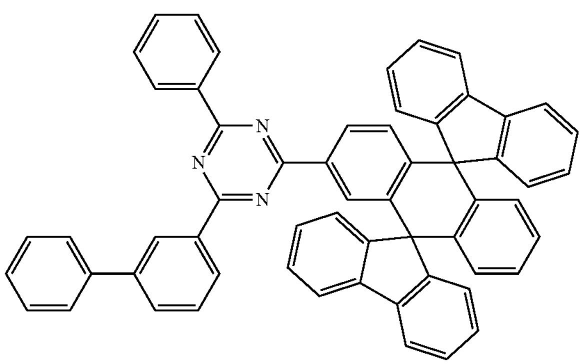
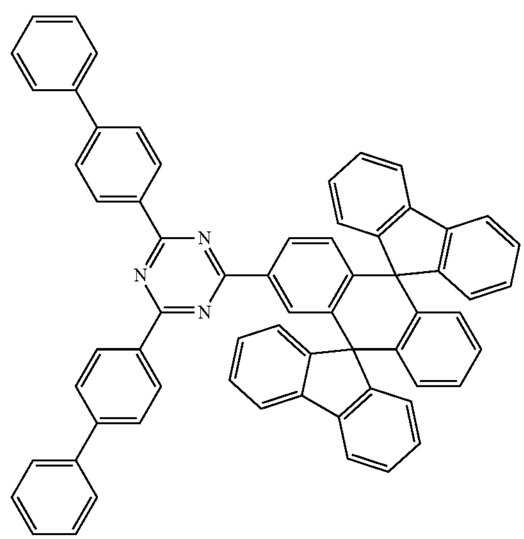

-continued
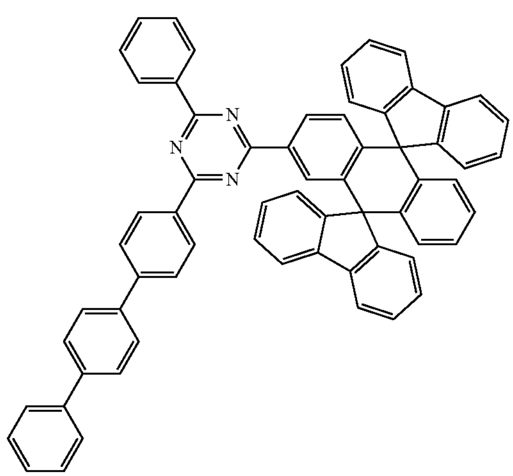
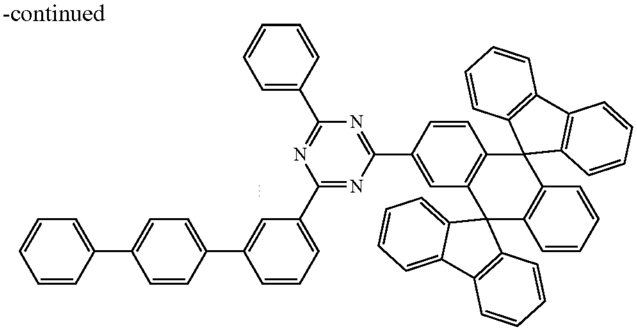
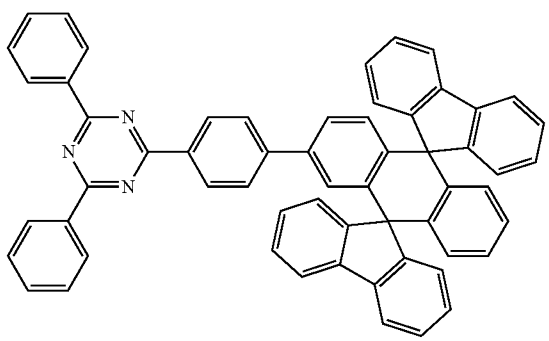
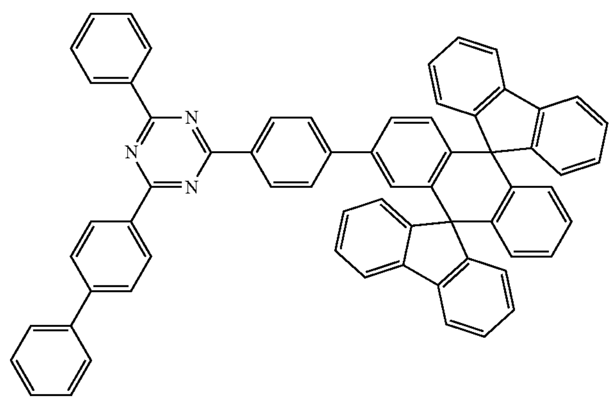
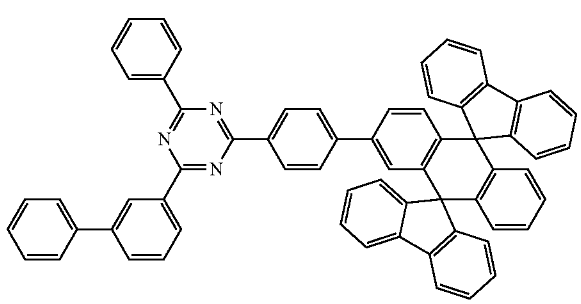
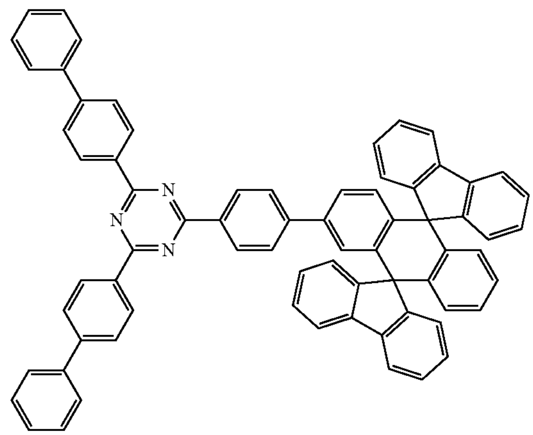

-continued
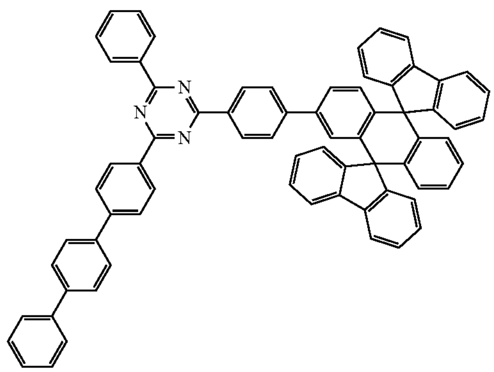
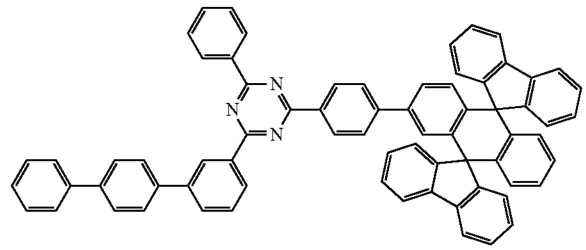
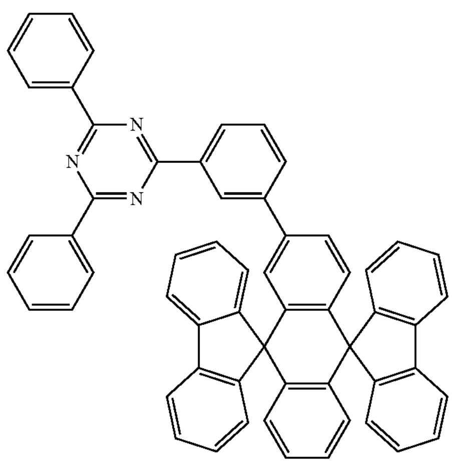
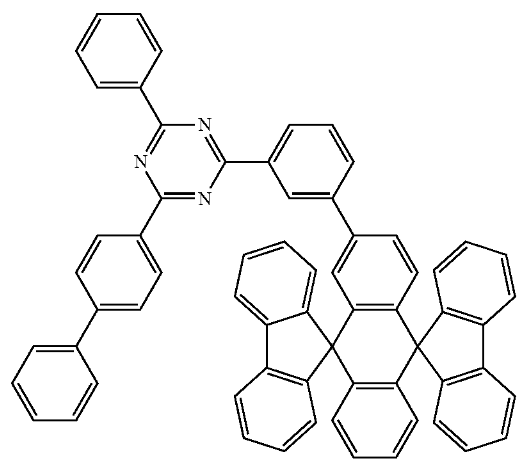
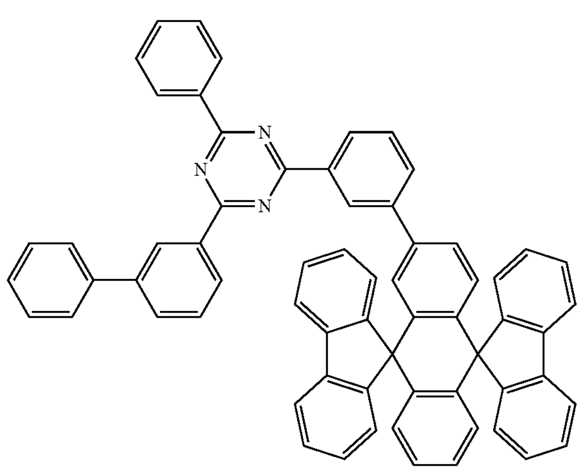
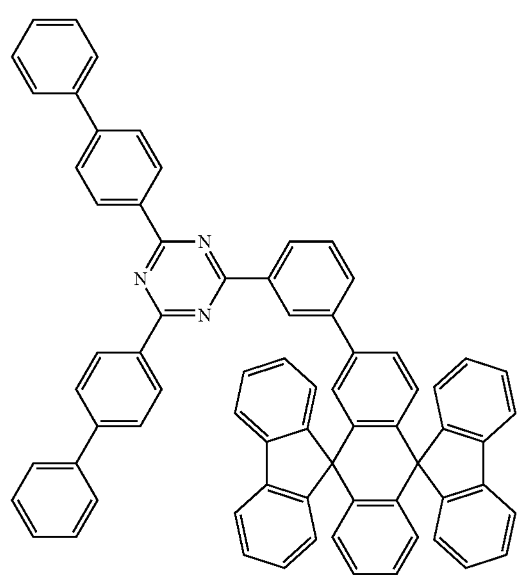

-continued
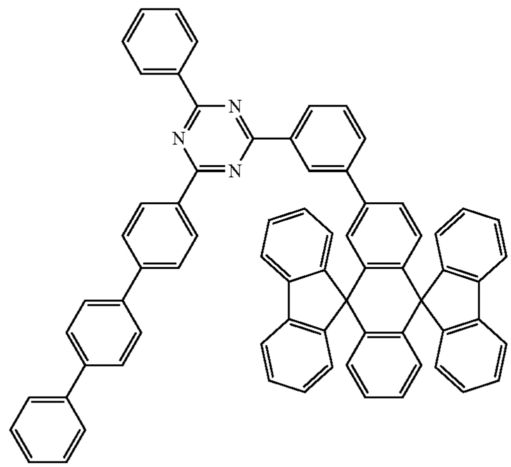
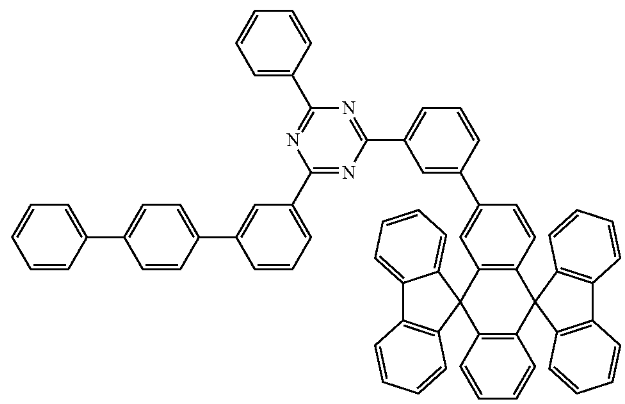
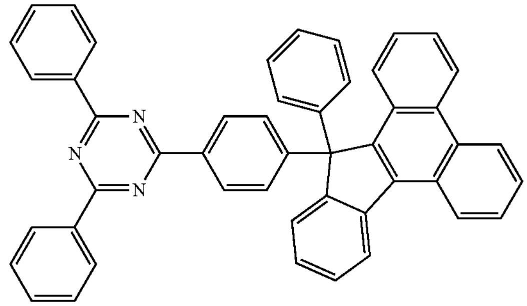
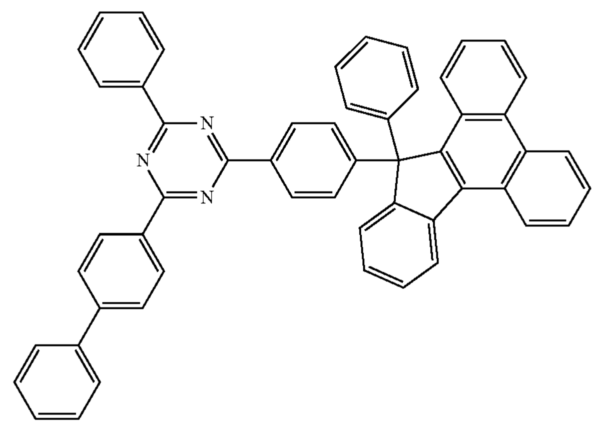
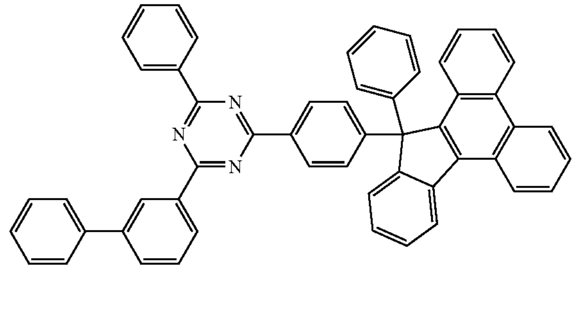
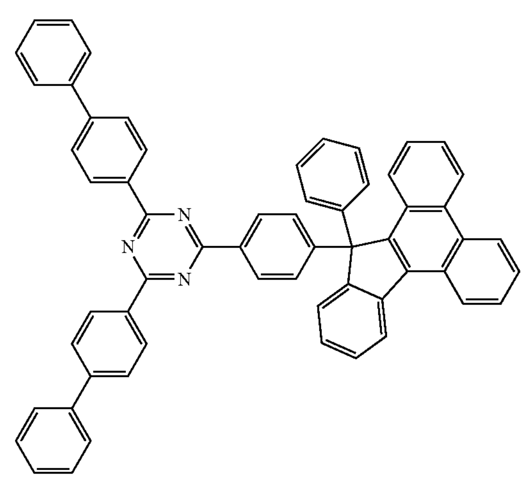

-continued
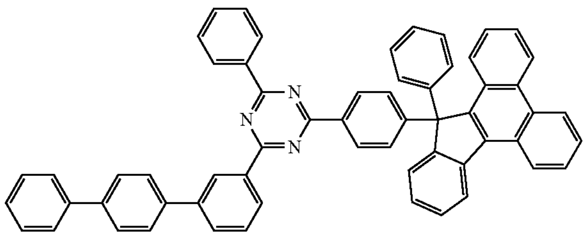
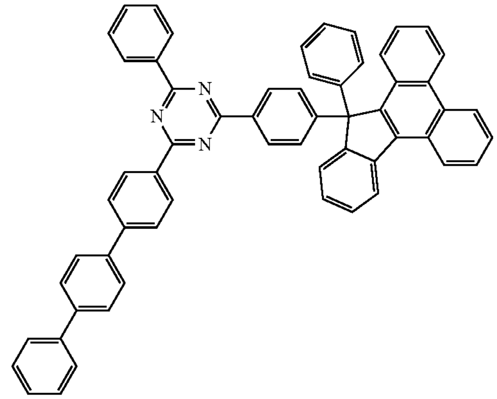
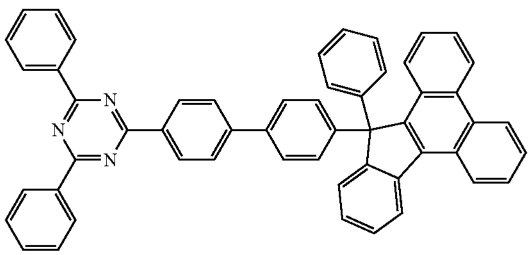
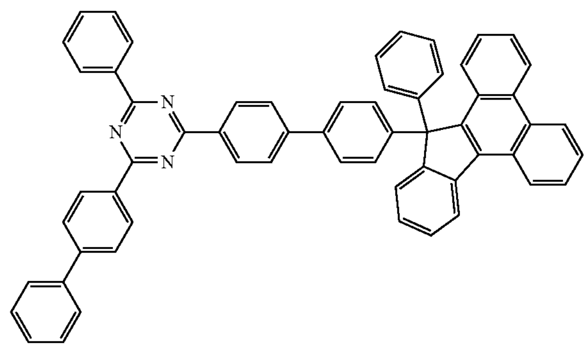
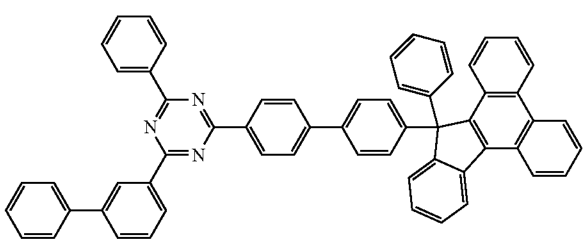
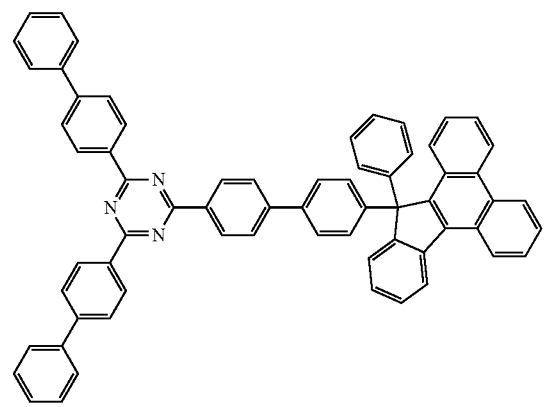
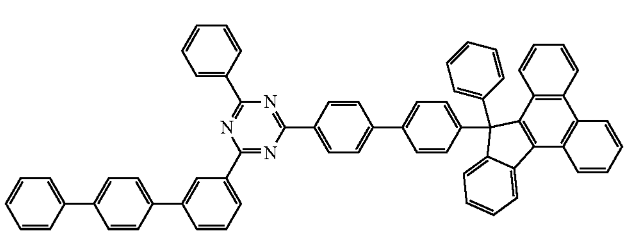
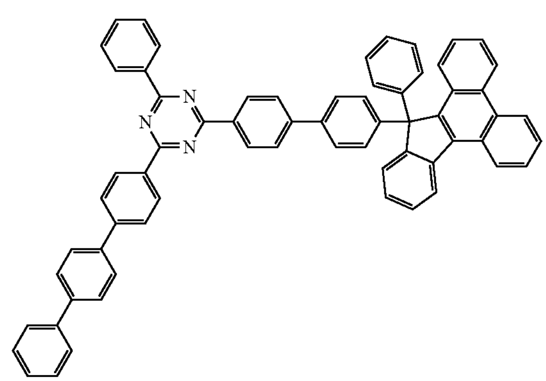

-continued
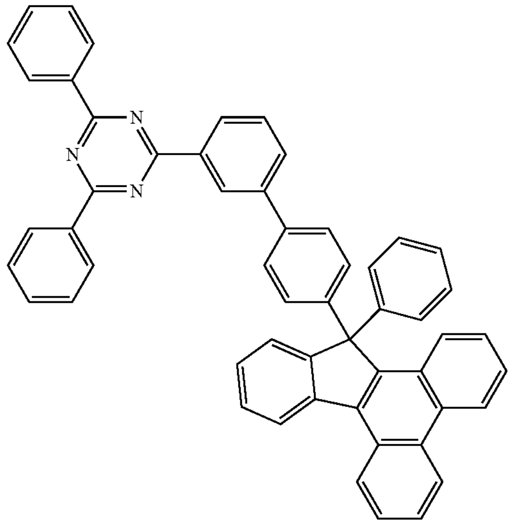
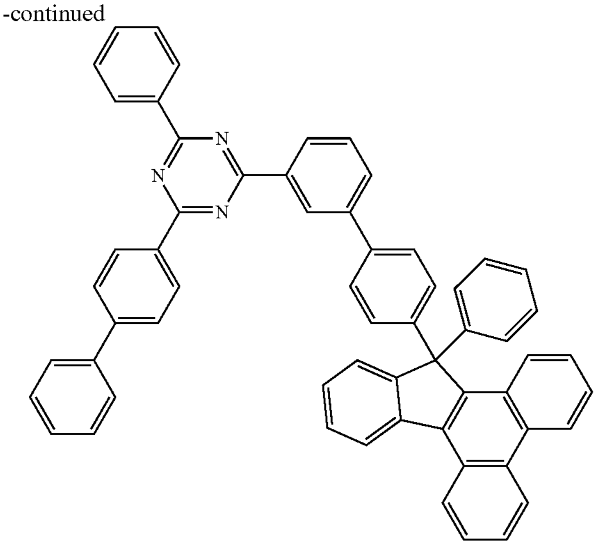
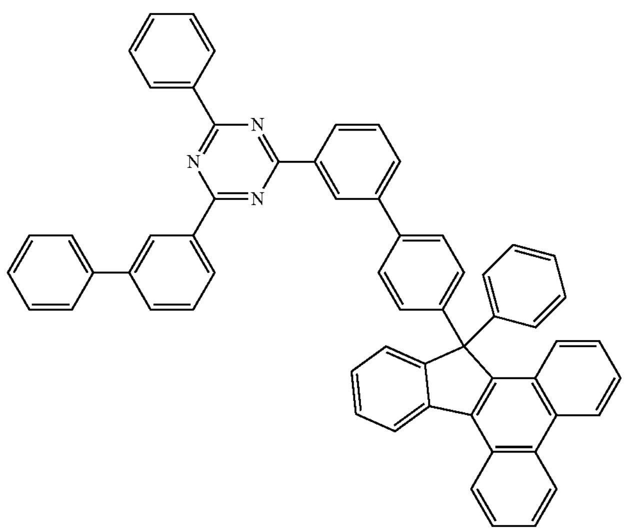
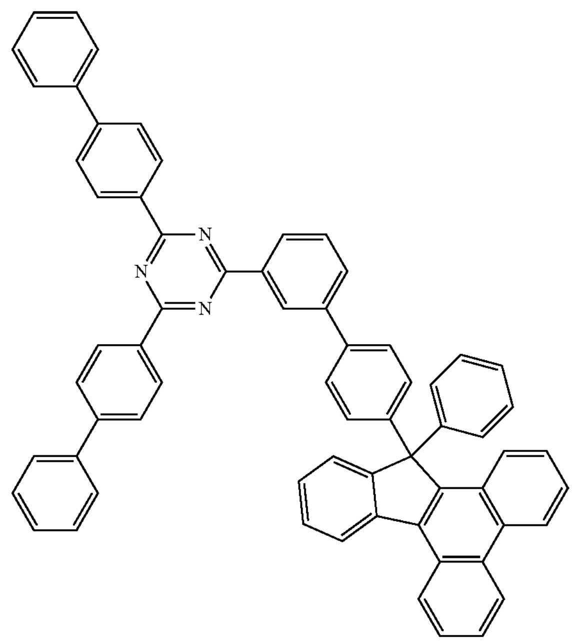
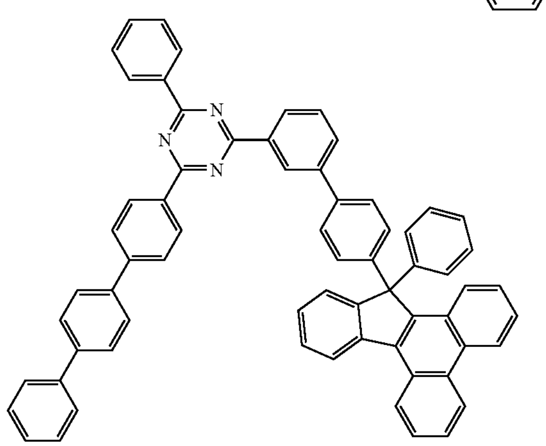
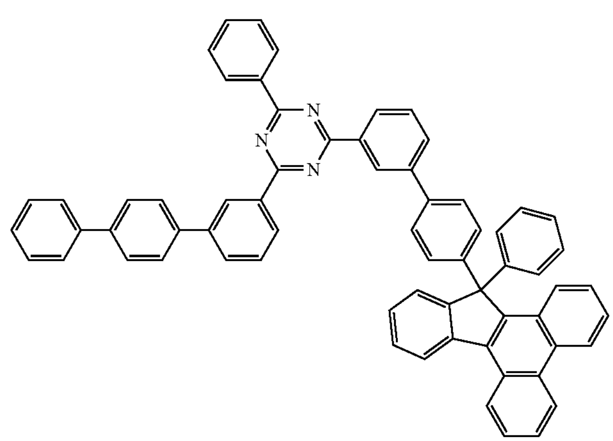

-continued
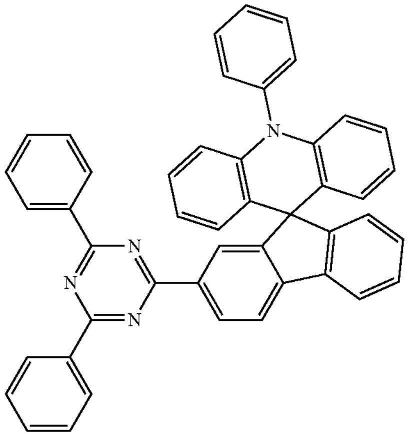
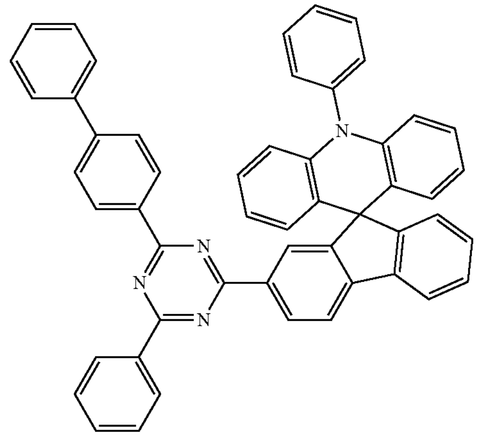
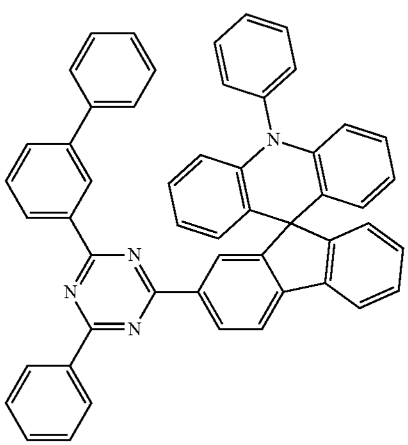
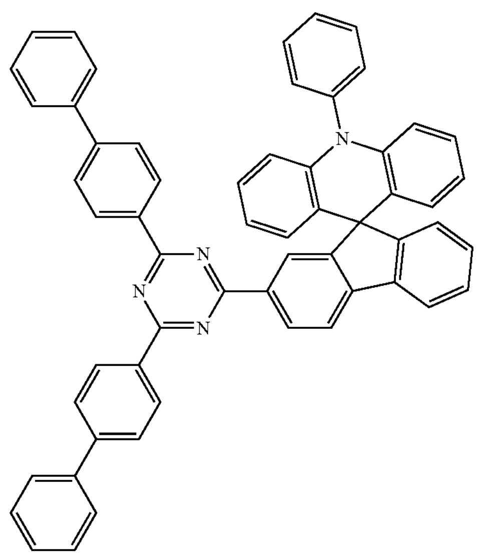
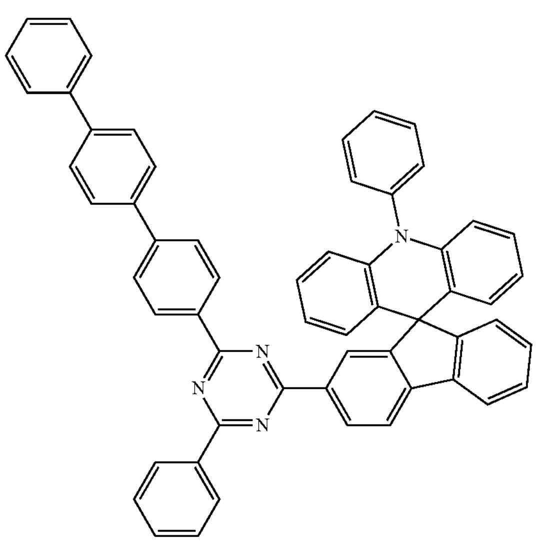
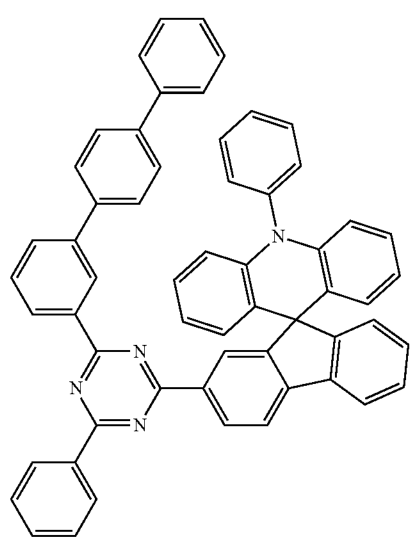

-continued
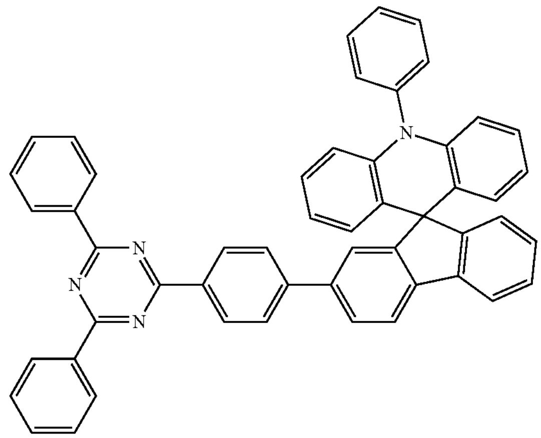
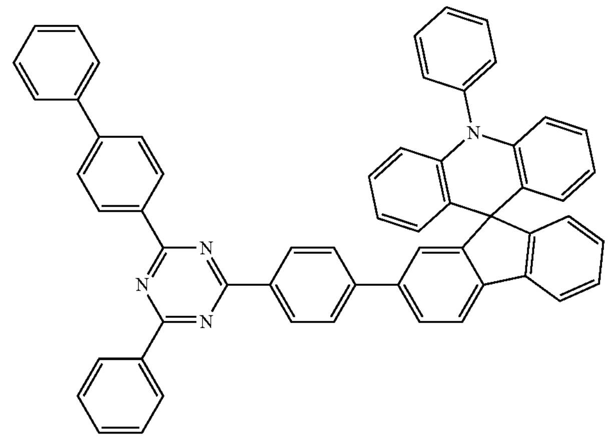
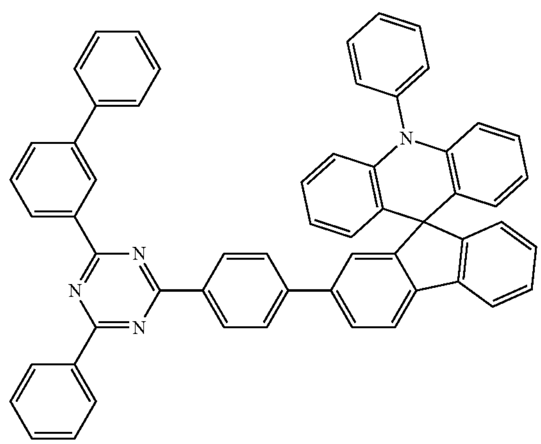
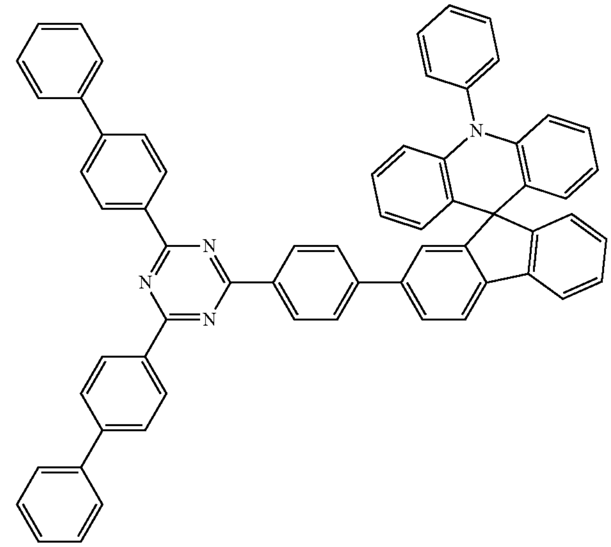
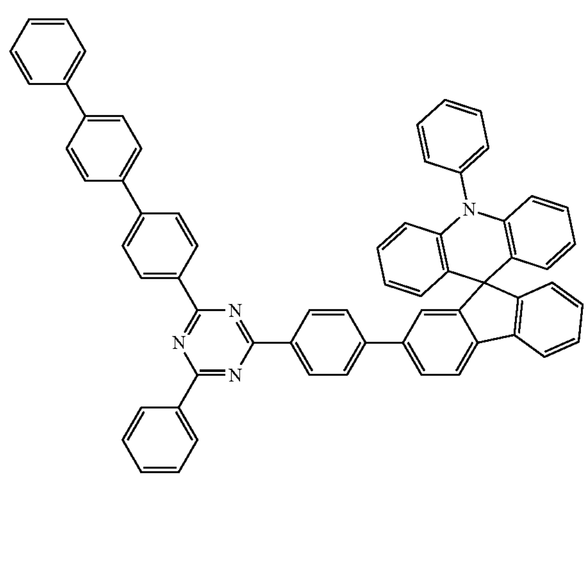
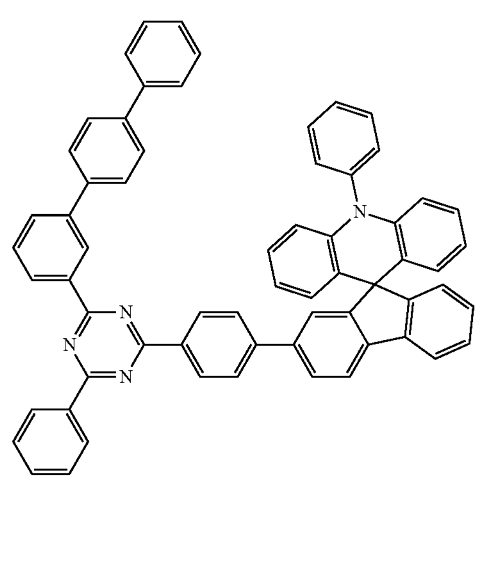

-continued
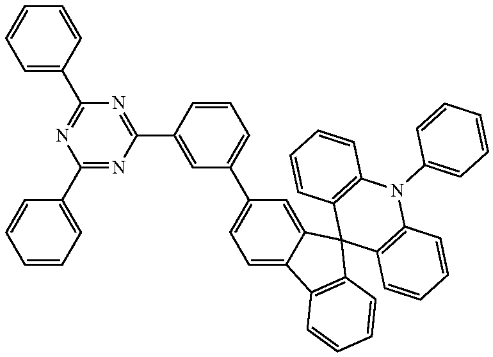
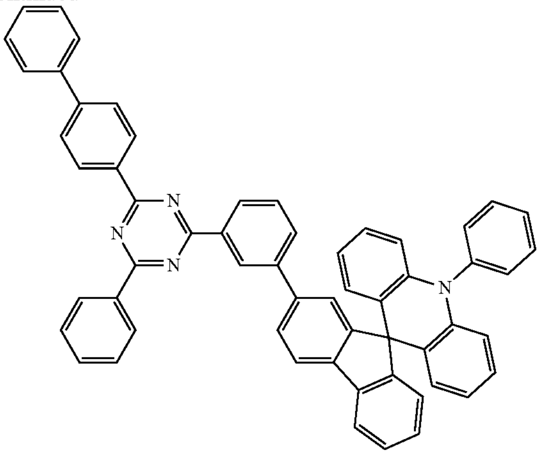
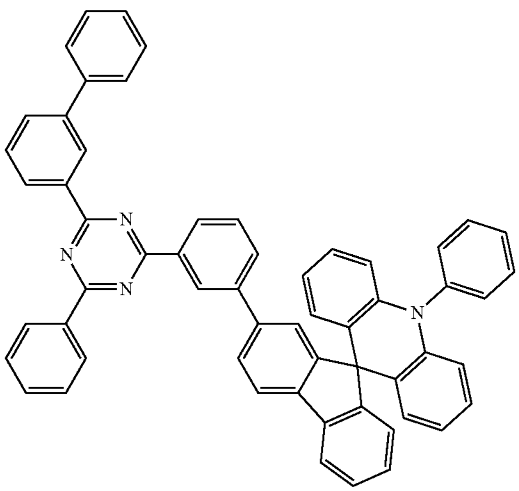
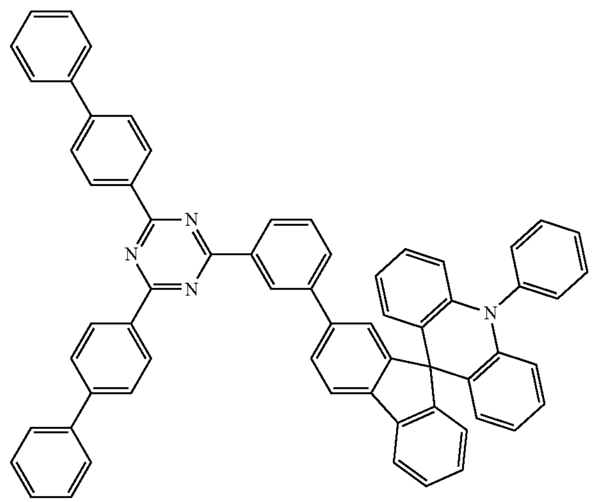
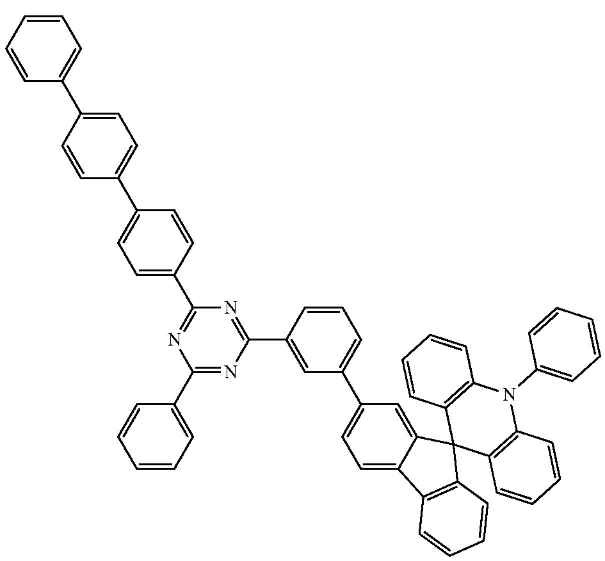
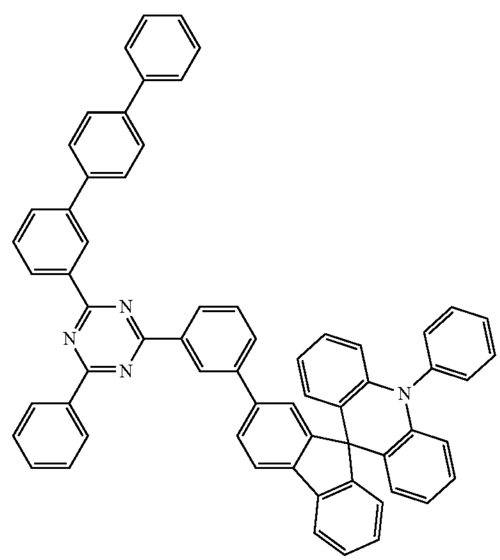

-continued
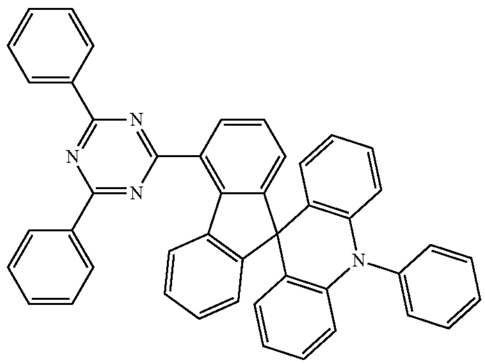
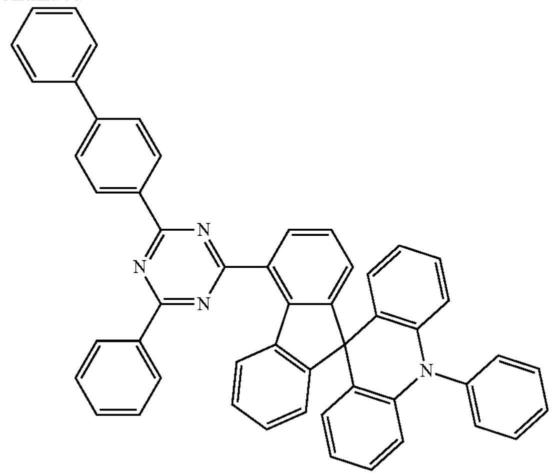
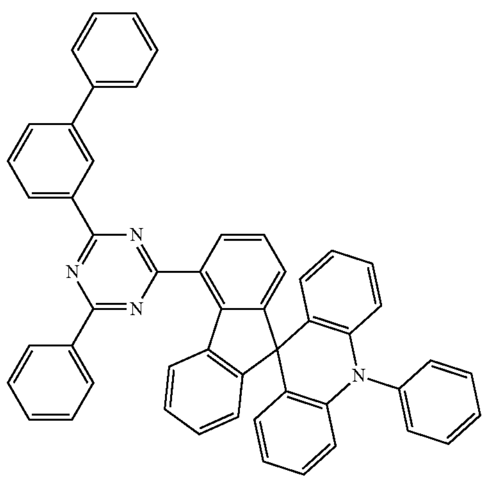
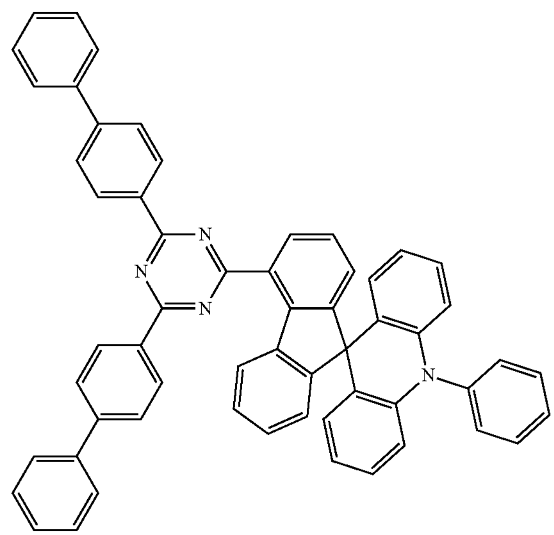
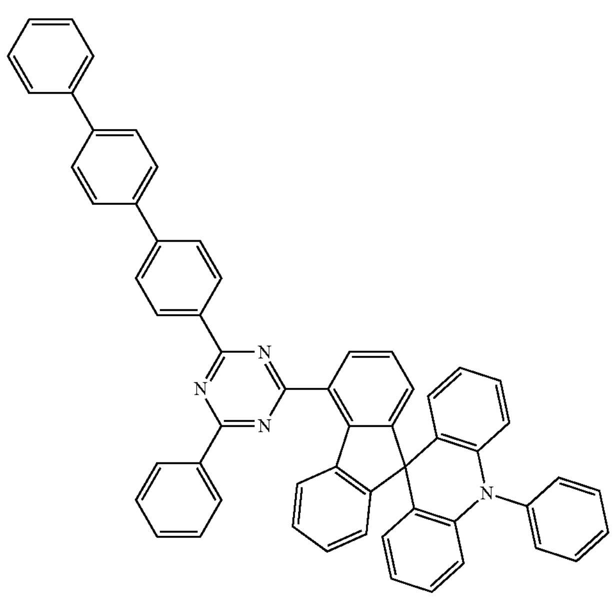
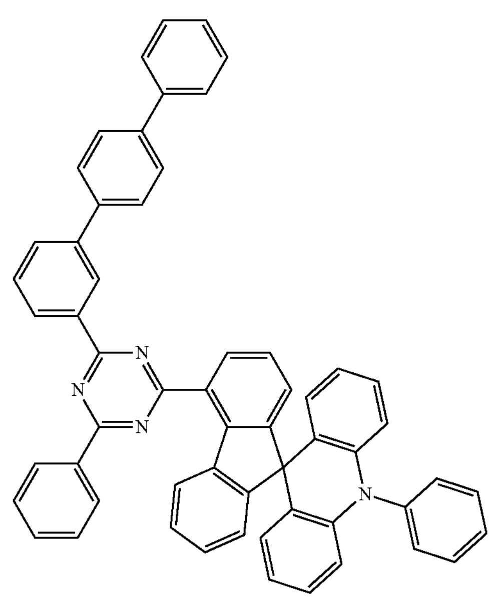

-continued
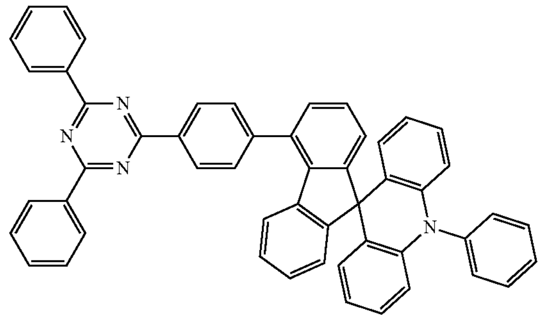
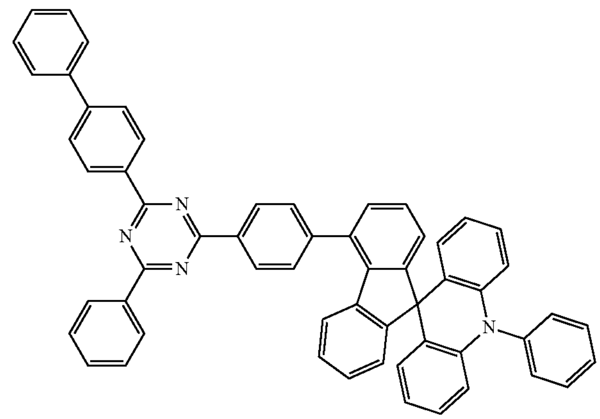
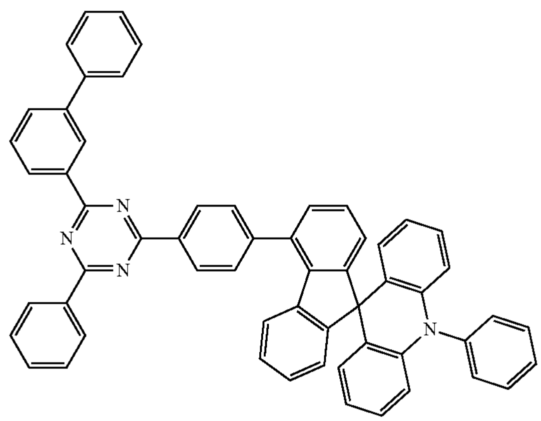
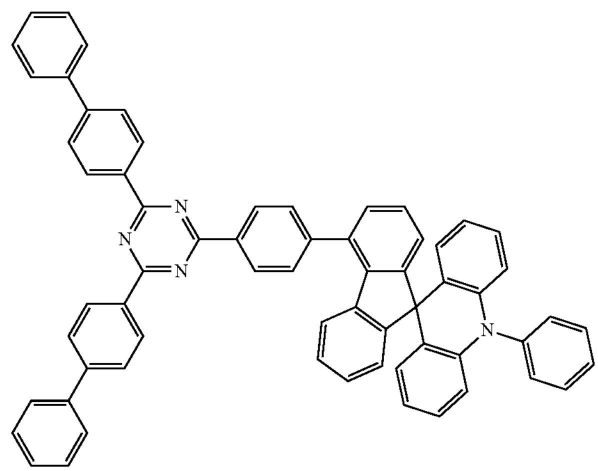
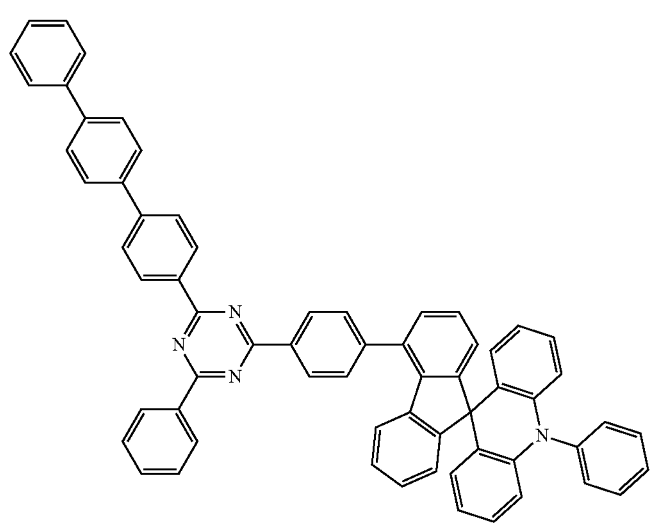
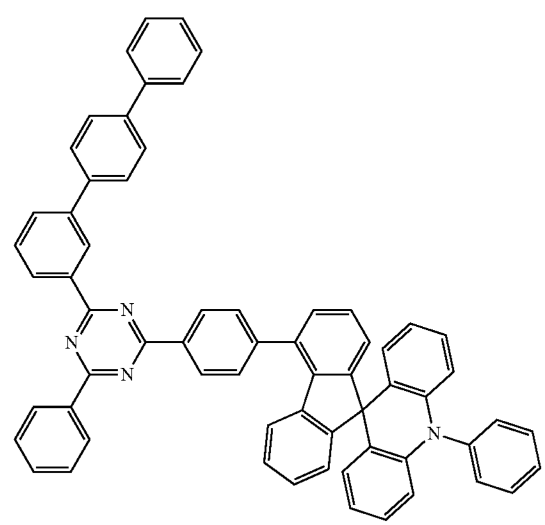

-continued
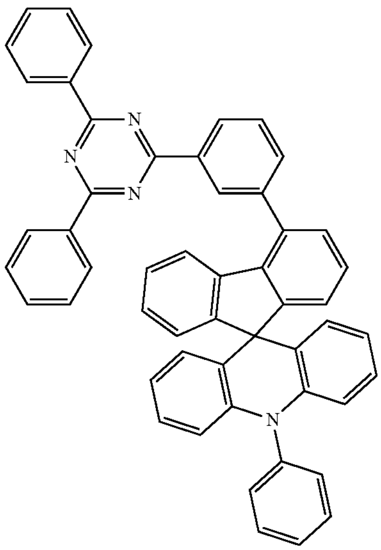
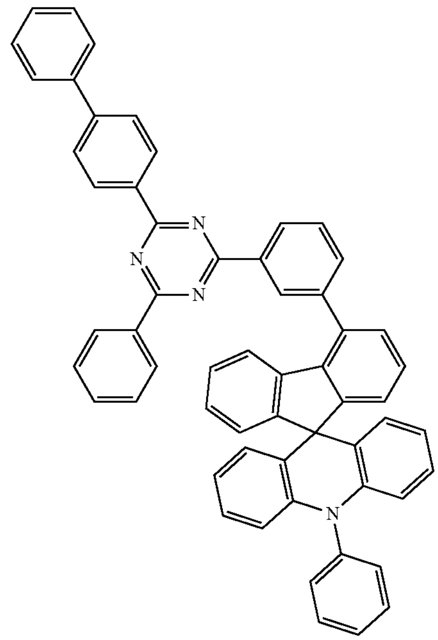
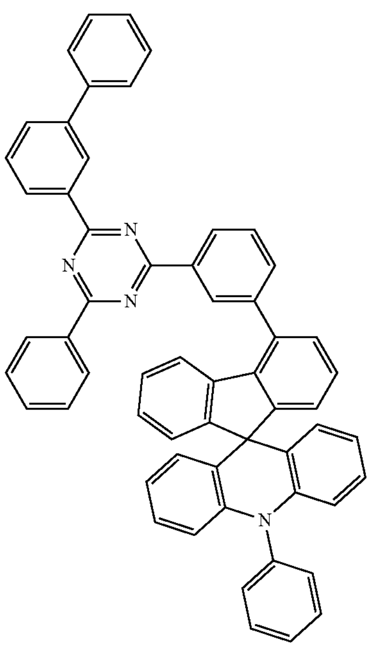
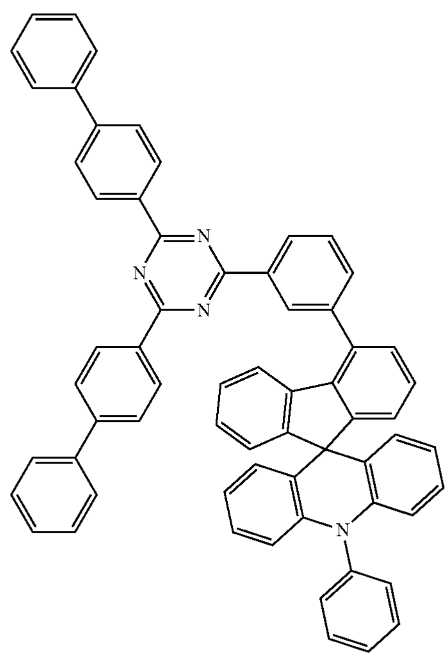

-continued
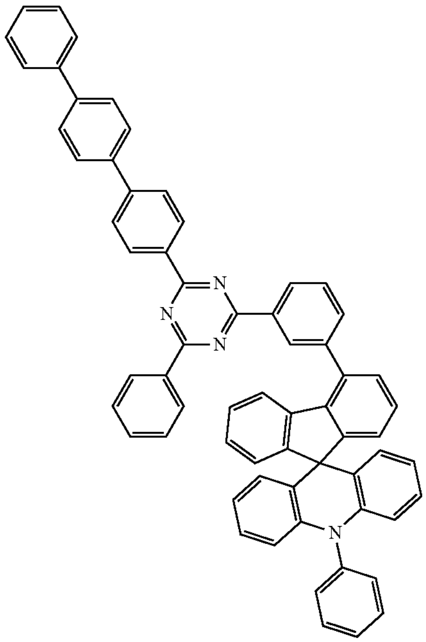
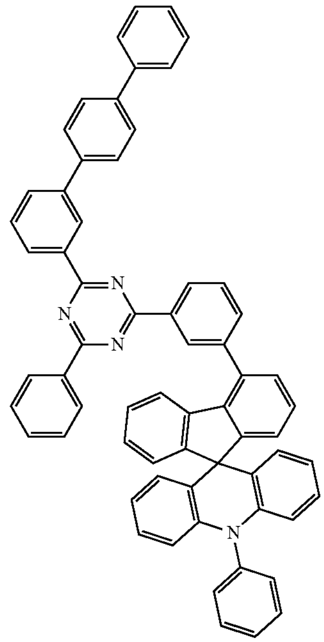
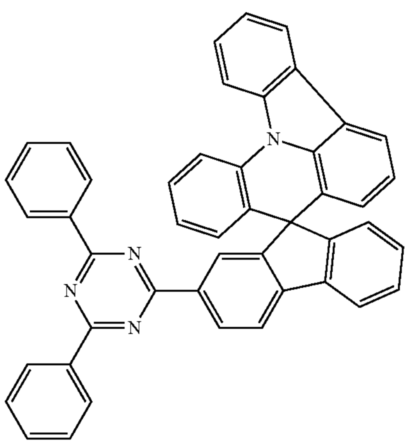
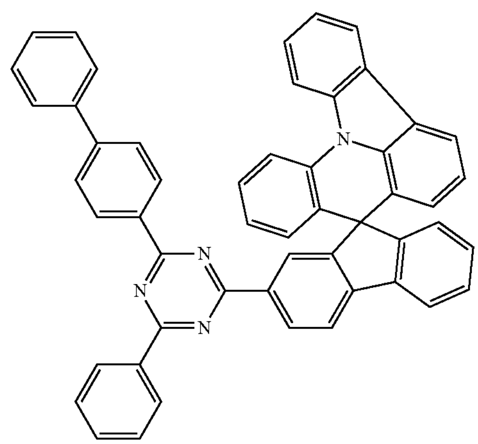
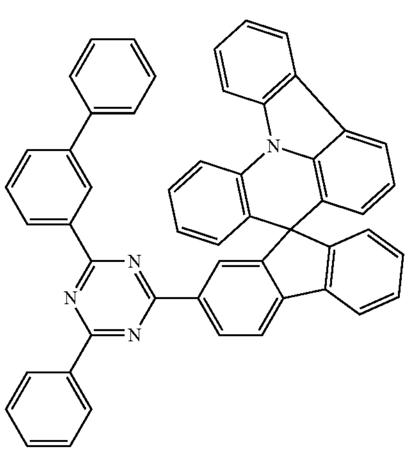
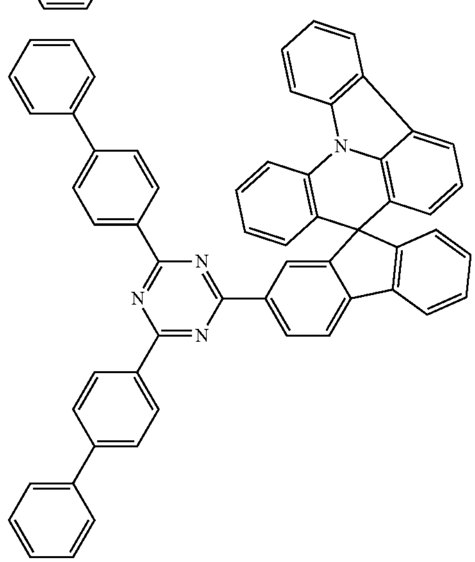

-continued
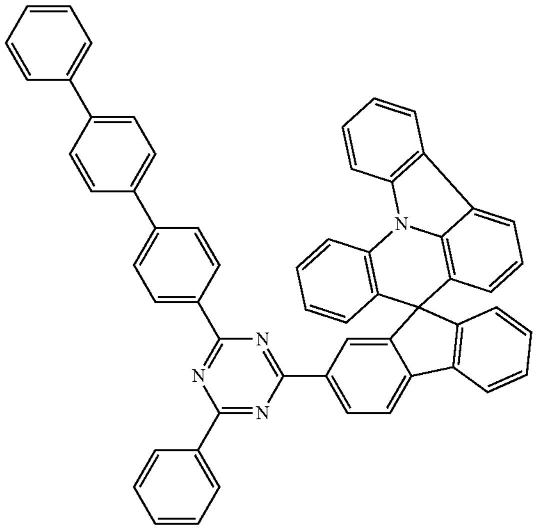
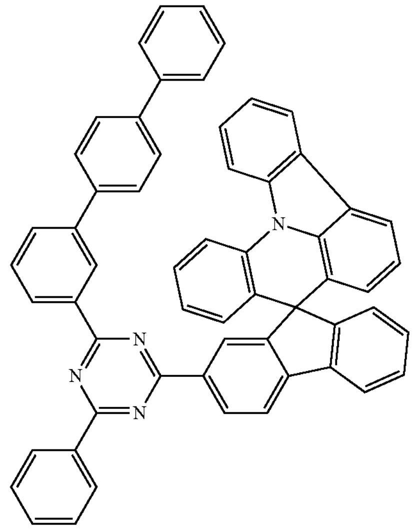
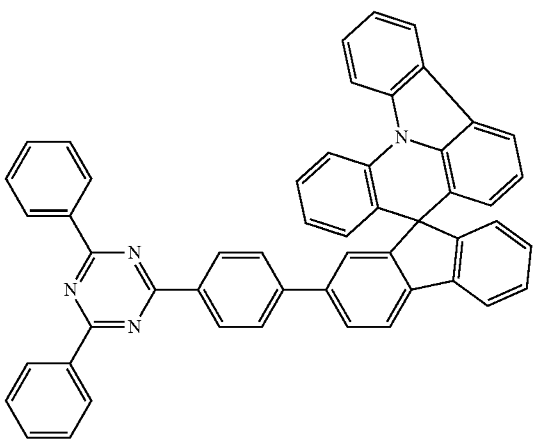
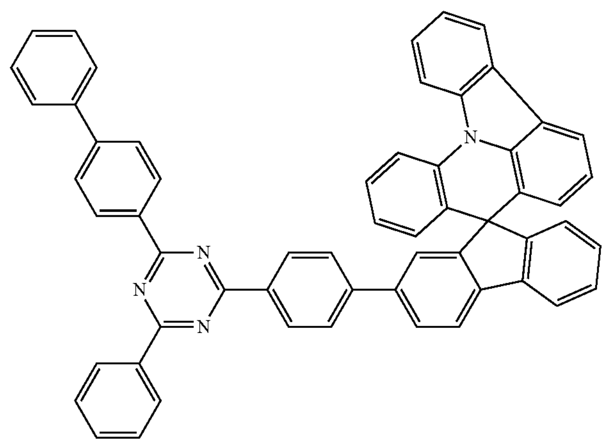
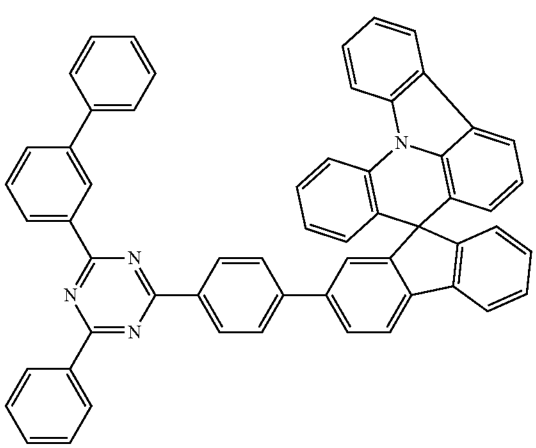
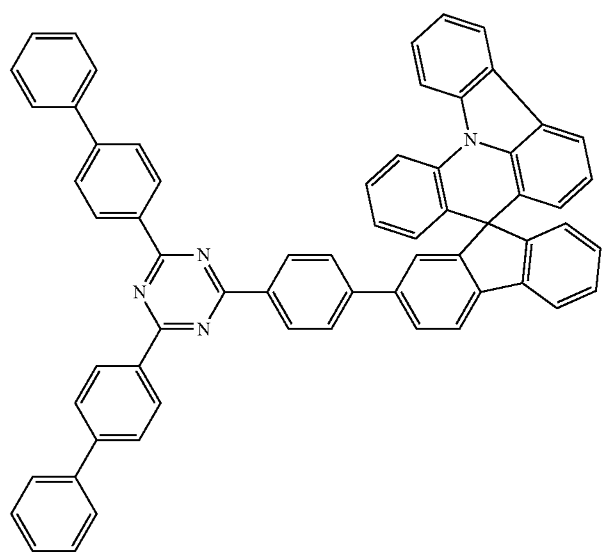

-continued
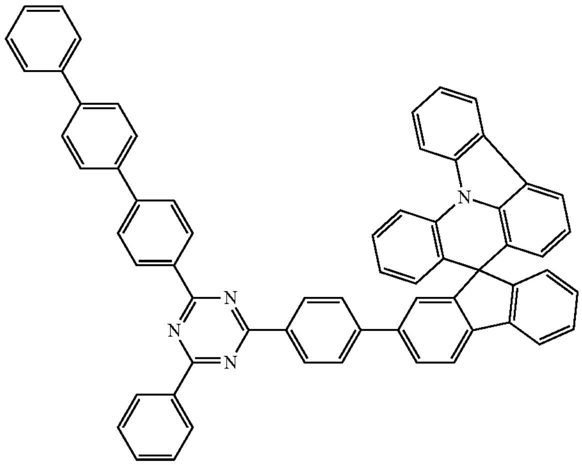
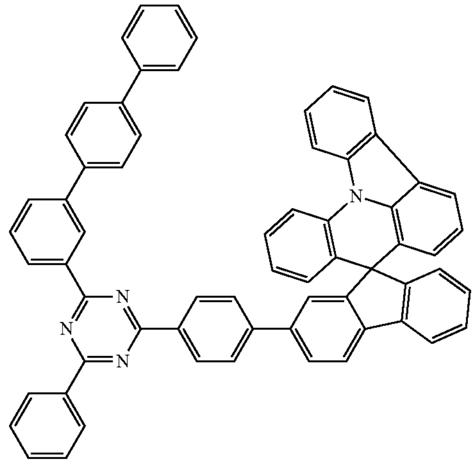
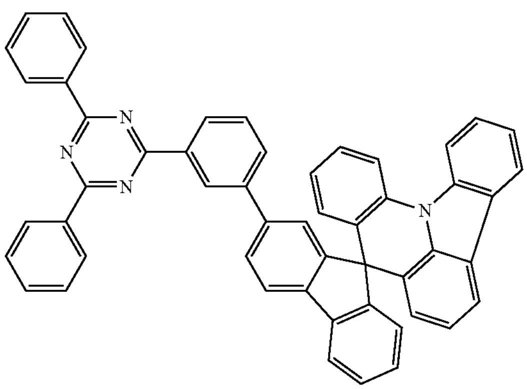
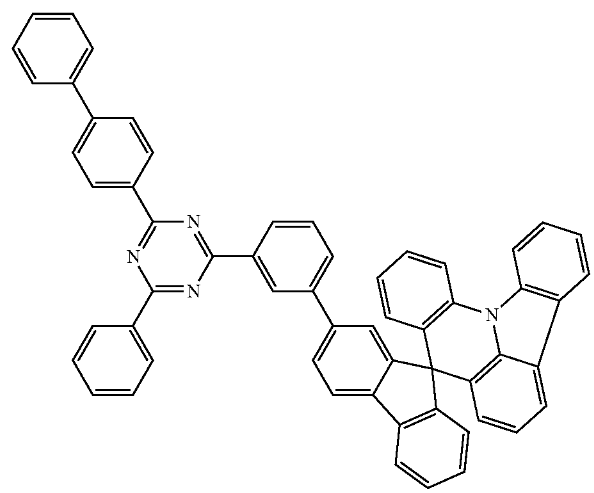
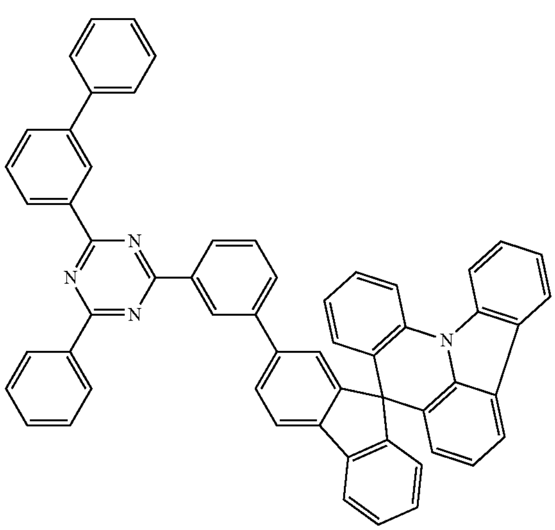
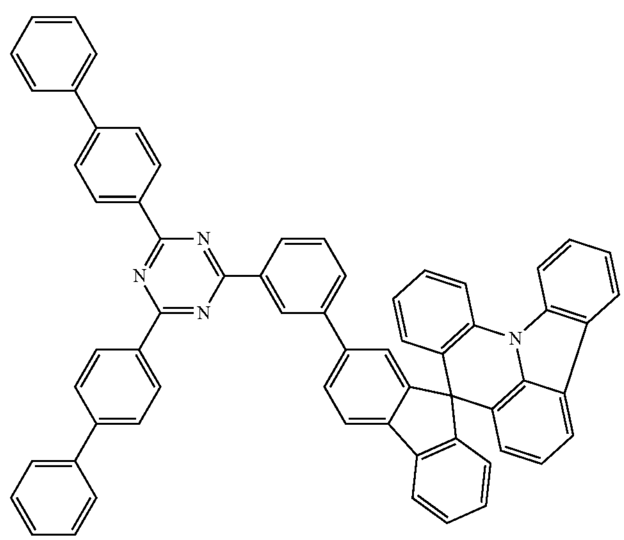

-continued
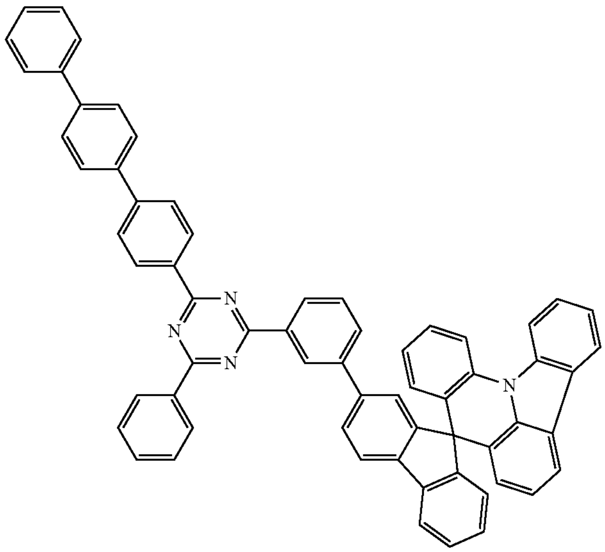
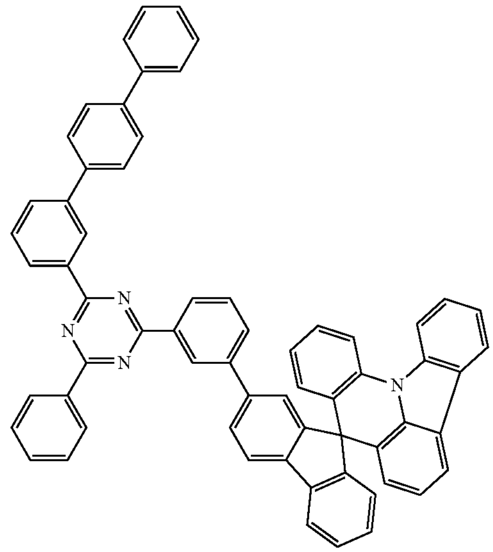
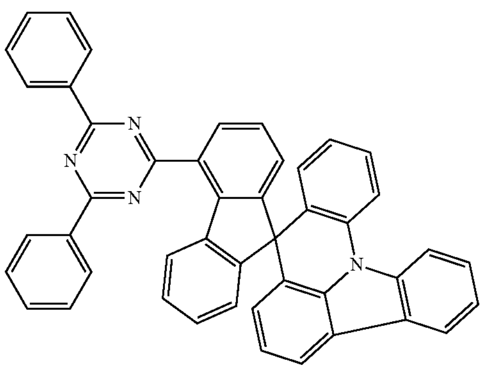
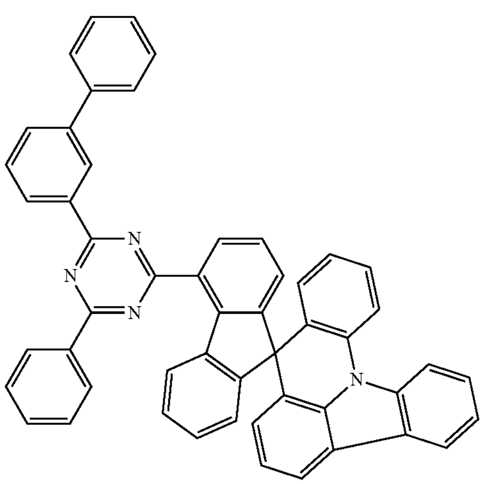
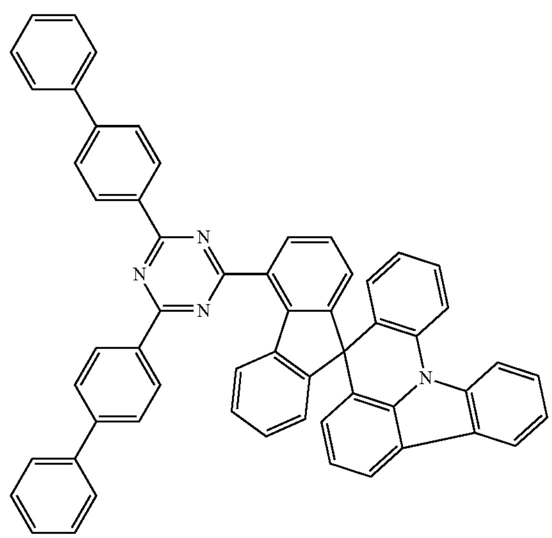

-continued
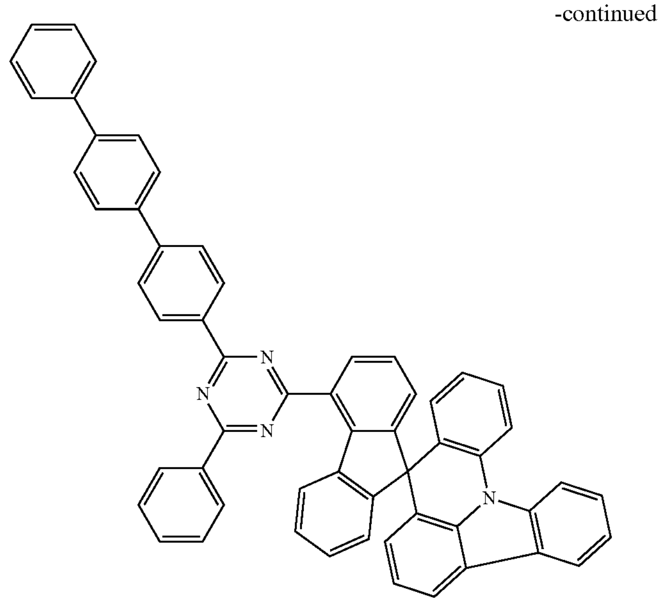
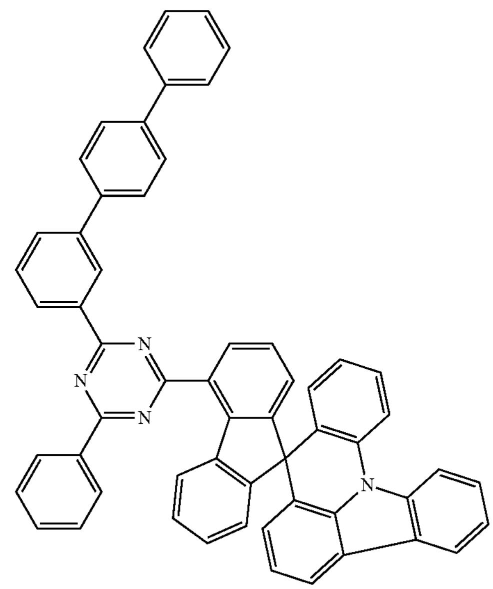
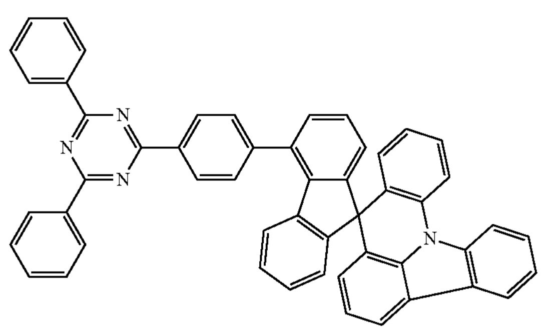
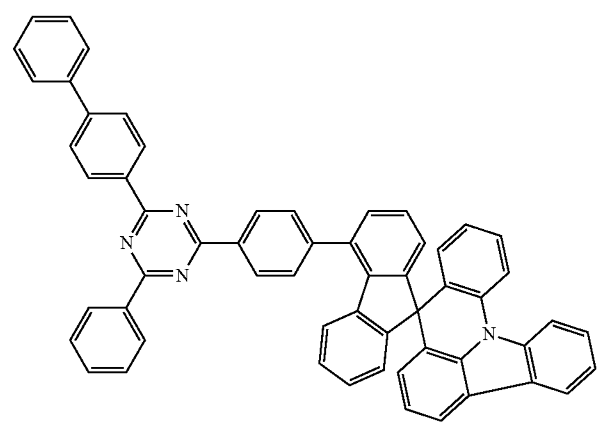
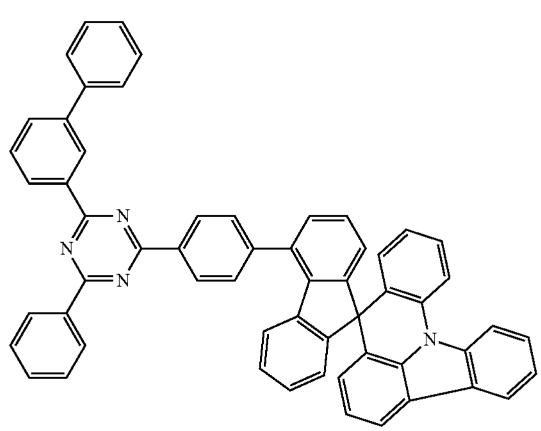
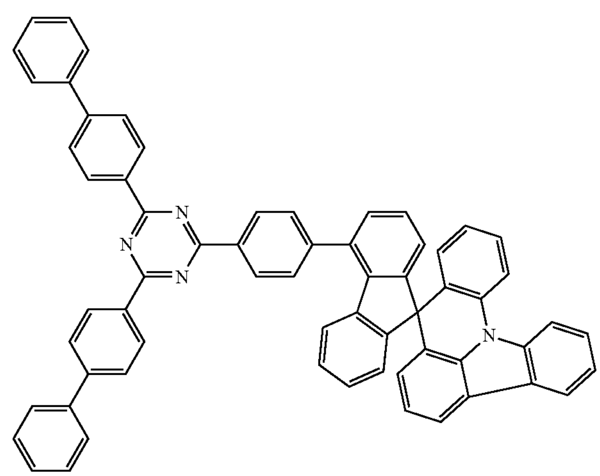

-continued
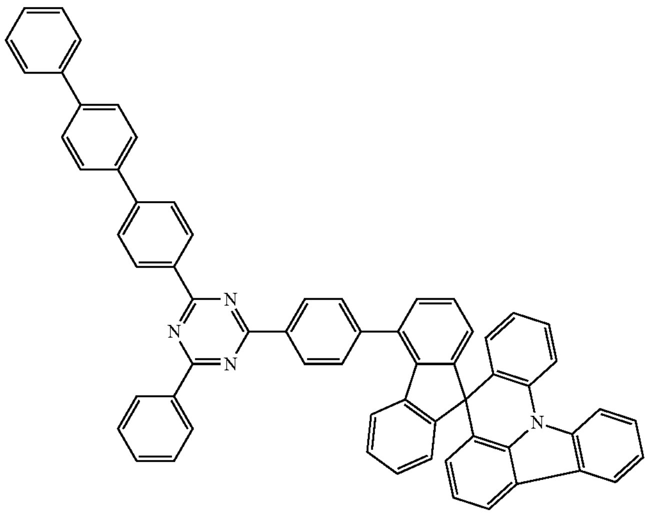
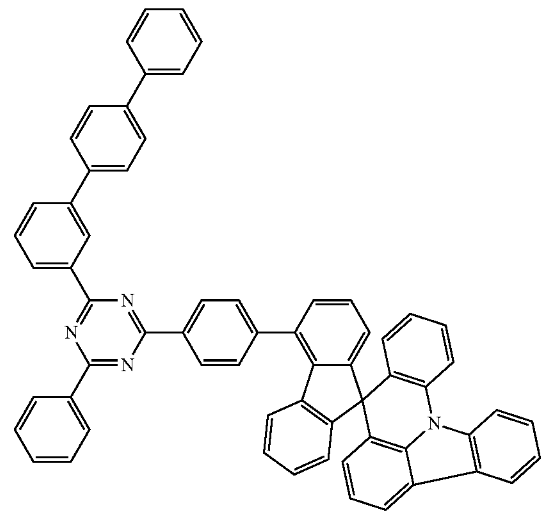
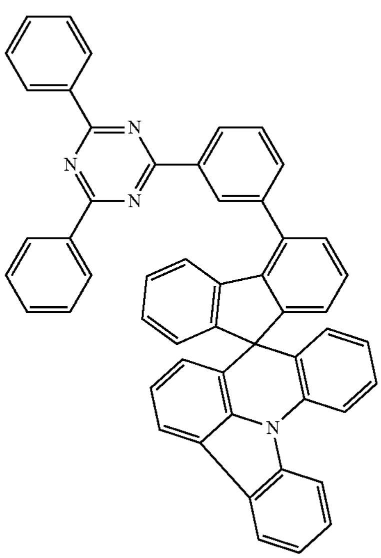
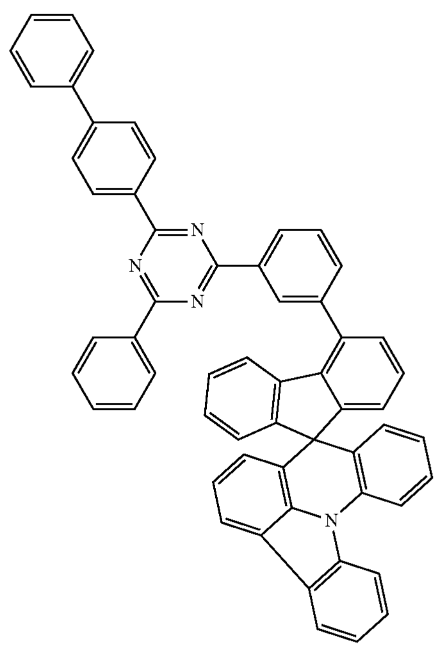

-continued
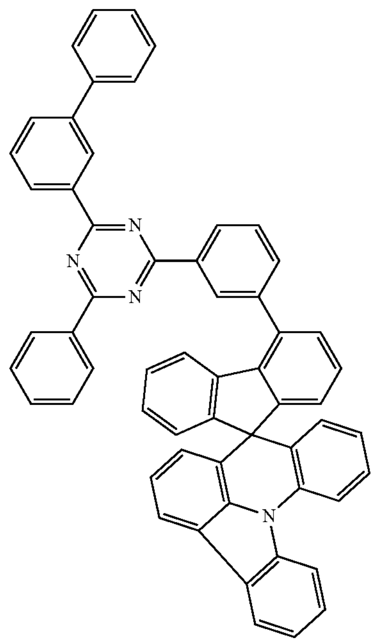
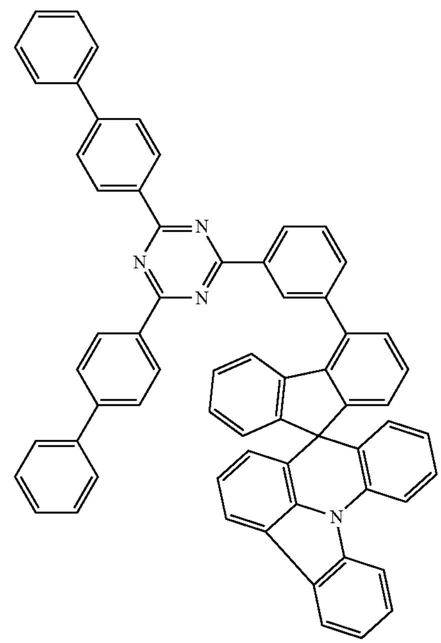
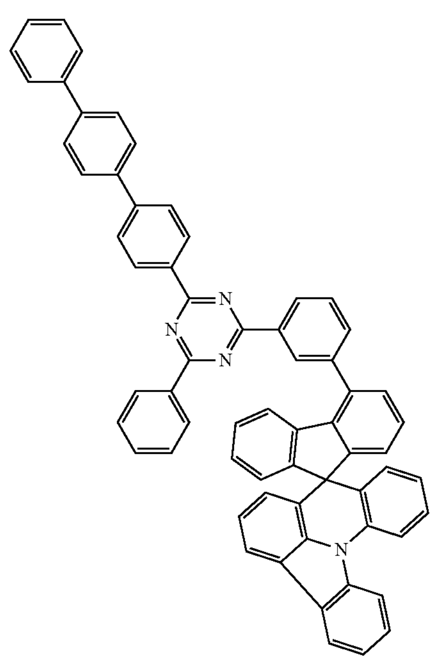
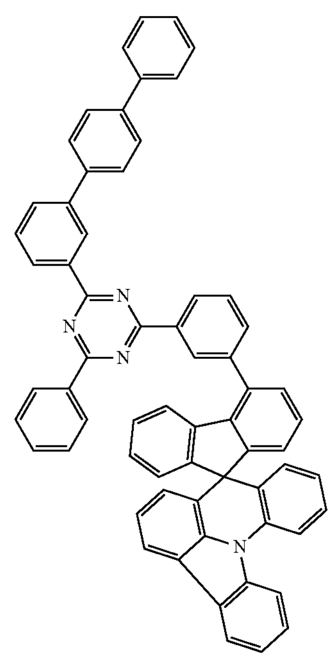

-continued
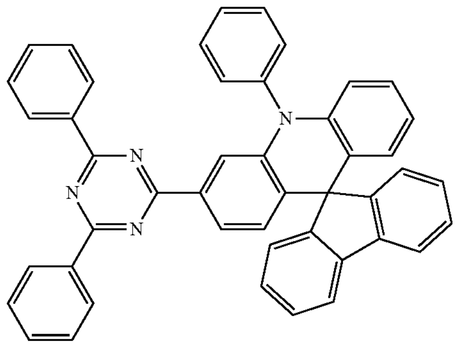
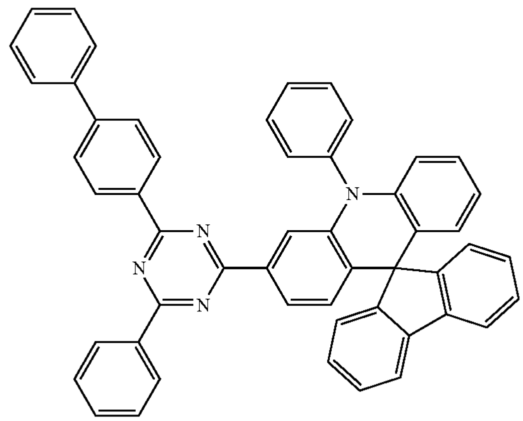
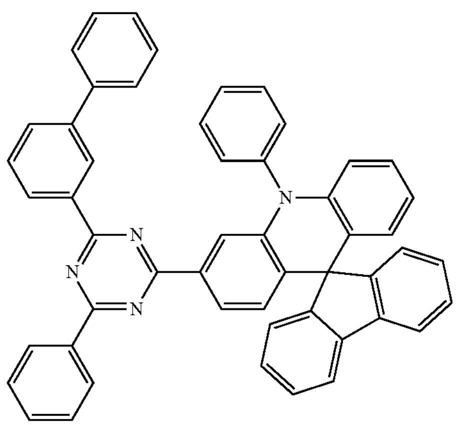
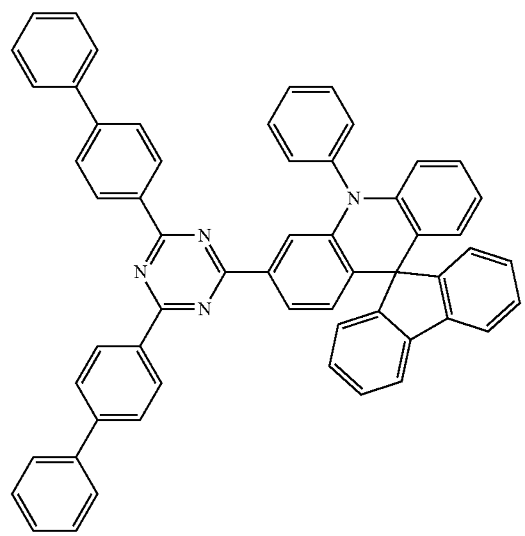
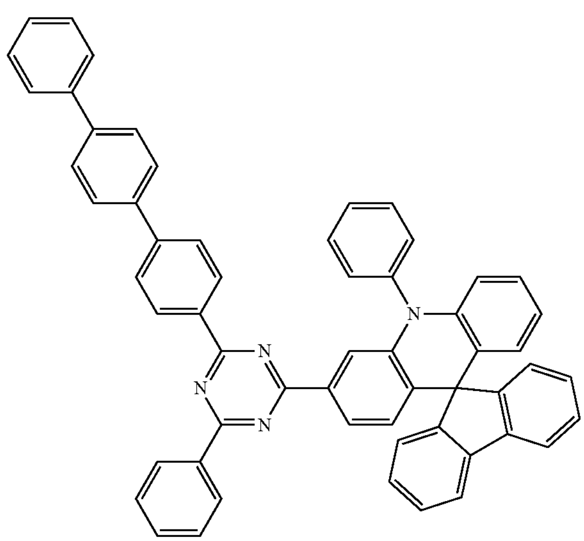
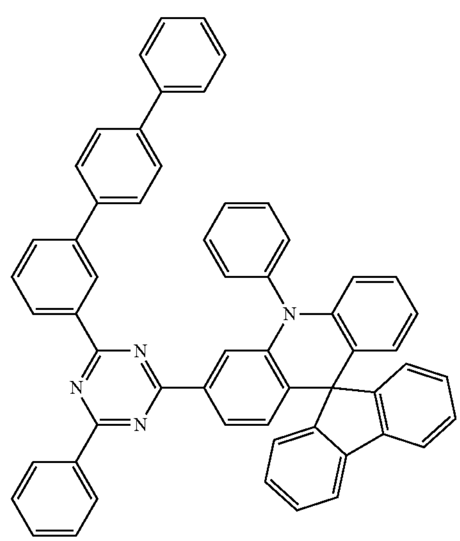

-continued
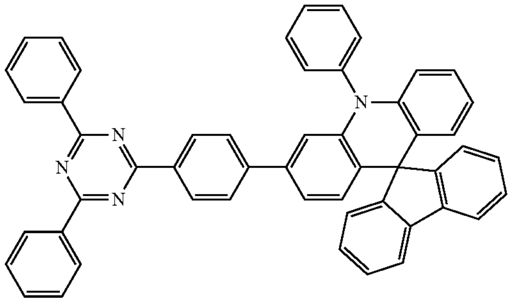
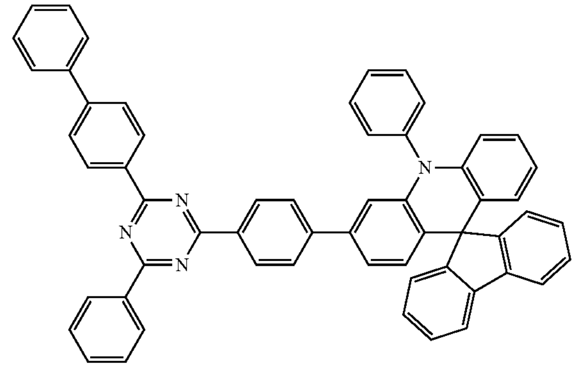
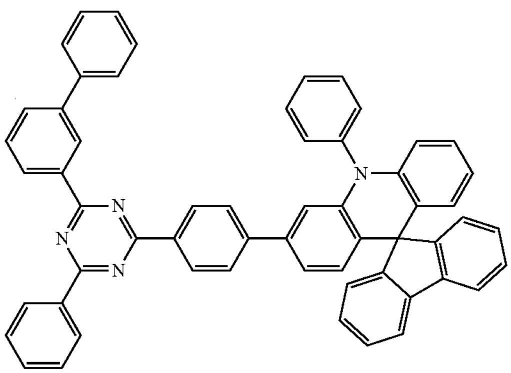
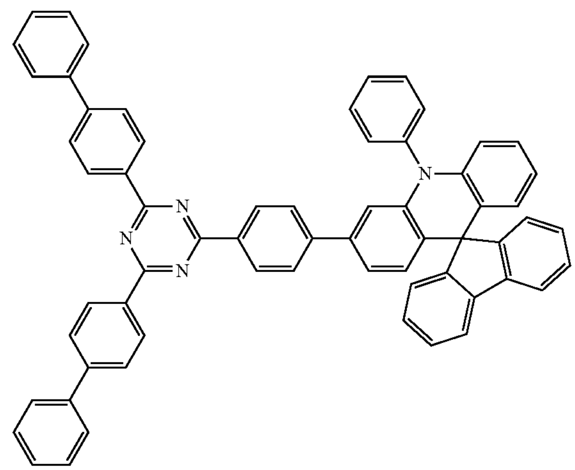
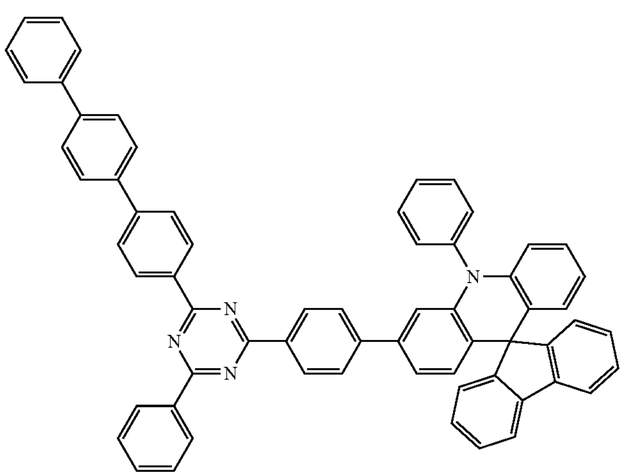
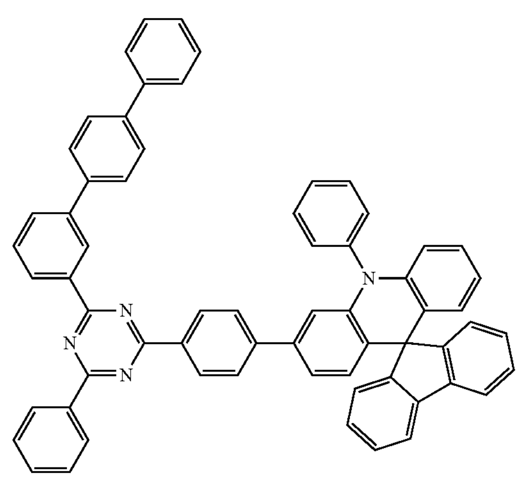

-continued
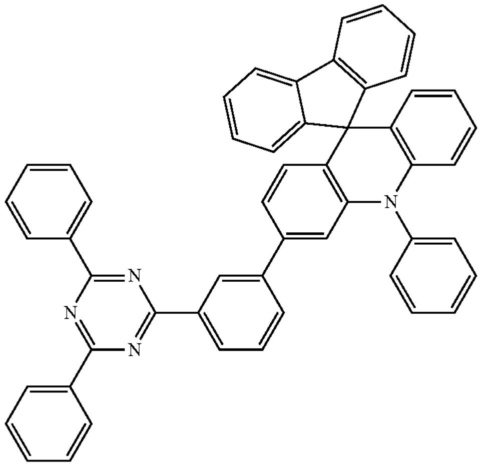
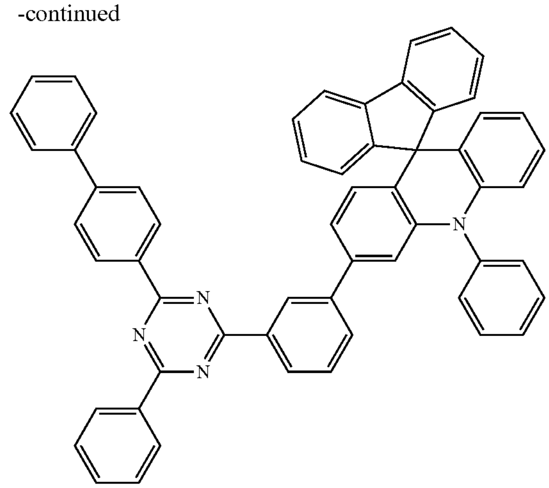
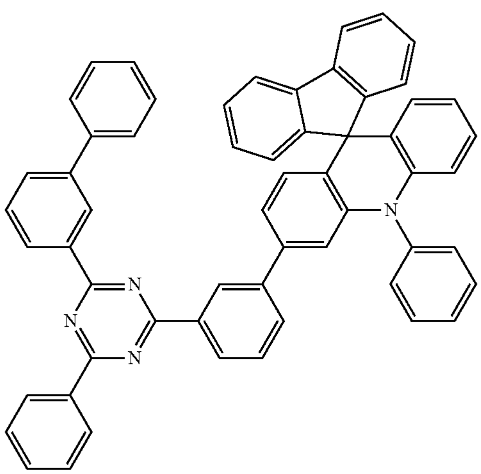
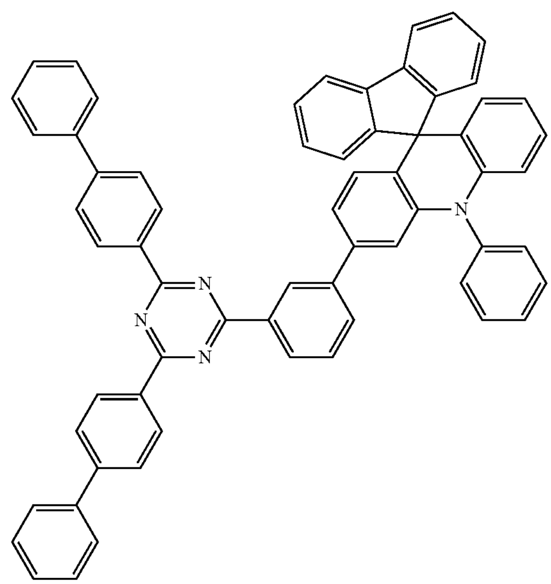
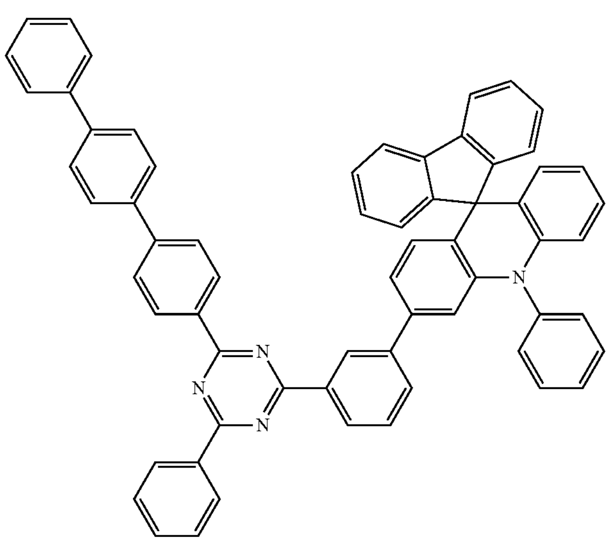
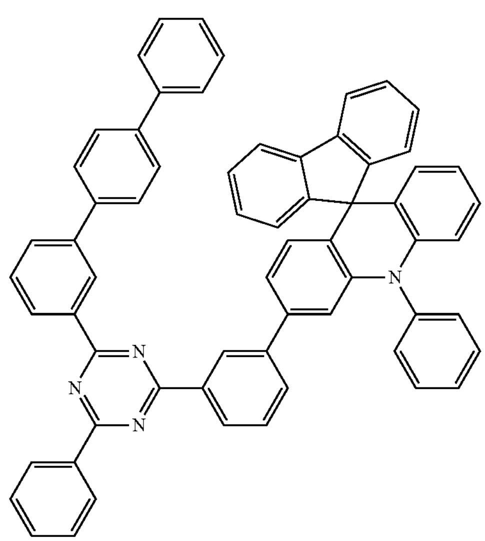

-continued
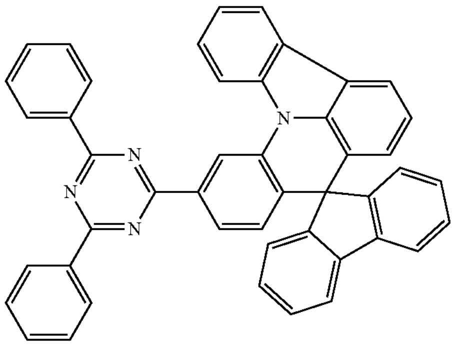
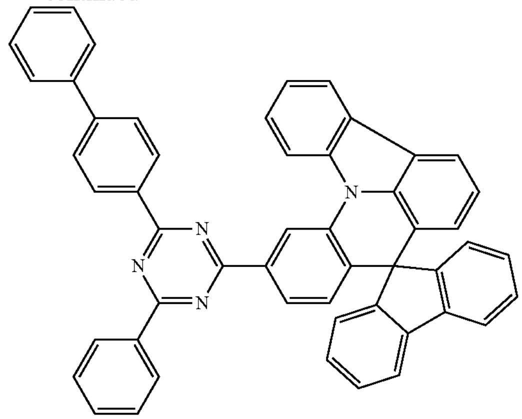
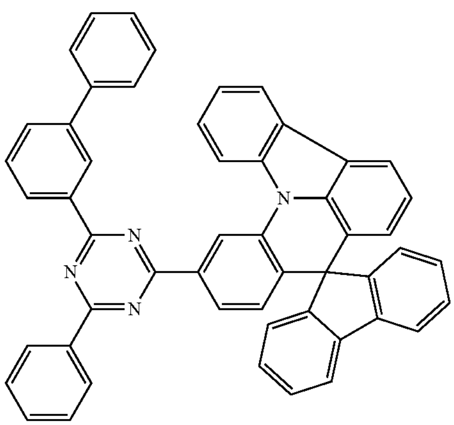
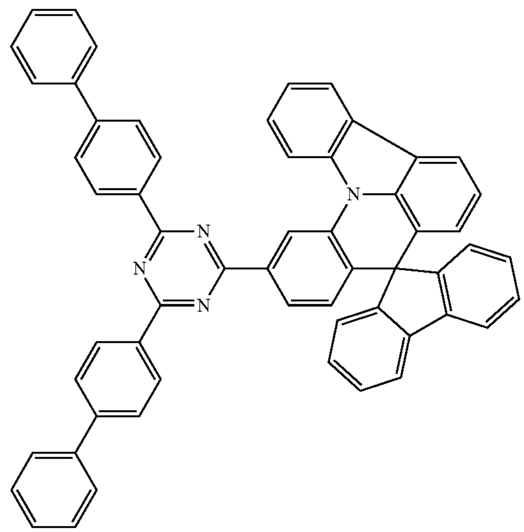
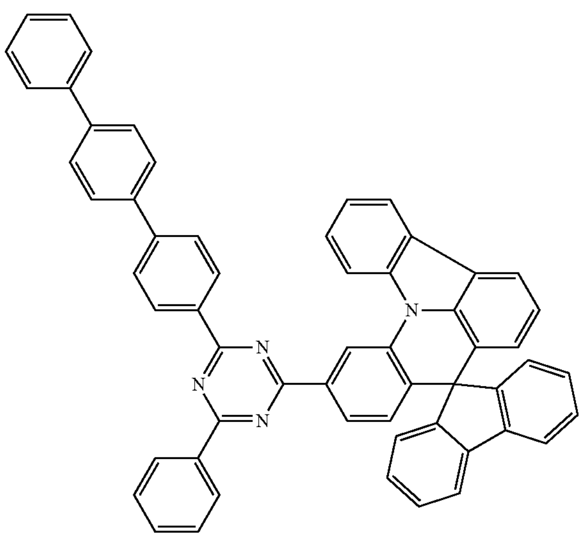
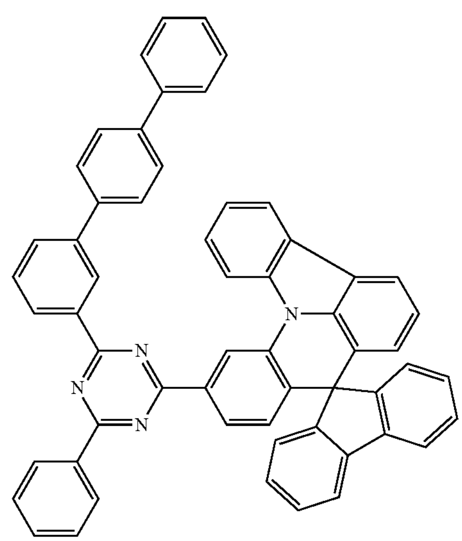

-continued
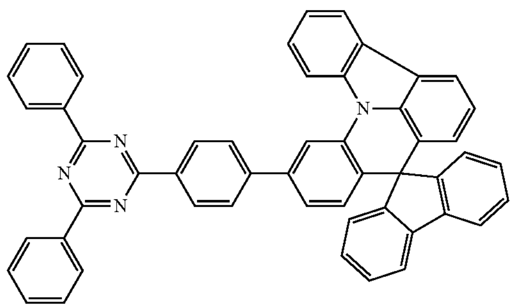
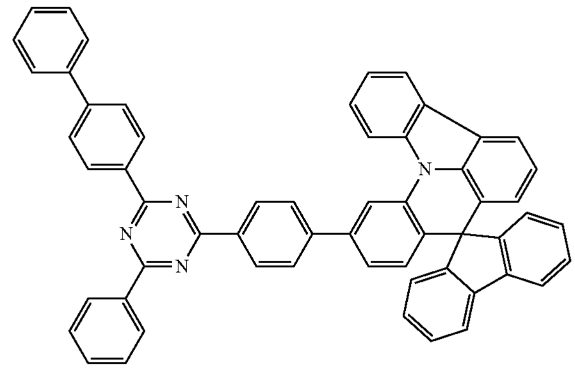
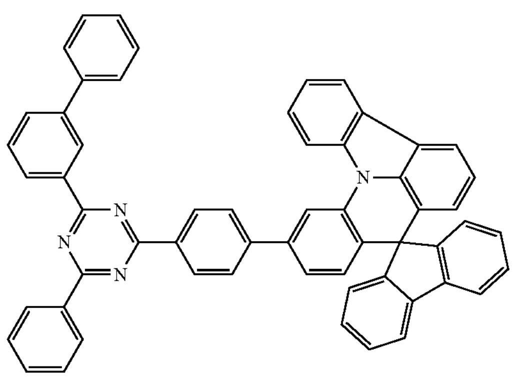
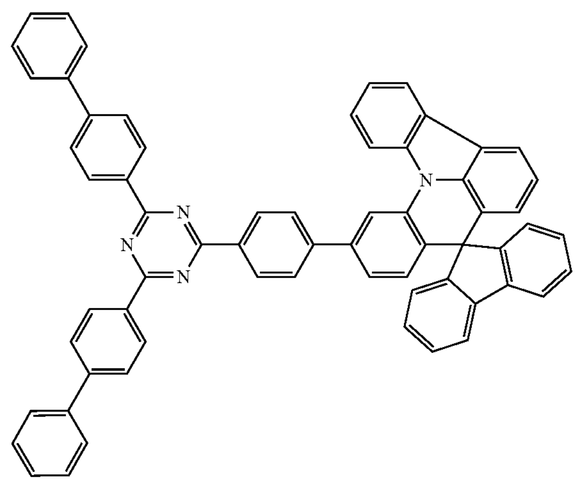
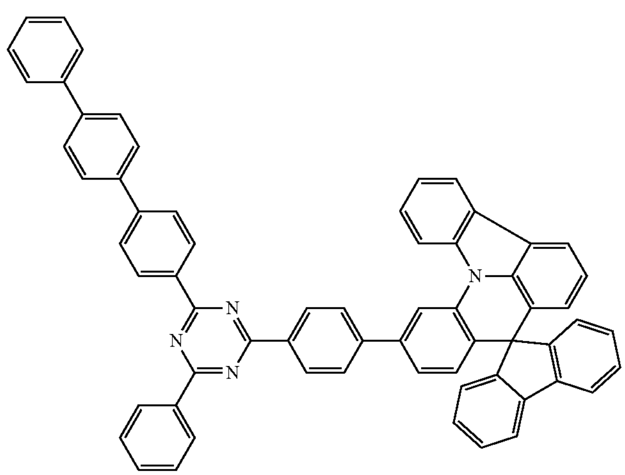
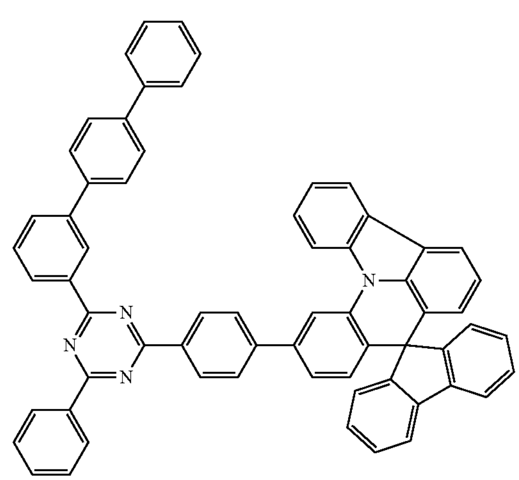

-continued
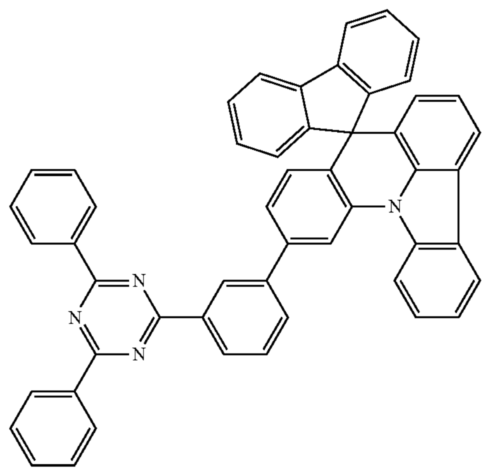
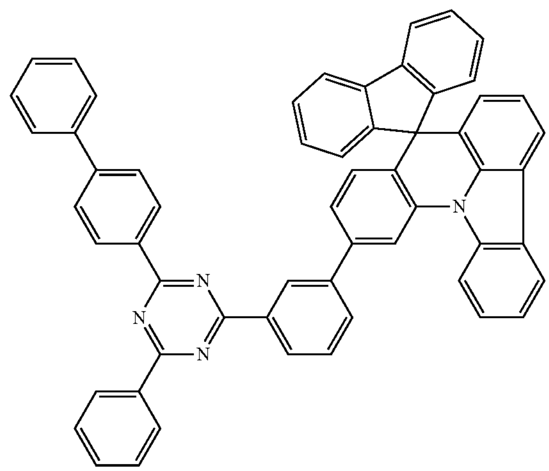
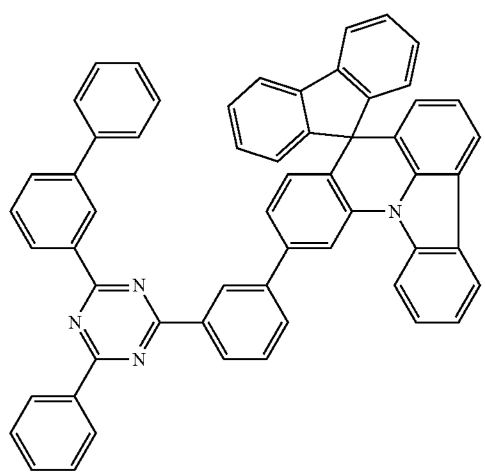
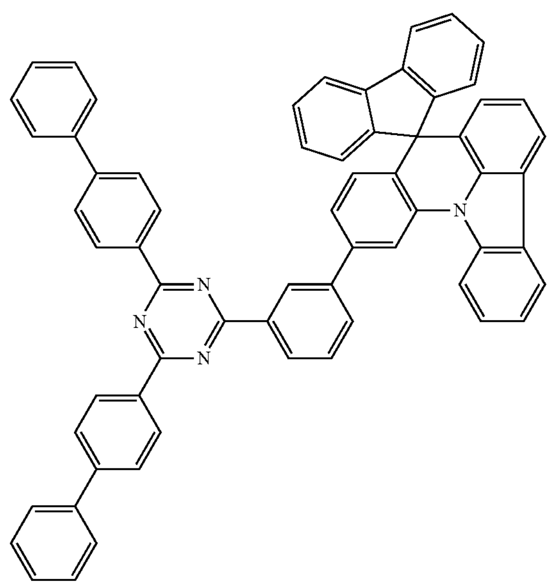
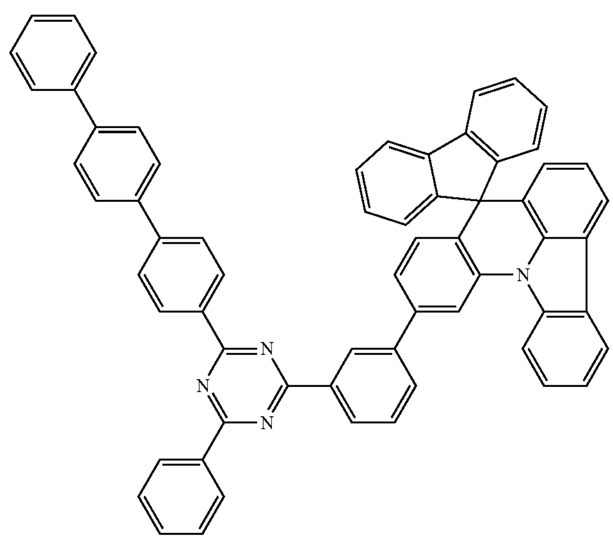
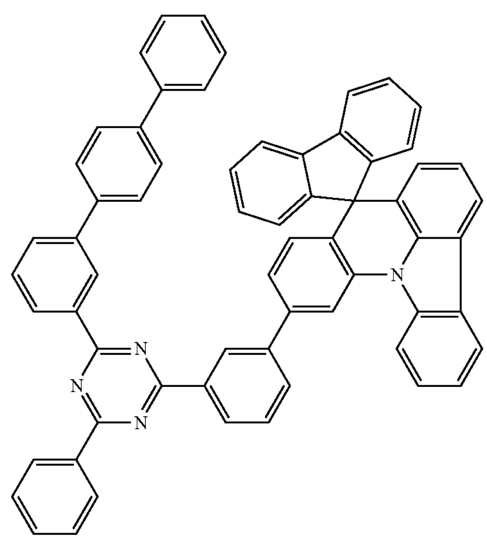

-continued
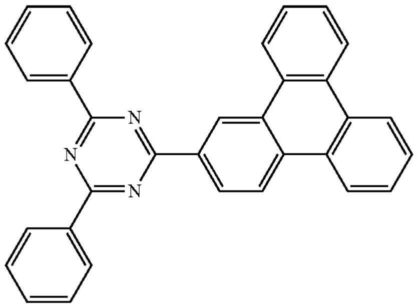
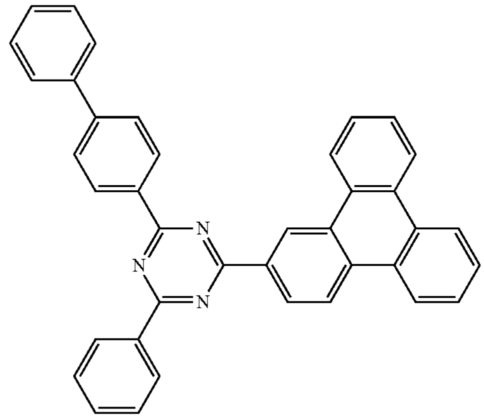
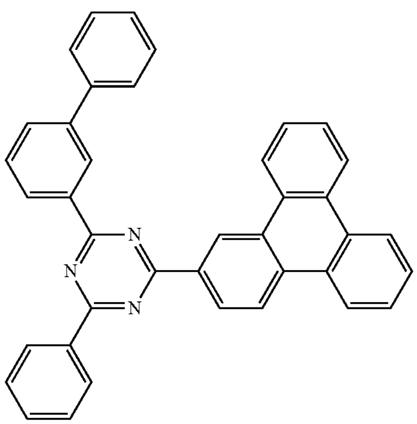
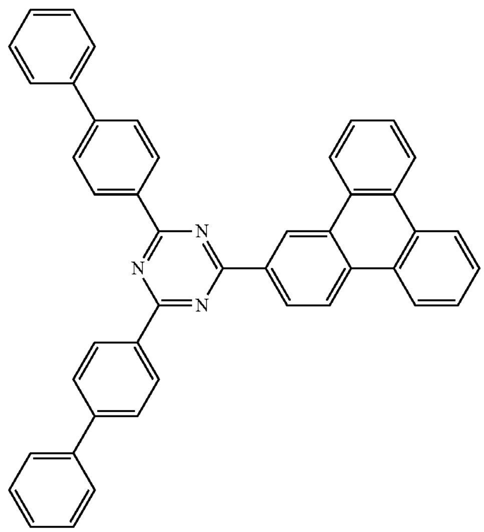
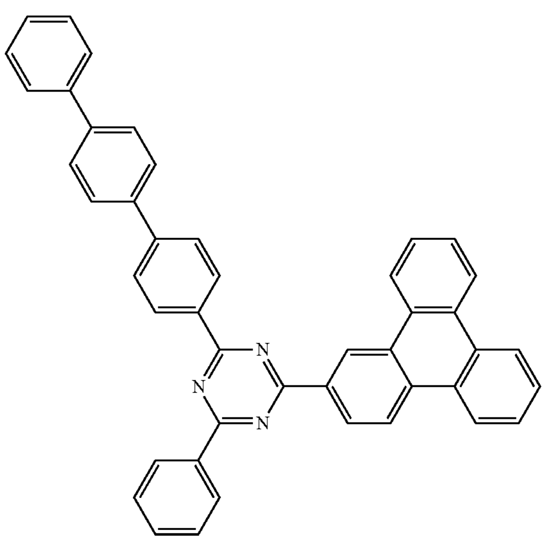
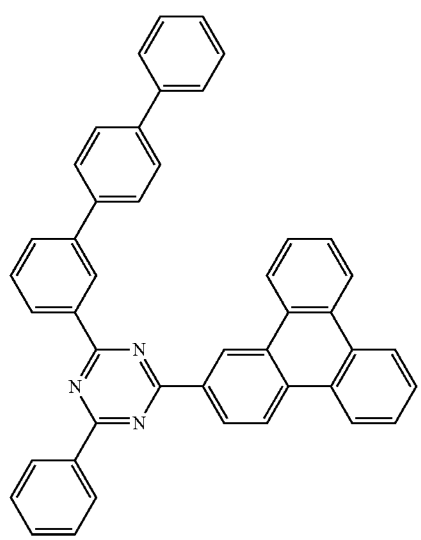

-continued
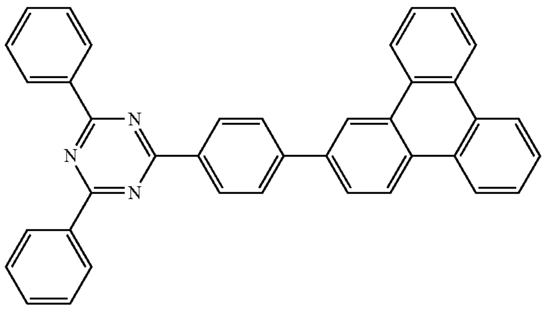
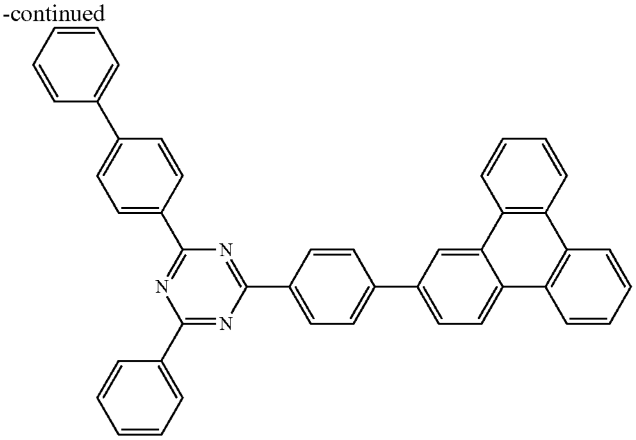
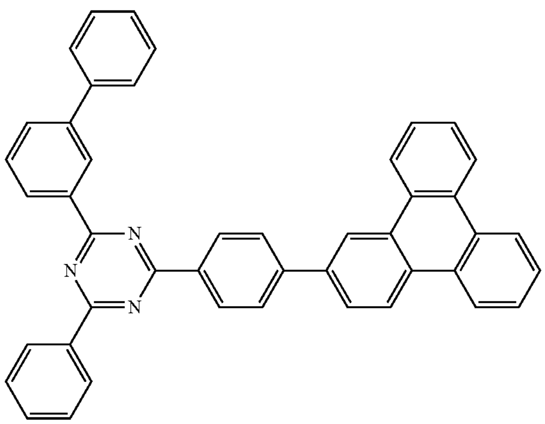
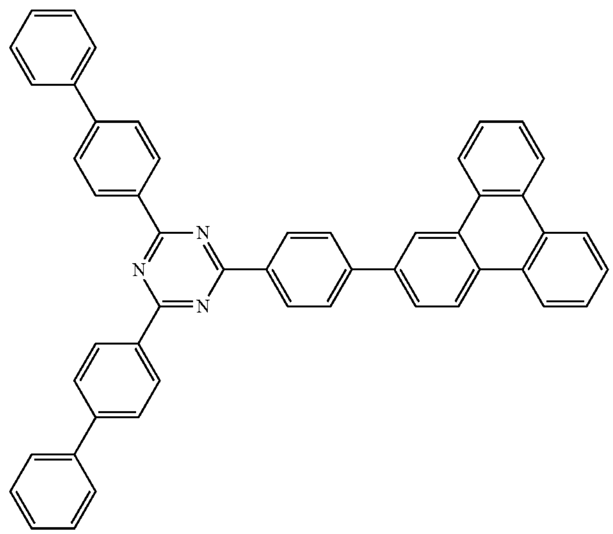
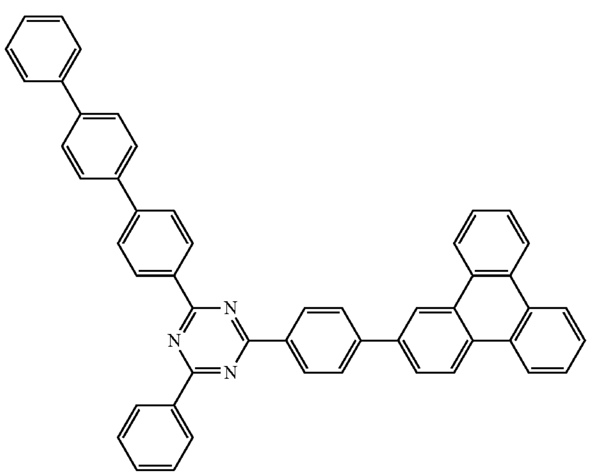
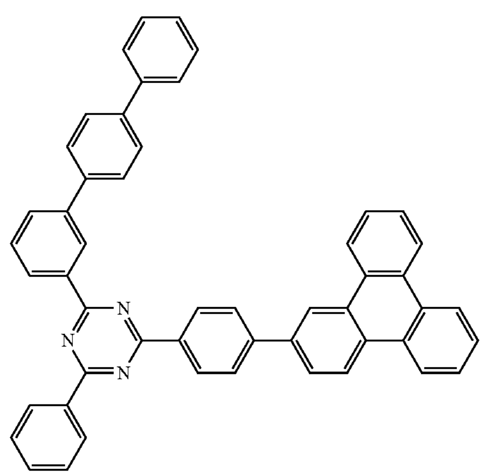

-continued
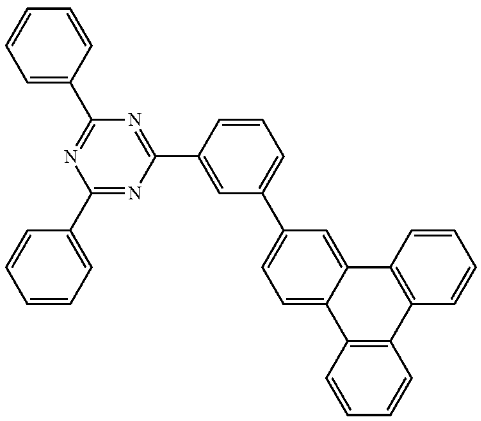
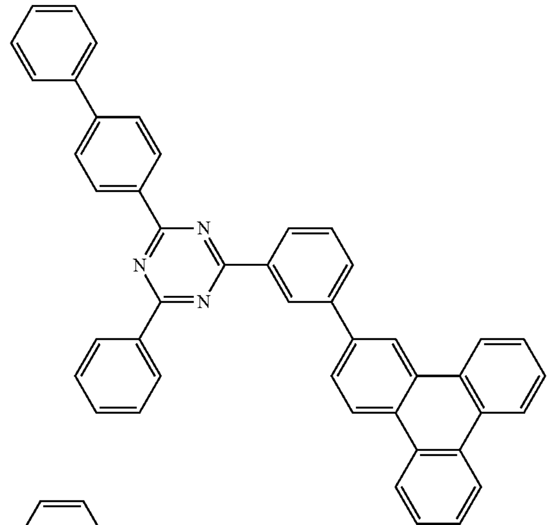
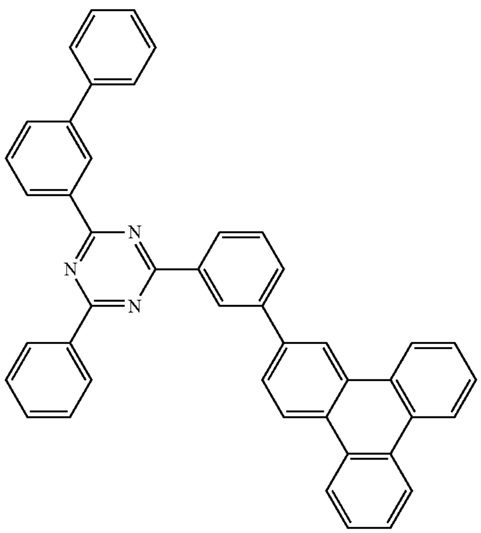
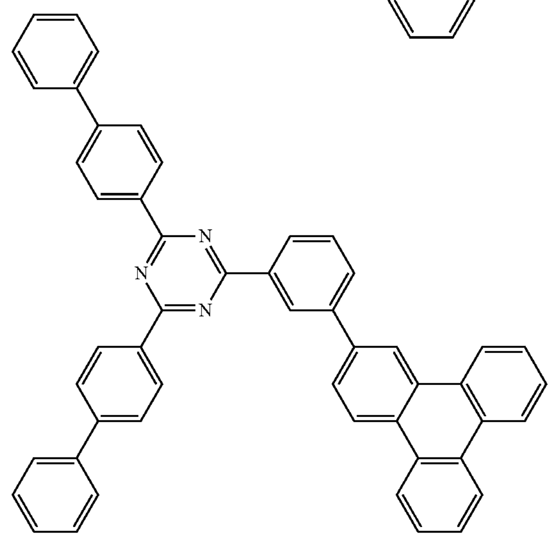
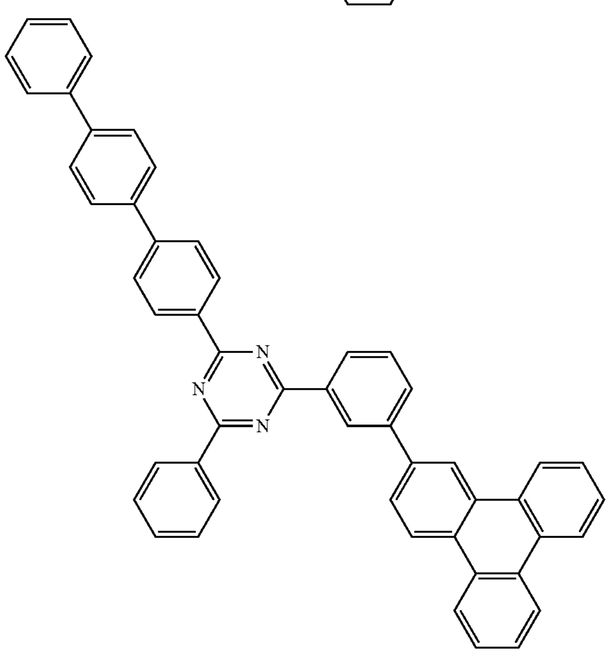
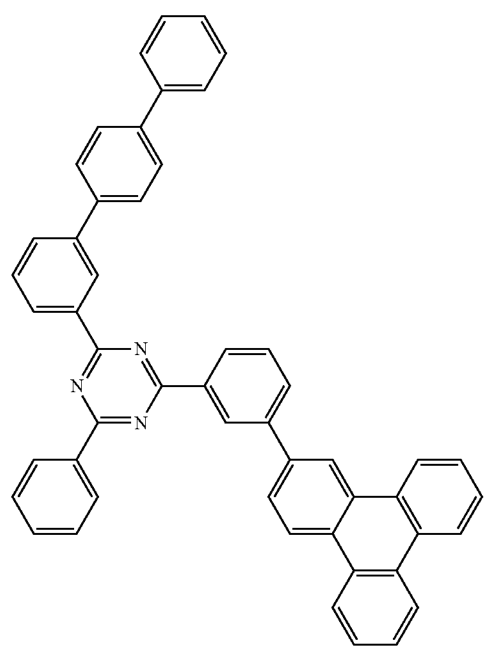

-continued
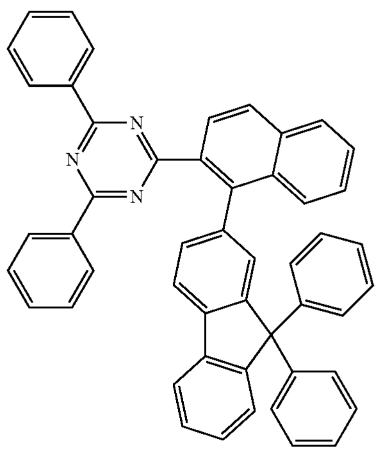
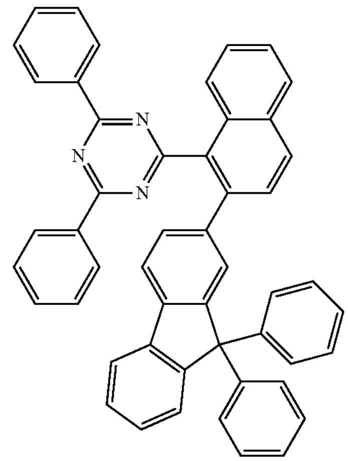
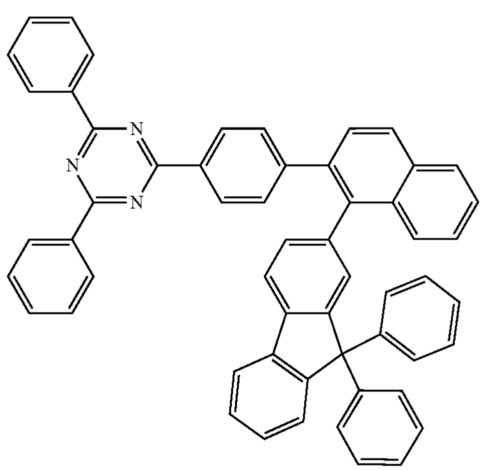
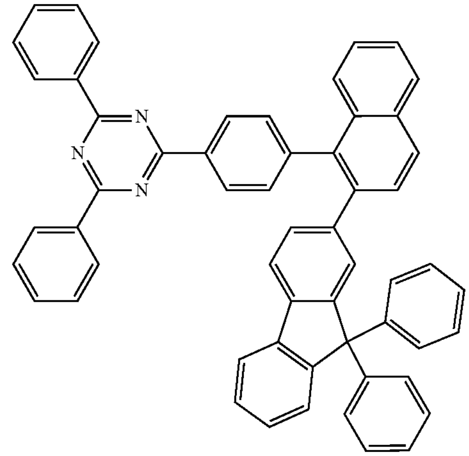
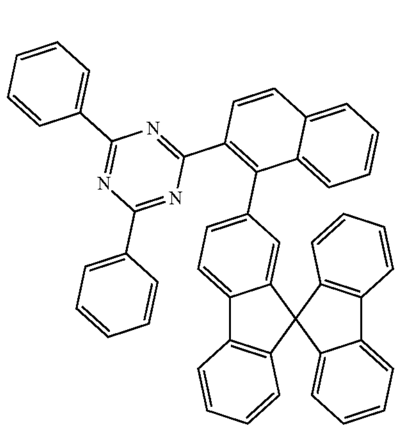
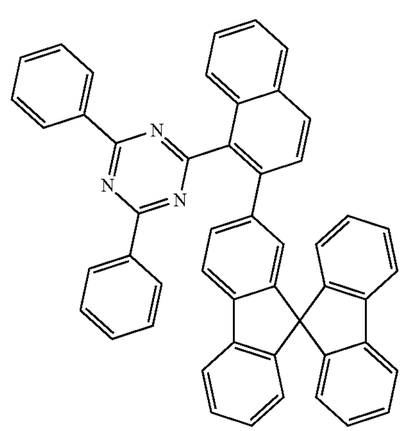

-continued
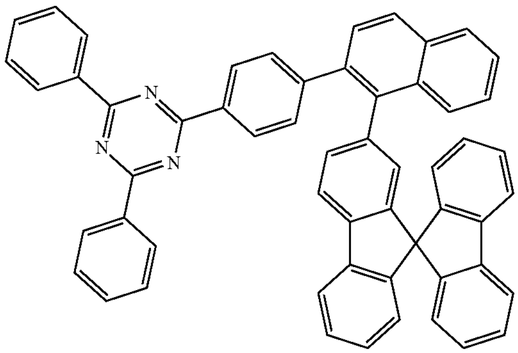
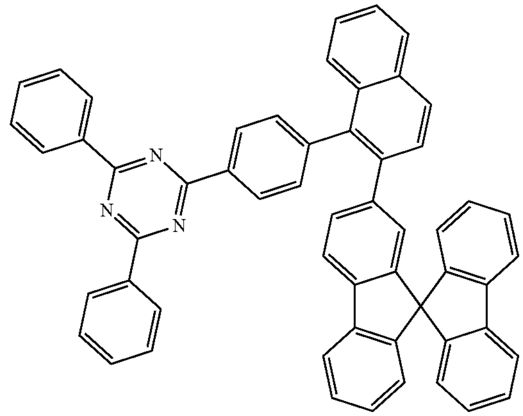
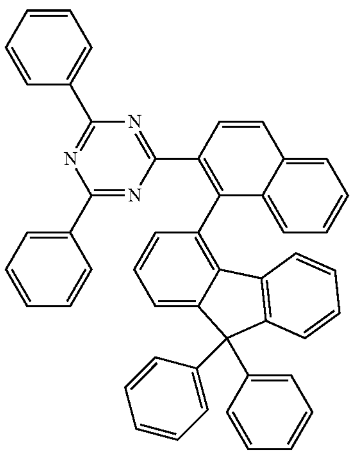
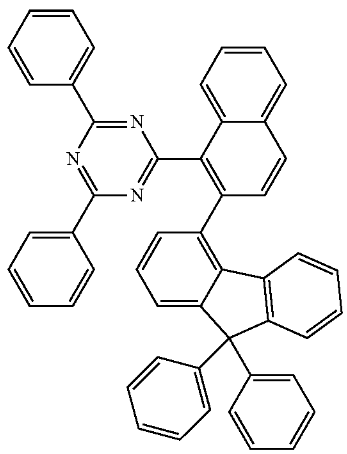
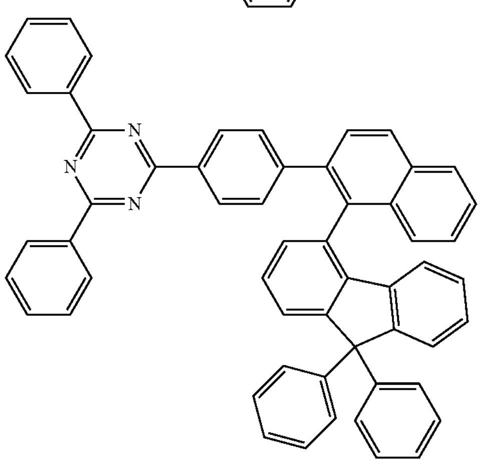
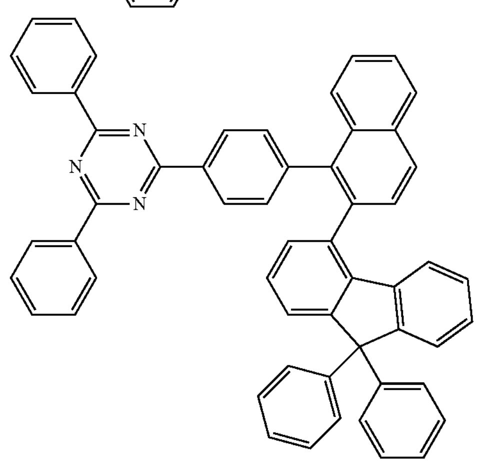
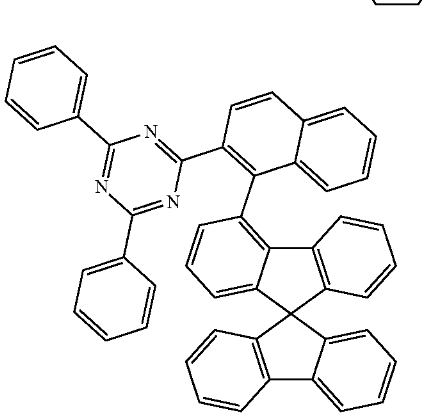
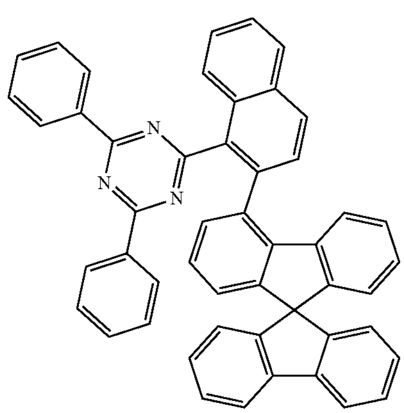

-continued
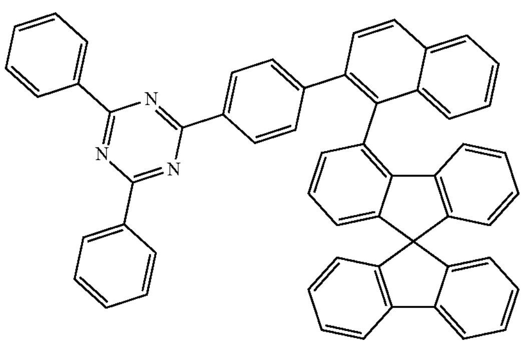
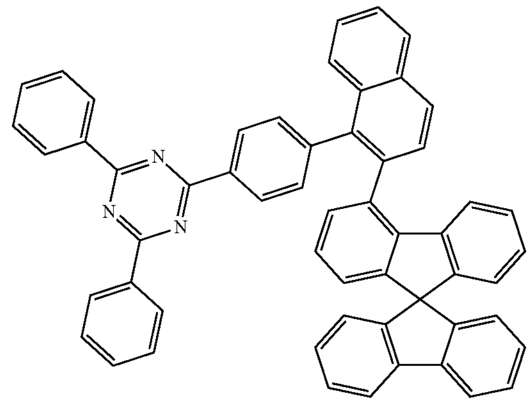
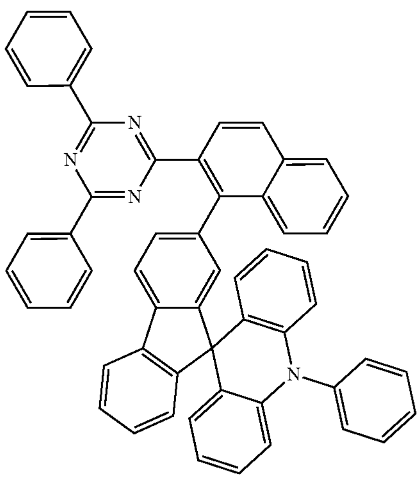
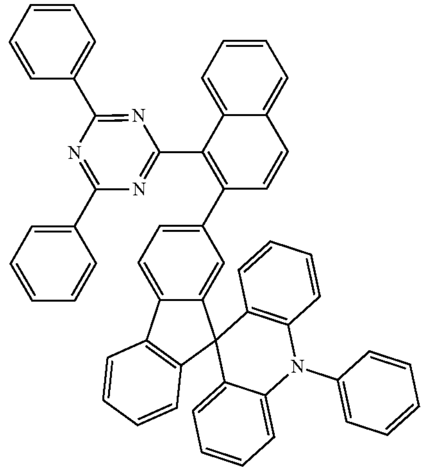
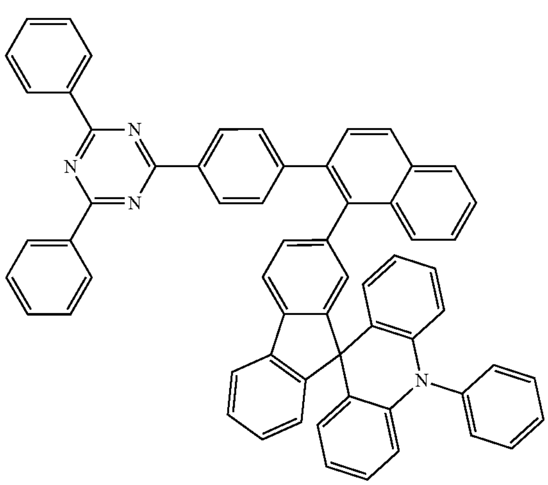
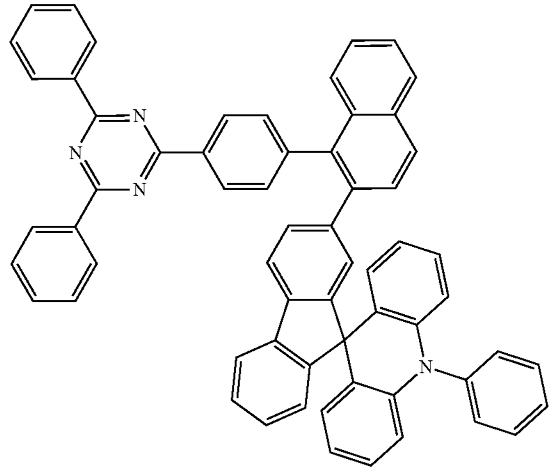

-continued
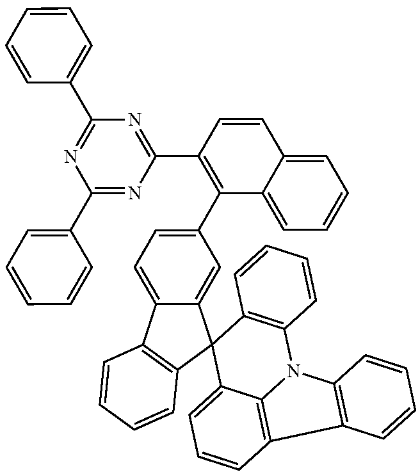
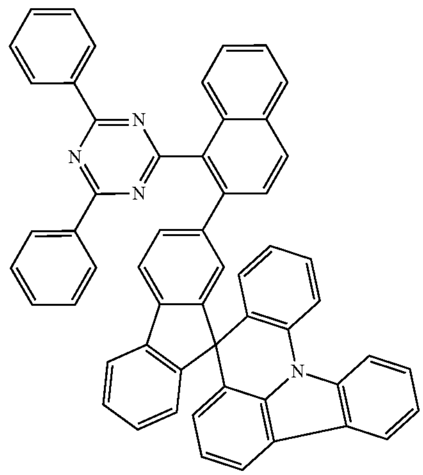
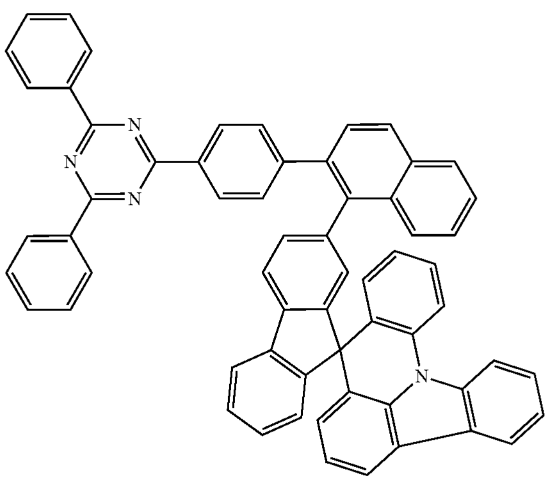
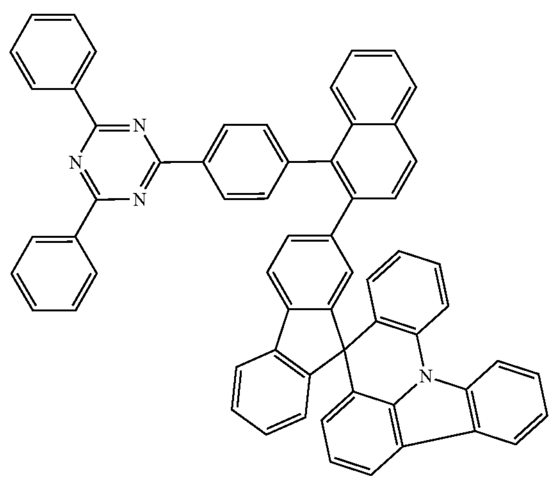
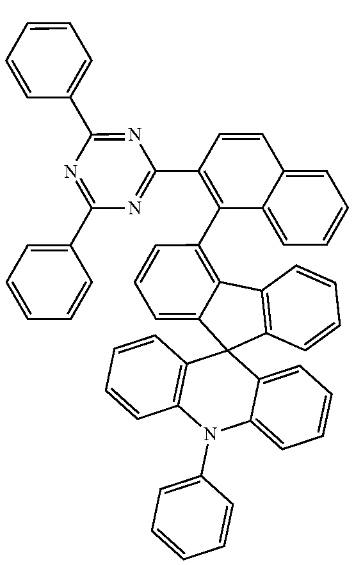
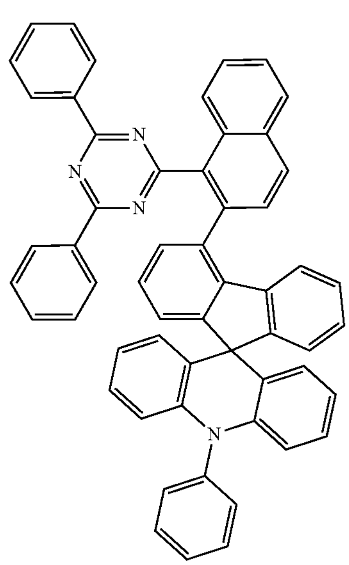

-continued
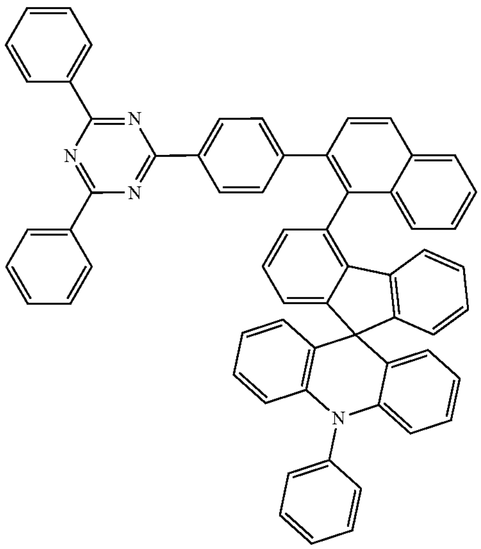
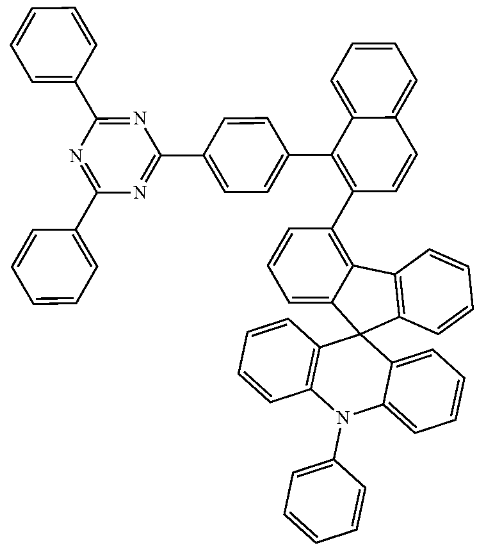
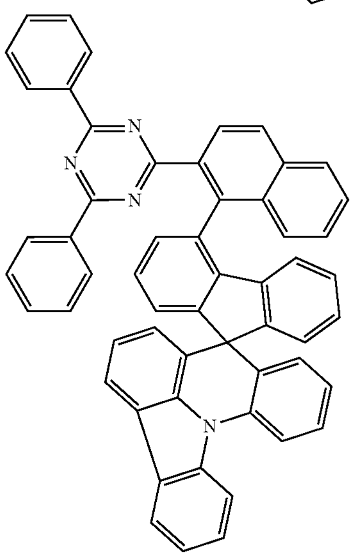
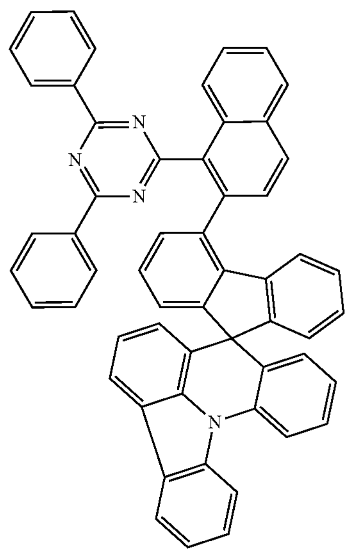
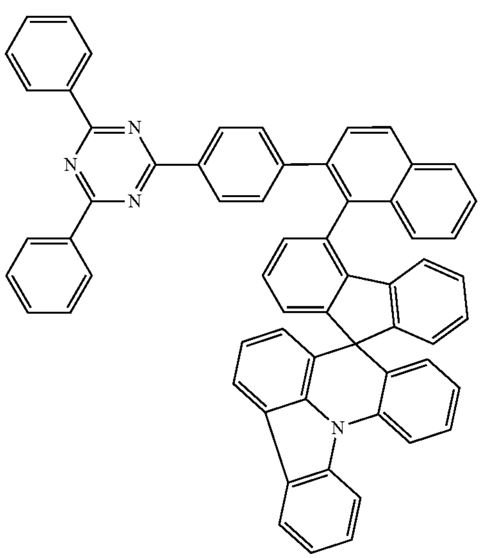
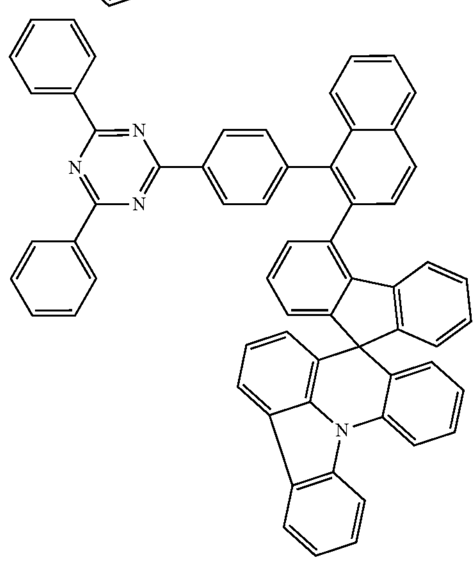

-continued
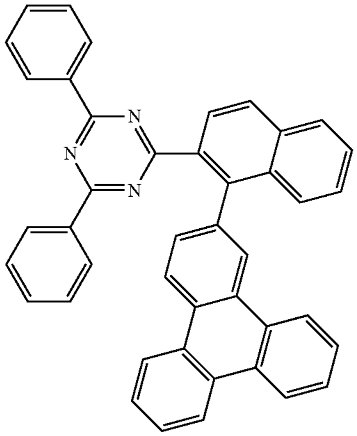
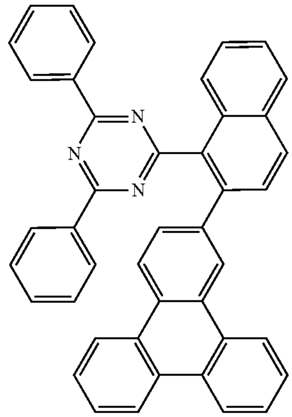
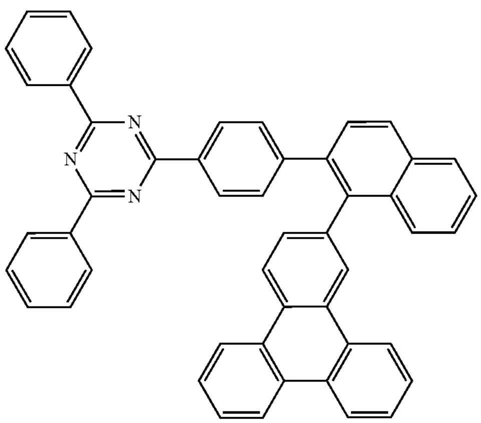
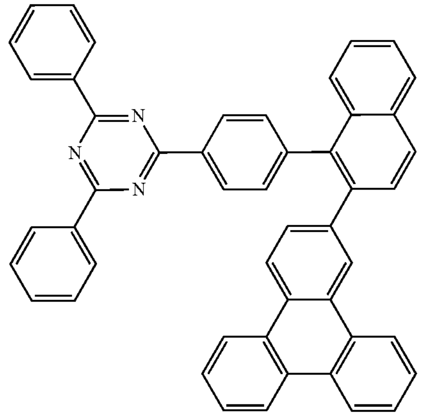
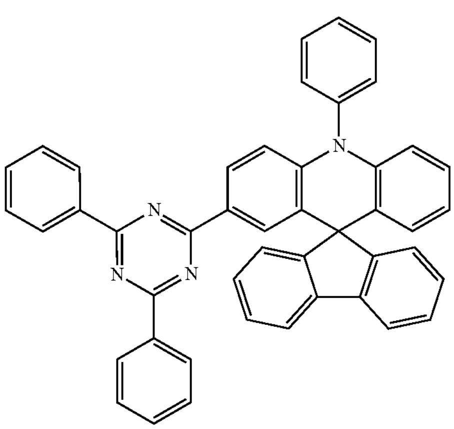
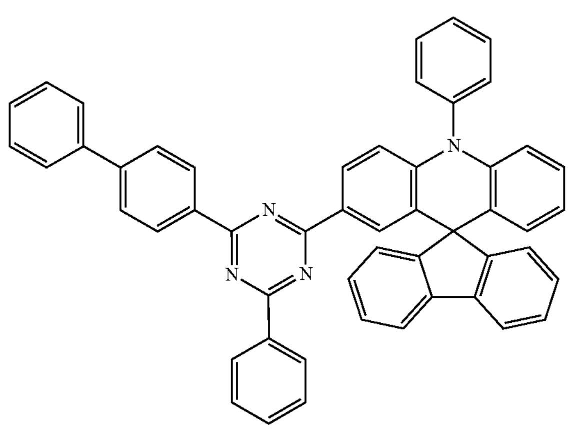

-continued

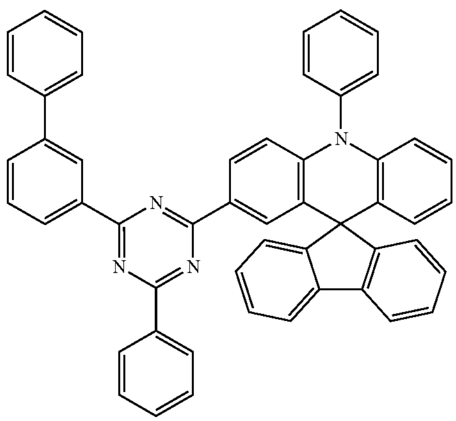

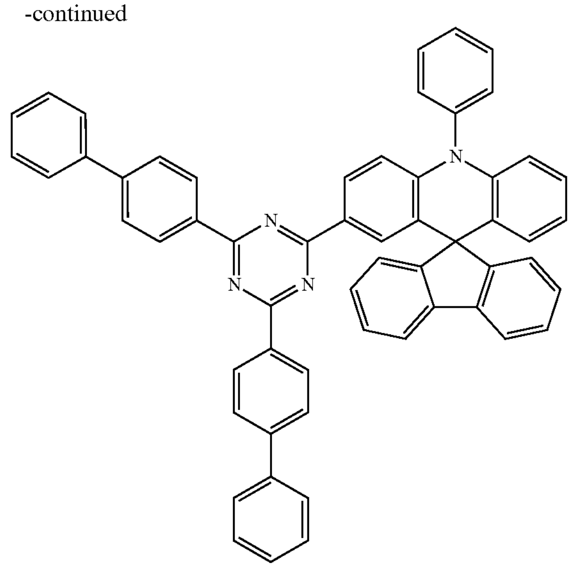

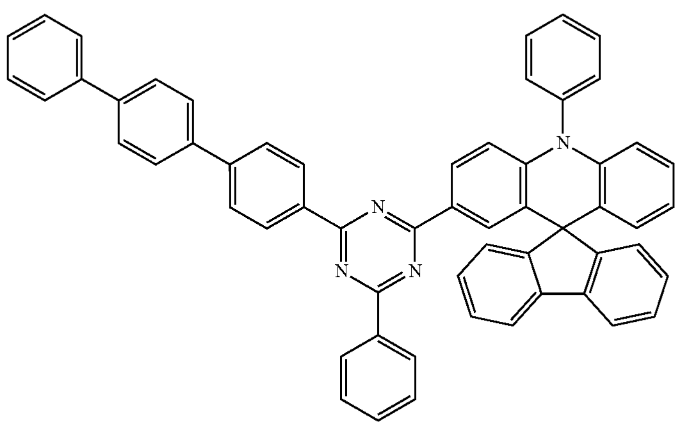

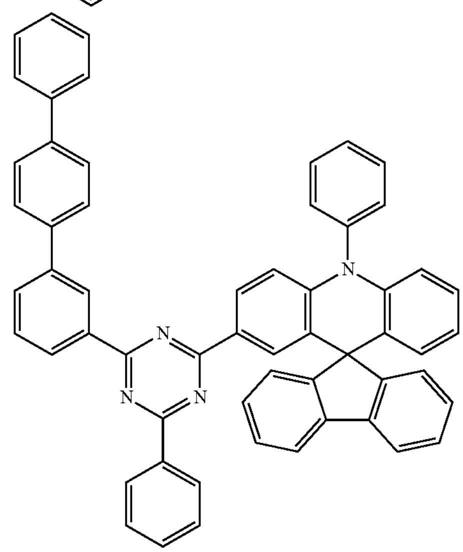

.

10. The organic light emitting device of claim 1, wherein the electron transport region comprises an electron transport layer, and the electron transport layer comprises the compound represented by the Chemical Formula 2.

11. The organic light emitting device of claim 1, wherein the electron transport region comprises an electron transport layer and a hole blocking layer, and the hole blocking layer comprises a compound represented by the Chemical Formula 2.

12. The organic light emitting device of claim 11, wherein the light emitting layer and the hole blocking layer are positioned adjacent to each other.

* * * * *